US008236599B2

(12) United States Patent
Chang et al.

(10) Patent No.: US 8,236,599 B2
(45) Date of Patent: Aug. 7, 2012

(54) SOLUTION-BASED PROCESS FOR MAKING INORGANIC MATERIALS

(75) Inventors: Chih-hung Chang, Corvallis, OR (US); Wei Wang, Corvallis, OR (US)

(73) Assignee: State of Oregon acting by and through the State Board of Higher Education, Corvallis, OR (US)

( * ) Notice: Subject to any disclaimer, the term of this patent is extended or adjusted under 35 U.S.C. 154(b) by 103 days.

(21) Appl. No.: 12/798,755

(22) Filed: Apr. 9, 2010

(65) Prior Publication Data
US 2010/0261304 A1 Oct. 14, 2010

Related U.S. Application Data

(60) Provisional application No. 61/168,107, filed on Apr. 9, 2009.

(51) Int. Cl.
*H01L 21/00* (2006.01)
(52) U.S. Cl. .................................. 438/72; 438/85
(58) Field of Classification Search .................. 438/85, 438/72
See application file for complete search history.

(56) References Cited

U.S. PATENT DOCUMENTS

| 4,100,068 A | 7/1978 | Jordan et al. |
| 4,647,748 A | 3/1987 | Glassman |
| 4,875,619 A | 10/1989 | Anderson et al. |
| 4,921,531 A | 5/1990 | Nagle et al. |
| 5,073,658 A | 12/1991 | Saleh et al. |
| 5,087,930 A | 2/1992 | Roy et al. |
| 5,469,264 A | 11/1995 | Shigemori |
| 5,502,470 A | 3/1996 | Miyashita et al. |
| 5,534,328 A | 7/1996 | Ashmead et al. |
| 5,571,754 A | 11/1996 | Bertin et al. |
| 5,575,855 A | 11/1996 | Kanai et al. |
| 5,580,523 A | 12/1996 | Bard |
| 5,610,645 A | 3/1997 | Moore et al. |
| 5,611,214 A | 3/1997 | Wegeng et al. |
| 5,648,684 A | 7/1997 | Bertin et al. |
| 5,689,966 A | 11/1997 | Zess et al. |

(Continued)

FOREIGN PATENT DOCUMENTS
WO  WO 2010/085764  7/2010

OTHER PUBLICATIONS

"Transparent Conducting Oxides," MRS Bulletin, 25(8), pp. 1-8 (2000).

(Continued)

*Primary Examiner* — Walter L Lindsay, Jr.
(74) *Attorney, Agent, or Firm* — Klarquist Sparkman, LLP

(57) ABSTRACT

Disclosed embodiments provide a solution-based process for producing useful materials, such as semiconductor materials. One disclosed embodiment comprises providing at least a first reactant and a second reactant in solution and applying the solution to a substrate. The as-deposited material is thermally annealed to form desired compounds. Thermal annealing may be conducted under vacuum; under an inert atmosphere; or under a reducing environment. The method may involve using metal and chalcogen precursor compounds. One example of a metal precursor compound is a metal halide. Examples of suitable chalcogen precursor compounds include a chalcogen powder, a chalcogen halide, a chalcogen oxide, a chalcogen urea, a chalcogen or dichalcogen comprising organic ligands, or combinations thereof. Certain disclosed embodiments concern a method for making a solar cell from I-III-VI semiconductors.

48 Claims, 62 Drawing Sheets

U.S. PATENT DOCUMENTS

| | | | |
|---|---|---|---|
| 5,749,226 | A | 5/1998 | Bowman et al. |
| 5,769,985 | A | 6/1998 | Kawakami et al. |
| 5,779,833 | A | 7/1998 | Cawley et al. |
| 5,811,062 | A | 9/1998 | Wegeng et al. |
| 5,853,866 | A | 12/1998 | Watanabe et al. |
| 5,932,940 | A | 8/1999 | Epstein et al. |
| 5,974,867 | A | 11/1999 | Forster et al. |
| 5,985,068 | A | 11/1999 | Kawakami et al. |
| 6,048,432 | A | 4/2000 | Ecer |
| 6,100,463 | A | 8/2000 | Ladd et al. |
| 6,121,539 | A | 9/2000 | Johnson et al. |
| 6,129,973 | A | 10/2000 | Martin et al. |
| 6,143,247 | A | 11/2000 | Sheppard et al. |
| 6,148,635 | A | 11/2000 | Beebe et al. |
| 6,192,596 | B1 | 2/2001 | Bennett et al. |
| 6,202,312 | B1 | 3/2001 | Rando |
| 6,225,149 | B1 | 5/2001 | Gan et al. |
| 6,225,497 | B1 | 5/2001 | Becker et al. |
| 6,329,139 | B1 | 12/2001 | Nova et al. |
| 6,357,332 | B1 | 3/2002 | Vecchio |
| 6,537,506 | B1 | 3/2003 | Schwalbe et al. |
| 6,652,627 | B1 | 11/2003 | Tonkovich et al. |
| 6,672,502 | B1 | 1/2004 | Paul et al. |
| 6,676,835 | B2 | 1/2004 | O'Connor et al. |
| 6,688,381 | B2 | 2/2004 | Pence et al. |
| 6,737,026 | B1 | 5/2004 | Bergh et al. |
| 6,744,038 | B2 | 6/2004 | Wang et al. |
| 6,749,814 | B1 | 6/2004 | Bergh et al. |
| 6,793,831 | B1 | 9/2004 | Paul et al. |
| 6,814,859 | B2 | 11/2004 | Koehler et al. |
| 6,863,867 | B2 | 3/2005 | Bussche et al. |
| 6,903,332 | B2 | 6/2005 | Weiss et al. |
| 6,927,108 | B2 | 8/2005 | Weng et al. |
| 6,946,677 | B2 | 9/2005 | Ostergard |
| 6,981,522 | B2 | 1/2006 | O'Connor et al. |
| 7,118,920 | B2 | 10/2006 | Brophy et al. |
| 7,150,815 | B2 | 12/2006 | Ashmead et al. |
| 7,341,917 | B2 | 3/2008 | Milliron et al. |
| 7,507,380 | B2 | 3/2009 | Chang et al. |
| 2002/0045265 | A1 | 4/2002 | Bergh et al. |
| 2002/0108859 | A1 | 8/2002 | Wang et al. |
| 2003/0047816 | A1 | 3/2003 | Dutta |
| 2003/0052429 | A1 | 3/2003 | Vigna et al. |
| 2003/0118865 | A1 | 6/2003 | Marks et al. |
| 2003/0168590 | A1 | 9/2003 | Weiss et al. |
| 2004/0022691 | A1 | 2/2004 | Allen et al. |
| 2004/0208751 | A1 | 10/2004 | Lazar et al. |
| 2004/0256230 | A1 | 12/2004 | Yager et al. |
| 2005/0074834 | A1 | 4/2005 | Chaplen et al. |
| 2005/0126211 | A1 | 6/2005 | Drost et al. |
| 2005/0158909 | A1* | 7/2005 | Milliron et al. ........... 438/85 |
| 2007/0020400 | A1 | 1/2007 | Chang et al. |
| 2007/0128707 | A1 | 6/2007 | Rorrer et al. |
| 2007/0163643 | A1* | 7/2007 | Van Duren et al. ......... 136/262 |
| 2007/0184576 | A1 | 8/2007 | Chang et al. |
| 2008/0108122 | A1 | 5/2008 | Chang et al. |

OTHER PUBLICATIONS

Afzali, Ali et al., "High-Performance, Solution-Processed Organic Thin Film Transistors from a Novel Pentacene Precursor," *J. Am. Chem. Soc.*, vol. 124, pp. 8812-8813 (2002).

Alman et al., "Fabrication, Structure and Properties of Aluminum-Aluminide Layered Composites," *Materials Research Society Symp. Proc.*, vol. 434, pp. 255-260 (1996).

Alman et al., "Processing, Structure and Properties of Aluminum-Aluminide Layered Sheet Composites," *Light Weight Alloys for Aerospace Applications III*, The Minerals, Metals & Materials Society, pp. 531-544 (1995).

Arias et al., "Polymer transistor display backplanes: High performance inkjet printed devices," Abstracts of Papers, 229th ACS National Meeting, San Diego, CA (Mar. 13-17, 2005).

Chang et al., "A comparison of Chemical Bath Deposition of CdS from a Batch Reactor and a Continuous-flow Microreactor," *Journal of the Electrochemical Society*, 154 (9), pp. 482-488 (2007).

Chang et al., "High-performance spin-coated zinc tin oxide thin-film transistors," *Electrochemical and Solid-State Letters*, 10(5), pp. H135-H138 (2007).

Chang et al., "Nanocrystalline CdS MISFETs Fabricated by a Novel Continuous Flow Microreactor," *Electrochemical and Solid-State Letters*, 9(5), pp. G174-G177 (2006).

Chopra et al., "Transparent Conductors—A Status Review," *Thin Solid Films*, vol. 102, pp. 1-46 (1983).

Colgan, "A Review of Thin-Film Aluminide Formation," *Material Science Reports* 5, pp. I-44, North-Holland (Jan. 1990).

deMello et al., "Microscale reactors: nanoscale products," *The Royal Society of Chemistry*, Lab Chip, No. 4, pp. 11N-15N (2004).

Demura et al., "Ductile Thin Foil of $Ni_3Al$," *Mechanical Properties of Structural Films*, 15 pp. (Nov. 11-12, 2000).

Direct Writing of Injet Printing of Transparent Conducting Oxides (TCO) such as Antimony Tin Oxide (ATO) Materials World, vol. 11., No. 7, pp. 12-13 (Jul. 2003); obtained from http://www.azon.com/details.asp?ArticleID+2156, pp. 1-7.

Freeman et al., "Chemical and Thin-Film Strategies for New Transparent Conducting Oxides," *Materials Research Society Bulletin*, 25(8), pp. 45-51 (Aug. 2000).

Fuller et al., "Ink-Jet Printed Nanoparticle Microelectromechanical Systems," *J. Microelectromechanical Systems*, 11(1), pp. 54-60 (Feb. 2002).

Ginley et al., "Transparent Conducting Oxides," *Materials Research Society Bulletin*, 25(8), pp. 15-18 (Aug. 2000).

Gordon, Roy G., "Criteria for Choosing Transparent Conductors," *Materials Research Society Bulletin*, 25(8), pp. 52-57 (Aug. 2000).

Hershberg, "Manufacturing Technology of the Tektronix Digital Ink Jet Head," *SPSE 3rd International Congress on Advanced in Non-Impact Printing Technologies, Journal of Imaging Technology*, vol. 14, pp. 124-128 (1998).

Hesse et al., "Micro mixers—a review on passive and active mixing principles", *Chem. Eng. Sci.* 60, 2479 (2005).

Hong, Cheong Min et al., "Inkjet Printed Copper Source/Drain Metallization for Amorphous Silicon Thin-Film Transistors," *IEEE Electron Device Letters*, 21(8), pp. 384-386 (Aug. 2000).

Hu et al., "Using Soft Lithography to Fabricate GaAs/AIGaAs Heterstructures Field Effect Transistors," *Appl. Phys. Lett.* 71(14), 2020-2022 (1997).

Kawazoe, Hiroshi et al., "Transparent $p$-Type Conducting Oxides: Design and Fabrication of $p$-$n$ Heterojunctions," *Materials Research Society Bulletin*, 25(8), pp. 28-36 (Aug. 2000).

Lee et al., "A General and Low-Cost Route to Printable High-Mobility Inorganic Thin Film Transistors." *Digital Fabrication*, pp. 27-30 (Sep. 17, 2006).

Lee et al., "A General Route to Printable High-Mobility Transparent Amorphous Oxide Semiconductors," *Adv. Mater.*, vol. 19, pp. 843-847 (2007).

Lewis, Brian G. et al., "Applications and Processing of Transparent Conducting Oxides," *Materials Research Society Bulletin*, 25(8), pp. 22-27 (Aug. 2000).

Minami, Tadatsugu, New $n$-Type Transparent Conducting Oxides, *Materials Research Society Bulletin*, 25(8), pp. 38-44 (Aug. 2000).

Office Action issued by the U.S. Patent and Trademark Office on Apr. 1, 2008, for U.S. Appl. No. 11/086,074, 22 pp.

Office Action issued by the U.S. Patent and Trademark Office on Dec. 23, 2009, for U.S. Appl. No. 11/490,966, 15 pp.

Office Action issued by the U.S. Patent and Trademark Office on Oct. 21, 2008, for U.S. Appl. No. 11/490,966, 10 pp.

Office Action issued by the U.S. Patent and Trademark Office on Jun. 6, 2008, for U.S. Appl. No. 10/803,502, 27 pp.

Office Action issued by the U.S. Patent and Trademark Office on May 21, 2010, for U.S. Appl. No. 11,564,759, 28 pp.

Ota et al., "Indium-tin-oxide Films Prepared by Dip Coating Using an Ethanol Solution of Indium Chloride and Tin Chloride," *Surface and Coating Technology*, 169-170, pp. 521-524 (2003).

Ridley et al., "All-Inorganic Field Effect Transistors Fabricated by Printing," *Science*, vol. 286, pp. 746-749 (Oct. 22, 1999).

Ridley, "Inorganic Semiconductors for Printed Transistors," Ph.D. Thesis, MIT, 25 pp. (1999).

Sirringhaus et al., "High-Resolution Inkjet Printing of All-Polymer Transistor Circuits," *Science*, vol. 290, pp. 2123-2126 (Dec. 15, 2000).

Spear, W.E. et al., "Substitutional Doping of Amorphous Silicon," *Solid State Communications*, vol. 17, pp. 1193-1196 (1975).

Tour, "Chapter 3: Chemical Synthesis," *Molecular Electronics, Commercial Insights, Chemistry, Devices, Architecture and Programming*, World Scientific, pp. 33-41 (Mar. 2003).

Volkman et al., "Inkjetted Organic Transistors using a Novel Pentacene Precursor," *Mat. Res. Soc. Symp. Proc.*, vol. 769, pp. H11.7.1/L12.7.1-H11.7.6/L12.7.6 (2003).

Voss et al., "Growth Kinetics of Thin-Film Cadmium Sulfide by Ammonia-Thiourea Based CBD," *Journal of The Electrochemical Society*, 151 (10), pp. C655-C660 (2004).

Hara et al., "Optimization and properties of Zn doped indium oxide films on plastic-substrate," *Jpn. J. Appl. Phys.* 43(2), 745-749 (2004).

Hoffman, "ZnO-channel thin-film transistors: channel mobility," *J. Appl. Phys.* 95, 5813-5819 (2004).

Kostoglou et al., "Modeling Thin Film CdS Development in a Chemical Bath Deposition Process," *Ind. Eng. Chem. Res.*, 39, 3272-3283 (2000).

Nomura et al., "Room-temperature fabrication of transparent flexible thin-film transistors using amorphous oxide semiconductors," *Nature* 432, 488-492 (2004).

Nomura et al., "Thin-film transistor fabricated in single-crystalline transparent oxide semiconductor," *Science* 300 (5623), pp. 1269-1272 (2003).

\* cited by examiner

SOLUTION-BASED PROCESS FOR MAKING INORGANIC MATERIALS

CROSS REFERENCE TO RELATED APPLICATIONS

This application claims the benefit of the earlier filing date of U.S. Provisional Application No. 61/168,107, filed on Apr. 9, 2009, which is incorporated in its entirety herein by reference.

Additional patent documents describing subject matter or background information which may be pertinent to the present disclosure include U.S. Pat. No. 7,507,380, issued Mar. 24, 2009, U.S. patent application Ser. No. 11/490,966, filed on Jul. 21, 2006, U.S. patent application Ser. No. 11/564,759, filed on Nov. 29, 2006, U.S. patent application Ser. No. 11/595,479, filed Nov. 10, 2006, U.S. patent application Ser. No. 11/897,998, filed Aug. 31, 2007, and International Application No. PCT/US2010/02201, filed Jan. 25, 2010, each of which is incorporated in its entirety herein by reference.

ACKNOWLEDGMENT OF GOVERNMENT SUPPORT

The present invention was developed, at least in part, using funds provided by the National Science Foundation CAREER S0799A National Science Foundation grant No. CTS-0348723. The federal government has certain rights in this invention.

FIELD

The present disclosure concerns embodiments of a method for making inorganic materials, particularly materials useful for electronic applications, embodiments of a method for depositing the inorganic materials, typically as thin films, onto a substrate, and products made comprising the inorganic materials.

BACKGROUND

Electronic devices are ubiquitous in modern society, prompting technological development in related or peripheral fields, such as transistor materials and methods for their manufacture. Current methods for producing functional devices from inorganic materials typically employ sequential deposition and etching of selected semiconducting, conducting, and insulating materials. These steps are performed using multiple photolithography and vacuum deposition steps, such as physical or chemical vapor deposition, which contribute to their high manufacturing costs. Methods that reduce or eliminate one or more of these steps would benefit commercial production of electronic devices.

Thin films conventionally are deposited by a CVD (Chemical Vapor Deposition) method and a sputtering method. Silicon films, such as amorphous silicon films, and poly-silicone films, typically are used for the semiconductor films and have been formed by thermal CVD, plasma CVD or photo-CVD using monosilane or disilane gas. Thermal CVD generally has been used for depositing poly-silicon films (*J. Vac. Sci. Technology*, Vol. 14, p 1082 (1977)). Plasma CVD has been used for depositing amorphous silicon (*Solid State Com.*, Vol. 17, p 1193 (1975)).

Silicon films formed by CVD have experienced manufacturing complications. For example, the yield is low due because the manufacturing apparatus becomes contaminated and side products are formed. Moreover, a silicon film having a uniform thickness cannot be deposited on a substrate having a rough surface, since a gaseous starting material is used. The substrate also must be heated, and productivity is low because of unacceptably slow film deposition rates. Finally, complicated and expensive microwave generators and evacuation apparatuses are necessary for plasma CVD deposition.

Inkjet printed organic materials are known. Sirringhaus et al., for example, fabricated all-polymer thin film transistors using a combination of inkjet printing and spin-coating. Sirringhaus, H., Kawase, T., Friend, R. H., Shimoda, T., Inbasekaran, M., Wu, W., Woo, E. P., "High-resolution inkjet printing of all-polymer transistor circuits," Science, 290, 2123-2126 (2000). A mobility of 0.02 $cm^2/V \cdot sec$ was achieved by spin-coating a semiconducting polymer channel layer. Researchers at IBM developed a one-step synthetic process for making a soluble pentacene precursor. Afzali A., Dimitrakopoulos, C. D., Breen, T. L., "High-performance, solution-processed organic thin film transistors from a novel pentacene precursor," *JACS Comm.* 124, 8812-8813 (2002). The first inkjet-printed pentacene transistor was fabricated in 2003 with a mobility of 0.02 $cm^2/V \cdot sec$ and a current on-to-off ratio of $10^5$. Volkman S. K., Molesa, S., Mattis, B. Chang, P. C., Subramanian, V., "Inkjetted organic transistors using a novel pentacene precursor," *Mat. Res. Soc. Symp. Proc.* 769, H11.7.1/L12.7.1-H11.7.6/L12.7.6 (2003). Arias et al. reported an inkjet-printed TFT using a polythiophene semiconductor channel having a field effect mobility of 0.1 $cm^2/V \cdot s$, and a current on-to-off ratio of $10^7$. Arias, A. C. et al., "Polymer transistor display backplanes: high performance inkjet printed devices," *Abstract of papers, 229th ACS National Meeting*, San Diego, Calif., United States (2005). Recently, Kawasaki et al. reported an organic TFT that was made using an inkjet-printed pentacene channel layer having a mobility of 0.15 $cm^2/V \cdot s$ (the highest value for all reported inkjet printed TFTs) and a current on-to-off ratio of $10^5$. Kawasaki, M. et al., "Printable organic TFT technologies for FPD applications," *Proceedings of SPIE—The International Society for Optical Engineering* 5940 (Organic Field-Effect Transistors IV) (2005).

Solution-based printing methods offer one approach to address this issue. To date, very few inorganic materials have been printed onto substrates to make electronic devices. Most published reports concern printing metal nanoparticle solutions for metallization. For example, copper nanoparticle solutions were inkjet printed for source/drain metallization of silicon-based transistors. Hong, C. M., Wagner S., "Inkjet printed copper source/drain metallization for amorphous silicon thin-film transistors," *IEEE Electron Device Lett.* 21(8), 384-386 (2000). Silver and gold nanoparticle solutions have been used for inkjet printing active microelectromechanical systems (MEMS). Fuller, S. B., Wilhelm, E. J., Jacobson, J. M., "Ink-jet printed nanoparticle microelectromechanical systems," *Journal of microelectromechanical systems* 11(1), 54-60 (2002). Ridley et al. fabricated a thin film transistor having a mobility of 1 $cm^2/V \cdot s$ and a current on-to-off ratio of $3.1 \times 10^4$ by casting CdSe thin films from a precursor solution of cadmium selenide nanocrystals using a micro-pipette. Ridley, B. A., Nivi, B., Jacobson, J. M., "All-inorganic field effect transistors fabricated by printing," *Science* 286(5440), 746-749 (1999).

Transparent conducting oxides (TCOs), like zinc oxide, tin oxide, and indium tin oxide, are important for a plethora of optical and electrical applications. For example, such materials are useful for making flat-panel displays, organic light-emitting diodes, electromagnetic shielding, and electrochromatic windows. See, for example, MRS Bulletin, *Transparent Conducting Oxides,* 25(8), 22-65 (2000); and Chopra, K. L., Major, S., Pandya, D. K., "Transparent conductors-a status review," *Thin Solid Films* 102, 1-46 (1983). More recently, conductive oxide materials have been used as channel materials for thin film transistors. See, for example, Nomura, K., Ohta H., Takagi A., Kamiya T., Hirano M., Hosono H., "Room-temperature fabrication of transparent flexible thin-film transistors using amorphous oxide semiconductors," *Nature* 432, 488-492 (2004); and Nomura, K., Ohta H., Ueda K., Kamiya T., Hirano M., Hosono H., "Thin-film transistor fabricated in single-crystalline transparent oxide semiconductor," *Science* 300(5623), 1269-1272 (2003).

Methods for solution processing materials for electronic device applications also have been patented. For example, Ostergard, U.S. Pat. No. 6,946,677, entitled "Pre-Patterned Substrate for Organic Thin Film Transistor Structures and Circuits and Related Method for Making Same," concerns forming a desired circuit configuration in the surface of a substrate, thereby pre-patterning the area to receive material useful for forming an organic thin film transistor (OTFT) structure and interconnecting conductive paths. According to the '677 patent, the "OTFT material is deposited in the pre-patterned area using printing techniques such as inkjet printing."

Weng et al., U.S. Pat. No. 6,927,108, also concerns solution processing thin-film materials for forming transistors. The '108 patent discloses forming "conductive solution-processed thin film material contacts, semiconductor solution-processed thin film material active regions, and dielectric solution-processed thin film material isolations in a sequence and organization to form a solution-processed thin film structure capable of transistor operation." Additional structure is formed by laser ablation "in one or more of the conductive solution-processed thin film material contacts, the semiconductor solution-processed thin film material active regions and the dielectric solution-processed thin film material isolations to pattern or complete patterning of a material being selectively ablated." The method may involve "depositing drain and source conductive solution-processed thin film material and depositing gate conductive material solution-processed'thin film material" by inkjet printing conductive solution-processed thin film material. The '108 patent states that:

categories of solution-processed thin films include organic thin films and polymer thin film categories. The majority of the solution-processed materials that can be formed into thin films are the conductive polymers, semiconductive polymers and dielectric polymers. However, a solution-processed material may also be a precursor of small organic molecular material that is soluble in a solvent. One example is the pentacene precursor that is soluble in chloroform. It can be spin-coated to form a thin film and then heated to reduce to pentacene at temperatures of ≈200° C. Pentacene is an organic semiconductor but is not a polymer.

The '108 patent also states that "there may be inorganics that may be solution-processed to form thin films." However, no species of inorganic material appears to be identified by the '108 patent, nor is any detail provided by the '108 patent that would enable a person of ordinary skill in the art to solution-process an inorganic material to form electronic devices.

SUMMARY

Embodiments of the present invention address deficiencies of known processes. Solution-based deposition processes provide several advantages, such as low manufacturing costs, and large area depositions. Furthermore, direct writing provides high efficiency, and precludes having to use multiple lithography steps and/or processes. Solution-processing refers generally to forming a solution of materials for subsequent deposition by a solution technique, e.g., inkjet printing or spin coating, typically resulting in the formation of a thin film.

A first disclosed embodiment of a method for solution deposition of inorganic compounds involves providing a first solution comprising at least a first inorganic compound, and depositing the solution on a substrate. The inorganic compound often comprises a metal, such as a Group Ia, IIa, IIIa, IVa, Va, Ib, IIb, IIIb, IVb, Vb, VIIb, VIIb, or VIIIb metal, or mixtures thereof, with specific examples of metals including antimony (Sb), bismuth (Bi), cadmium (Cd), calcium (Ca), magnesium (Mg), barium (Ba), strontium (Sr), copper (Cu), gallium (Ga), gold (Au), titanium (Ti), zirconium (Zr), hafnium (Hf), indium (In), aluminum (Al), iron (Fe), ruthenium (Ru), lead (Pb), manganese (Mn), rhenium (Re), chromium (Cr), molybdenum (Mo), tungsten (W), nickel (Ni), silicon (Si), silver (Ag), thallium (Tl), germanium (Ge), tin (Sn), vanadium (V), niobium (Nb), tantalum (Ta), scandium (Sc), lanthanum (La), yttrium (Y), zinc (Zn), cobalt (Co), rhodium (Rh), lithium (Li), sodium (Na), potassium (K), rubidium (Rb), cesium (Cs), boron (B), mercury (Hg), palladium (Pd), platinum (Pt), iridium (Ir), osmium (Os), technetium (Tc), cerium (Ce), beryllium (Be), europium (Eu), terbium (Tb), gadolinium (Gd), holmium (Ho), erbium (Er), thulium (Tm), and lutetium (Lu).

Several working embodiments have used metal halides, metal carbonyls, and/or metal carbonyl halides as the inorganic compound. Examples of such compounds include, without limitation, $SbCl_3$, $SbBr_3$, $SbI_3$, $SbF_3$, $SbCl_5$, $SbBr_5$, $SbI_5$, $SbF_5$, $BiCl_3$, $BiBr_3$, $BiI_3$, $BiF_3$, $CdCl_2$, $CdBr_2$, $CdI_2$, $CdF_2$, $CaF_2$, $CaBr_2$, $CaCl_2$, $CaI_2$, $MgCl_2$, $MgBr_2$, $MgI_2$, $MgF_2$, $BaCl_2$, $BaBr_2$, $BaI_2$, $BaF_2$, $BeF_2$, $BeCl_2$, $BeBr_2$, $BeI_2$, strontium (Sr), CuCl, CuBr, CuI, CuF, $CuCl_2$, $CuBr_2$, $CuI_2$, $CuF_2$, GaCl, GaI, GaBr, GaF, $GaCl_3$, $GaBr_3$, $GaI_3$, $GaF_3$, AuCl, $AuCl_3$, $Au4Cl_8$, AuBr, $AuBr_3$, AuI, $AuI_3$, $AuF_3$, $AuF_5$, $TiCl_2$, $TiBr_2$, $TiI_2$, $TiF_2$, $TiCl_3$, $TiBr_3$, $TiI_3$, $TiF_3$, $TiCl_4$, $TiBr_4$, $TiF_4$, $ZrC_2$, $ZrBr_2$, $ZrI_2$, $ZrF_2$, $ZrCl_3$, $ZrBr_3$, $ZrI_3$, $ZrF_3$, $ZrCl_4$, $ZrBr_4$, $ZrI_4$, $ZrF_4$, $HfCl_4$, $HfBr_4$, $HfI_4$, $HfF_4$, InCl, InBr, InI, InF, $InCl_2$, $InBr_2$, $InI_2$, $InF_2$, $InCl_3$, $InCBr_3$, $InI_3$, $InF_3$, $AlCl_3$, $AlBr_3$, $AlI_3$, $AlF_3$, $TlCl_4$, TlBr, TlI, $FeI_2$, $FeI_3$, $FeCl_2$, $FeCl_3$, $FeBr_2$, $FeBr_3$, $FeF_2$, $FeF_3$, $RuCl_2$, $RuBr_2$, $RuI_2$, $RuF_2$, $RuCl_3$, $RuBr_3$, $RuI_3$, $RuF_3$, PbCl, PbBr, PbI, PbF, $MnCl_2$, $MnBr_2$, $MnF_2$, $MnI_2$, $ReCl_2$, $ReBr_2$, $ReI_2$, $ReF_2$, $ReCl_4$, $ReBr_4$, $ReI_4$, $ReI_4$, $CrCl_3$, $CrBr_3$, $CrI_3$, $CrF_3$, $MoCl_4$, $MoBr_4$, $MoI_4$, $MoCl_2$, $MoBr_2$, $MoI_2$, $MoF_2$, $MoCl_3$, $MoBr_3$, $MoI_3$, $MoF_3$, $MoCl_4$, $MoBr_4$, $MoI_4$, $MoF_4$, $MoCl_5$, $MoCl_6$, $WCl_6$, $WBr_6$, $WI_6$, $WF_6$, AgI, AgBr, AgCl, TlCl, TlBr, TlI, TlF, $SiCl_2$, $SiCl_4$, $SiBr_2$, $SiBr_4$, $SiI_2$, $SiI_4$, $SiF_2$, $SiF_4$, $GeCl_2$, $GeCl_4$, $GeBr_2$, $GeBr_4$, $GeI_2$, $GeI_4$, $GeF_2$, $GeF_4$, $SnCl_2$, $SnCl_4$, $SnBr_2$, $SnBr_4$, $SnI_2$, $SnI_4$, $SnF_2$, $SnF_4$, $VCl_2$, $VBr_2$, $VI_2$, $VF_2$, $VCl_3$, $VBr_3$, $VI_3$, $VF_3$, $VCl_4$, $VBr_4$, $VI_4$, $VF_4$, $NbCl_3$, $NbBr_3$, $NbI_3$, $NbF_3$, $NbCl_5$, $NbBr_5$, $NbI_5$, $NbF_5$, $TaCl_3$, $TaBr_3$, $TaI_3$, $TaF_3$, $TaCl_4$, $TaBr_4$, $TaI_4$, $TaF_4$, $TaCl_5$, $TaBr_5$, $TaI_5$, $TaF_5$, $ScCl_3$, $ScBr_3$, $ScI_3$, $ScF_3$, $LaCl_3$, $LaBr_4$, $LaI_3$, $LaF_3$, $YCl_3$, $YBr_3$, $YI_3$, $YF_3$, $ZnCl_2$, $ZnBr_2$, $ZnI_2$, $ZnF_2$, $NiCl_3$, $NiBr_3$, $NiI_3$, $NiF_3$, $CoCl_2$, $CoBr_2$, $CoI_2$, $CoF_2$, $CoCl_3$, $CoBr_3$, $CoI_3$, $CoF_3$, $RhCl_3$ $RhBr_3$, $RhI_3$, $RhF_3$, LiCl, LiBr, L10, LiF, NaCl, NaBr, NaI, NaF, KCl, KBr, KI, KF, RbCl, RbBr, RbI, RbF, CsCl, CsBr, Csl, CsF, $BCl_3$, $BBr_3$, BI3, $BF_3$, $HgCl_2$, $HgBr_2$, $HgI_3$, $HgF_3$, $PdCl_2$, $PdBr_2$, $PdI_2$, $PdF_2$, $PdF_4$, $PtCl_3$, $PtCl_4$, $PtBr_3$, $PtBr_2$, $PtBr_4$, $PtI_2$, $PtI_3$, $PtI_4$, $PtF_4$, $PtF_6$, $IrCl_2$, $IrBr_2$, $IrI_2$, $IrF_2$, $IrCl_3$, $IrBr_3$, $IrI_3$, $IrF_3$, $IrCl_4$, $IrBr_4$, $IrI_4$, $IrF_4$, $OsCl_3$, $OsCl_4$, $OsCl_5$, $OsBr_3$, $OsBr_4$, OsI, $OsI_2$, $OsI_3$, $OsF_4$, $OsF_5$, $OsF_6$, $OsF_7$, $OsF_8$, $TcF_5$, $TcF_6$, $TcCl_4$, $TcCl_6$, $TcBr_4$, $Tc_2(CO)_{10}$, $Tc_3(CO)_{12}$, $CeCl_2$, $CeBr_2$, $CeI_2$, $CeF_2$, $CeCl_3$, $CeBr_3$, $CeI_3$, $CeF_3$, $EuCl_2$, $EuBr_2$, $EuI_2$, $EuF_2$, $EuCl_3$, $EuBr_3$, $EuI_3$, $EuF_3$, $TbF_2$, $TbF_3$, $TbF_4$, $TbCl_3$, $TbBr_3$, $TbI_3$, $GdCl_2$, $GdCl_3$, $GdBr_2$, $GdI_2$, $GdF_2$, $HoCl_3$, $HoBr_3$, $HoI_3$, $HoF_3$, $ErCl_3$, $ErBr_3$, $ErI_3$, $ErF_3$, $SrCl_2$, $SrBr_2$, $SrI_2$, $TcF_5$, $TcF_6$, $TcCl_4$, $TcCl_6$, $TcBr_4$, $Tc_2(CO)_{10}$, $Tc_3(CO)_{12}$, $ThCl_4$, $ThBr_4$, $ThI_2$, $ThI_3$, $ThI_4$, $ThF_4$, $TmCl_2$, $TmBr_2$, $TmI_2$, $TmF_2$, $TmCl_3$, $TmBr_3$, $TmI_3$, $TmF_3$, $LuCl_3$, $LuB_{r3}$, $LuI_3$, $LuF_3$, $CuAgI_2$, $CuCdI_2$, $CuBiI_4$, $CuPbI_3$, $CuSnI_5$, SbSI, Sc(CO), $Ti(CO)_4$, $Ti(CO)_6$, $V(CO)_6$, $Cr(CO)_6$, $Mn_2(CO)_{12}$, $Fe(CO)_5$, $Fe_2(CO)_9$, $CO_2(CO)_8$, $CO_4(CO)_{12}$, $CO_6(CO)_{16}$, $Rh_2(CO)_8$, $Rh_4(CO)_{12}$, $Rh_6(CO)_{16}$, $Ni(CO)_4$, $Y(CO)_3$, $Zr(CO)_7$, $Nb(CO)_6$, $Mo(CO)_6$, Tc(CO), $Ru(CO)_5$, $Ru_2(CO)_{10}$, $Ru_3(CO)_{12}$, Rh(CO), $Pd(CO)_4$, Ag(CO), $Hf(CO)_7$, $Ta(CO)_6$, $W(CO)_6$, $Re_2(CO)_{10}$, $Os_3(CO)_{12}$, $Ir_4(CO)_{12}$, $Pt(CO)_4$, Au(CO), $Mn(CO)_5Cl$, $Re(CO)_4Cl_2$, $Ru(CO)_2I_2$, $Os(CO)_3Cl_2$, $Ir(CO)_2Cl_2$, $Pt(CO)Cl_2$, and $Pt(CO)_2Cl_2$. However, a person of ordinary skill in the art will appreciate that other compounds also can be used to practice the invention including, by way of example and without limitation, acetates, sulfates, phosphates, carbonates, carbonyls, and mixtures thereof. For metal halides, the inorganic compound may have a formula $M_aX_b$ where M is a metal, X is a halide, a is 1, 2 or 3, and b provides halide anions sufficient to equal a positive charge on the metal. Particularly useful halides include chloride and iodide. For other compounds, the inorganic compound may have a formula $M_aY_b$ where M is a metal, Y is an anionic species, a is sufficient to provide metal atoms equal to the sum of the charge associated with any one or more Y groups, and b is sufficient to provide anionic groups equal to the sum of the positive charge associated with one or more metal atoms.

The inorganic compound also may be a binary compound, a ternary compound, or other higher-order compound. Examples of suitable binary inorganic compounds may have a formula $M_a^1M_b^2Y_c$ where a+b is sufficient to provide metal atoms equal to a negative charge associated with any one or more Y groups, and c is sufficient to provide anionic groups equal to a positive charge associated with the metal atoms. Examples of suitable ternary inorganic compounds have a formula $M_a^1M_b^2M_c^3Y_d$ where a+b+c is sufficient to provide metal atoms equal to a negative charge associated with any one or more Y groups, and d is sufficient to provide anionic groups equal to a positive charge associated with the metal atoms. Examples of higher order compounds include copper-cadmium, copper-silver, zinc-indium, zinc-tin, indium-tin, and manganese-silicon-zirconium oxide ($ZrSiO_4$:Mn).

The solvent used to form the solution, or solutions, used to practice the method can be any solvent suitably capable of dissolving required compounds. Additional factors to consider when selecting a solvent include: compatibility with other materials or facets of the process, such as substantially inert to substrate materials; volatility, as the more volatile the solvent, the easier it is to remove the solvent post deposition, such as by evaporation; availability; cost; and toxicity. Examples of suitable solvents include, but are not limited to, protic and aprotic aliphatic organic solvents, protic and aprotic heteroaliphatic solvents, protic and aprotic aryl solvents, protic and aprotic heteroaryl solvents, and combinations thereof. Specific examples of solvents include nitriles or alcohols, such as lower (i.e. 10 carbon atoms or fewer) alcohols or nitriles.

The method also includes removing, such as by evaporating, the solvent. Solvent can be allowed to evaporate under ambient conditions; alternatively, steps can be used to facilitate evaporation, such as by heating or impinging the solvent with a flowing fluid like an inert gas, such as nitrogen or argon.

Disclosed embodiments of the present invention deposit at least a first material onto a substrate. Solution may be deposited using any suitable process, such as inkjet printing, spin coating, gravure coating, micro-pen coating, nano-fountain pen coating, dip-pen coating, screen printing, spray coating, slide coating, slot coating, curtain coating, dip coating, and combinations thereof. Spin coating and inkjet printing are two currently preferred solution deposition processes.

The method may further comprise post deposition processing the deposited material. Examples of post deposition processing include thermal annealing, oxidation processes, reduction processes, exchange reactions, disproportionation reaction, and combinations thereof.

For example, deposited metal halides may be post deposition processed to oxidize the metal halide to form a metal oxide. Post deposition processing to convert the first compound to a metal oxide can be accomplished by treatment with water, oxygen, a chemical oxidizing agent, or combinations thereof. Examples of metal oxides include, without limitation, $ZnO$—$In_2O_3$ (ZIO), ZnO, $In_2O_3$, $SnO_2$, $In_2O_3$—$SnO_2$ (ITO), $ZnO$—$SnO2$ (ZTO), and $In_2O_3$—$ZnO$—$SnO_2$ (IZTO), $Ga_2O_3$, $ZnO$—$Ga_2O_3$ (ZGO), $Al_2O_3$, $B_2O_3$, $GeO_2$, PbO, $In_2O_3$—$GeO_2$, $SnO_2$—$GeO_2$, $SiO_2$, CdO, CdO—$SnO_2$, CuO, CuO—$Al_2O_3$, MgO, MgO—$In_2O_3$, CaO, CaO—$Al_2O_3$, SrO, $SrO_2$, $TcO_2$, $Tc_2O_7$, BeO, $TbO_2$, $Tb_2O_3$, BaO, AgO, $Ag_2O$, ScO, CuO—ScO, SrO, CoO, $Fe_2O_3$, $Fe_3O_4$, ZnO—$Fe_3O_4$, $Cr_2O_3$, ZnO—$Cr_2O_3$, NiO, $RuO_2$, $ReO_2$, $ReO_3$, RhO, $MoO_2$, MnO, WO, $V_2O_3$, $Nb_2O_3$, $Ta_2O_5$, $TiO_2$, BaO—$TiO_2$, $ZrO_2$, $ZrO_2$—$SiO_2$, $HfO_2$, $HfO_2$—$SiO_2$, $Y_2O_3$, $La_2O_3$, PbO, TiO, $Sb_2O_3$, $Sb_2O_3$—$SnO_2$, $Sb_2O_5$, $Bi_2O_3$, and any and all combinations thereof.

Specific examples of post deposition processing include air annealing. Working embodiments have air annealed at 600° C. for one hour.

Post deposition processing also can be used to convert the first compound to a second compound other than a metal oxide, such as a metal (typically in an oxidation state other than as deposited), silicon, sulfides, selenides, tellurides, nitrides, carbides, phosphides, borides, or combinations thereof. Examples of metals that can be produced by post deposition processing include antimony (Sb), bismuth (Bi), cadmium (Cd), calcium (Ca), magnesium (Mg), barium (Ba), strontium (Sr), copper (Cu), gallium (Ga), gold (Au), titanium (Ti), zirconium (Zr), hafnium (HO, indium (In), aluminum (Al), iron (Fe), ruthenium (Ru), lead (Pb), manganese (Mn), rhenium (Re), chromium (Cr), molybdenum (Mo), tungsten (W), nickel (Ni), silicon (Si), silver (Ag), thallium (Tl), silicon (Si), germanium (Ge), tin (Sn), vanadium (V), niobium (Nb), tantalum (Ta), scandium (Sc), lanthanum (La), yttrium (Y), zinc (Zn), cobalt (Co), rhodium (Rh), lithium (Li), sodium (Na), potassium (K), rubidium (Rb), cesium (Cs), boron (B), mercury (Hg), palladium (Pd), platinum (Pt), iridium (Ir), osmium (Os), technetium (Tc), cerium (Ce), beryllium (Be), europium (Eu), terbium (tb), gadolinium (Gd), holmium (Ho), erbium (Er), thulium (Tm), and lutetium (Lu). Post deposition processing can convert the first compound to: a sulfide by treatment with a suitable sulfiding agent, such as $H_2S$, S, $S_n$, where n is from about 2 to about 12, $CS_4$, thiourea, thioacetamide, dimethylthiourea and combinations thereof; a selenide by treatment with a suitable selenizing agent, such as $H_2Se$, Se, $Se_n$, where n is from about 2 to about 8, selenourea, dimethylselenourea, selenosemicarbazide, and combinations thereof; a telluride by treatment with a suitable tellurizing agent, such as $H_2Te$, Te, and lower (typically 10 carbon atoms or fewer) aliphatic agents, typically alkyl agents, such as $(C_2H_5)_2Te$, and combinations thereof; a nitride by treatment with a suitable nitriding agent, such as $NH_3$, $N_2H_4$, N, $N_2$, and combinations thereof; a carbide by treatment with a suitable carbiding agent, such as carbon compounds having 10 or fewer carbon atoms, such as $CH_4$, $C_2H_6$, $C_2H_4$, $CCl_4$, $C_3H_8$, $C_6H_6$, $CH_3Cl$ or combinations thereof; a phosphide by treatment with a suitable phosphiding agent, such as $PH_3$; and/or a boride by treatment with a suitable boriding agent, such as $BCl_3$, $B_2H_6$, or combinations thereof.

A person of ordinary skill in the art will appreciate that the method can involve depositing only one solution, or can involve depositing plural solutions. Furthermore, the method may involve simultaneous deposition of two or more solutions, referred to as co-deposition, or can involve serial deposition of plural solutions to provide desired compositions in desired arrangements on the substrate. The same solution also can be deposited several times. This can be done, for example, to increase the thickness of the deposited materials. Thus, the method involves depositing a solution on a substrate to produce a first layer, and then solution depositing at least a second layer on the first layer.

For certain applications the thickness of a deposited layer can be an important consideration. The thickness of the deposited layer may vary, but typically is from greater than 0 nanometers to at least 300 nanometers, more typically from about 5 to about 250 nanometers, and even more typically from about 10 nanometers to about 200 nanometers. A desired thickness can be achieved either empirically simply by depositing material until the desired layer thickness is achieved. Desired thicknesses also can be provided by first over depositing material, and then removing material, such as by laser ablation, to provide a desired layer thickness. Alternatively, process steps can be implemented to allow more precise control over deposited layer thicknesses. For example, a concentration versus a deposited layer thickness curve can be obtained or generated. Disclosed embodiments of the method then involve providing a first solution with a concentration of the inorganic compound selected to provide a desired layer thickness, and depositing the solution to provide the desired layer thickness.

A particular embodiment of the method for solution deposition of inorganic compounds involves providing a first solution comprising at least a first inorganic compound comprising a Group Ia, IIa, IIIa, IVa, Va, Ib, IIb, IIIb, IVb, Vb, VIIb, VIIb, or VIIIb metal, or mixtures thereof. The first solution is then deposited on a substrate using a process selected from inkjet printing, spin coating, gravure, micro-pen, nano-fountain pen, dip-pen, screen printing, spray coating, slide coating, slot coating, curtain coating, dip coating, and combinations thereof. The solvent is then evaporated, or allowed to evaporate, to provide a layer comprising the inorganic compound, the layer having a thickness of from greater than 0 nanometers to at least 300 nanometers.

Another particular embodiment of the method for solution deposition of inorganic compounds involves providing a first solution comprising an inorganic compound comprising a Group Ia, IIa, IIIa, IVa, Va, Ib, IIb, IIIb, IVb, Vb, VIIb, VIIb, or VIIIb metal, or mixtures thereof. A second solution is provided comprising an inorganic compound comprising a Group Ia, IIa, IIIc, IVa, Va, Ib, IIb, IIIb, IVb, Vb, VIIb, VIIb, or VIIIb metal, or mixtures thereof. The first and second solutions are deposited on a substrate using a process selected from inkjet printing, spin coating, gravure coating, micro-pen coating, nano-fountain pen coating, dip-pen coating, screen printing, spray coating, slide coating, slot coating, curtain coating, dip coating, and combinations thereof. The solvent is then allowed to evaporate, or is evaporated by an affirmative process such as heating or using an impinging fluid flow, such as a flowing inert gas, to provide a layer comprising the inorganic compound or compounds, the layer having a thickness of from greater than 0 nanometers to at least 300 nanometers. The first and second solutions can be deposited serially, or may be co-deposited on the substrate. The method may involve depositing the first solution on a substrate to produce a first layer. The second solution is then used to deposit a second layer.

Still another particular embodiment of the disclosed method comprises obtaining a concentration versus a deposited layer thickness curve, and providing a first solution with a concentration of an inorganic compound selected to provide a desired layer thickness. The solution is then deposited to provide a desired layer thickness.

Still another particular embodiment of the disclosed method for solution deposition of an inorganic compound involves providing a first solution comprising at least a first inorganic compound comprising a Group Ia, IIa, IIIa, IVa, Va, Ib, IIb, IIIb, IVb, Vb, VIb, VIIb, or VIIIb metal, or mixtures thereof. A second solution optionally is provided, the second solution comprising at least a first inorganic Compound comprising a Group Ia, IIa, IIIa, IVa, Va, Ib, IIb, IIIb, IVb, Vb, VIb, VIIb, or VIIIb metal, or mixtures thereof. The first, and optionally the second, solution are solution deposited on a substrate using a process selected from inkjet printing, spin coating, gravure coating, micro-pen coating, nano-fountain pen coating, dip-pen coating, screen printing, spray coating, slide coating, slot coating, curtain coating, dip coating, and combinations thereof. This embodiment optionally may comprise obtaining a concentration versus a deposited layer thickness curve, and providing a first solution with a concentration of an inorganic compound selected to provide a desired layer thickness. The solution, or solutions, is then deposited to provide a desired layer thickness. The solvent is then evaporated, or allowed to evaporate, to provide a layer comprising the inorganic compound, the layer having a thickness of from greater than 0 nanometers to at least 300 nanometers. Deposited materials are then post deposition processed using a process selected from thermal annealing, oxidation, reduction, exchange reactions, and combinations thereof.

A method for making an electronic device or a component of an electronic device also is disclosed. The method comprises solution depositing at least one, and typically plural, solutions as disclosed herein. An electronic device is then formed comprising the inorganic compound or compounds. Examples of classes of electronic devices that can be made using the present invention include a conductor, a semiconductor, an insulator, a photoluminescent device, and combinations thereof. Particular examples of electronic devices, or components of electronic devices, that can be made using the present invention include transistors, circuits, capacitors, photovoltaics, photodetectors, such as a UV detector, gas sensors, batteries, X-ray imagers, light emitting diodes, solid electrolytes, computer readable media, and combinations thereof.

Solution-processed thin film transistors could fundamentally change the semiconductor industry. Solution processed thin film transistors also might be fabricated by simple techniques, e.g., direct printing of circuits. A thin film transistor typically includes semiconductor films, insulation films and conductive films. The insulation film includes gate insulation films and interlayer insulation films, and the conductive film is used for gate electrodes, source/drain electrodes, pixel electrodes and wiring lines.

One particular disclosed method for making a transistor comprises providing a substrate material, and forming a p+silicon gate layer. A silicon dioxide ($SiO_2$) layer is provided on the gate layer. A metal oxide or metal oxide precursor material is then solution deposited, followed by formation of source and drain contacts.

Inkjet printing is one method for depositing inorganic compounds on substrates. Inkjet printing can be used to deposit such materials in desired patterns. As a result, the present invention also concerns an inkjet printer modified for deposition of inorganic thin films, as well as inkjet printer cartridges comprising inorganic fluids useful for inkjet printing electronic components according to disclosed embodiments.

Additional disclosed embodiments provide a solution-based process for producing industrially useful materials, particularly chalcogen materials useful for solar cell applications. One disclosed embodiment of the present method comprises providing at least a first reactant and a second reactant in solution. The first reactant and the second reactant are applied to a substrate. The solvent is allowed to evaporate or is heated or placed under a vacuum to assist solvent evaporation. The remaining material deposited on the substrate is then thermally annealed to form desired compounds, such as a semiconductor, particularly a semiconductor absorber layer for a photovoltaic, and even more particularly a semiconductor. Thermal annealing may be conducted under vacuum, or at least a partial vacuum, or under an inert atmosphere, to form a semiconductor. This process avoids having to expose the deposited material to an annealing gas, as is taught by the '759 patent application. However, a person of ordinary skill in the art will appreciate that the method of the present invention can further comprise exposing the deposited material or the semiconductor to an annealing gas to aid formation of the desired material, or to form a different desired material.

Certain disclosed embodiments concern depositing the first and second reactants onto the substrate as separate solutions. Alternatively, a single solution comprising the first and second reactants may be deposited onto the substrate. For example, the method may involve flowing a first reactant, such as a metal precursor compound, and a second reactant, such as a chalcogen precursor compound, to a mixer to form a solution for deposition onto a substrate. One example of a metal precursor compound is a metal halide. The method also can involve applying the solution to the substrate using a microchannel applicator.

The second reactant may comprise a chalcogen precursor compound. Examples, without limitation, of suitable chalcogen precursor compounds include a chalcogen powder, a chalcogen halide, a chalcogen oxide, a chalcogen urea, a chalcogen or dichalcogen comprising organic ligands, or combinations thereof.

Exemplary chalcogen ureas typically have a formula

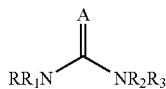

where A is a chalcogen, and R—$R_3$ are independently aliphatic, substituted aliphatic, arylalkyl, cyclic, substituted cyclic, heterocyclic, substituted heterocyclic, aryl, substituted aryl, heteroaryl, substituted heteroaryl, or hydrogen. More typically R—$R_3$ are independently hydrogen, phenyl or lower alkyl, such as methyl, ethyl, propyl, butyl, etc. Particular chalcogen urea precursor compounds include

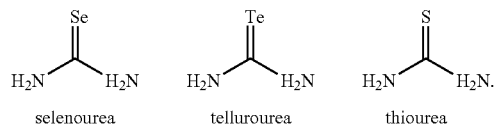

Exemplary chalcogen precursor compounds also include chalcogens or dichalcogens comprising organic ligands. For instance, the chalcogen precursor compound may have a formula R-Chalcogen-$R_1$ R-Chalcogen$_1$-Chalcogen$_2$-$R_1$ or R—(O,S,Se and/or Te)—$R_1$ where Chalcogen$_1$ and Chalcogen$_2$ and R and $R_1$ are the same or different and are independently selected from aliphatic, substituted aliphatic, arylalkyl, cyclic, substituted cyclic, heterocyclic, substituted heterocyclic, aryl, substituted aryl, heteroaryl, substituted heteroaryl, or hydrogen. More typically R—$R_1$ are independently hydrogen, phenyl or lower alkyl, such as methyl, ethyl, propyl, butyl, etc. Thus, such compounds may also satisfy the formulae

R—S—S—$R_1$

R—Se—Se—$R_1$ or

R—Te—Te—$R_1$ where R and $R_1$ are as stated above. Specific examples of such compounds include, by way of example and without limitation, dimethyl sulfide, dimethyl disulfide, diethyl sulfide, diethyl disulfide, diphenyl sulfide, diphenyl disulfide, dimethyl selenide, dimethyl diselenide, diethyl selenide, diethyl diselenide, diphenyl selenide, diphenyl diselenide, diphenylselenium dichloride, dimethyl telluride, dimethyl ditelluride, diethyl telluride, diethyl ditelluride, diphenyl telluride, diphenyl ditelluride, diphenyltellerium dichloride, phenol, thiophenol, phenylseleno (e.g., phenylselenylchloride, methyl phenyl selenide, etc.) and the tellurium analog, or combinations thereof.

Certain disclosed embodiments concern a method for making a photovoltaic, such as a solar cell. For these embodiments, the method comprises depositing a metal precursor solution onto a substrate, and forming a first metal contact layer from the precursor. Exemplary substrates include materials comprising glass, a metal, a metal alloy, a polymer, or combinations thereof. For working embodiments, the metal precursor solution was a solution of a metal hexacarbonyl compound, such as molybdenum hexacarbonyl. As used herein, depositing can include any suitable process, but typically comprises a printing process, such as inkjet printing, spin coating, gravure, micro-pen, nano-fountain pen, dip-pen, screen printing, spray coating, slide coating, slot coating, curtain coating, dip coating or combinations thereof.

A semiconductor absorber precursor solution is deposited on the metal layer, where the semiconductor absorber precursor solution comprises a first precursor reactant and at least a second precursor reactant in appropriate stoichiometric ratios for forming a semiconductor absorber layer. A semiconductor absorber layer, particularly a semiconductor, such as a CIS, CIGS, CIGSS or CGS semiconductor, is then formed from the solution-deposited precursors, typically by thermally annealing the precursor compound in a vacuum or under an inert atmosphere. A buffer layer is then formed on the semiconductor layer. A transparent conductive metal oxide precursor solution is deposited on the buffer layer, and a metal oxide formed from the precursor, such as by thermally annealing in air. A metal contact layer precursor solution is deposited on the metal oxide layer, and the metal contact layer formed from the precursor, again such as by thermally annealing. The method may optionally include forming an antireflective coating on the metal contact layer. The method may also optionally include encapsulating at least a portion of the photovoltaic in an encapsulant.

A specific embodiment for making a solar cell comprises depositing a molybdenum precursor solution onto a glass substrate and forming a molybdenum metal contact layer. A CIS, CIGS, CIGSS or CGS semiconductor absorber precursor solution is deposited on the molybdenum metal layer. The semiconductor absorber precursor solution comprises at least a first metal precursor reactant and at least a second chalcogen precursor compound comprising a chalcogen powder, a chalcogen halide, a chalcogen oxide, a chalcogen urea, a chalcogen or dichalcogen comprising organic ligands, or combinations thereof. The metal precursor reactant and chalcogen precursor reactant are provided in appropriate stoichiometric ratios for forming a semiconductor absorber layer for the solar cell. This layer is thermally annealed under vacuum or an inert atmosphere to form, for example, a CIS, CIGS, CIGSS or CGS semiconductor absorber layer. A buffer layer, such as a CdS layer, is formed on the semiconductor layer. A transparent conductive metal oxide precursor solution is deposited on the buffer layer. The metal oxide layer, such as a zinc oxide layer, is then formed from the precursor solution. A solution comprising an antireflective coating precursor material is deposited on the metal oxide layer, and the antireflective coating, such as a MgF coating, is formed on the metal oxide layer.

The foregoing and other objects, features, and advantages of the invention will become more apparent from the following detailed description, which proceeds with reference to the accompanying figures.

DETAILED DESCRIPTION

I. Terms and Introduction

Figure 1:
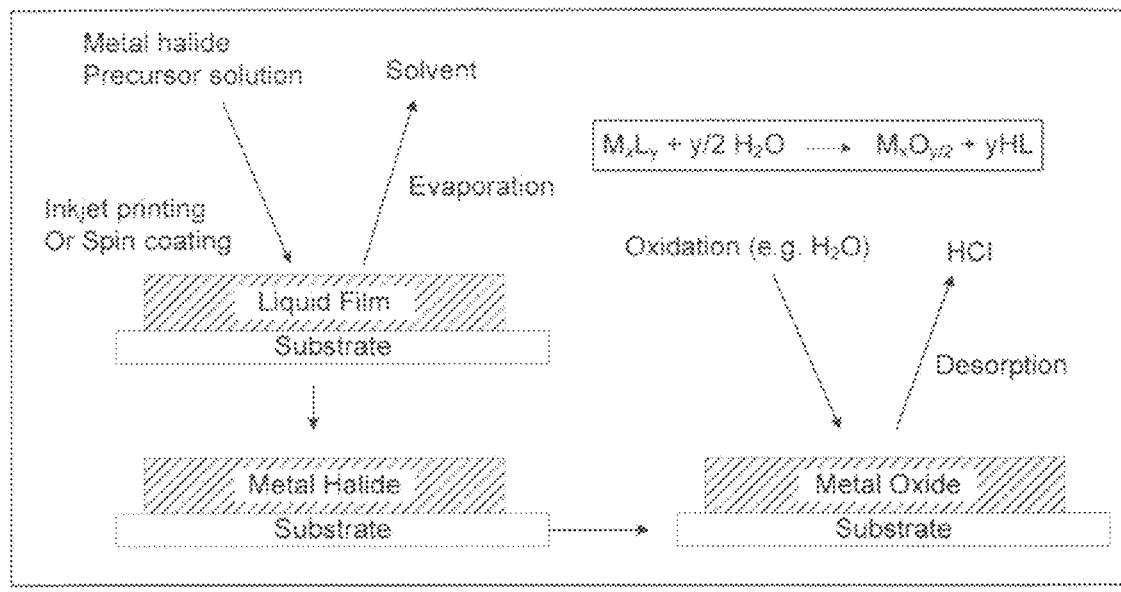
FIG. 1 illustrates one possible mechanism for metal oxide semiconductor thin film formation.

Unless otherwise noted, technical terms are used according to conventional usage. As used herein, the singular terms "a," "an," and "the" include plural referents unless context clearly indicates otherwise. Similarly, the word "or" is intended to include "and" unless the context clearly indicates otherwise. Also, as used herein, the term "comprises" means "includes." Hence "comprising A or B" means including A, B, or A and B. All publications, patent applications, patents, and other references mentioned herein are incorporated by reference in their entirety, unless context indicates otherwise. In case of conflict, the present specification, including explanations of terms, will control. In addition, the materials, methods, and examples are illustrative only and are not intended to limit the scope of the invention to the particular materials, methods and examples disclosed.

In order to facilitate review of this disclosure, the following explanations of specific terms are provided.

Aliphatic: A substantially hydrocarbon-based compound, or a radical thereof (e.g., $C_6H_{13}$, for a hexane radical), including alkanes, alkenes and alkynes, and further including straight- and branched-chain arrangements, and all stereo and position isomers as well.

Aryl: A substantially hydrocarbon-based aromatic compound, or a radical thereof (e.g. $C_6H_5$) as a substituent bonded to another group, particularly other organic groups, having a ring structure as exemplified by benzene, naphthalene, phenanthrene, anthracene, etc.

Arylalkyl: A compound, or a radical thereof (e.g., $C_7H_7$ for toluene) as a substituent bonded to another group, particularly other organic groups, containing both aliphatic and aromatic structures.

CIS, CISS: Refers to semiconductor materials comprising copper, indium, and selenium and/or sulfur. The materials based on $CuInSe_2$ that are of interest for photovoltaic applications include several elements from groups I, III and VI in the periodic table. These semiconductors are especially attractive for thin film solar cell application because of their high optical absorption coefficients and versatile optical and electrical characteristics, which can be tuned for a specific need in a given device.

CIGS: Certain disclosed embodiments of the present invention concern CIGS materials. Refers to semiconductor materials comprising copper, indium, gallium, and selenium or sulfur. These materials are believed to be solid solutions of copper indium selenide ("CIS" materials) and copper gallium selenide, and often are written as $Cu(In,Ga)Se_2$, or as $CuInxGa_{(1-x)}Se_2$, where the value of x can vary from 1 (pure copper indium selenide) to 0 (pure copper gallium selenide). Certain CIGS compounds are tetrahedrally-bonded semiconductors, with the chalcopyrite crystal structure, and a bandgap varying continuously with x from about 1.0 eV (for copper indium selenide) to about 1.7 eV (for copper gallium selenide).

CIGSS: Refers to semiconductor materials comprising copper, indium, gallium and selenium and/or sulfur. Exemplary compounds include those having a formula Cu(In,Ga)(SeS)$_2$.

Chalcogen: Refers to compounds of Group 16 of the periodic table (old-style: VIB or VIA), sometimes referred to as the oxygen family, and includes the elements oxygen (O), sulfur (S), selenium (Se), tellurium (Te), the radioactive element polonium (Po), and the synthetic element ununhexium (Uuh). Sulfur, selenium and tellurium are chalcogens of primary interest for disclosed embodiments of the present invention.

Chalcogenide: Typically refers to compounds of the chalcogens. Oxides often are not considered chalcogenides, but as used herein "chalcogenide" may refer to oxides, unless particular context of this application indicates otherwise.

Cyclic: Designates a substantially hydrocarbon, closed-ring compound, or a radical thereof. Cyclic compounds or substituents also can include one or more sites of unsaturation. "Cyclic" typically does not include aromatic compounds.

Heteroaryl: Refers to an aromatic, closed-ring compound, or radical thereof as a substituent bonded to another group, particularly other organic groups, where at least one atom in the ring structure is other than carbon, and typically is oxygen, sulfur and/or nitrogen.

Heterocyclic: Refers to a closed-ring, non-aromatic compound, or radical thereof as a substituent bonded to another group, particularly other organic groups, where at least one atom in the ring structure is other than carbon, and typically is oxygen, sulfur and/or nitrogen.

Lower: Refers to organic compounds having 10 or fewer carbon atoms in a chain, including all branched and stereochemical variations, particularly including methyl, ethyl, propyl, butyl, pentyl, hexyl, heptyl, octyl, nonyl, and decyl.

Photovoltaic: A photovoltaic material produces a voltage when exposed to radiant energy, particularly light.

Semiconductor: A material having electrical conductivity between those of a conductor and an insulator. Exemplary semiconductors include: Group III-V semiconductors, such as aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP); Group III-V ternary semiconductor alloys, such as aluminum gallium arsenide (AlGaAs, Al$_x$Ga$_{1-x}$As), indium gallium arsenide (InGaAs, In$_x$Ga$_{1-x}$As), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb); Group III-V quaternary semiconductor alloys, such as aluminum gallium indium phosphide (AlGaInP, also InAlGaP, InGaAlP, AlInGaP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN); Group III-V quinary semiconductor alloys, such as gallium indium nitride arsenide antimonide (GaInNAsSb), gallium indium arsenide antimonide phosphide (GaInAsSbP); Group II-VI semiconductors, such as cadmium selenide (CdSe), cadmium sulfide (CdS), cadmium telluride (CdTe), zinc oxide (ZnO), zinc selenide (ZnSe), zinc sulfide (ZnS), zinc telluride (ZnTe); Group II-VI ternary alloy semiconductors, such as cadmium zinc telluride (CdZnTe, CZT), mercury cadmium telluride (HgCdTe), mercury zinc telluride (HgZnTe), mercury zinc selenide (HgZnSe); Group I-VII semiconductors, such as cuprous chloride (CuCl); Group IV-VI semiconductors, such as lead selenide (PbSe), lead sulfide (PbS), lead telluride (PbTe), tin sulfide (SnS), tin telluride (SnTe); IV-VI ternary semiconductors, such as lead tin telluride (PbSnTe), thallium tin telluride (Tl$_2$SnTe$_5$), thallium germanium telluride (Tl$_2$GeTe$_5$); Group V-VI semiconductors, such as bismuth telluride (Bi$_2$Te$_3$); Group II-V semiconductors, such as cadmium phosphide (Cd$_3$P$_2$), cadmium arsenide (Cd$_3$As$_2$), cadmium antimonide (Cd$_3$Sb$_2$), zinc phosphide (Zn$_3$P$_2$), zinc arsenide (Zn$_3$As$_2$), zinc antimonide (Zn$_3$Sb$_2$).

The present invention is useful for making Group semiconductors. I refers to Group IB, the elements Cu, Ag and Au. III refers to Group IIIA elements, B, Al, Ga, In and Ti. VI refers to Group VIA, that is elements O, S, Se, Te and Po. A comma often is used between two elements, for example (Se, S), (In, Ga), where (Se, S), is short hand for (Se$_{i-y}$S$_y$). Group alloys, such as CuInSe$_2$, CuGaSe$_2$, CuInS$_2$, CGS, CIS and CIGS are useful for forming absorber layers in thin film photovoltaic cells or devices. Semiconductor films comprising Group alloys wherein the alloy includes Ga in combination with another Group III element produce semiconductor films with higher band gap values and subsequently, in solar/photovoltaic cell devices, with higher open-circuit voltages and reduced short circuit currents.

Solar cell: A semiconductor device that converts sunlight into electric energy.

Substituted: A fundamental compound, such as an aryl or aliphatic compound, or a radical thereof, having coupled thereto, typically in place of a hydrogen atom, a second substituent. For example, substituted aryl compounds or substituents may have an aliphatic group coupled to the closed ring of the aryl base, such as with toluene. Again solely by way of example and without limitation, a long-chain hydrocarbon may have a substituent bonded thereto, such as an aryl group, a cyclic group, a heteroatom or heteroatom-based functional group, such as hydroxyl groups for alcohols, a heteroaryl group, and/or a heterocyclic group.

Thin: Certain disclosed embodiments of the present invention are useful for forming thin films of materials useful for making devices, such as CIGS solar cells. As used herein, thin refers to films having a thickness of greater than zero up to at least 1 millimeter thick, but more likely refers to a film having a thickness of from about 1 nanometer to about 2 microns.

XRD: XRD (powder X-ray diffraction) is a technique used to characterize the crystallographic structure, crystallite size (grain size), and preferred orientation in polycrystalline or powdered solid samples. Powder diffraction is commonly used to identify unknown substances, by comparing diffraction data against a database maintained by the International Centre for Diffraction Data, or to confirm that a synthesized material is the desired material.

II. Introduction and Solution Processing

Disclosed embodiments of the present invention concern solution deposition of inorganic materials. Deposition of inorganic materials has many industrial applications, including manufacturing electronic devices, or components of electronic devices. These electronic devices are exemplified herein primarily by reference to transistors, circuits comprising the transistors, and solar cells. A person of ordinary skill in the art will appreciate that devices other than transistors and solar cells also can be made by the process.

One disclosed embodiment of the method involves first forming a solution comprising a metal compound, or a precursor material used to make a desired metal compound material, that can be deposited onto a substrate. Metal halides are one example of a class of compounds useful as precursors for making metal oxides. At least one, and potentially plural, metal compounds are dissolved in a solvent (e.g. acetonitrile or a lower aliphatic alcohol) and the resulting solution is then solution deposited onto a surface to form a substantially uniform and substantially continuous thin film. Solution deposition includes, but is not limited to, digital fabrication (e.g. inkjet printing) and/or blanket coating (e.g. spin coating) techniques. Solutions can be deposited in desired patterns, such as patterns designed to form working electronic components or devices. The deposited materials are then potentially subjected to post-deposition procedures, such as thermal annealing, oxidation, reduction, exchange reactions, etc., and combinations thereof.

Another disclosed embodiment of the method involves forming a solution comprising at least a first precursor compound, such as a compound that provides a metal, and a second precursor compound, such as a chalcogen compound, that are useful for forming desired products, such as a semiconductors. "Precursor" in this context indicates that the reactants in solution provide constituents of a material that is made from the reactants. This solution is then deposited onto a substrate. As an alternative, a first solution comprising the first precursor compound and at least a second solution comprising the second precursor compound can be deposited onto the substrate as separate solutions in a process that effectively mixes the first and second solutions on the substrate surface. The first and second compounds can be any compounds that can be effectively dissolved in a useful solvent. Examples, without limitation, of classes of compounds include halides, oxides, ureas, compounds having organic ligands, such as aliphatic ligands, including alkyl ligands, such as methyl, ethyl, propyl, etc. ligands, aryl ligands, such as phenyl ligands, heteroaryl ligands, metal acids, etc.

III. Inorganic Materials

A. General Discussion

The present disclosure concerns embodiments of a method for solution deposition of inorganic materials, typically solution deposition of inorganic materials deemed useful for electronic applications. A person of ordinary skill in the art will appreciate that many species of inorganic materials potentially are useful for end applications and can be processed according to embodiments of the method described herein. The present application is directed to all such inorganic materials.

B. Halide and Salt Precursor Materials

Solely by way of example, and without limitation, suitable inorganic materials include metal-containing materials. The metal typically is a Group Ia, IIa, IIIa, IVa, Va, Ib, IIb, IIIb, IVb, Vb, VIb, VIIb or VIIIb metal, or mixtures thereof.

Disclosed embodiments of the present invention can be used to make binary compounds, that is compounds having only two different elements. Binary compounds can be made comprising antimony (Sb), bismuth (Bi), cadmium (Cd), calcium (Ca), copper (Cu), gallium (Ga), germanium (Ge), gold (Au), hafnium (Hf), indium (In), iron (Fe), lead (Pb), magnesium (Mg), manganese (Mn), molybdenum (Mo), nickel (Ni), silicon (Si), silver (Ag), thallium (Tl), tin (Sn), vanadium (V) zirconium (Zr), yttrium (Y), zinc (Zn). Working embodiments have made, for example, metal halides comprising at least one metal and at least one halide, and metal oxides comprising a metal and oxygen atoms. These materials are referred to herein as binary compounds as they include only two different elements. Working embodiments of metal halides, and mixed metal halides that have been made include $AgI$, $BiI_3$, $CaF_2$, $CaI_2$, $CdI$, $CuCl$, $CuCl_2$, $CuBr$, $CuBr_2$, $CuI$, $CuI_2$, $MgF_2$, $MgI_2$, $NiI_3$, $PbI_2$, $SbI_3$, $SnI_2$, $SnI_4$, $TiI$, $ZnI_2$, $FeI_2$, $GeI_4$, $FeCl_2$, $FeCl_3$, $SnCl_2$, $SnCl_4$, $InCl_3$, $SbCl_3$, $SbCl_5$, $SeCl_4$, $SeBr_4$, $Se_2Cl_2$, $Se_2Br_2$, $GeCl_4$, $SiCl_4$, $ZnCl_2$, $AgCl$, $CuAgI_2$, $CuCdI_2$, $CuBiI_4$, $CuPbI_3$, $CuSnI_5$ and $SbSI$. Mixed-metal compounds also can be made using the present invention. For example, copper-cadmium, copper-silver, zinc-indium, zinc-tin, indium-tin, indium-tin-zinc mixed metal materials etc. can be made using embodiments of the method disclosed herein.

Ternary and higher order mixed-metal compounds also have been made. For example, copper-cadmium, copper-silver, zinc-indium, zinc-tin, indium-tin, etc. compounds have made using embodiments of the method disclosed herein. For quaternary compounds, working embodiments include indium-tin-zinc mixed metal materials. A manganese-silicon-zirconium oxide ($ZnSiO_4$:Mn) also has been made for optical applications.

For CIG compounds, the precursor compounds selected must provide copper, indium and gallium. For CIGS compounds, the precursor compounds selected must provide copper, indium, gallium and selenium. For CIGSS compounds, the precursor compounds must provide copper, indium, gallium, selenium and sulfur. And for CIS compounds, the precursor compounds selected must provide copper, indium, and selenium.

Inorganic materials comprising metals are solution processed for deposition on a surface. As a result, many exemplary compounds are metal salts. For example, metal halides have been used to make suitable solutions. These materials typically have a formula $M_aX_b$ where M is a metal, X is a halide, i.e., fluoride, chloride, bromide, iodide, or mixtures thereof, a typically is 1, 2 or 3, and b typically is equal to the positive charge on the metal atom or atoms.

Metal halides have been used to make suitable solutions for working embodiments. These metal halides typically have a formula $M_aX_b$ where M is a metal, X is a halide, i.e., fluoride, chloride, bromide, iodide, or mixtures thereof, a typically is 1, 2 or 3, and b typically is equal to the positive charge on the metal atom or atoms.

Metal compounds other than metal halides may be used to practice the present invention. For example, metal acetates also have been used, such as copper (I) acetate [$CuCO_2CH_3$] and copper (II) acetate [$Cu(CO_2CH_3)_2$]. These materials typically satisfy the formula $M_aY_b$ where M is a metal, Y typically is an anionic species, such as a halide, an acetate, a sulfate, a phosphate, etc., and combinations thereof, a is sufficient to provide metal atoms equal to the sum of the charge associated with any one or more Y groups, and b is sufficient to provide anionic groups equal to the sum of the positive charge associated with one or more metal atoms.

Ternary and higher-order mixed metal compounds also can be processed as disclosed herein. Ternary compounds typically have a formula $M_a^1M_b^2Y_c$ where a+b is sufficient to provide metal atoms equal to the sum of the charge associated with any one or more Y groups, and c is sufficient to provide anionic groups equal to the sum of the positive charge associated with the metal atoms. Similarly, quaternary compounds typically have a formula $M_a^1M_b^2M_c^3Y_d$ d where a+b+c is sufficient to provide metal atoms equal to the sum of the charge associated with any one or more Y groups, and d is sufficient to provide anionic groups equal to the sum of the positive charge associated with the metal atoms.

C. Ureas

Another example of a class of precursor compounds useful for making desired end compounds, such as semiconductors, are ureas. These compounds typically have a formula

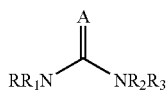

where A is a metal or chalcogen selected from the those discussed herein, and R—R$_3$ are independently aliphatic, substituted aliphatic, arylalkyl, cyclic, substituted cyclic, heterocyclic, substituted heterocyclic, aryl, substituted aryl, heteroaryl, substituted heteroaryl, or hydrogen. More typically R—R$_3$ are independently hydrogen, phenyl or lower alkyl, such as methyl, ethyl, propyl, butyl, etc. For example, the chalcogen may be sulfur, selenium or tellurium, and if R—R$_3$ are hydrogen, the compound is a selenourea, tellurourea, or thiourea as shown below.

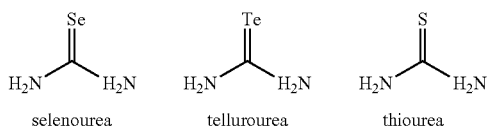

selenourea    tellurourea    thiourea

Alternatively, one or more of R—R$_3$ might by lower alkyl, such as with the N,N-dimethyl and N,N' dimethylchalcogenureas shown below.

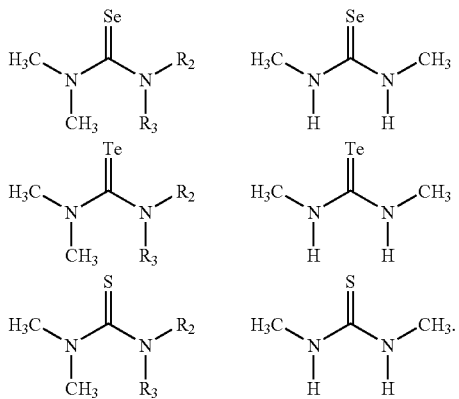

D. Inorganic Compounds Comprising Organic Ligands

Metals, mixed metals, chalocogens and mixed chalcogens having organic ligands also can be used to practice the present invention. A first formula for describing these compounds is provided below, where R and R$_1$ are the same or different and are independently selected from aliphatic, substituted aliphatic, and more typically alkyl, and even more typically lower alkyl, arylalkyl, cyclic, substituted cyclic, heterocyclic, substituted heterocyclic, aryl, substituted aryl, heteroaryl, substituted heteroaryl, hydrogen, etc.

(RR$_1$)-Chalcogen

A second general formula for describing representative compound is as follows:

R-(M,O,S,Se, and/or Te)—R$_1$

With reference to this general formula, M is a metal, and R and R$_1$ are the same or different and are selected from aliphatic, substituted aliphatic, and more typically alkyl, and even more typically lower alkyl, arylalkyl, cyclic, substituted cyclic, heterocyclic, substituted heterocyclic, aryl, substituted aryl, heteroaryl, substituted heteroaryl, hydrogen, etc. Dimetals and dichalcogens can be used, and these compounds typically have a formula:

R-Metal$_1$-Metal$_2$-R$_1$ or

R-Chalcogen$_1$-Chalcogen$_2$-R$_1$ where R and R$_1$ are the same or different and are selected from aliphatic, substituted aliphatic, and more typically alkyl, and even more typically lower alkyl, arylalkyl, cyclic, substituted cyclic, heterocyclic, substituted heterocyclic, aryl, substituted aryl, heteroaryl, substituted heteroaryl, hydrogen, etc. Aliphatic dichalcogens include, by way of example, and without limitation:

R—S—S—R$_1$

R—Se—Se—R$_1$

R—Te—Te—R$_1$ where R and R$_1$ are as disclosed above. Particular examples of suitable compounds include dimethyl sulfide, dimethyl disulfide, diethyl sulfide, diethyl disulfide, diphenyl sulfide, diphenyl disulfide, dimethyl selenide, dimethyl diselenide, diethyl selenide, diethyl diselenide, diphenyl selenide, diphenyl diselenide, diphenylselenium dichloride, dimethyl telluride, dimethyl ditelluride, diethyl telluride, diethyl ditelluride, diphenyl telluride, diphenyl ditelluride, diphenyltellerium dichloride, phenol, thiophenol, phenylseleno (e.g., phenylselenylchloride, methyl phenyl selenide, etc.) and the tellurium analog.

E. Metal Oxides

Certain embodiments of the present invention concern forming photovoltaics, such as solar cells. Solar cells often include an absorber layer comprising a semiconductor and a transparent conducting oxide layer. Methods for making metal oxide layers are disclosed in U.S. patent application Ser. No. 11/564,759, and summarized herein. Examples of metal oxides include, without limitation, ZnO—In$_2$O$_3$ (ZIO), ZnO, In$_2$O$_3$, SnO$_2$, In$_2$O$_3$—SnO$_2$ (ITO), ZnO—SnO$_2$ (ZTO), and In$_2$O$_3$—ZnO—SnO$_2$ (IZTO), Ga$_2$O$_3$, ZnO—Ga$_2$O$_3$ (ZGO), Al$_2$O$_3$, B$_2$O$_3$, GeO$_2$, PbO, In$_2$O$_3$—GeO$_2$, SnO$_2$—GeO$_2$, SiO$_2$, CdO, CdO—SnO$_2$, CuO, CuO—Al$_2$O$_3$, MgO, MgO—In$_2$O$_3$, CaO, CaO—Al$_2$O$_3$, SrO, SrO$_2$, TcO$_2$, Tc$_2$O$_7$, BeO, TbO$_2$, Tb$_2$O$_3$, BaO, AgO, Ag$_2$O, ScO, CuO—ScO, SrO, CoO, Fe$_2$O$_3$, Fe$_3$O$_4$, ZnO—Fe$_3$O$_4$, Cr$_2$O$_3$, ZnO—Cr$_2$O$_3$, NiO, RuO$_2$, ReO$_2$, ReO$_3$, RhO, MoO$_2$, MnO, WO, V$_2$O$_3$, Nb$_2$O$_3$, Ta$_2$O$_5$, TiO$_2$, BaO—TiO$_2$, ZnO$_2$, ZrO$_2$, ZrO$_2$—SiO$_2$, HfO$_2$, HfO$_2$—SiO$_2$, Y$_2$O$_3$, La$_2$O$_3$, PbO, TiO, Sb$_2$O$_3$, Sb$_2$O$_3$—SnO$_2$, Sb$_2$O$_5$, Bi$_2$O$_3$, and any and all combinations thereof.

Many of the disclosed metal oxide embodiments concern ZnO—In$_2$O$_3$, which may be referred to herein as ZIO. Metal oxides in addition to ZIO also have been made according to the present invention, including seven transparent conductive oxide thin films, namely ZnO, In$_2$O$_3$, SnO$_2$, In$_2$O$_3$—SnO$_2$ (ITO), ZnO—SnO$_2$ (ZTO), and In$_2$O$_3$—ZnO—SnO$_2$ (IZTO). These materials have been fabricated by combining ZnCl$_2$, SnCl$_2$ and InCl$_3$ precursors in acetonitrile in various concentrations, followed by either inkjet printing or spin coating.

The metal halides can be used directly as deposited for conductors (electrons, holes, and ions), semiconductors, insulators, photoconductors and phosphors. Alternatively, the deposited inorganic layer comprising a metal, such as a metal halide layer, may be subjected to post deposition processing. Post deposition processing can include processing designed to maintain composition, but change physical properties. Alternatively, post deposition processing can include processing to convert deposited materials into other desired compounds, such as metal oxides. The metal halide can be oxidized, such as by treatment with water or an oxidizing atmosphere, to form the metal oxide on the substrate. Working embodiments have used air oxidation at a temperature of about 600° C. Oxidation can change the metal halide, having an initial molecular formula of $M_aX_b$ into a metal oxide having a formula $M_aO_{b/2}$ where M is a metal, and a and b have the values stated above.

F. Miscellaneous Precursor Compounds

Hydrous acids of the chalcogens also can be used. Examples of hydrous acids include sulfuric acid ($H_2SO_4$), sulfurous acid ($H_2SO_3$), selenic acid ($H_2SeO_4$), selenous acid ($H_2SeO_3$), telluric acid ($Te(OH)_6$ and tellurous acid ($H_2TeO_3$).

Metals and chalcogens having ligands other than those discussed above for organic ligands also can be used. One common class of metal ligands are carbonyl (CO) ligands where the metal comprises at least one carbonyl group. Most carbonyl compounds have a formula $M(CO)_x$ where X typically is 4, 5 or 6. Polymetal carbonyl compounds also are known, and typically have a formula of $M_x(CO)_y$ where X is from 2 up to at least 4, and X is from 9 to at least 12. For example, certain working embodiments have used $Mo(CO)_6$ to form photovoltaics.

Chalcogens also can be used as metal powders, vapor, nanoparticles, etc.

IV. Solution Processing Inorganic Materials

One feature of certain disclosed embodiments is solution processing inorganic materials. While it is possible that suspensions of materials also may be useful, certain of the disclosed embodiments, such as inkjet printing methods, are best implemented using solutions and not suspensions. FIG. 1 schematically illustrates one solution processing embodiment. FIG. 1 refers to metal halides, but this is solely to exemplify solution-processing metal compounds generally. Moreover, FIG. 1 exemplifies optional post deposition processing of the metal halide to form metal oxides.

With reference to FIG. 1, a metal halide precursor solution is solution deposited onto a substrate. FIG. 1 indicates depositing the solution by either inkjet printing or spin coating. While these are two preferred solution deposition embodiments, they are by no means the only suitable methods for solution deposition. Other methods include, but are not limited to, gravure, micro-pen, nano-fountain pen, dip-pen, screen printing, spray coating, slide coating, slot coating, curtain coating, dip coating and combinations thereof.

Solvent used to form the metal halide precursor solution is then allowed to evaporate. Evaporation may be facilitated by optional drying procedures. These optional drying procedures include, but are not limited to, heating and using a flowing fluid like an inert gas, to facilitate solvent evaporation.

The metal halides can be used directly as deposited for conductors (electrons, holes, and ions), semiconductors, insulators, photoconductors and phosphors. Alternatively, the deposited inorganic layer comprising a metal, such as a metal halide layer, may be subjected to post deposition processing. Post deposition processing can include processing designed to maintain composition, but change physical properties. Alternatively, post deposition processing can include processing to convert deposited materials into other desired compounds, such as metal oxides. FIG. 1 illustrates oxidizing the metal halide, such as by treatment with water or an oxidizing atmosphere, to form the metal oxide on the substrate. Oxidation can change the metal halide, having an initial molecular formula of $M_aX_b$ where M is a metal, X is a halide, a is sufficient to provide a positive charge balancing the negative charge provided by the sum of the charge on the anionic halide, and b is sufficient to provide a negative charge to balance the positive charge provided by the sum of the charges on the cationic metal species. The metal halides are converted into oxides having a formula $M_aO_{b/2}$ where M is a metal, and a and b have the values stated above.

It also originally was believed that aprotic solvents, such as acetonitrile, were best suited for practicing disclosed solution deposition embodiments. Aprotic solvents were considered less likely to dissociate metal precursor materials, such as metal halides. In addition, acetonitrile is volatile (boiling point =81–82° C.), which helps convert the printed liquid thin films into solid metal halide thin films in short order. In contrast, metal halides tend to dissociate and form hydroxide precipitates in an aqueous solution and dry much more slowly. Nevertheless, protic solvents, such as lower (i.e. fewer than 10 carbon atoms) aliphatic alcohols, typically lower alkyl alcohols, such as methanol, ethanol, isopropanol, etc., also can be used to solution process inorganic materials. Thus, suitable solvents include protic and aprotic aliphatic organic solvents, protic and aprotic heteroaliphatic solvents, protic and aprotic aryl solvents, protic and aprotic heteroaryl solvents, and combinations thereof. A person of ordinary skill in the art therefore will appreciate that a large number of liquids are potentially useful as solvents for practicing the present invention. Hence, appropriate solvents for a particular application are best determined by considering factors such as solubility of the material in the solvent, boiling point (to facilitate removal or evaporation), wettability, availability, cost, toxicity, etc.

Solutions of varying concentrations can be used to practice the present invention. Thus, any solution where the concentration of the inorganic material is greater than zero to the saturation concentration can be used to practice the present invention. Solely by way of example, working embodiments typically have used a metal halide concentration of from about 0.015 molar to about 0.16 M.

Figure 2:
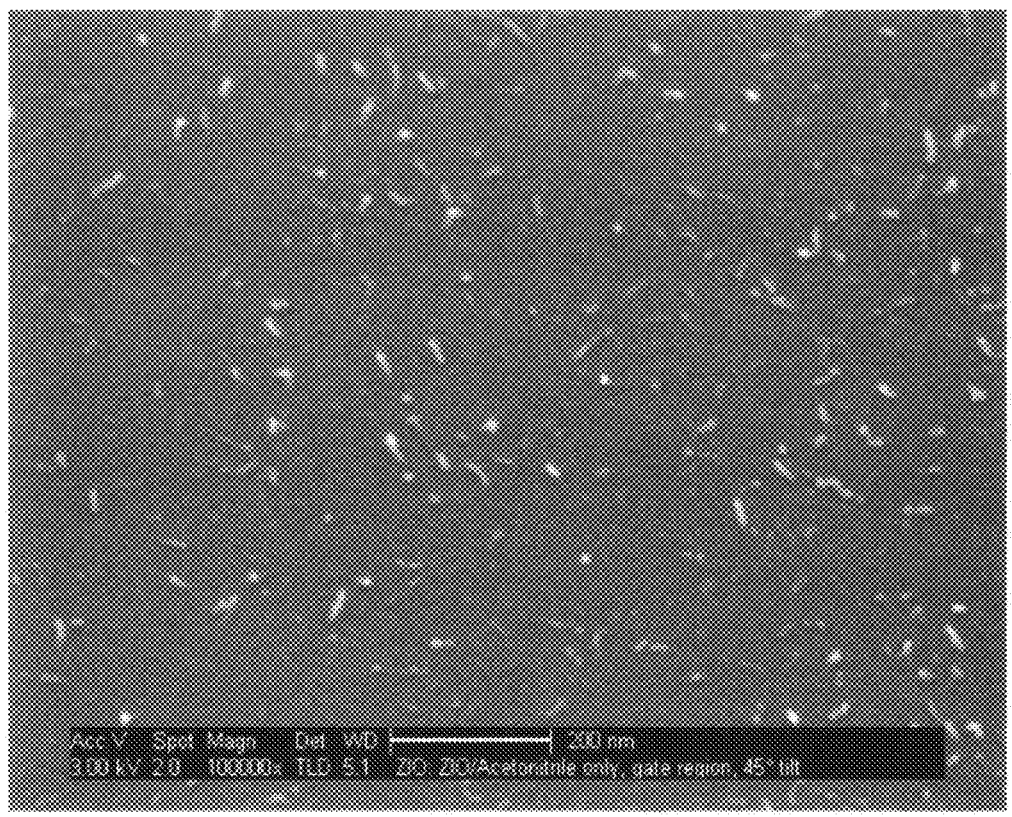
FIG. 2 is a top SEM image of an inkjet printed $ZnO$—$In_2O_3$ (ZIO) formed using a low concentration (0.015 M of $ZnCl_2$ and $InCl_3$ in 25 ml acetonitrile) deposition solution.
Figure 3:
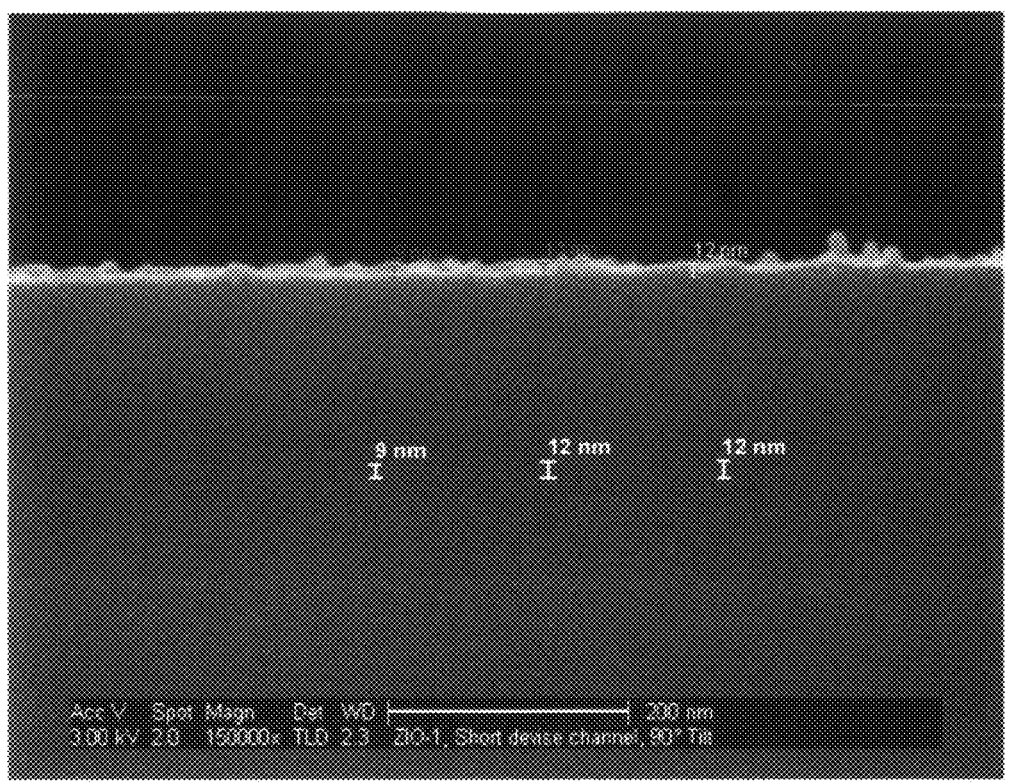
FIG. 3 is a cross-sectional SEM image of an inkjet printed $ZnO$—$In_2O_3$ (ZIO) formed using a low concentration deposition solution showing a deposited layer thickness of about 11 nanometers.
Figure 4:
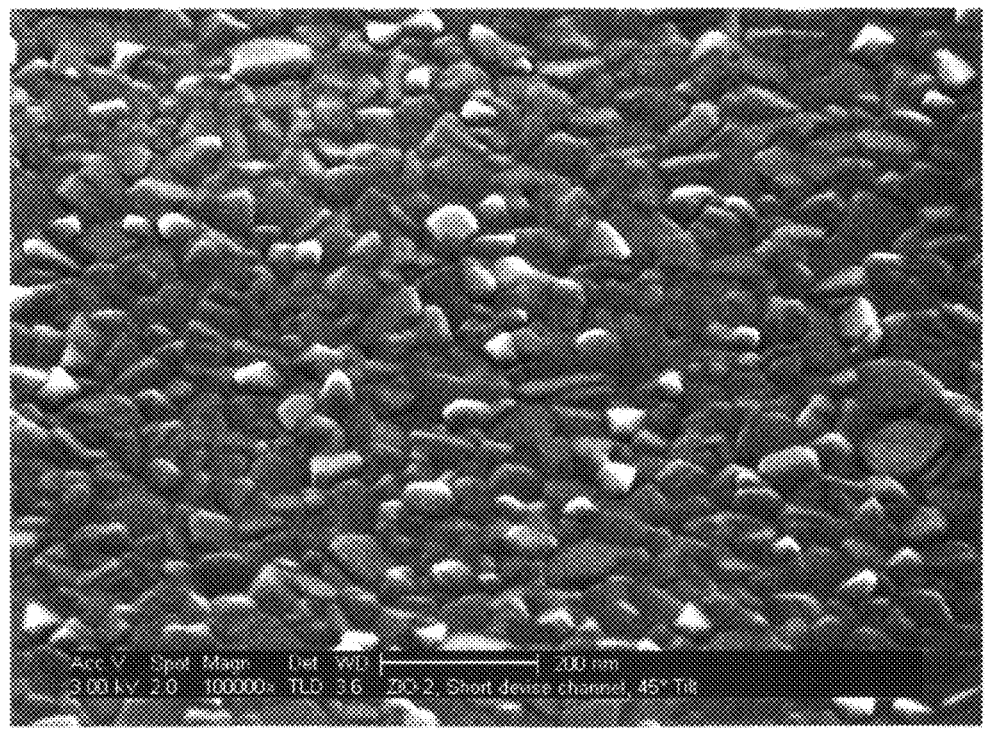
FIG. 4 is a top SEM image of an inkjet printed $ZnO$—$In_2O_3$ (ZIO) formed using a high concentration (0.03 M of $ZnCl_2$ and $InCl_3$ in 25 ml acetonitrile) deposition solution.
Figure 5:
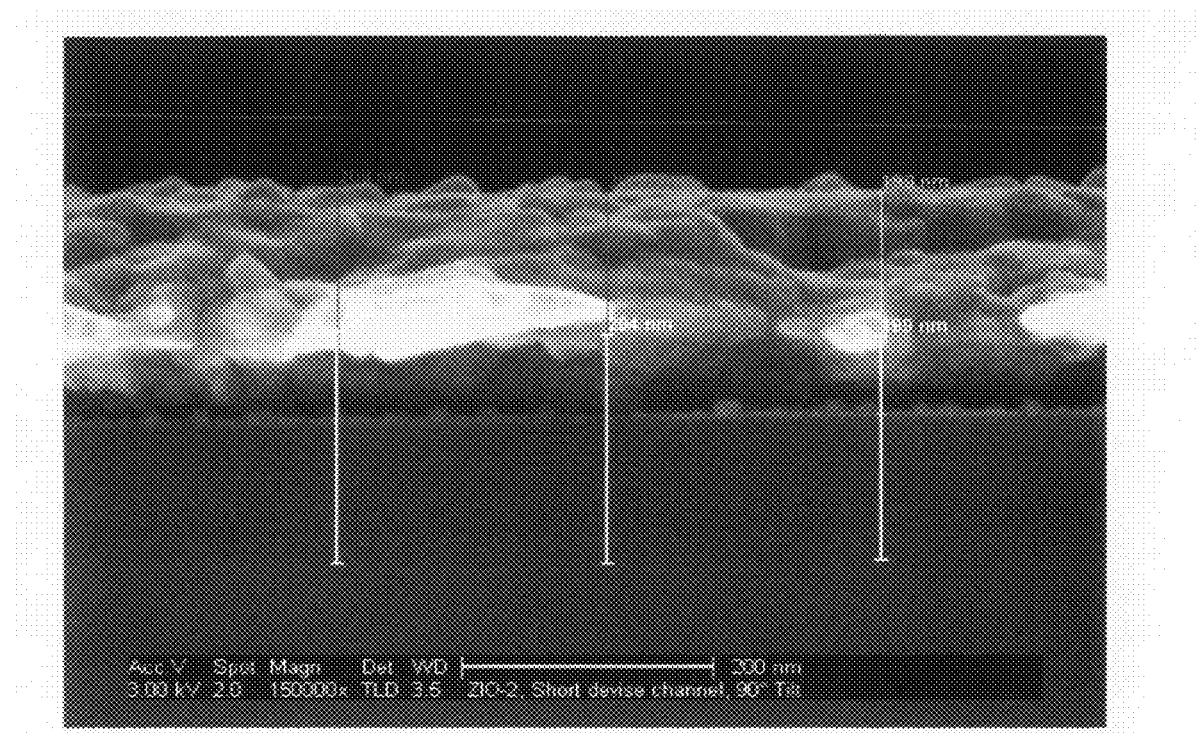
FIG. 5 is a cross-sectional SEM image of an inkjet-printed $ZnO$—$In_2O_3$ (ZIO) layer formed using a high concentration deposition solution showing a deposited layer thickness of about 204 nanometers.

Moreover, deposited film thicknesses appear to be directly correlated with the concentration of the solution used to deposit the material used to make the film. This result is illustrated by FIGS. 2-5. FIG. 2 is a top SEM image of an inkjet printed $ZnO-In_2O_3$ (ZIO) formed using a low deposition solution. FIG. 3 is a cross-sectional SEM image of an inkjet printed $ZnO-In_2O_3$ (ZIO) formed using a low concentration (0.015 M of $ZnCl_2$ and $InCl_3$ in 25 ml acetonitrile) deposition solution. FIG. 2 clearly shows that the deposited layer thickness varies from about 9 nanometers to about 11 nanometers. FIG. 4 is a top SEM image of an inkjet printed $ZnO-In_2O_3$ (ZIO) formed using a high concentration (0.03 M of $ZnCl_2$ and $InCl_3$ in 25 ml acetonitrile) deposition solution. FIG. 5 is a cross-sectional SEM image of an inkjet-printed $ZnO-In_2O_3$ (ZIO) layer formed using a high concentration deposition solution. FIG. 5 clearly shows a deposited layer thickness that varies from about 199 nanometers to about 208 nanometers. Thus, deposited film thickness can vary from some value greater than 0 nanometers to at least about 300 nanometers, more typically from greater than 5 nanometers to about 250 nanometers, and even more typically from about 10 nanometers to about 200 nanometers. A person or ordinary skill in the art will appreciate that a film thickness versus concentration curve can be determined empirically for a particular system, and this information can be used to determine suitable concentrations for use in that application. For film thicknesses greater than can be deposited with a single deposition step, multiple deposition steps can be practiced to provide the requisite film thickness.

Particular embodiments are directed to making CIS, CGS, CIGS or CIGSS compounds. For these embodiments, metal halides are one example of a class of compounds useful for providing at least a first metal, such as copper, required to form the CIS, CIGS or CIGSS compounds. Solely by way of example, the second chalcogen compound has been provided in working embodiments by halides and ureas.

Suitable metal and chalcogen compounds are dissolved in a solvent (e.g. acetonitrile or a lower aliphatic alcohol) and the resulting solution is then solution deposited onto a substrate to form a substantially uniform and substantially continuous thin film. Solution deposition includes, but is not limited to, digital fabrication (e.g. inkjet printing) and/or blanket coating (e.g. spin coating) techniques. Solutions can be deposited in desired patterns, such as patterns designed to form working electronic components or devices. The deposited materials are then potentially subjected to post-deposition procedures, typically thermal annealing in an inert atmosphere or under a vacuum, to form the desired end compound.

Figure 6:
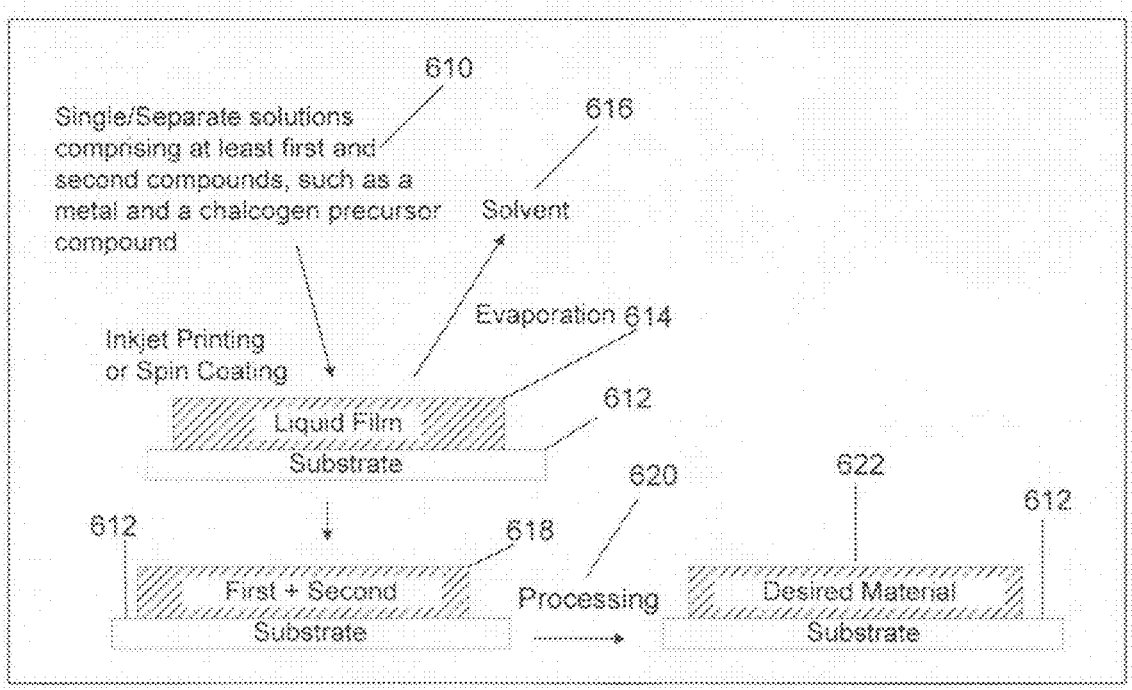
FIG. 6 is a schematic drawing illustrating one embodiment of a method according to the presently disclosed invention.

FIG. 6 schematically illustrates one solution processing embodiment according to the present invention. With reference to FIG. 6, a solution or solutions 610 comprising a first compound, such as a metal-providing compound, and a second compound, such as a chalcogen-providing compound, is solution deposited onto a substrate 612 to provide a liquid film 614 on the substrate. FIG. 6 indicates depositing the solution by either inkjet printing or spin coating. While these are two preferred solution deposition embodiments, they are by no means the only suitable methods for solution deposition. Other methods include, but are not limited to, gravure, micro-pen, nano-fountain pen, dip-pen, screen printing, spray coating, slide coating, slot coating, curtain coating, dip coating and combinations thereof.

Solvent 616 is then allowed to evaporate to form a thin film 618 comprising at least the first and second compounds on substrate 612. Solvent evaporation may be facilitated by optional drying procedures. These optional drying procedures include, but are not limited to, heating and using a flowing fluid like an inert gas, to facilitate solvent evaporation.

Aprotic solvents, such as acetonitrile, are well suited for practicing disclosed solution deposition embodiments. Aprotic solvents are considered less likely to dissociate precursor materials, such as metal halides. In addition, acetonitrile is volatile (boiling point=81–82° C.), which helps convert the printed liquid thin films into thin films in short order. In contrast, certain precursor compounds, such as metal halides, tend to dissociate and form hydroxide precipitates in an aqueous solution and dry much more slowly. Nevertheless, protic organic solvents, such as lower (i.e. fewer than 10 carbon atoms) aliphatic alcohols, typically lower alkyl alcohols, such as methanol, ethanol, isopropanol, etc., also can be used to solution process inorganic materials. Thus, suitable solvents include protic and aprotic aliphatic organic solvents, protic and aprotic heteroaliphatic solvents, protic and aprotic aryl solvents, protic and aprotic heteroaryl solvents, and combinations thereof. A person of ordinary skill in the art therefore will appreciate that a large number of solvents are potentially useful for practicing the present invention. Hence, appropriate solvents for a particular application are best determined by considering factors such as solubility of the material in the solvent, boiling point (to facilitate removal or evaporation), wettability, availability, cost, toxicity, etc.

Solutions of varying concentrations can be used to practice the present invention. Thus, any solution where the concentration of the inorganic material is greater than zero to the saturation concentration can be used to practice the present invention. Solely by way of example, working embodiments typically have used a precursor compound concentrations of from greater than 0 to at least about 0.5 molar, and more typically from about 0.01 molar to about 0.2 M.

Moreover, deposited film thicknesses appear to be directly correlated with the concentration of the solution used to deposit the material used to make the film. Thus, deposited film thickness can vary from some value greater than 0 nanometers to at least about 300 nanometers, more typically from greater than 5 nanometers to about 250 nanometers, and even more typically from about 10 nanometers to about 200 nanometers. A person of ordinary skill in the art will appreciate that a film thickness versus concentration curve can be determined empirically for a particular system, and this information can be used to determine suitable concentrations for use in that application. For film thicknesses greater than can be deposited with a single deposition step, multiple deposition steps can be used to provide the requisite film thickness.

A person of ordinary skill in the art will understand that the composition of the deposited material 618 depends on the composition of the compounds used to form the deposition solution 610. Many devices require deposition of films comprising materials other than the original material, such as a metal halide or chalcogen compound, that is initially solution deposited. Thus, composite structures having deposited inorganic thin films optionally can be subjected to post deposition processing too.

FIG. 6 illustrates using a post deposition processing step 620 to process the deposited materials 618 to form desired materials 622, such as solar cell materials. Post deposition processing step 620 can include processing designed to maintain composition, but change physical properties, or processing to change chemical composition. In some embodiments, post deposition processing concerns treating the thin film with a reactive material in a gas phase. Such post processing techniques can be used for the present embodiments. Post deposition processing can include processing to convert deposited materials into other desired compounds, such as solar cell materials. However, one aspect of the present embodiments is designed to avoid having to treat deposited thin films with a reactive "annealing gas." Accordingly, "processing" as referred to in FIG. 6 often indicates thermal processing, and often thermal processing under a vacuum or under an inert atmosphere, which is different from subjecting the deposited material 618 to an annealing gas. For example, the solvent of a deposited solution can be evaporated, and the remaining deposited solution thermally processed to form the desired compound. "Thermal processing" means heating the substrate and deposited solution to or at a temperature and for a time period useful for forming the desired end product. For working embodiments to form CIS, CGS, CIGS, or CIGSS compounds, thermal processing typically means heating to a temperature greater than ambient and up to 600° C., more typically from about 100° C. to about 500° C., even more typically more typically from about 200° C. to about 400° C., for a period of time of a few minutes up to at least an hour.

V. Optional Post Solution Deposition Processing

As will be understood by a person of ordinary skill in the art, the composition of the deposited inorganic material depends on the composition of the material used to form the deposition solution. For example, if the metal-comprising compound dissolved in the deposition solution is a metal halide, then metal halide thin films are produced by the initial deposition step. However, many devices require deposition of films comprising materials other than the original material, such as a metal halide, that is initially solution deposited. Thus, composite structures having deposited inorganic thin films optionally can be subjected to post deposition processing too.

Figure 7:
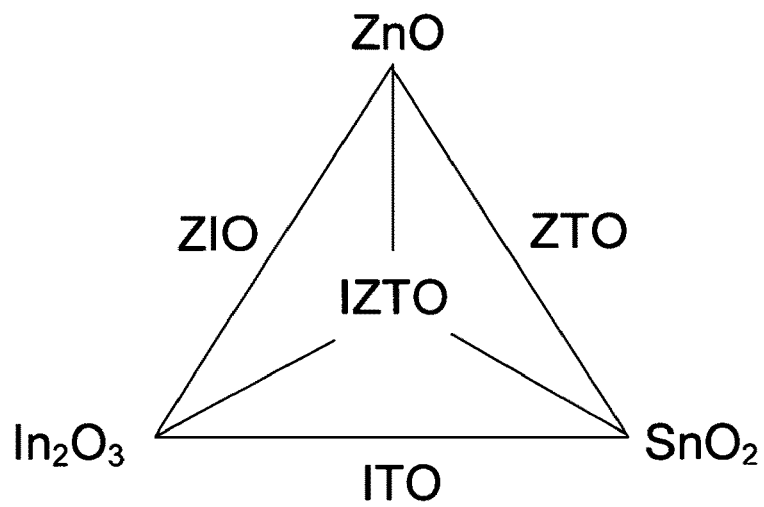
FIG. 7 schematically illustrates a number of different conductive oxide thin films that can be deposited using metal halide precursor solutions and suitable deposition processes, such as inkjet printing and spin coating deposition.

Post deposition processing can include, by way of example and without limitation, annealing, oxidation, reduction, exchange reactions, etc. Post processing is exemplified by the formation of oxide materials from halide materials by a variety of methods, such as air annealing (e.g., at 600° C. for one hour) and treating deposited materials with oxidizing agents, such as oxygen and/or water. FIG. 7 schematically illustrates a number of different conductive oxide thin films that can be deposited using metal halide precursor solutions, suitable deposition processes, such as inkjet printing and spin coating deposition, and post processing to form the oxide.

Examples of additional classes of materials that can be made from as-deposited materials, and post processing techniques used to make such additional materials, are provided below in Table 1.

TABLE 1

| Compounds | Annealing Gas |
| --- | --- |
| Oxides | e.g. $H_2O$, $O_2$, O (oxidizing agents) |
| Sulfides | e.g. $H_2S$, S, $CS_4$ (Sulfiding agents) |
| Selenides | e.g. $H_2Se$, Se (Selenizing agents) |
| Tellurides | e.g. $H_2Te$, Te (Tellurizing agents) |
| Nitrides | e.g. $NH_3$, N (Nitriding agents) |
| Carbides | e.g. $CH_4$, $C_2H_6$, $C_2H_4$ (Carbiding agents) |
| Phosphides | e.g. $PH_3$ (phosphiding agents) |
| Borides | e.g. $BCl_3$, $B_2H_6$ (boriding agents) |
| Elements | e.g. $H_2$, H reducing agents |
| e.g. Si, Ge | $SiI_4 + 2H_2 \rightarrow Si + 4HI$ |
|  | $GeI_4 + 2H_2 \rightarrow Ge + 4HI$ |
|  | Disproportionation reaction |
|  | $2GeI_2 \rightarrow Ge + GeI_4$ |

VI. General Description of Transistors

Figure 8A:
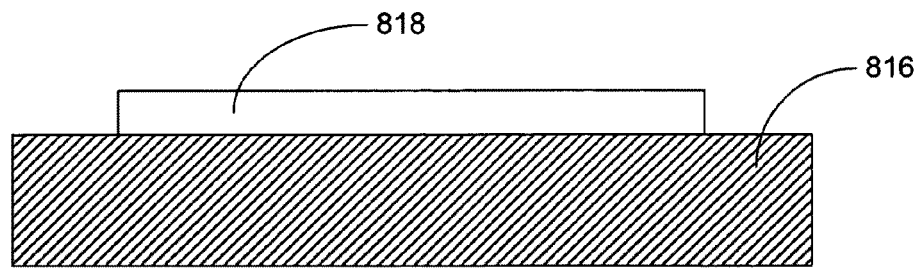
FIGS. 8A-8C are schematic block diagrams illustrating an exemplary thin film transistor.
Figure 8B:
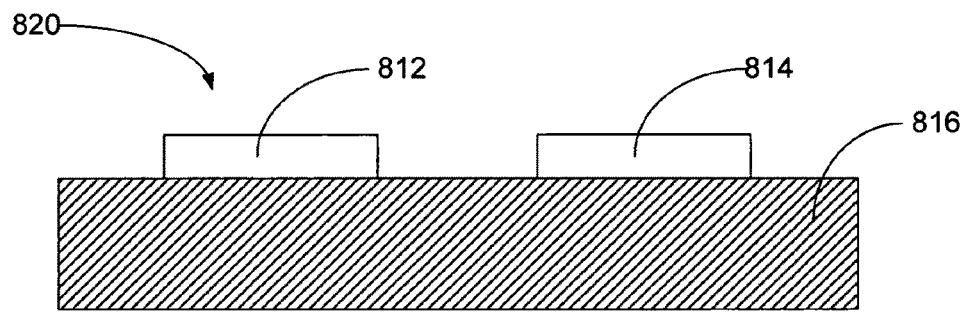
Figure 8C:
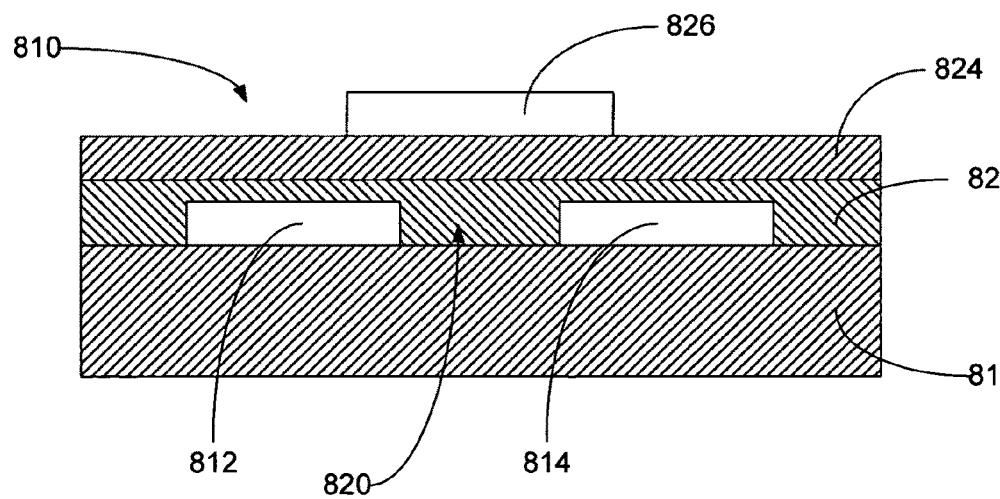

FIGS. 8A-8C illustrate a first exemplary embodiment of a thin film transistor 810. Transistor 810 has source contacts 812 and drain contacts 814 formed upon a substrate 816. Substrate 816 can be made from any suitable material, but preferably has good dielectric properties. Substrate 816 also should be compatible with the solution-processed thin film materials used to form the transistor 810. Examples of suitable exemplary substrates include, without limitation, glass, silica, polymeric materials, such as polycarbonate, polyarylate, polyethylenterephtalate (PET), polyestersulfone (PES), polyimide, polyolefin, and polyethylene naphthalate (PEN). Initially, a desired conductive solution-processed material is deposited as a thin film 818, such as by inkjet printing or spin coating, onto substrate 816.

Solution-processed thin film 818 may form a rough pattern, such as a circuit interconnect pattern useful for connecting multiple transistors. If an initial step forms a roughly patterned deposit, additional patterning may be done, using any suitable method, to form more refined detail. For example, laser ablation using laser irradiation tuned to a wavelength preferably selectively absorbed by the thin film material 818 may be used for additional patterning. By these methods, desired structures can be formed. For example, a transistor channel 820 can be formed between the source contacts 812 and drain contacts 814. Channel 820 preferably is made as narrow as possible to reduce threshold voltage. Channel 820 typically has a width of 5 μm or less, and channel widths of at least as narrow as 1 μm or less can be formed. Some devices permit wider channels. A person of ordinary skill in the art will appreciate that the minimum and maximum feature sizes will depend on various factors including variable device architecture.

Again with reference to the exemplary transistor of FIGS. 8A-8C, a thin film of semiconductor material is deposited to form an active region thin film layer 822 over the source contacts 812, drain contacts 814 and exposed portions of the substrate 816. The thin film layer may be formed by any suitable solution deposition process, such as inkjet printing or spin coating. A dielectric solution-processed thin film material is then used to form an isolation layer 824 over the active region thin film layer 822. A conductive solution-processed thin film material is then deposited upon the isolation layer 824 to form a gate contact 826, which also may form part of a circuit interconnect pattern.

Figure 9:
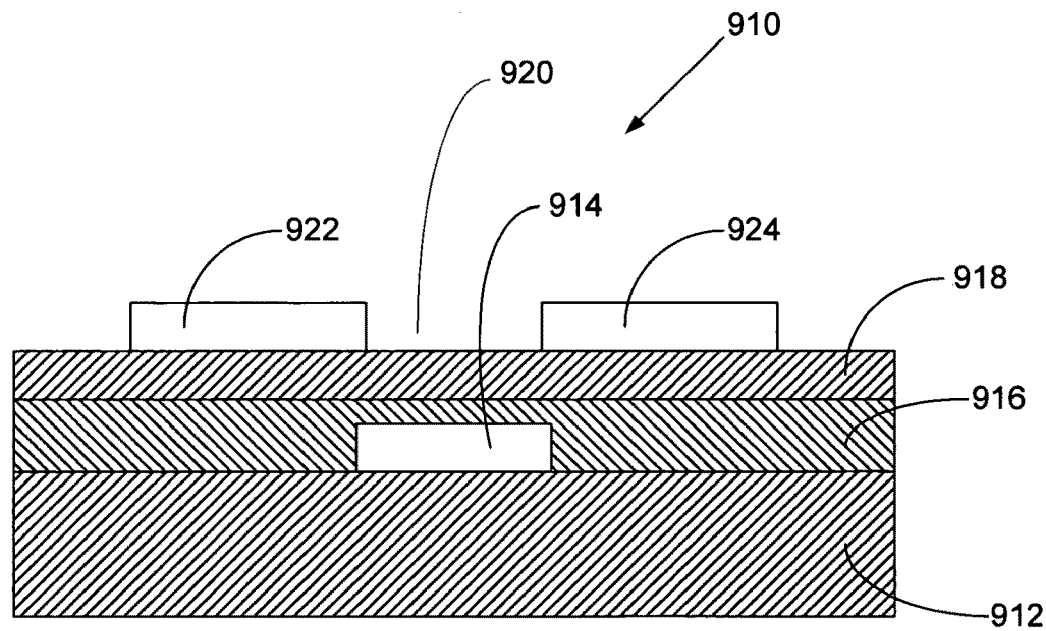
FIG. 9 is a schematic block diagram illustrating an exemplary thin film transistor.

FIG. 9 illustrates a second exemplary embodiment of a solution-processed thin film transistor 910. A conductive solution-processed thin film material is deposited onto substrate 912 to form a gate contact 914, which first may be patterned roughly by solution deposition, and then refined by any suitable method, such as laser ablation. Gate contact 914 also may form part of a circuit interconnect pattern. A dielectric solution-processed thin film material is then deposited as thin film layer 916 over the gate contact 914 and any exposed portions of the substrate 912. A semiconductor solution-processed thin film material then may be deposited as an active region thin film layer 918. Conductive solution-processed thin film material is deposited on the semiconductor active region thin film layer 918. Patterning techniques, such as laser ablation, can be used to pattern a transistor channel 920 between the source contact 922 and drain contact 924.

Figure 10:
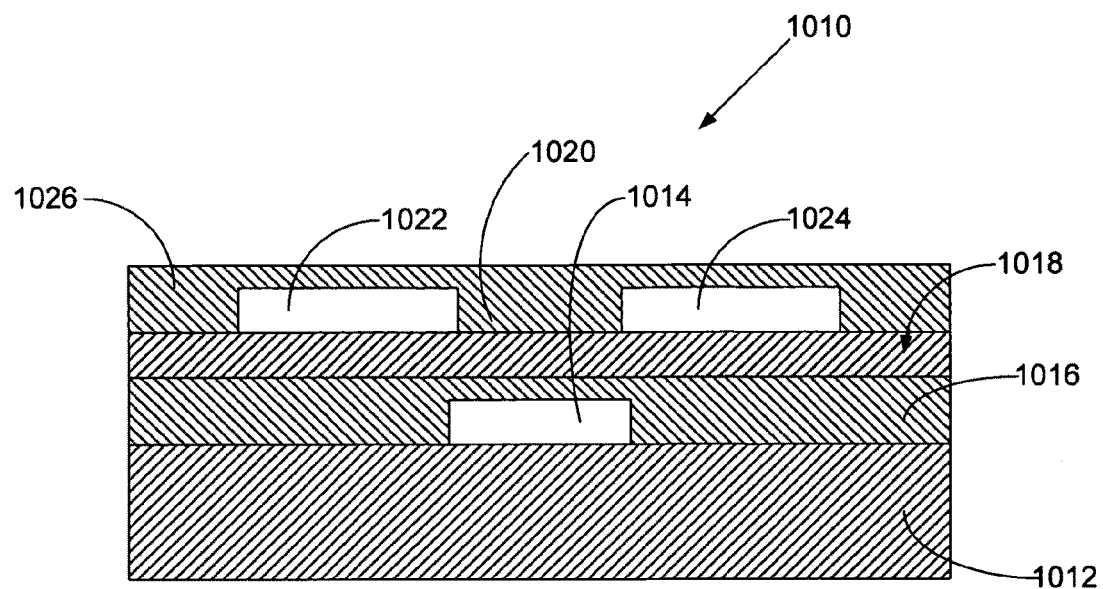
FIG. 10 is a schematic block diagram illustrating an exemplary thin film transistor.

FIG. 10 illustrates yet another embodiment of an exemplary thin film transistor 1010. A conductive solution-processed thin film material is patterned upon the substrate 1012 to form a gate contact 1014. Gate contact 1014 initially may be patterned roughly by solution deposition, and then refined subsequently by any suitable patterning methodology, such as laser ablation. Gate contact 1014 also may form part of a circuit interconnect pattern. A dielectric solution-processed thin film layer 1016 is then formed over the gate contact 1014 and exposed portions of the substrate 1012. Conductive solution-processed thin film material 1018 is deposited on the thin film layer 1016. Additional patterning, such as laser ablation patterning, can be used to pattern a transistor channel 1020 between the source contacts 1022 and drain contacts 1024. A semiconductor solution-processed thin film material is then deposited over the source contact 1022 and drain contact 1022 to form semiconductor solution-processed thin film material active region thin film layer 1026.

Figure 11:
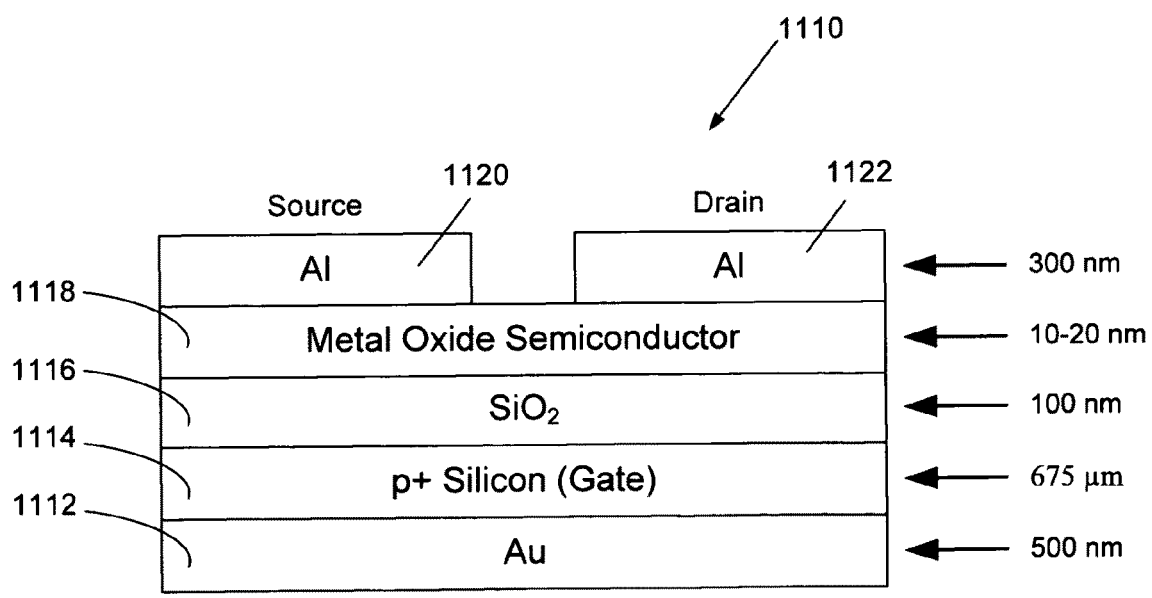
FIG. 11 is a schematic, cross-sectional view of one embodiment of a metal oxide semiconductor MISFET structure.

FIG. 11 illustrates one embodiment of a metal oxide semiconductor MISFET 1110. MISFET structure 1110 includes a gold substrate material 1112 having a thickness of about 500 nanometers. A p+silicon gate layer 1114 was formed having a thickness of about 675 μm. Gold layer 1112 was sputter deposited on the silicon substrate to form a gate contact. Silicon dioxide ($SiO_2$) layer 1116 was thermally grown on top of a silicon layer 1114. Layer 1116 typically had a thickness of about 100 nanometers. As the name implies, a metal oxide semiconductor MISFET requires a metal oxide semiconductor layer 1118. Layer 1118 can be formed as described herein by solution process deposition of a suitable metal oxide or metal oxide precursor material, such as a metal halide. These layers have typical thicknesses of from about 10 to about 20 nanometers. 300-nanometer aluminum source contact 1120 and drain contact 1122 were evaporated on top of the ZnO layer 1118 through a shadow mask with a channel width-to-length ratio of 7 and 12, respectively.

VII. Description of Photovoltaics/Solar Cells

The present invention is directed to embodiments of a method for making photovoltaics generally, and more specifically solar cells. Any solar cell now known or hereafter developed that includes inorganic semiconductor materials can be made according to disclosed embodiments of the present invention.

Figure 12:
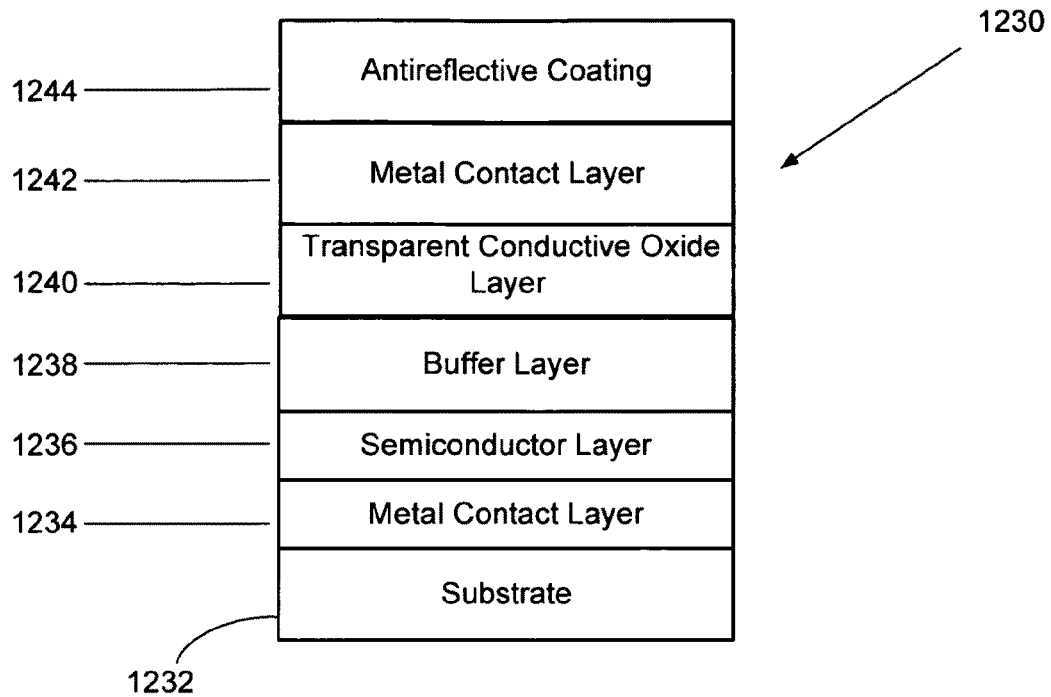
FIG. 12 is a schematic drawing illustrating a general solar cell structure.

However, most solar cells have certain features in common. One embodiment of an exemplary solar cell 1230 is illustrated schematically in FIG. 12. A substrate 1232 is coated with metal contact layer 1234. The most common substrate used for industrial applications is soda-lime glass having a thickness of from about 1 millimeter to about 3 millimeters. However, other substrate materials also can be used, including metal and metal alloys, such as stainless steel. Polymeric materials, such as polysulfones and polyethersulfones, also can be used. Moreover, the substrate composition and/or thickness can be selected such that the resultant solar cell is flexible.

A semiconductor absorber layer 1236, such as a semiconductor, is then formed on the coated substrate. The absorber layer 1236 is then coated with a buffer layer 1238. A transparent conductive oxide layer 1240 is then deposited onto the buffer layer. A second metal contact layer 1242 is then formed on layer 1240.

The components described above are typically found in known solar cells. However, additional structure also can be applied to this typical solar cell. For example, an antireflective coating layer 1244 may be applied to the solar cell structure. The antireflective coating reduces reflected light, thereby increasing the light potentially absorbed by the solar cell. An encapsulating material, such as a metal oxide, including alumina, and/or a polymeric material, such as polyacetate, can be used to encapsulate at least a portion or substantially the entire solar cell structure, such as to increase its durability.

Figure 13:
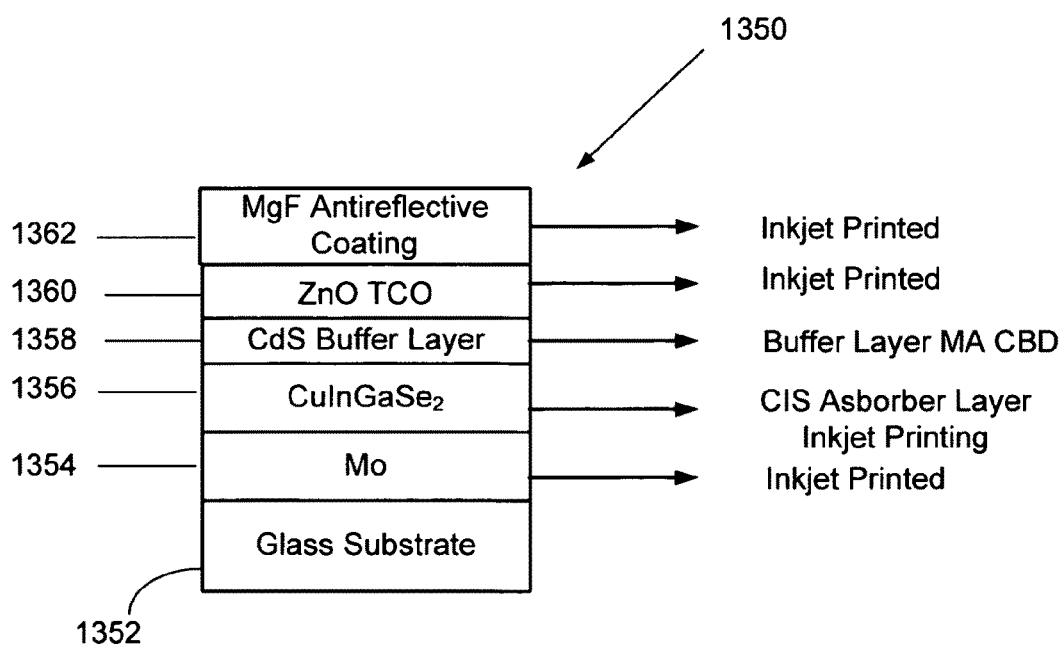
FIG. 13 is a schematic drawing illustrating one embodiment of a CIGSS solar cell that can be made according to the presently disclosed invention.

A more specific embodiment of a photovoltaic cell 1350 is illustrated schematically in FIG. 13. A substrate 1352, such as a glass substrate, is coated with molybdenum (Mo) layer 1354. The molybdenum layer 1354 typically has a thickness of from about 1 to about 5 µm, more typically from about 1 to about 2 µm thick, and serves as metal back contact. For certain disclosed embodiments, the molybdenum layer 1354 can be applied to the glass substrate 1352 using an inkjet printer to deposit a thin film using a solution of molybdenum precursor compound, such as molybdenum hexacarbonyl [$Mo(CO)_6$]. Solely by way of example, A HP 1220C thermal inkjet printer has been modified to accommodate substrates on a plastic tray, which were loaded from the back of the printer, for deposition of thin film inorganic materials. An ink cartridge, typically the black ink cartridge, was filled with a solution of molybdenum hexacarbonyl [$Mo(CO)_6$] using a syringe. The cartridge was sealed with a metallic ball and loaded into the printer's cartridge holder. Microsoft Excel software was used to print individual layers.

A semiconductor absorber layer 1356 is then deposited on the coated substrate. For the illustrated embodiment, the absorber layer is a copper-indium-gallium-diselenide (CIGSS) layer 1356. The semiconductor layer 1356 typically has a thickness of from about 1 to about 5 more typically from about 1 to about 2 µm thick. The CIGSS layer is formed as disclosed herein using deposition of acetonitrile solutions of copper, indium and gallium halides (such as copper, indium and gallium chlorides) and selenochloride, selenooxide or selenourea, in the appropriate stoichiometric ratios required to produce the semiconductor layer 1356. For the illustrated embodiment these relative stoichiometric amounts were $Cu(In_{0.7}Ga_{0.3})Se_2$. The semiconductors used as absorber layers in thin-film photovoltaics exhibit direct bandgaps allowing the cells to be a few micrometers thin; hence, the term thin-film solar cells is often used to describe such films. Once deposited, the structure is then thermally annealed at a temperature of from about 200° C. to about 600° C., and more typically at about 400° C., for a period of time of a few minutes to about an hour, to form the semiconductor layer.

The CIGSS absorber 1356 is then coated with a buffer layer 1358. In the illustrated embodiment, the buffer layer 1358 was cadmium sulfide (CdS). The buffer layer typically has a thickness of several hundred Angstroms, such as about 500 Angstroms. The buffer layer can be produced by microreactor assisted chemical bath deposition (CBD). This technology is discussed in detail in U.S. patent application Ser. No. 11/490,966, which is incorporated herein by reference. One primary benefit of this technology is the ability to deposit a continuous film of a material. Moreover, the better the quality of the film deposited on the substrate, the better the properties that result from such a film. Part of the problem associated with prior art processes is the formation of discrete particles, typically nanoparticles, prior to deposition on a substrate. Nanoparticle formation has a deleterious effect on the quality of the resulting film. Using a continuous flow microreactor significantly increased the film coverage on a substrate surface versus batch processes. This process produces more uniform films with fewer defects than the prior art processes. The films are more continuous and have a higher crystallinity than products produced using prior art processes. Deposition rates are greater too. These differences and benefits associated with microreactor assisted deposition versus prior art chemical bath deposition are discussed in a entitled "A comparison of Chemical Bath Deposition of CdS from a Batch Reactor and a Continuous-flow Microreactor," *Journal of the Electrochemical Society*, 154 (9), pp. 482-488 (2007). The primary author on this paper, Professor Chih-hung Chang, also is an inventor of the present invention. This paper highlights differences between films made using particular embodiments of the process of the present invention relative to batch processes, such as are used in the prior art documents cited against this application. FIG. 5 of this publication, for instance, is an X-ray diffractogram of a CdS film deposited using a continuous flow microreactor compared to a batch reactor. According to this paper:

The presence of only (1110) and (222) peaks indicates the highly oriented nature of CDS films deposited by the CFM [continuous flow microreactor] which must grow as successive alternative planes composed of only either Cd or S atoms parallel to the substrate surface, as it corresponds to the (111) plane of the cubic crystalline structure. This type of growth is in good agreement with the molecular-level growth mechanism. In contrast, the XRD spectrum from the batch process shows peaks from (222), (200), (220), and (311) planes. The intensity of the peaks is much lower than the peaks from the films deposited by the CFM. This result indicates that the films deposited by the batch process were more randomly oriented and had lower crystallinity.

Id., p. 485. The MA CBD process comprises heating a deposition mixture for a period of time sufficient to form a reaction flux useful for forming a deposition material, providing a substrate, heating the substrate, and applying the deposition material to form a film on the substrate using a microchannel applicator. This process provides a substantially constant flux of reactant solution that allows control over the homogeneous reaction of the chemical bath solution before the solution impinges on the substrate. Transmission electron microscopy analysis indicates that an impinging flux without the formation of nanoparticles could be obtained. The continuous flow microreactor supplies a reactant flux with constant concentration that provides a higher nucleation density. This higher nucleation density made a significant difference in film coverage between the batch and a continuous flow microreactor processes.

Embodiments of a continuous flow microreactor system have been developed for performing CBD. FIG. 2 of the Ser. No. 11/490,966 application is a schematic diagram of one embodiment of a continuous flow microreactor CBD system. The system 10 includes a mixer, particularly a micromixer, such as an interdigital micromixer. Micromixers offer features that cannot be easily achieved using macroscopic devices, such as ultrafast mixing on the microscale. Fluids A and B to be mixed are introduced into the mixer, often as two counter-flowing fluid streams. For an interdigital micromixer, the two fluids A and B enter interdigital channels (30 µm in a working embodiment) and form plural interpenetrated substreams. The substreams exit the interdigital channels perpendicular to the direction of the feed flows, initially with a multilayered structure. Fast mixing through diffusion soon follows due to the small thickness of individual layers.

The continuous flow microreactor system includes a reactant source, typically plural reactant sources, such as reactant sources that are combined to form the deposition material or materials. In working embodiments, two syringe pumps (V6 module from Kloehn Ltd.) of 25 milliliters each were used for reactant streams A and B. Each pump had three ports (A, B, C). One port of each pump aspirated the reactant streams and one port was used for dispensing the same. Syringe pumps were fluidly coupled to mixer using polyetheretherketone (PEEK) conduits 22, 24 (1/16" OD, 0.03" ID from Upchurch Scientific).

For the embodiment illustrated in the '966 application, a commercial interdigital micromixer was used. This interdigital micromixer included a stainless steel (SS 316Ti) housing with inlaid, thermally oxidized silicon to form 30 µm×100 µm microchannels. Reactant streams A and B were pumped through PEEK conduits for mixing in the mixer.

The fluid mixture flowing from mixer comprises the chemical species useful for deposition. A conduit was immersed in a water bath to provide temperature control. Water bath generally was maintained at an effective temperature for processing. A person of ordinary skill in the art will appreciate that the effective temperature may vary depending on, for example, the composition of the deposition material. Moreover, the homogeneous chemistry of the impinging flux can be controlled by selecting various factors, such as the length of the channel, the flow rate through channel, residence time in channel, etc., and combinations thereof.

The fluid mixture formed by mixing fluids A and B was made to impinge on substrate. In the illustrated embodiment, the substrate was coupled to a metal plate. Certain embodiments of CBD are facilitated by heating. Thus, a heater can be provided to heat the substrate to a desired temperature.

Again with reference to FIG. 13 of the present disclosure, a final transparent conductive oxide layer 1360 is then deposited onto buffer layer 1358. In the illustrated embodiment, the transparent conductive oxide layer 1360 is zinc oxide. The transparent conductive oxide layer 1360 typically has a thickness of from about 1 to about 5 µm, more typically from about 1 to about 2 µm thick. The metal oxide layer 1360 can be formed by depositing a metal halide, such as $ZnCl_2$, and then oxidizing the halide to an oxide, such as by thermal processing in air or an oxygen-enriched environment.

An antireflective coating layer 1362 is then applied. One example of an antireflective material is $MgF_2$. The antireflective coating layer 1362 typically has a thickness of about 1,000 nanometers.

A person of ordinary skill in the art will appreciate that multiple such photovoltaic cells can be produced according to this process and electrically connected together to form photovoltaic modules or solar panels. A single module is enough to power an emergency telephone, but for a house or a power plant the modules must be arranged in arrays.

IX. Electronic Devices

A person of ordinary skill in the art will appreciate that many different electronic devices can be made using disclosed embodiments of the present invention. These electronic devices are exemplified herein primarily by reference to transistors, and circuits comprising such transistors. Many embodiments of working transistors have been made, including copper iodide, $ZnO$—$In_2O_3$ (ZIO), tin oxide, indium tin oxide, indium oxide, indium zinc tin oxide, CuAgI and CuCdI transistors.

However, there are other applications for disclosed embodiments of the present invention, including conductors (electrons, holes, and ions), semiconductors, and insulators. Light emitting materials also can be processed as described herein to make, for example, light emitting diodes. Thus, devices such as thin film photovoltaics, photodetectors, gas sensors, thin film batteries, X-ray imagers, etc. can be made using disclosed embodiments of the present invention.

Figure 14:
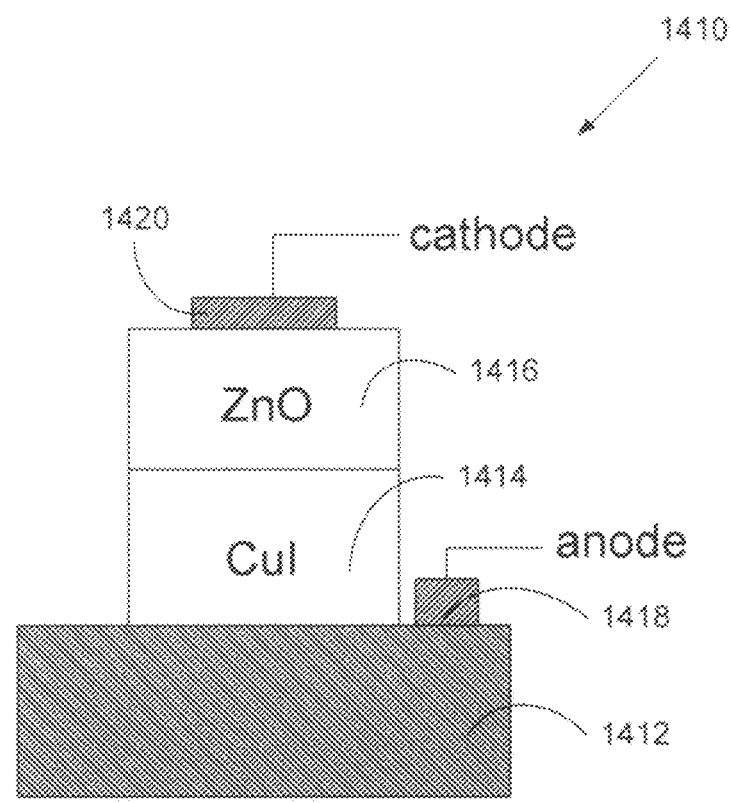
FIG. 14 is a schematic diagram of one embodiment of a UV light detector that can be made according to the present invention.

FIG. 14 illustrates one embodiment of a UV light detector 1410 that can be made according to the present invention. UV light detector 1410 includes a substrate later 1412. A first layer, such as a copper iodide layer, 1414 is solution deposited on substrate 1412. A second layer, such as a zinc oxide layer, 1416 is then solution deposited on layer 1414. UV light detector also includes anode portion 1418 and cathode portion 1420.

Figure 15:
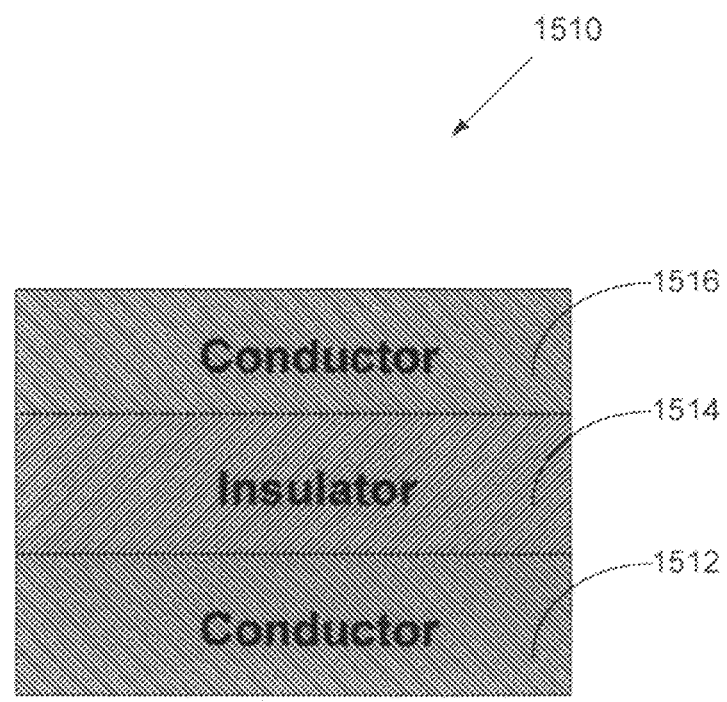
FIG. 15 is a schematic diagram of one embodiment of capacitor that can be made according to the present invention.

FIG. 15 illustrates a capacitor 1510 that can be made according to the present invention. Capacitor 1510 includes a first conductive layer 1512. An insulating layer 1514 can be solution deposited on a conductive layer 1512. Finally a second conductive layer 1516 can be deposited on insulating layer 1514 to form capacitor 1510.

Figure 16:
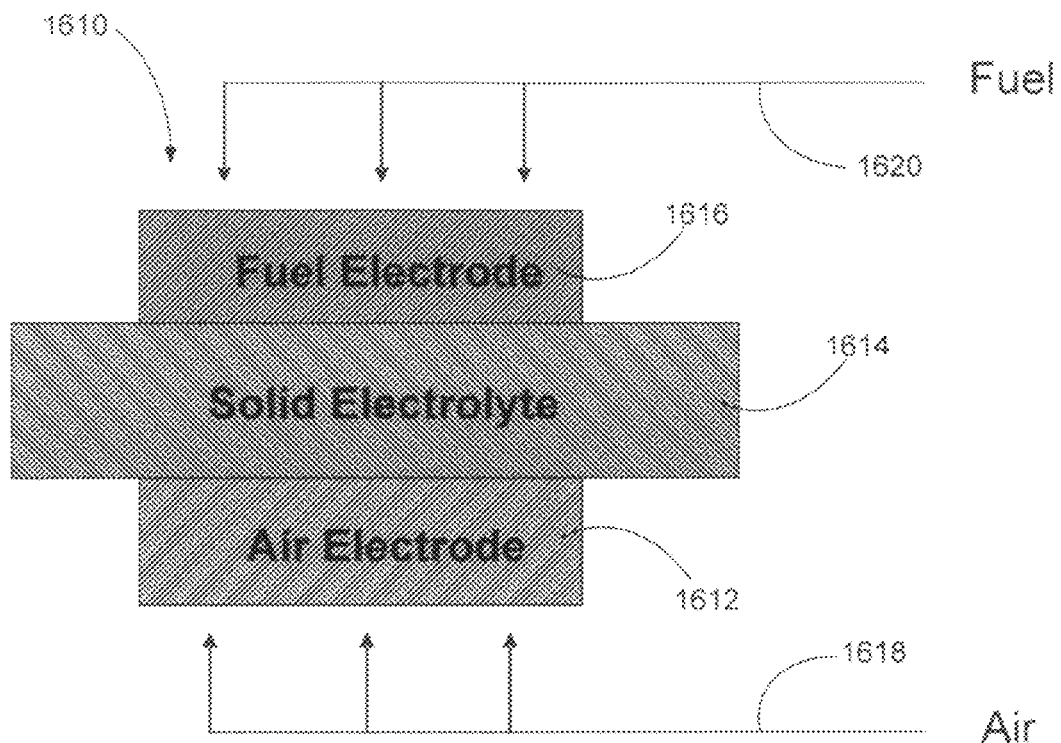
FIG. 16 is a schematic diagram of one embodiment of a solid electrolyte that can be made according to the present invention.

FIG. 16 is a schematic of one embodiment of a solid electrolyte that can be made according to the present invention. Solid electrolyte 1610 has three components, an air electrode 1612, a solid electrolyte 1614 and a fuel electrode 1616. Solid electrolyte layer 1614 can comprise a variety of materials. Solely by way of example, electrolyte layer 1614 can comprise $ZrO_2(CaO)$, $La(Sr) MnO_3$, $ZrO_2(Y_2O_3)$, $LaCr(Mg) O_3$, and combinations thereof. Air electrode 1612 receives an air stream 1618. Fuel electrode receives a fuel stream 1620.

Figure 17:
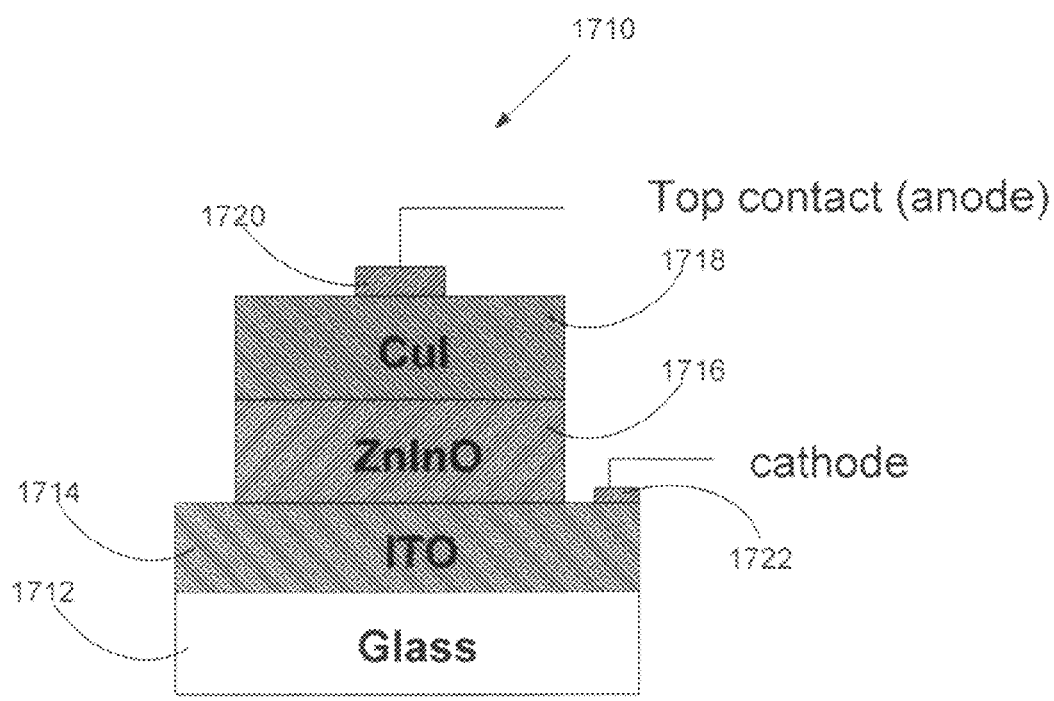
FIG. 17 is a schematic diagram of one embodiment of an LED that can be made according to the present invention.

FIG. 17 is a schematic diagram of a light emitting diode (LED) 1710 that can be made according to the present invention. LED 1710 includes a substrate 1712, such as a glass substrate. A first layer, such as an indium tin oxide layer 1714, is formed, such as by solution deposition on glass layer 1712. A second layer, such as a zinc indium oxide layer 1716, is formed on layer 1714. A third layer 1718, such as a copper iodide layer, is formed on layer 1716. LED also includes an anode layer 1720 and a cathode layer 1722.

Figure 18:
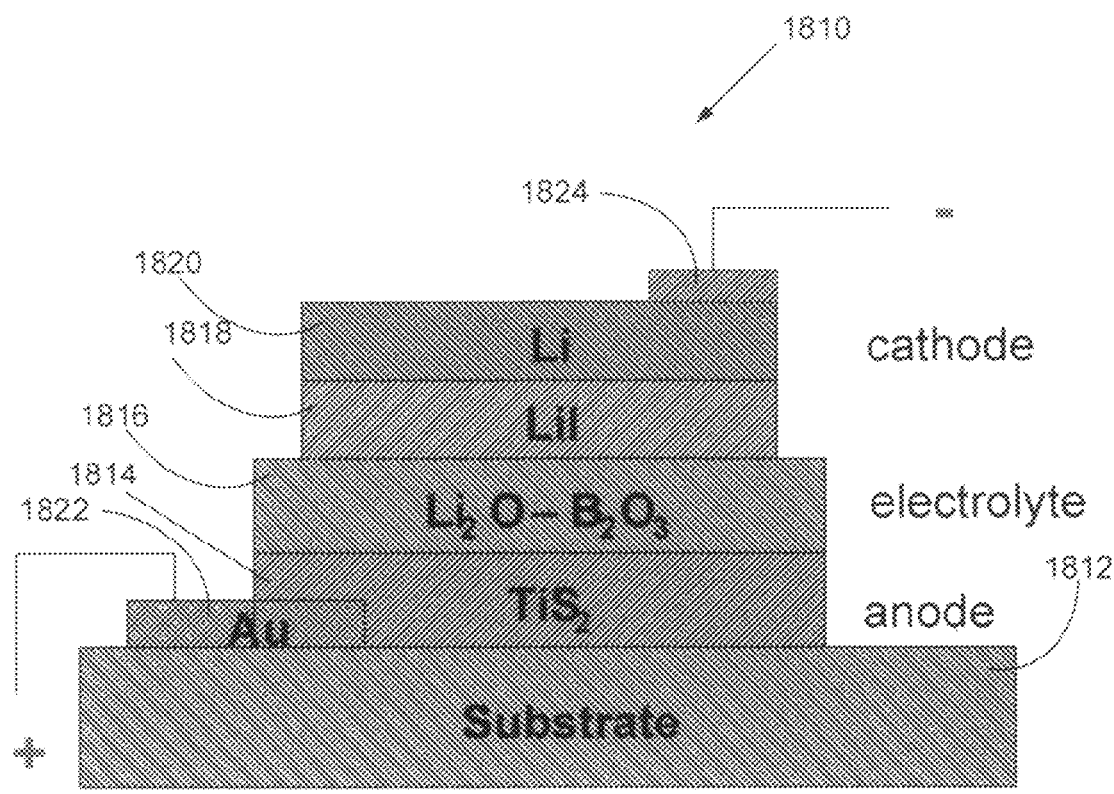
FIG. 18 is a schematic diagram of one embodiment of a thin film battery that can be made according to the present invention.

FIG. 18 is a schematic diagram of one embodiment of a thin-film battery 1810 that can be made according to the present invention. Thin-film battery 1810 includes a substrate layer 1812. Thin-film battery 1810 also includes an anode layer, such as a $TiS_2$ layer 1814. Thin-film battery 1810 also includes an electrolyte layer 1816, such as an $Li_2$—$B_2O_3$ layer. Lithium iodide layer 1818 is formed on top of layer 1816, followed by deposition of a cathode layer 1820, such as a lithium cathode layer. A thin-film battery also has contacts, such as gold cathode contact 1822 and anode contact 1824.

Figure 19:
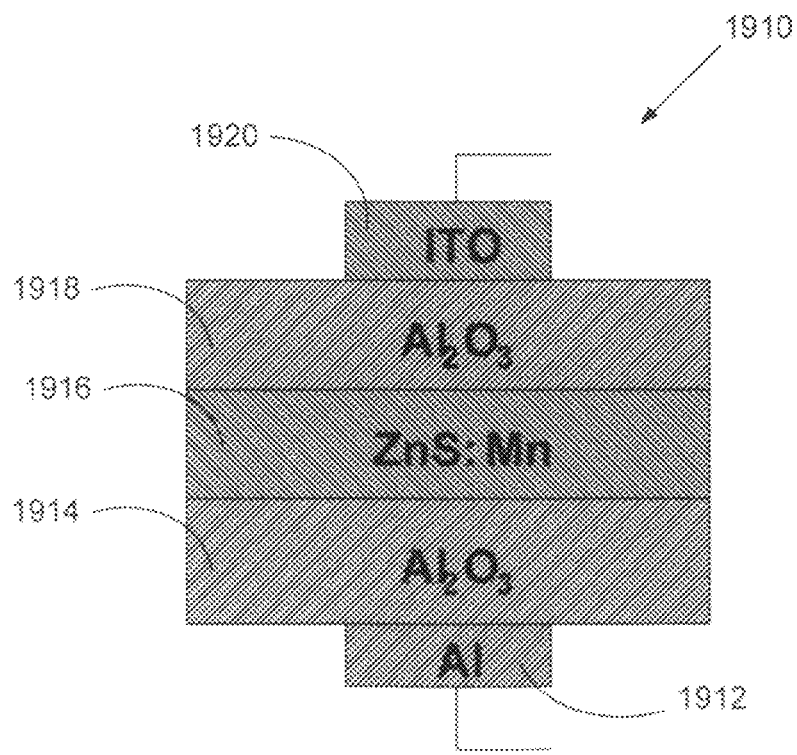
FIG. 19 is a schematic diagram of one embodiment of an electroluminescent device that can be made according to the present invention.

FIG. 19 is a schematic diagram of one embodiment of an electroluminescent device 1910 that can be made according to the present invention. Electroluminescent device 1910 includes a first layer 1912, such as an aluminum layer. A second layer 1914, such as an aluminum oxide layer $Al_2O_3$, can be formed upon the first layer 1912. A third layer 1916, such as a ZnS:Mn layer is formed on the second layer. A fourth layer 1918, such as an aluminum oxide layer, can be formed on layer 1916. Electroluminescent device 1910 also includes a layer 1920, such as an indium tin oxide layer. The zinc sulfide layer can be formed by first depositing a zinc chloride layer, followed by treating the zinc chloride layer with sulfiding agent, such as hydrogen sulfide, to produce zinc sulfide.

Figure 20:
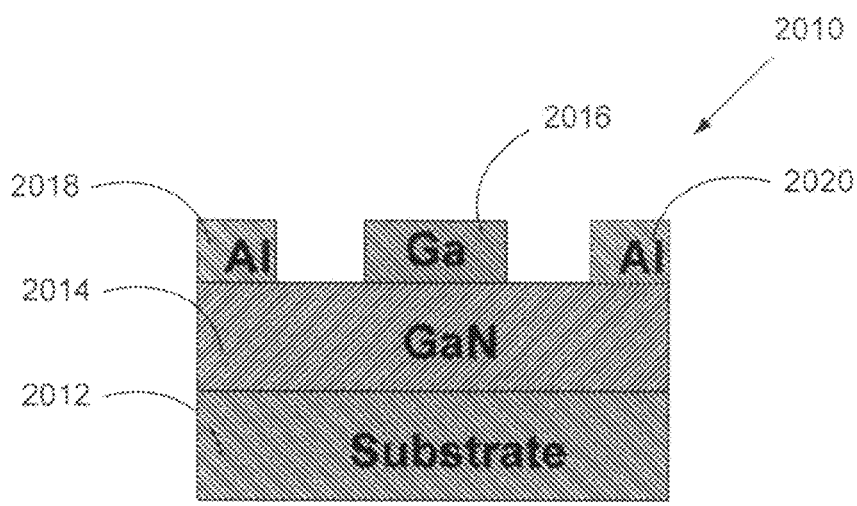
FIG. 20 is a schematic diagram of one embodiment of a MESFET that can be made according to the present invention.

FIG. 20 is a schematic diagram of one embodiment of a MESFET 2010 that can be made according to the present invention. MESFET 2010 includes a substrate layer 2012. MESFEST 2010 includes a second layer, such as a gallium nitride layer, GaN, 2014. Gallium nitride can be formed, for example, by treating a gallium iodide thin film with a nitriding agent, such as ammonia. A Shottkey gate 3516 is formed, along with contact layers 2018 and 2020.

Figure 21:
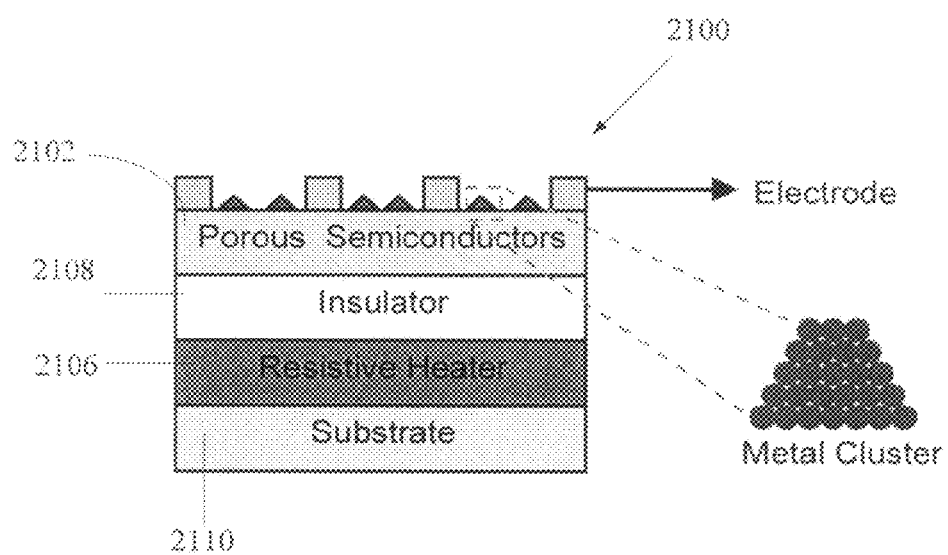
FIG. 21 is a schematic cross-sectional view of a typical thin film resistive gas sensor.
Figure 22:
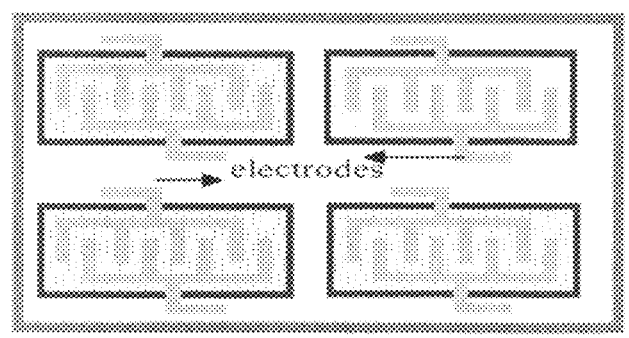
FIG. 22 is a plan view of electrodes used with the gas sensor of FIG. 21.

Semiconductor gas sensors operate primarily based on monitoring the conductance change caused by interaction of gas molecules with the semiconductor, such as oxygen chemisorption and its reaction with reducing gases. Thus, semiconductor thin film sensors are thin film resistors with a modulated electrical conductivity controlled by the gases in contact. A cross-session view of a typical thin film resistive gas sensor 2100 is shown in FIG. 21. The illustrated gas sensor comprises a semiconductor thin films (e.g. $SnO_2$, $WO_3$) 2102, with contact electrodes 2104 for measuring the conductance change, a thin film resistive heater (e.g. Pt, $RuO_2$) 2106 to operate the sensor at elevated temperature (the gas sensing is essentially a gas/solid reaction that is strongly depending on the temperature), an insulating layer 2108 to separate the semiconductor thin film and the conducting resistive heater, and a substrate layer 2110. Associated electrodes are illustrated in FIG. 22.

IX. EXAMPLES

The following examples are provided to exemplify particular features of working and/or hypothetical embodiments of the present invention. A person of ordinary skill in the art will appreciate that the invention is not limited to the particular features of such examples.

Example 1

This example describes thin film deposition of $ZnCl_2$ for use in fabricating inkjet-printed ZIO and IZTO thin films. $ZnCl_2$ powder was obtained from Alfa Aesar and used directly without further purification. A 0.015 molar $ZnCl_2$ solution in acetonitrile was then prepared. The solution was subjected to ultrasonic mixing for 10 minutes at ambient temperature in a 30 milliliter, pre-cleaned vial to provide a well mixed solution for printing.

A HP 1220C thermal inkjet printer was modified to allow placement of $Si/SiO_2$ substrates on a plastic tray, which were loaded from the back of the printer for deposition of thin film inorganic materials. The black ink cartridge was filled with $ZnCl_2$ solution (~10 milliliters) using a syringe. The cartridge was sealed with a metallic ball and loaded into the printer's cartridge holder. Microsoft Excel software was used to print the active layer with a desired pattern.

Desired substrate materials were then treated using a standard acetone/methanol/de-ionized water (AMD) pre-cleaning method. A nitrogen stream was used to dry the cleaned substrate, which was then loaded into the inkjet printer for printing. Spin coating was performed using a Specialty Coating System P-6708D spin coater operating at 8,000 rpm for 30 seconds.

Example 2

This example describes thin film deposition of $InCl_3$ for use in fabricating inkjet-printed thin films. $InCl_3$ powder was obtained from Alfa Aesar and used directly without further purification. A 0.015 molar $InCl_3$ solution in acetonitrile was then prepared. The solution was subjected to ultrasonic mixing for 10 minutes at ambient temperature in a 30 milliliter, pre-cleaned vial to provide a well mixed solution for printing.

A HP 1220C thermal inkjet printer was modified to allow placement of $Si/SiO_2$ substrates on a plastic tray, which were loaded from the back of the printer for deposition of thin film inorganic materials. The black ink cartridge was filled with $InCl_3$ solution (~10 milliliters) using a syringe. The cartridge was sealed with a metallic ball and loaded into the printer's cartridge holder. Microsoft Excel software was used to print the active layer with a desired pattern.

Desired substrate materials were then subjected to the AMD pre-cleaning process. A nitrogen stream was used to dry the cleaned substrate, which was then loaded into the inkjet printer for printing. Spin coating was performed using a Specialty Coating System P-6708D spin coater operating at 8,000 rpm for 30 seconds.

Example 3

This example describes thin film deposition of $SnCl_2$ for use in fabricating inkjet-printed thin films. $SnCl_2$ powder was obtained from Alfa Aesar and used directly without further purification. A 0.015 molar $SnCl_2$ solution in acetonitrile was then prepared. The solution was subjected to ultrasonic mixing for 10 minutes at ambient temperature in a 30 milliliter, pre-cleaned vial to provide a well mixed solution for printing.

A HP 1220C thermal inkjet printer was modified to allow placement of $Si/SiO_2$ substrates on a plastic tray, which were loaded from the back of the printer for deposition of thin film inorganic materials. The black ink cartridge was filled with SnCl$_2$ solution (—10 milliliters) using a syringe. The cartridge was sealed with a metallic ball and loaded into the printer's cartridge holder. Microsoft Excel software was used to print the active layer with a desired pattern.

Desired substrate materials were then subjected to the AMD pre-cleaning process. A nitrogen stream was used to dry the cleaned substrate, which was then loaded into the inkjet printer for printing. Spin coating was performed using a Specialty Coating System P-6708D spin coater operating at 8,000 rpm for 30 seconds.

Example 4

This example concerns one embodiment of a method for making a Metal-Insulator-Semiconductor Field Effect Transistors (MISFETs), illustrated schematically in FIG. 11, using ZnCl$_2$ thin film deposition. A heavily boron (p+) doped silicon substrate served as the gate and an inverted-gate structure was used. Silicon dioxide having a thickness of 100 nm was thermally grown on top of a silicon substrate. A 500-nanometer gold layer was sputtered on the backside of the Si substrate to form a gate contact. This structure was used to test device fabrication.

Semiconductor channel material was strip patterned using a designated layout that was generated using a Microsoft Excel software program in order to reduce the gate leakage current. A 10 to about 20 nanometer ZnCl$_2$ thin film was deposited on top of the SiO$_2$ by inkjet printing. After ZnCl$_2$ deposition, post deposition annealing was performed at 600° C. for 1 hour. This converted the ZnCl$_2$ thin film to a ZnO layer. 300-nanometer aluminum source and drain contacts were then evaporated on top of the ZnO layer through a shadow mask with channel width-to-length ratio of 7 and 12 (channel length equals 200 μm) to form the MISFET. Device characterization was performed in the dark at room temperature with an HP 4157B Semiconductor Parameter Analyzer.

Example 5

This example concerns one embodiment of a method for making a Metal-Insulator-Semiconductor Field Effect Transistors (MISFETs) using InCl$_3$ thin film deposition. A heavily boron (p+) doped silicon substrate served as the gate and an inverted-gate structure was used. Silicon dioxide having a thickness of 100 nm was thermally grown on top of a silicon substrate. A 500 nanometer gold layer was sputtered on the backside of the Si substrate to form a gate contact. This structure was used to test device fabrication.

Semiconductor channel material was strip patterned using a designated layout that was generated using a Microsoft Excel software program in order to reduce the gate leakage current. A 10 ~20 nanometer InCl$_3$ thin film was deposited on top of the SiO$_2$ by inkjet printing. After InCl$_3$ deposition, post deposition annealing was performed at 600° C. for 1 hour. This converted the InCl$_3$ thin film to In$_2$O$_3$. 300-nanometer aluminum source and drain contacts were then evaporated on top of the In$_2$O$_3$ layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented. The parameters characterized from the MISFETs including field effect mobility, drain current on-to-off ratio, and turn-on voltage.

Absorption and transmission analyses of the In$_2$O$_3$ thin films were measured at various wavelengths by a UV-Vis spectrophotometer (Ocean Optics Inc, USB 2000 optic spectrometer) for optical bandgap estimation and transmittance measurement, respectively. The surface morphology of the film was characterized by SEM (FEI Sirion XL30). The TEM sample was prepared by inkjet printed thin films directly on a TEM grid (Electron Microscopy Sciences, Dura SiN TEM grid). TEM analysis was performed using a FEI Tecnai F20 at 200 KV for high resolution images, structure (selected area electron diffraction) and chemical composition analysis (energy dispersive x-ray spectroscopy), respectively.

Example 6

This example concerns one embodiment of a method for making a Metal-Insulator-Semiconductor Field Effect Transistors (MISFETs) using SnCl$_2$ thin film deposition. A heavily boron (p+) doped silicon substrate served as the gate and an inverted-gate structure was used. Silicon dioxide having a thickness of 100 nm was thermally grown on top of a silicon substrate. A 500 nanometer gold layer was sputtered on the backside of the Si substrate to form a gate contact. This structure was used to test device fabrication.

Semiconductor channel material was strip patterned using a designated layout that was generated using a Microsoft Excel software program in order to reduce the gate leakage current. A 10~20 nanometer SnCl$_2$ thin film was deposited on top of the SiO$_2$ by inkjet printing. After SnCl$_2$ deposition, post deposition annealing was performed at 600° C. for 1 hour. This converted the SnCl$_2$ thin film to SnO. 300-nanometer aluminum source and drain contacts were then evaporated on top of the SnO layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented. The parameters characterized from the MISFETs including field effect mobility, drain current on-to-off ratio, and turn-on voltage.

Absorption and transmission analyses of the SnO thin films were measured at various wavelengths by a UV-Vis spectrophotometer (Ocean Optics Inc, USB 2000 optic spectrometer) for optical bandgap estimation and transmittance measurement, respectively. The surface morphology of the film was characterized by SEM (FEI Sirion XL30). The TEM sample was prepared by inkjet printed thin films directly on a TEM grid (Electron Microscopy Sciences, Dura SiN TEM grid). TEM analysis was performed using a FEI Tecnai F20 at 200 KV for high resolution images, structure (selected area electron diffraction) and chemical composition analysis (energy dispersive x-ray spectroscopy), respectively.

Example 7

Figure 23:
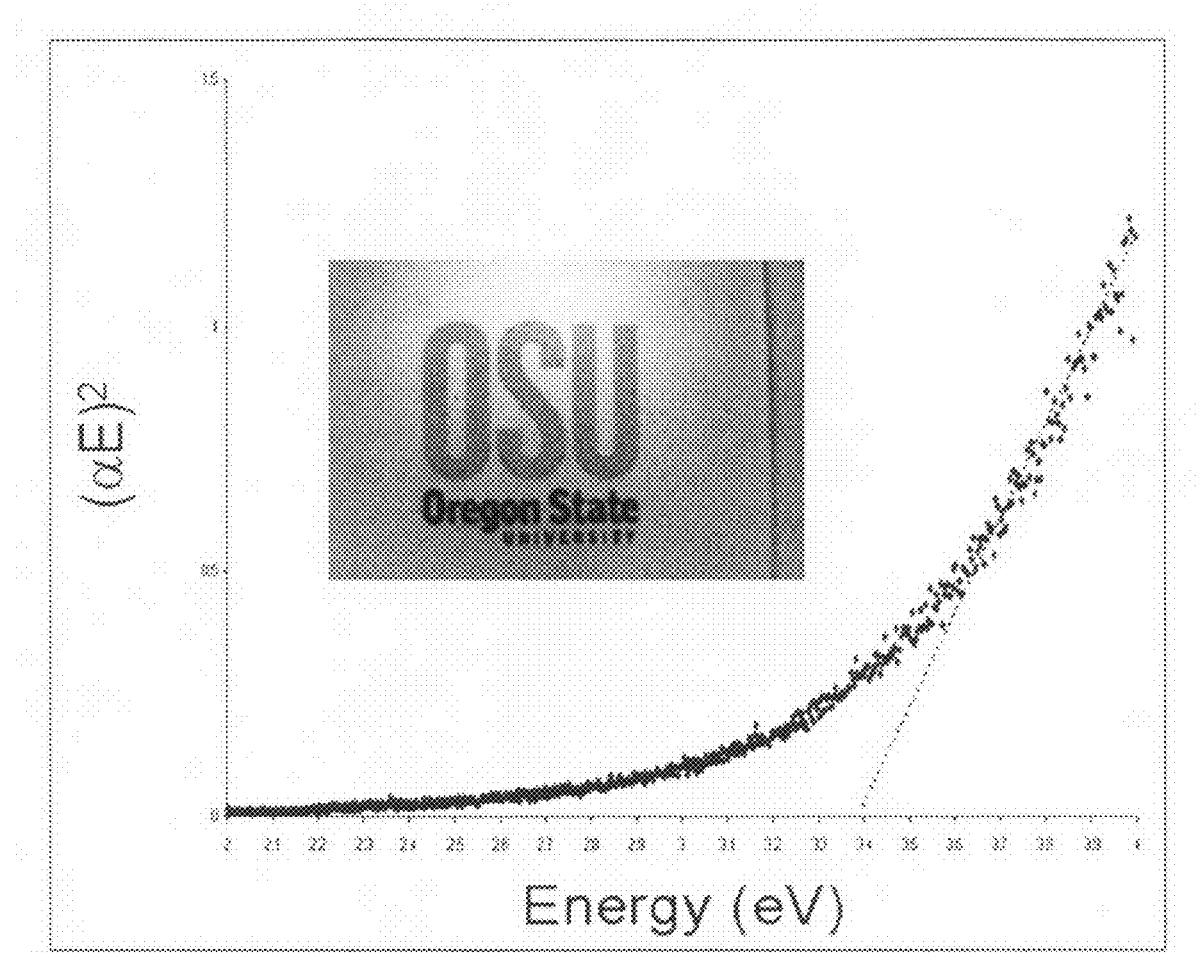
FIG. 23 is a UV-Vis absorption measurement (optical transmittance, bandgap estimation and optical image) for an inkjet-printed ZIO thin film made according to Example 7.

ZIO thin films were formed for optical evaluation. The ZIO precursor solution was prepared by dissolving 0.015 M of ZnCl$_2$ and InCl$_3$ in 25 ml acetonitrile. This solution was inkjet printed on glass slides. The UV-Vis absorption spectrum for the inkjet-printed ZIO thin film is provided by FIG. 23. The optical bandgap of the ZIO thin film was estimated to be 3.4 eV from the UV-Vis absorption spectra. This value is compared to a reported ZIO bandgap value of 3.7 eV. Hara, H., Shiro, T. Yatabe, T., "Optimization and properties of Zn doped indium oxide films on plastic substrate," *Jpn. J. Appl. Phys.* 43(2), 745-749 (2004). Transmittance of the ZIO thin film measured in the wavelength range from 300 to 800 nm indicates a highly transparent ZIO thin film with an average value of 85% beyond 400 nm. The image (inset) shows the transparency of obtained ZIO thin film.

Figure 24:
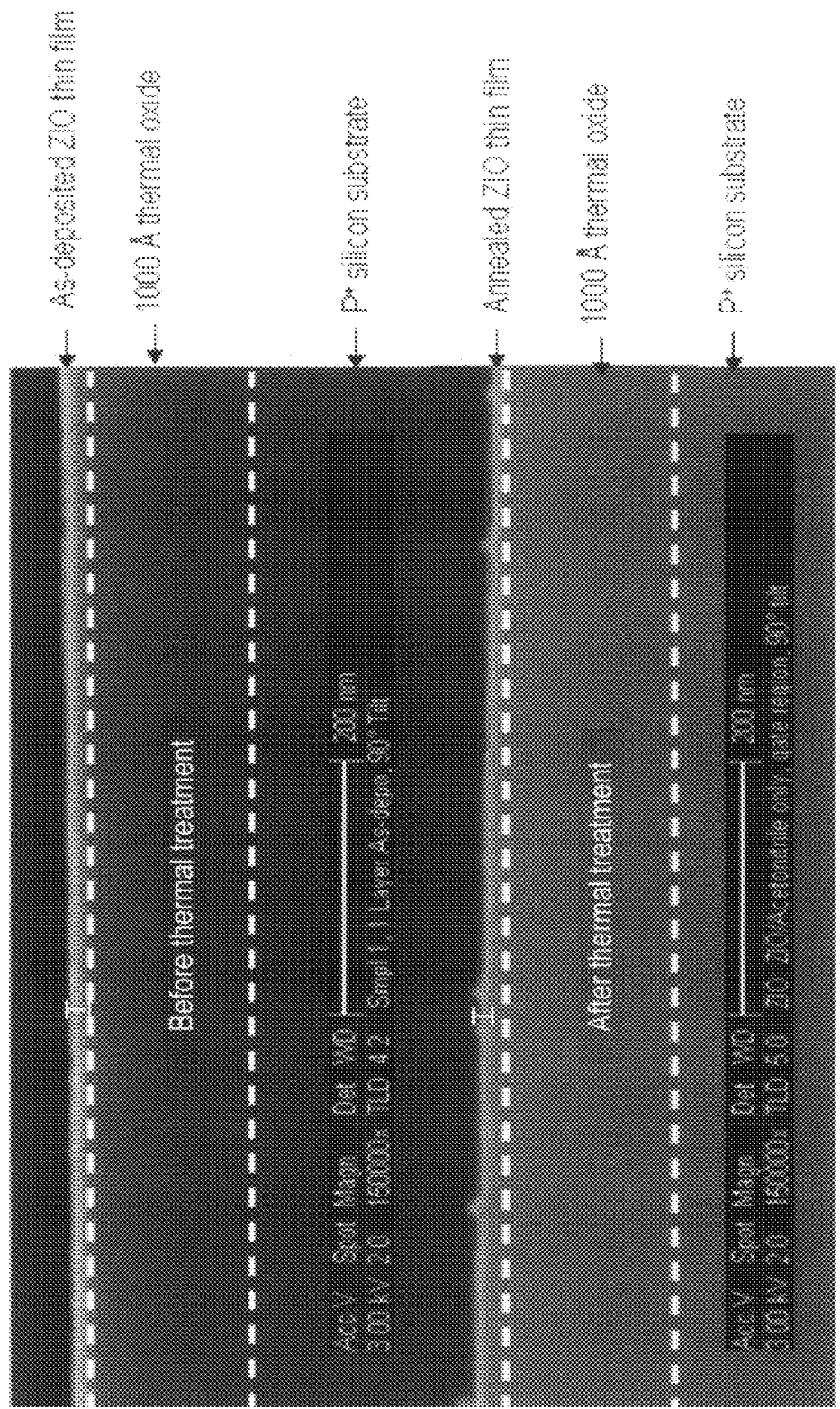
FIG. 24 provides cross-sectional SEM images for as-deposited ZIO thin films and after annealed $ZnO$—$In_2O_3$ (ZIO) thin films made according to Example 7.

ZIO thin film precursor and ZIO thin film after thermal treatment at 600° C. for 1 hour was characterized by Scanning Electron Microscopy (SEM) as provided by FIG. 24. An average thickness of about 11 nanometers for a single layer deposition can be measured from the cross-sectional SEM micrograph. Some particular defects could be observed on the surface of the channel layer in some cases (supplement). These defects may be caused by poor printing control, and non-uniform wetting and drying during the printing process.

Figure 25:
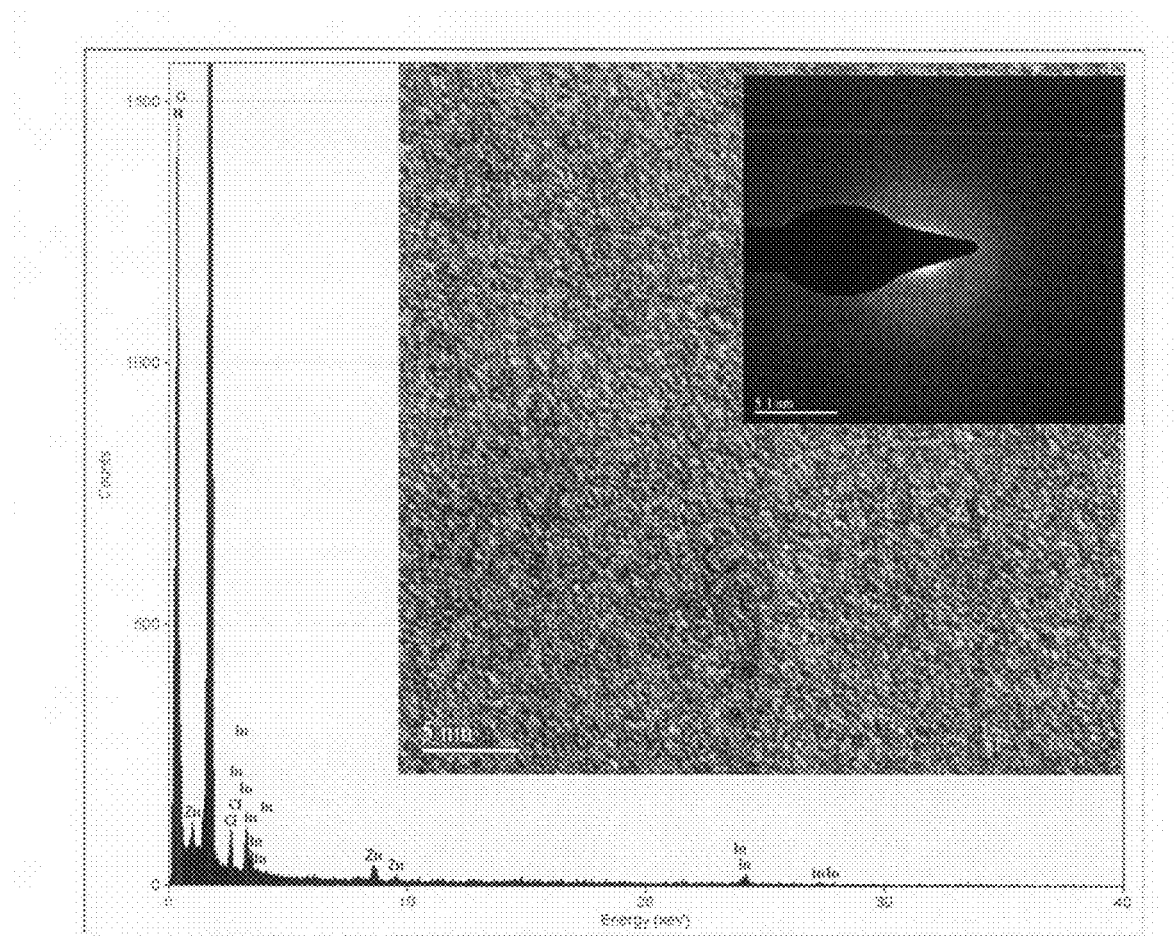
FIG. 25 is TEM micrograph, electron diffraction pattern (inset) and EDX analysis of a ZIO thin film made according to Example 7.

No clear crystalline patterns were observed in the high resolution TEM micrograph of FIG. 25. The TEM and the electron diffraction pattern (inset) of FIG. 16 both indicate the amorphous structure of the inkjet printed ZIO thin films. The Energy Dispersive X-ray (EDX) spectra of FIG. 16 clearly show the presence of Zn, In and O in the printed thin film. The Si and N peaks represent the background $Si_3N_4$ TEM grid.

Absorption and transmission analyses of the ZnO thin films were measured at various wavelengths by a UV-Vis spectrophotometer (Ocean Optics Inc, USB 2000 optic spectrometer) for optical bandgap estimation and transmittance measurement, respectively. The surface morphology of the film was characterized by SEM (FEI Sirion XL30). The TEM sample was prepared by inkjet printed thin films directly on a TEM grid (Electron Microscopy Sciences, Dura SiN TEM grid). TEM analysis was performed using a FEI Tecnai F20 at 200 KV for high resolution images, structure (selected area electron diffraction) and chemical composition analysis (energy dispersive x-ray spectroscopy), respectively.

Example 8

This example concerns one embodiment of a method for making a ZIO MISFET Metal-Insulator-Semiconductor Field Effect Transistors (MISFETs). Inkjet printed ZIO thin films have been used to form channel layers for the fabrication of Metal-Insulator-Semiconductor Field Effect Transistors (MISFETs). The ZIO precursor solution was prepared by dissolving 0.015 M of $ZnCl_2$ and $InCl_3$ in 25 ml acetonitrile. A ZIO MISFET was fabricated from a ZIO active channel layer that was deposited by a double inkjet printing process on an oxidized silicon substrate using the solution of $ZnCl_2$ and $InCl_3$ in acetonitrile. The inkjet printed films were subjected to a post annealing process at 600° C. for 1 hour. FIG. 11 is a schematic cross-sectional view of the ZIO MISFET structure.

Figure 26:
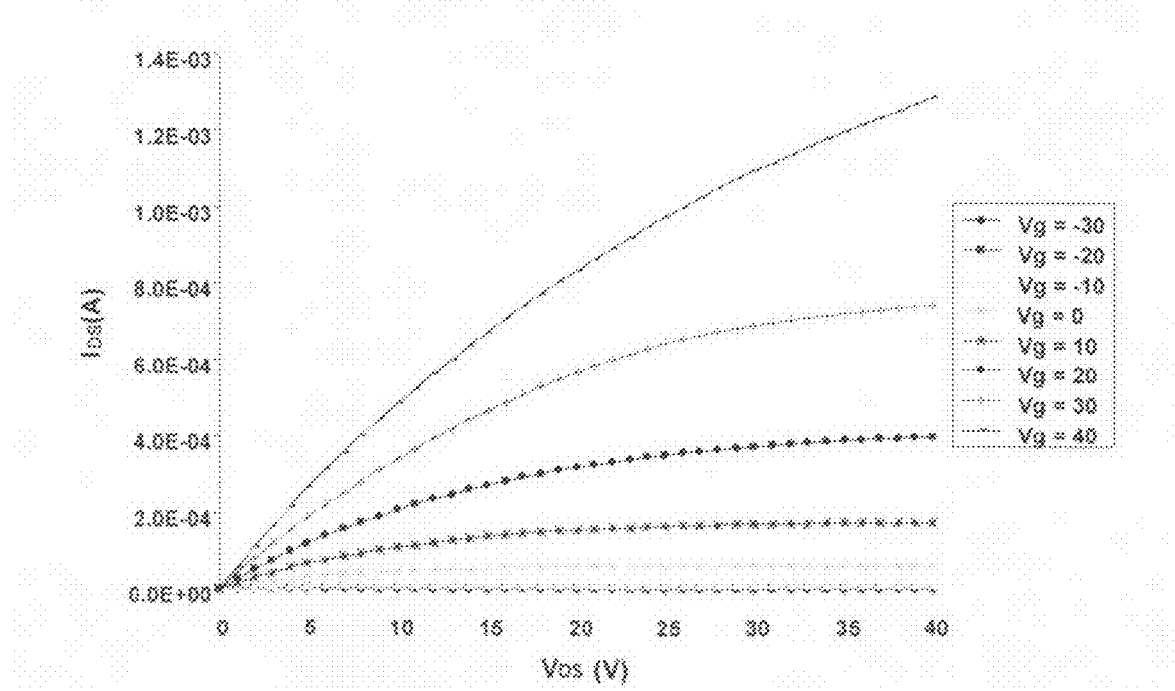
FIG. 26 provides the drain current-drain voltage ($I_{DS}$-$V_{DS}$) output characteristics for a $ZnO$—$In_2O_3$ (ZIO) MISFET made according to Example 8.

The drain current-drain voltage ($I_{DS}$-$V_{DS}$) output characteristics for the ZIO MISFET with a channel width-to-length ratio of 7 (channel length equals 200 μm) are presented in FIG. 26. The transistors exhibit very good gate-modulated behavior. The MISFET device parameters, including the field effect mobility, the drain current on-to-off ratio, and the turn-on voltage, have been determined. The mobility of a MISFET refers to the carrier mobility that is proportional to the carrier velocity in an electric field. See, Pierret, R. F., "Field Effect Devices," ($2^{nd}$ edn), Addison-Wesley Publishing Company, Inc., New York (1990). The field-effect mobility ($\mu_{FE}$) for this device is 7.37 $cm^2/V \cdot sec$, which is determined from the transconductance of the device at $V_{DS}$=1 V to ensure a mobility extracted from the linear region. Schroder, D. K., "Semiconductor Material and Device Characterization," ($2^{nd}$ edn), John Wiley & Sons, Inc., New York (1998).

Figure 27:
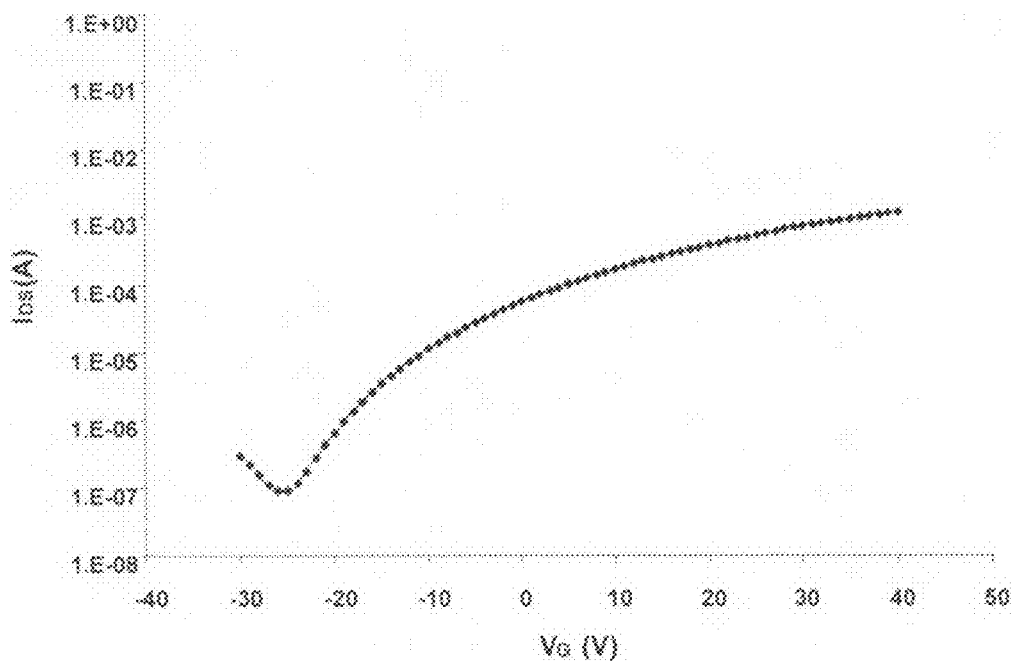
FIG. 27 provides the drain current-gate voltage (Log ($I_{DS}$)—$V_{GS}$) transfer characteristics at $V_{DS}$=40 V for the $ZnO$—$In_2O_3$ (ZIO) MISFET made according to Example 8.

The drain current on-to-off ratio determines the switching quality of the MISFET. FIG. 27 shows the Log($I_{DS}$)-$V_{GS}$ transfer characteristics at $V_{DS}$=40 V. These data indicate a drain current on-to-off ratio of approximately $10^4$ with a turn-on voltage at −26 V. With a negative turn on voltage, this device behaves as a depletion-mode device that is initially on and requires a negative gate voltage to fully turn off the device. Hoffman, R. L., "ZnO-channel thin-film transistors: channel mobility," *J. Appl. Phys.* 95, 5813-5819 (2004). Turn on voltage was used here, instead of threshold voltage, to determine the minimum required voltage in order to induce current in the active layer. The threshold voltage value extrapolated from the linear portion at $V_{DS}$=1 V of $I_{DS}$-$V_{GS}$ or at $V_{DS}$=40V of $I^{1/2}_{DS}$-$V_{GS}$ plot sometimes is arbitrary and had been discussed in a recent reported literature. Id. The threshold voltage value usually is higher than the turn-on voltage for embodiments of devices disclosed herein due to the assumption that the mobility is independent of the applied gate voltage. Schroder, D. K. *Semiconductor Material and Device Characterization* ($2^{nd}$ edn), John Wiley & Sons, Inc., New York (1998). For disclosed devices the mobility usually increases with applied gate voltage. As a result, using turn-on voltage to determine the minimum required gate voltage to produce a conductive channel is more appropriate. The field effect mobility obtained from the inkjet printed ZIO MISFET is much higher than previous reported inkjet printed transistors. This establishes that high performance inkjet printed electronic devices can be fabricated using this new process.

Example 9

Blanket coating processes, such as spin coating, also have been evaluated. ZIO precursor solutions (0.01M $ZnCl_2$ and 0.02M $InCl_3$) were spun on top of an $Si/SiO_2$ substrate at 8,000 rpm for 30 seconds. The substrate and deposited ZIO thin film were then subjected to a post annealing process at 600° C. for 1 hour. Inverted-gate ZIO MISFETs were fabricated on oxidized silicon substrates having the structure illustrated schematically in FIG. 11. A spin-coated ZIO MISFET made according to this example, having a channel width-to-length ratio of 12 (channel length equals 200 μm), had a relatively high field-effect mobility ($\mu_{FE}$), $\mu_{FE} \cong 16.13$ $cm^2/V$-sec; a drain current on-to-off ratio of approximately $10^4$; and a turn-on voltage at −32 V.

Example 10

Figure 28:
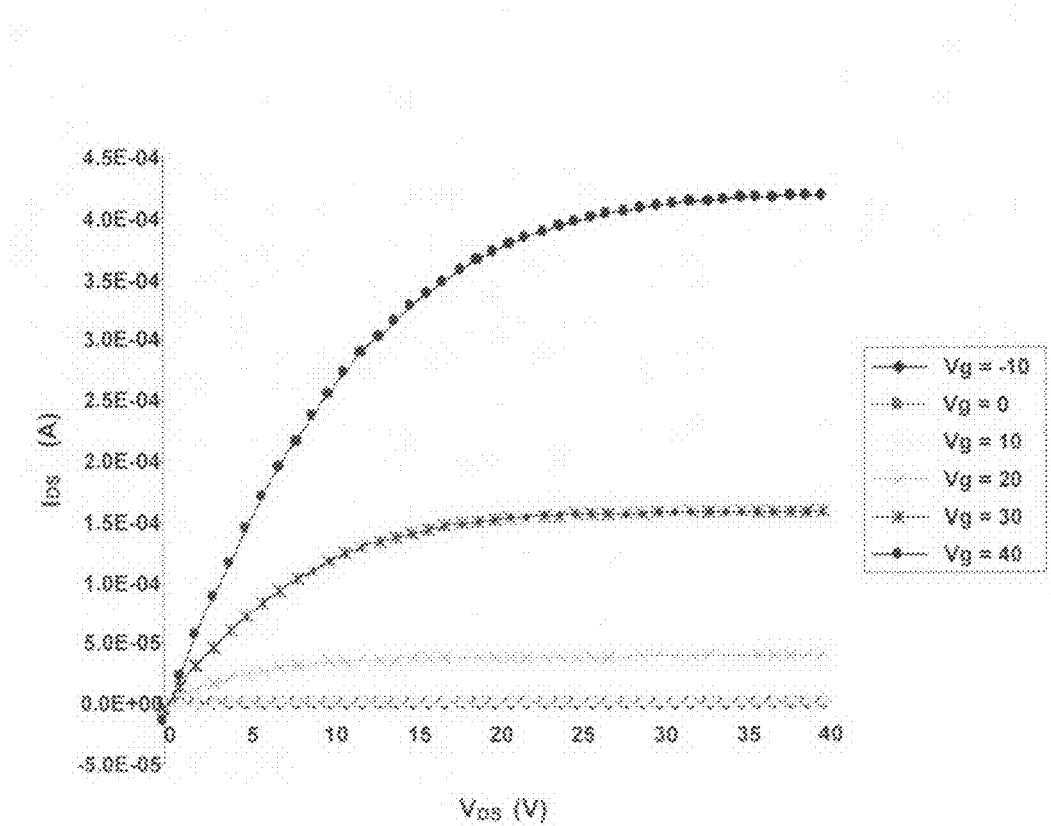
FIG. 28 provides the drain current-drain voltage ($I_{DS}$-$V_{DS}$) output characteristics for an inkjet printed $In_2O_3$—$ZnO$—$SnO_2$ (IZTO) MISFET made according to Example 10.
Figure 29:
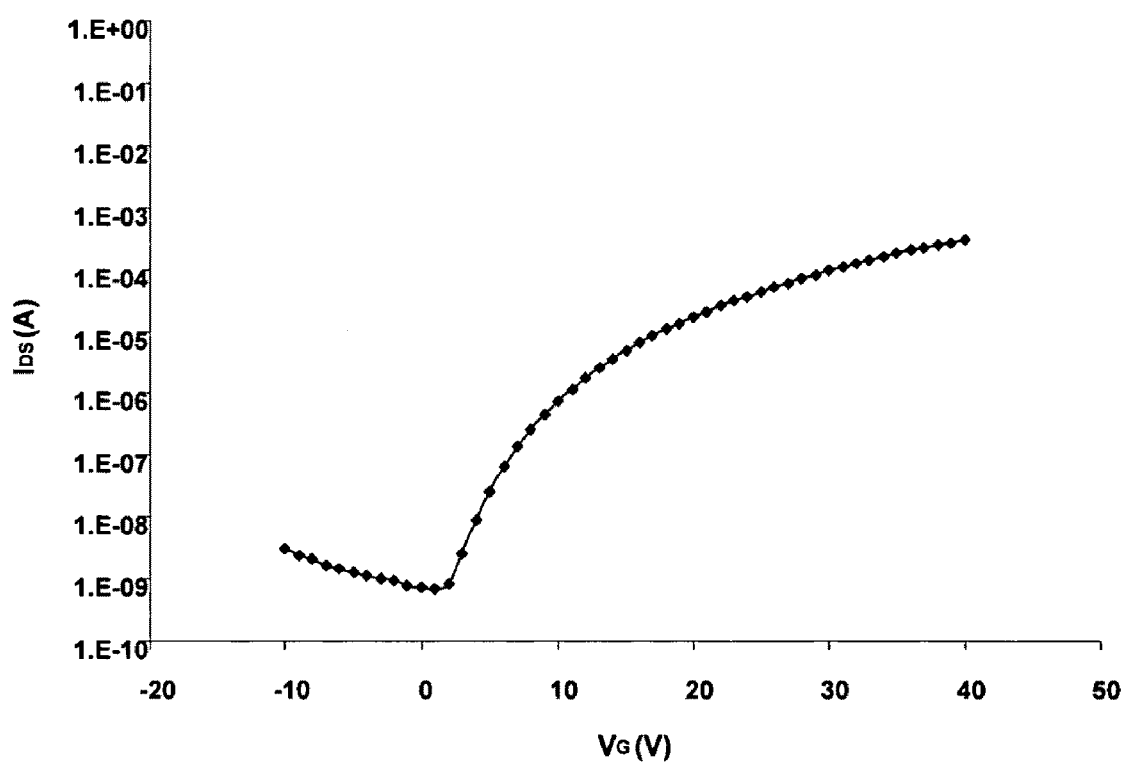
FIG. 29 provides the drain current-gate voltage (Log ($I_{DS}$)—$V_{GS}$) transfer characteristics at $V_{DS}$=40 V for an inkjet printed $In_2O_3$—$ZnO$—$SnO_2$ (IZTO) MISFET made according to Example 10.

Multi-component materials can be used to tailor the electrical, optical, physical and chemical properties of TCO films by altering the chemical composition. For example, IZTO thin films have been inkjet printed using a precursor solution of $InCl_3$, $ZnCl_2$ and $SnCl_2$ in acetonitrile. Without any process optimization, the overall device performance for the inkjet printed IZTO MISFET is good. FIG. 28 shows the drain current-drain voltage ($I_{DS}$-$V_{DS}$) output characteristics for an IZTO MISFET having a channel width-to-length ratio of 12 (channel length equals 200 μm). This IZTO MISFET has a good gate-modulated transistor behavior with a hard saturation. The field-effect mobility ($\mu_{FE}$) for this device is $\mu_{FE} \cong 3.87$ $cm^2/V$-sec. FIG. 29 shows the Log($I_{DS}$)-$V_{GS}$ transfer characteristics at $V_{DS}$=40 V. These data establish a drain current on-to-off ratio of approximately $10^6$ with a turn-on voltage of 1 V. With a positive turn-on voltage, this device behaves as an enhancement-mode device and the relatively large drain current on-to-off ratio indicates that it can function well as a switch.

Example 11

Figure 30:
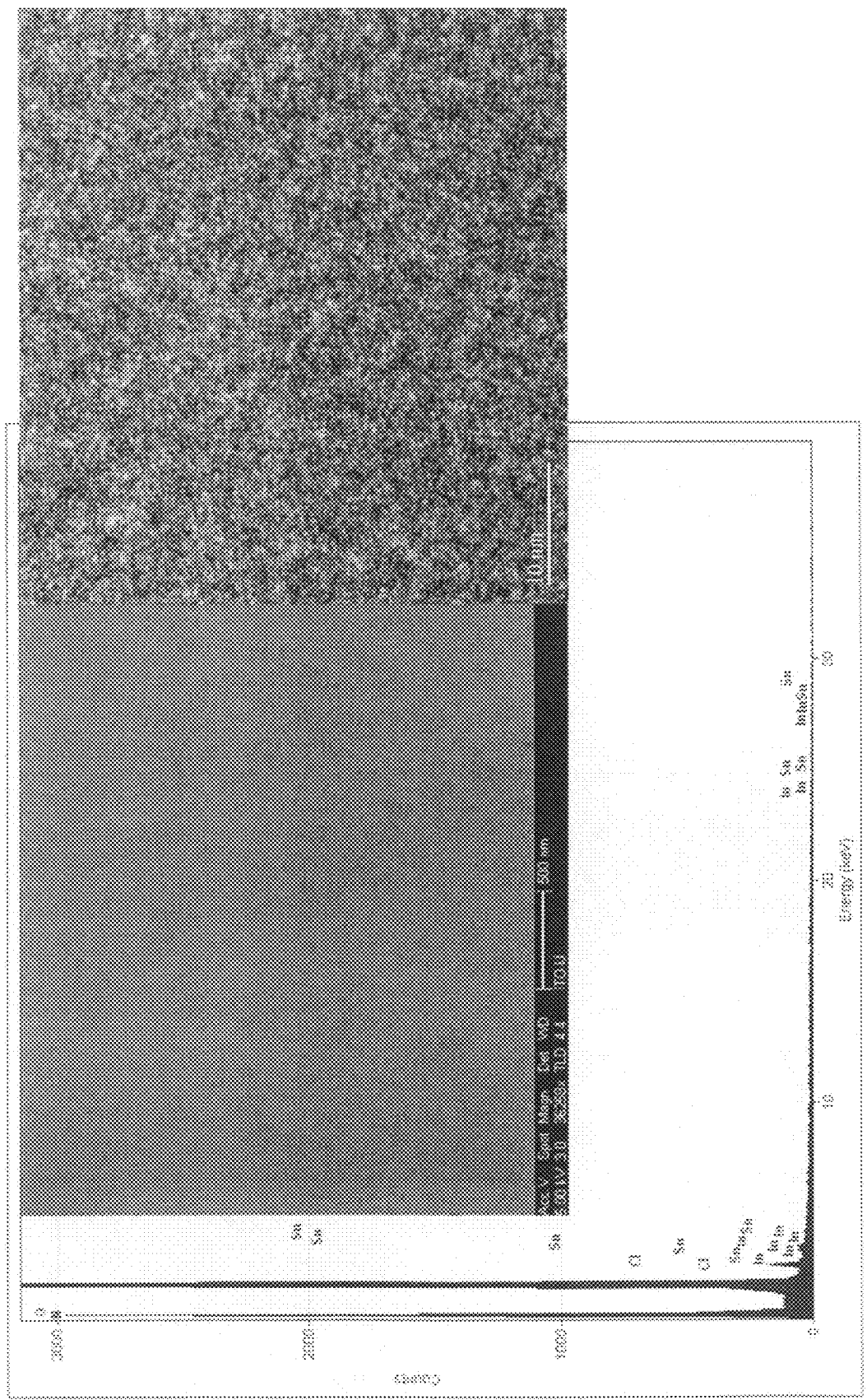
FIG. 30 provides a TEM micrograph, electron diffraction pattern and an EDX analysis of an $In_2O_3$—$SnO_2$ (ITO) thin film used to make an $In_2O_3$—$SnO_2$ (ITO) MISFET according to Example 11.

An ITO MISFET also has been made by spin coating. The output characteristics of the spin-coated ITO MISFET with a channel width-to-length ratio of 7 (channel length equals 200

μm) shows a relatively high field-effect mobility ($\mu_{FE}$) of 30.21 cm$^2$/V–sec, a drain current on-to-off ratio of approximately 10$^5$ and a turn-on voltage of –15 V. FIG. 30 provides a TEM micrograph, electron diffraction pattern and an EDX analysis of an In$_2$O$_3$—SnO$_2$ (ITO) thin film used to make the In$_2$O$_3$—SnO$_2$ (ITO) MISFET according to this example.

Example 12

Figure 31:
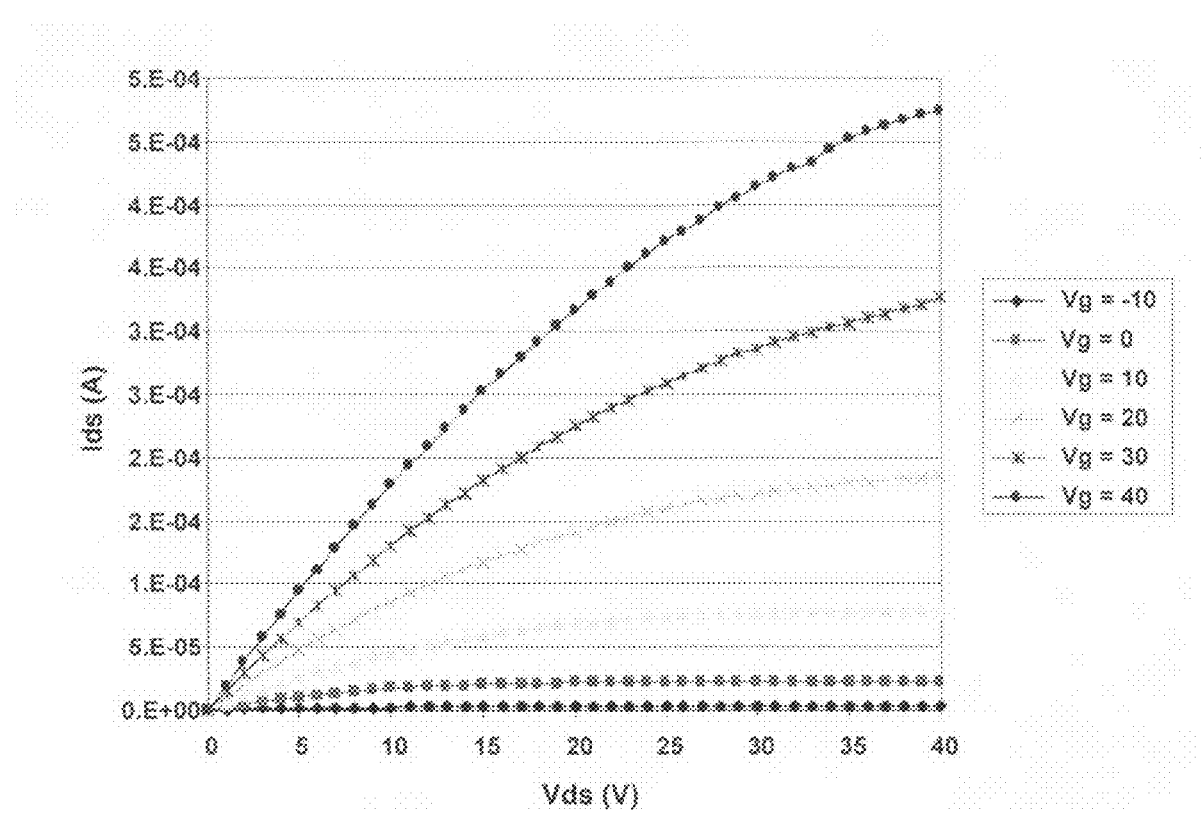
FIG. 31 provides the drain current-drain voltage ($I_{DS}$-$V_{DS}$) output characteristics for an $In_2O_3$—$SnO_2$ (ITO) MISFET made according to Example 12.
Figure 32:
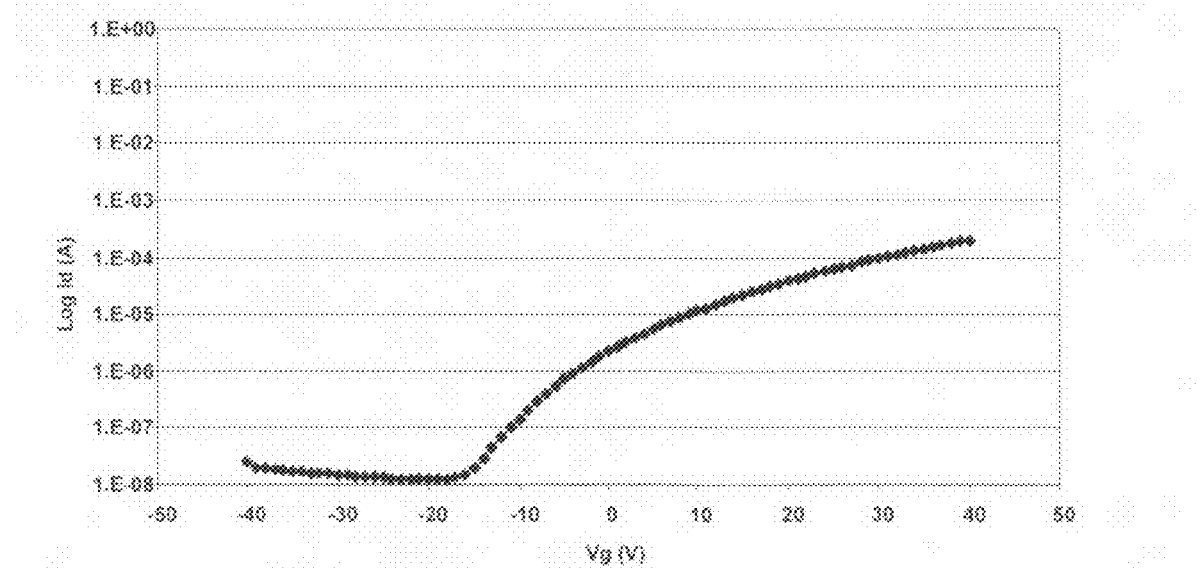
FIG. 32 provides drain current-gate voltage (Log($I_{DS}$)—$V_{GS}$) transfer characteristics at $V_{DS}$=40 V for an $In_2O_3$—$SnO_2$ (ITO) MISFET made according to Example 12.

An ITO MISFET has been made by inkjet printing too. The drain current-drain voltage ($I_{DS}$-$V_{DS}$) output characteristics and, drain current-gate voltage (Log($I_{DS}$)-$V_{DS}$) transfer characteristics at $V_{DS}$=40 V for the ITO MISFET of this example are provided by FIGS. 31 and 32, respectively. The ITO MISFET had a field effect mobility ($\mu_{FE}$) of 2.03 cm$^2$/V·sec., a turn on voltage at –20 volts, and a current on/off ratio of about 1e4. The inkjet printed ITO TFT showed inferior device performance compared to the device fabricated by spin coating the channel layer. But optimization of the inkjet printing process should lead to inkjet printed TFTs having better performance.

Example 13

This example describes thin film deposition of CuI for use in fabricating inkjet-printed and spin-coated CuI thin films. CuI powder was obtained from Alfa Aesar and used directly without further purification. A 0.153 molar CuI solution in acetonitrile was then prepared. The solution was subjected to ultrasonic mixing for 10 minutes at ambient temperature in a 30 milliliter, pre-cleaned vial to provide a well mixed solution for printing and spin coating.

An HP 1220C thermal inkjet printer was modified to allow placement of Si/SiO$_2$ substrates on a plastic tray, which were loaded from the back of the printer, for deposition of thin film inorganic materials. The black ink cartridge was filled with CuI solution (~10 milliliters) using a syringe. The cartridge was sealed with a metallic ball and loaded into the printer's cartridge holder. Microsoft Excel software was used to print the active layer with a desired pattern.

Desired substrate materials were then treated using a standard acetone/methanol/de-ionized water (AMD) pre-cleaning method. A nitrogen stream was used to dry the cleaned substrate, which was then loaded into the inkjet printer for printing.

Desired substrate materials were first ultrasonicated using a 1 M NaOH solution for 10 minutes following by rinsing with deionized-water. A nitrogen stream was used to dry the cleaned substrates. Spin coating was performed using a Specialty Coating System P-6708D spin coater operating at 8,000 rpm for 30 seconds.

Example 14

This example concerns one embodiment of a method for making a Metal-Insulator-Semiconductor Field Effect Transistors (MISFETs) using CuI thin film deposition. A heavily boron (p+) doped silicon substrate served as the gate and an inverted-gate structure was used. Silicon dioxide having a thickness of 100 nm was thermally grown on top of a silicon substrate. A 500-nanometer gold layer was sputtered on the backside of the Si substrate to form a gate contact. This structure was used to test device fabrication.

Figure 33:
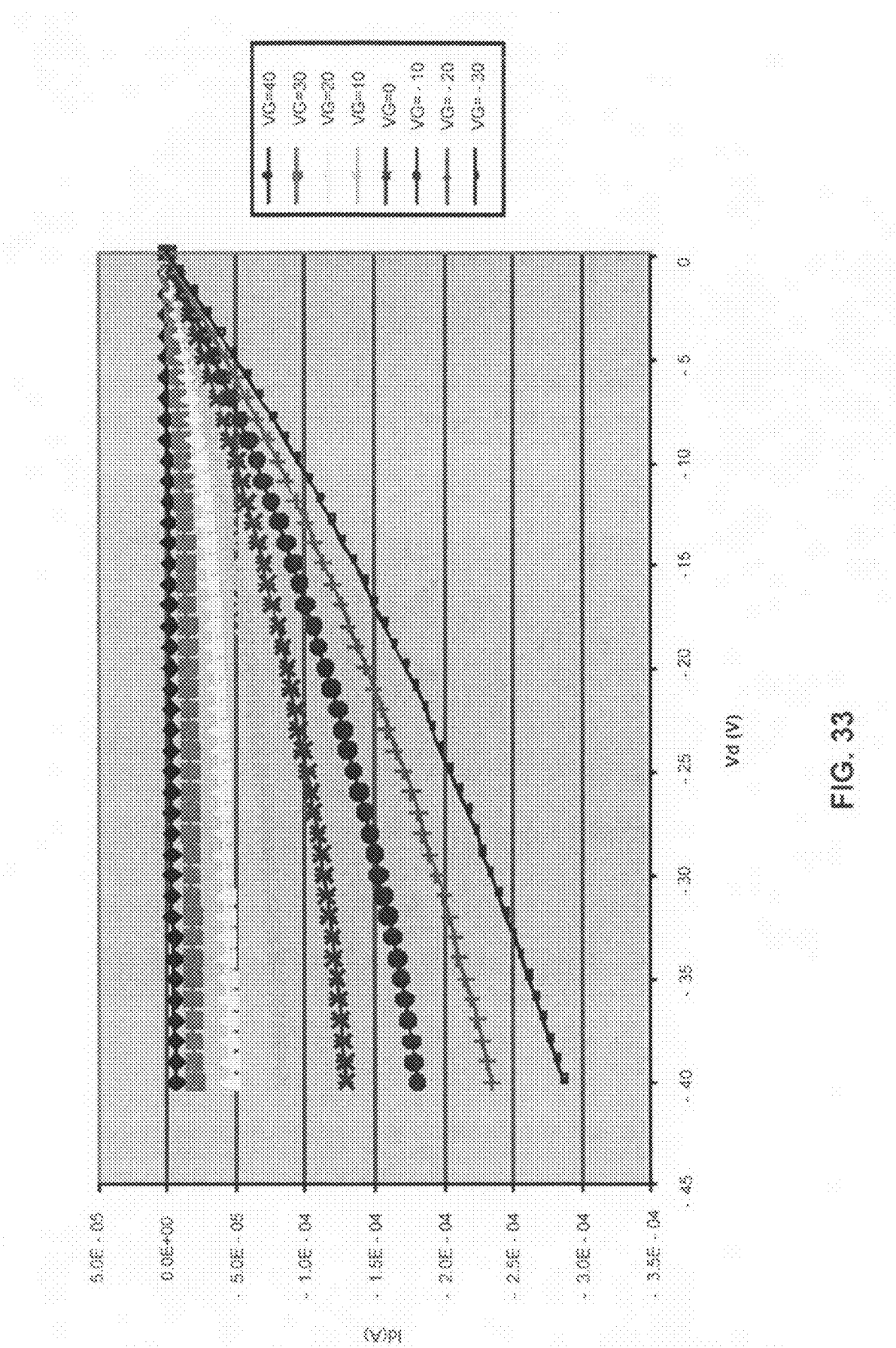
FIG. 33 provides the drain current-drain voltage ($I_{DS}$-$V_{DS}$) for a CuI MISFET according to Example 14.

Semiconductor channel material was strip patterned using a designated layout that was generated using a Microsoft Excel software program in order to reduce the gate leakage current. A ~30 nanometer CuI thin film was deposited on top of the SiO$_2$ by inkjet printing. No further post deposition annealing process was performed after CuI deposition. The CuI thin film growth mechanism is subject to direct dissolution and recrystallization after solvent evaporation in air. The 100-nanometer gold source and drain contacts were then evaporated on top of the CuI layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented in FIG. 33. Ambient moisture will be absorbed by the CuI thin films, which increases the conductivity. Moisture therefore was removed from the CuI thin film by preheating the substrate on a hotplate heated to a temperature of about 200° C. for 5 minutes before device characterization.

Example 15

This example describes thin film deposition of CuCdI for use in fabricating inkjet-printed and spin-coated CuCdI thin films. CuI powder was obtained from Alfa Aesar and used directly without further purification. A 0.04 M of CuI and CdI (1 to 1 mole ratio) solution in acetonitrile was then prepared. The solution was subjected to ultrasonic mixing for 10 minutes at ambient temperature in a 30 milliliter, pre-cleaned vial to provide a well mixed solution for printing and spin coating.

Desired substrate materials were treated using a standard acetone/methanol/de-ionized water (AMD) pre-cleaning method. A nitrogen stream was used to dry the cleaned substrates. Spin coating was performed using a Specialty Coating System P-6708D spin coater operating at 8,000 rpm for 30 seconds.

Example 16

Figure 34:
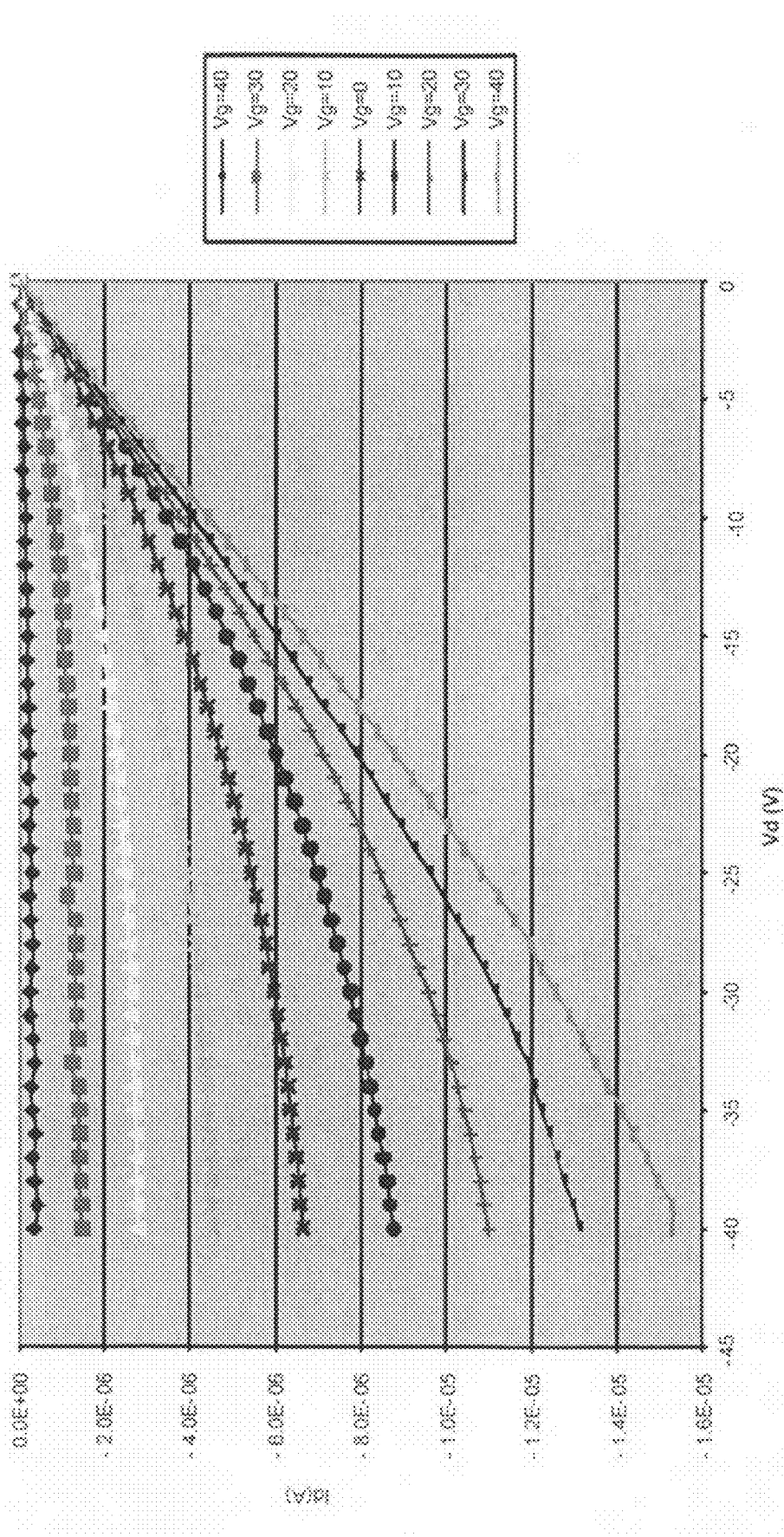
FIG. 34 provides the current-drain voltage characteristics for a CuCdI MISFET according to Example 16.

This example concerns one embodiment of a method for making a CuCdI Metal-Insulator-Semiconductor Field Effect Transistors (MISFETs). A heavily boron (p+) doped silicon substrate served as the gate and an inverted-gate structure was used. Silicon dioxide having a thickness of 100 nm was thermally grown on top of a silicon substrate. A 500-nanometer gold layer was sputter deposited on the backside of the Si substrate to form a gate contact. This structure was used to test device fabrication. A patterned ~20 nanometer CuCdI thin film was deposited on top of the SiO$_2$ by spin coating using a photolithography process. No further post deposition annealing process was performed after CuCdI deposition. The 100-nanometer gold source and drain contacts were then evaporated on top of the CuCdI layer through a shadow mask with channel width-to-length ratio of 7 and 12 (channel length equals 200 μm) to form the MISFET. Device characterization was performed in the dark at room temperature with an HP 4157B Semiconductor Parameter Analyzer. The drain current-drain voltage ($I_{DS}$-$V_{DS}$) output characteristics are presented in FIG. 34.

Example 17

Figure 35:
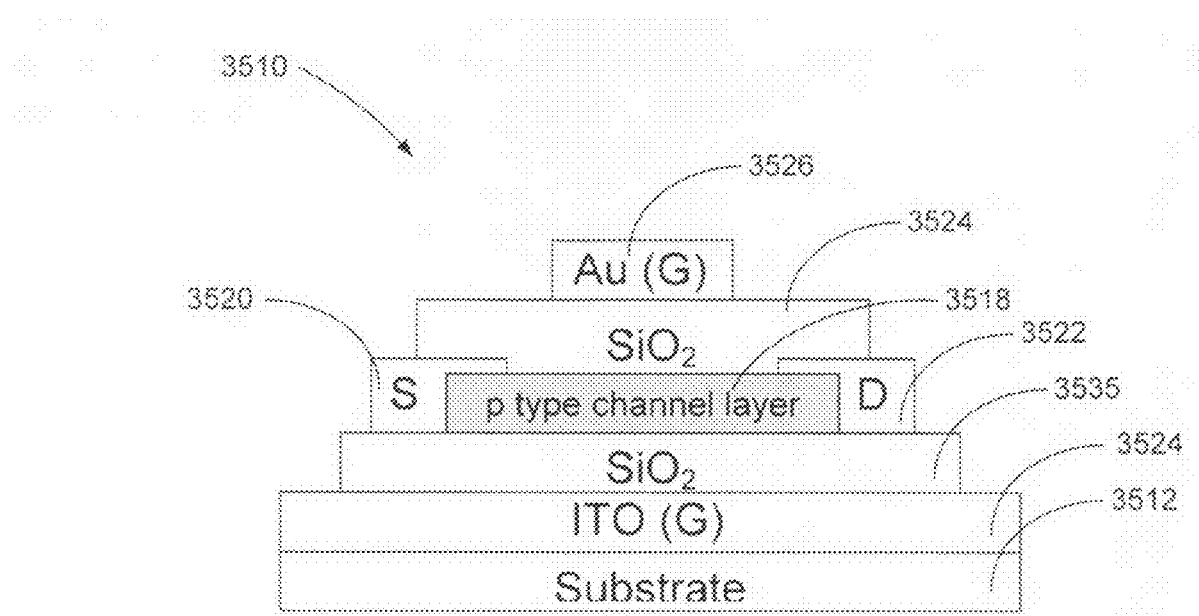
FIG. 35 is a schematic diagram illustrating an embodiment of a transparent flexible p-type MISFET according to Example 17.

This example concerns one embodiment of a method for making a transparent flexible P-type Metal-Insulator-Semiconductor Field Effect Transistors (MISFETs) using p-type channel materials such as CuI, CuCdI and CuAgI thin films as active layers for device fabrication. FIG. 35 is a schematic diagram illustrating one embodiment of a transparent, flexible P-type MISFET that can be made according to this example. With reference to FIG. 35, MISFET 3510 included a substrate 3512. An ITO gate electrode layer 3514 was formed positioned on top of the substrate. Patterned, silicon dioxide gate dielectric layer was grown on top of the ITO surface 3514. P-type channel 3518 was formed on layer 3516, followed by source layer 3520 and drain layer 3522. A silica layer 3524 was then formed to encapsulate the MISFET.

To make a specific implementation of MISFET 3510, a commercially available transparent glass slide/ITO or flexible PET/ITO can be used as the substrate. An ITO layer serves as the gate electrode and an inverted-gate structure was used. A patterned silicon dioxide gate dielectric layer having a thickness of 500 nm was sputtered and grown through a shadow mask on top of ITO surface. P-type channel materials were either ink jet printed or spin-coated on top of the $SiO_2$ layer. A 100-nanometer source and drain gold contact layer was evaporated on the channel layer. To prevent moisture from absorbing into the channel layer, the thin film was first pre-heated at 200° C. for 10 minutes, followed by sputtering a 500-nm thick $SiO_2$ encapsulation layer. A top gate device structure can be made by simply depositing a gold gate contact on top of the $SiO_2$ encapsulation layer.

Example 18

Figure 36:
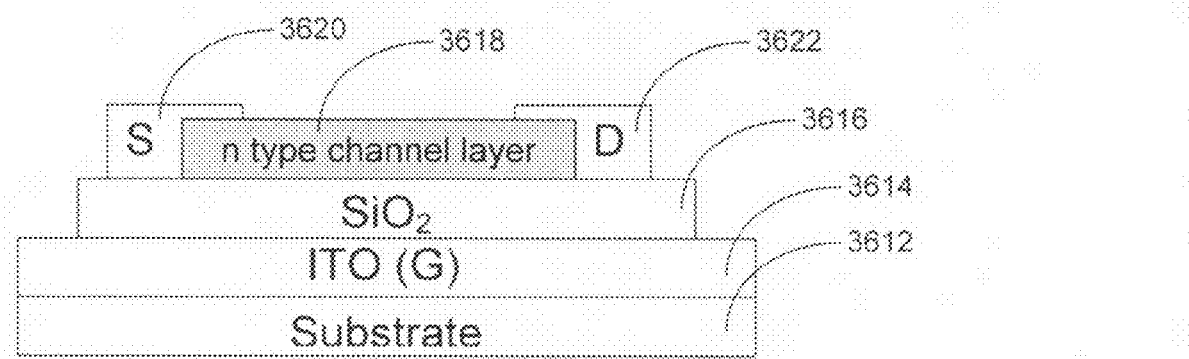
FIG. 36 is a schematic diagram of a transparent flexible N-type MISFET according to Example 18.

This example concerns one embodiment of a method for making a transparent, flexible N-type Metal-Insulator-Semiconductor Field Effect Transistors (MISFETs) illustrated schematically in FIG. 36 using n-type channel materials such as $InO_x$, ZnO, $SnO_x$, ITO, ZTO, ZIO and IZTO thin films as active layers for device fabrication. With reference to FIG. 36, a flexible N-type MISFET 2410 included a substrate layer 3612. An ITO gate layer 3614 is provided on top of the substrate layer 3612. $SiO_2$ layer 3616 is then deposited on top of the ITO gate layer. N-type channel layer 3618 is then positioned on top of the silica layer, followed by formation of source 3620 and drain 3622.

To make a specific implementation of a flexible N-type MISFET 3610, a commercially available transparent glass slide/ITO or flexible PET/ITO cab be used as the substrate. An ITO layer serves as the gate electrode and an inverted-gate structure cab be used. A patterned silicon dioxide gate dielectric layer having a thickness of 500 nm will be sputter deposited through a shadow mask on top of an ITO surface. N-type channel materials can be either inkjet printed or spin-coated on top of the $SiO_2$ layer. A 300-nanometer source and drain aluminum contact layer will be evaporated on top of the channel layer.

Example 19

Figure 37:
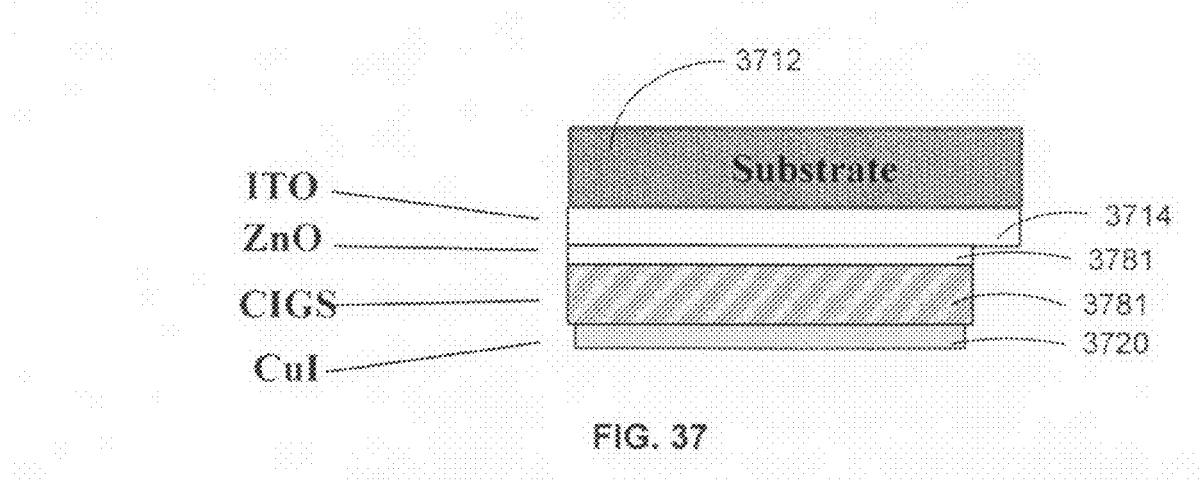
FIG. 37 is a schematic diagram of a thin film photovoltaic according to Example 19.

This example concerns one embodiment of a method for making a thin film photovoltaic using semiconductor materials, such as indium tin oxide (ITO), zinc oxide (ZnO), Cu(In-Ga)Se$_2$ (CIGS), and copper iodide (CuI) as active layers for device fabrication. FIG. 37 is a schematic diagram of one embodiment of a thin-film photovoltaic 3710 that can be made according to this example. With reference to FIG. 37, photovoltaic 3710 includes substrate 3712, such as a glass substrate. An n-type layer can then be formed using an ITO layer 3714 and a ZNO layer 3716. A selenized layer 3718 thin film photovoltaic 3710 also includes copper iodide layer 3720.

To make a specific implementation of a thin-film photovoltaic 3710, a commercially available transparent glass will be used as the substrate. A transparent indium tin oxide (ITO) and ZnO n-type window layer can be inkjet printed on top of the glass substrate using $InCl_3$, $SnCl_2$ precursor for ITO and $ZnCl_2$ precursor for ZnO. Thermal annealing in the presence of $H_2O$ was followed by formation of the n-type window layer. P-type absorber materials can be inkjet printed on top of the ZnO layer. A chalcopyrite Cu(In, Ga)Se$_2$ thin film could be fabricated by subjecting inkjet-printed CuCl, $InCl_3$, $GaCl_3$ precursor film to a selenization agent (e.g. $H_2Se$). P-type CuI transparent conductor then will be inkjet printed to form a contact with the absorber layer.

Example 20

Figure 38:
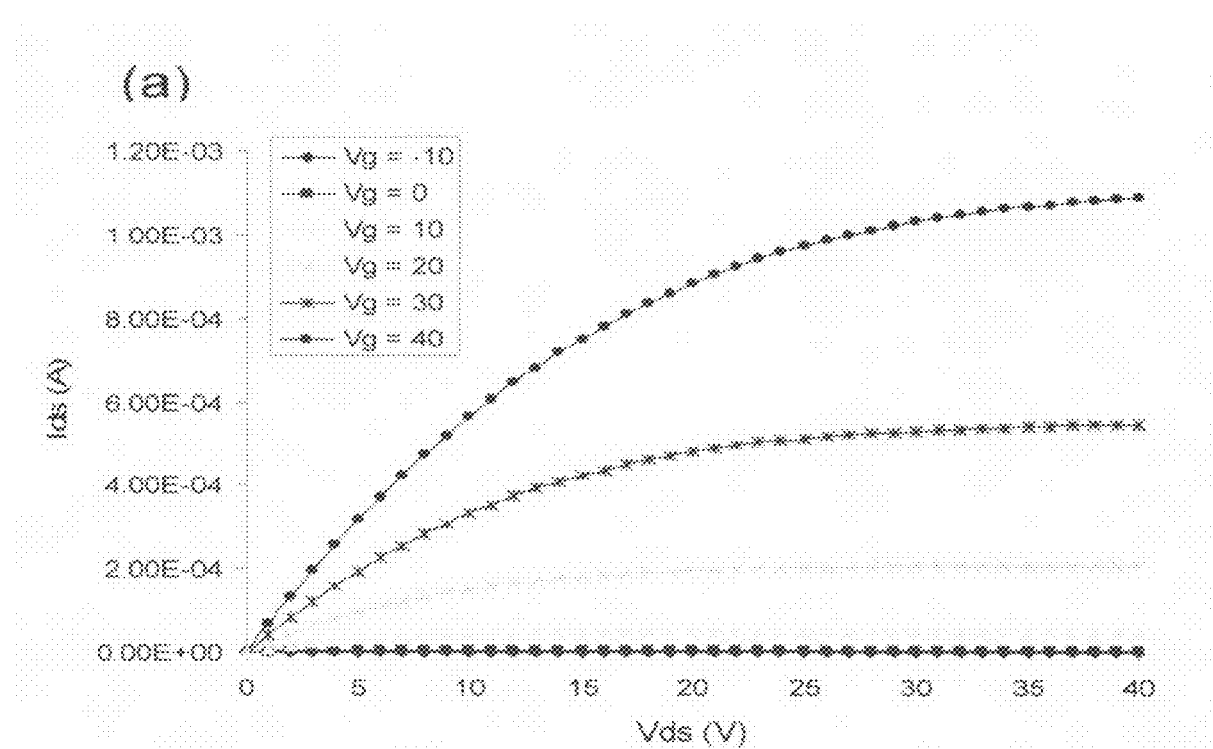
FIG. 38 provides drain current-drain voltage ($I_{DS}$-$V_{GS}$) output characteristics for one embodiment of an IZTO MISFET made according to the present invention.
Figure 39:
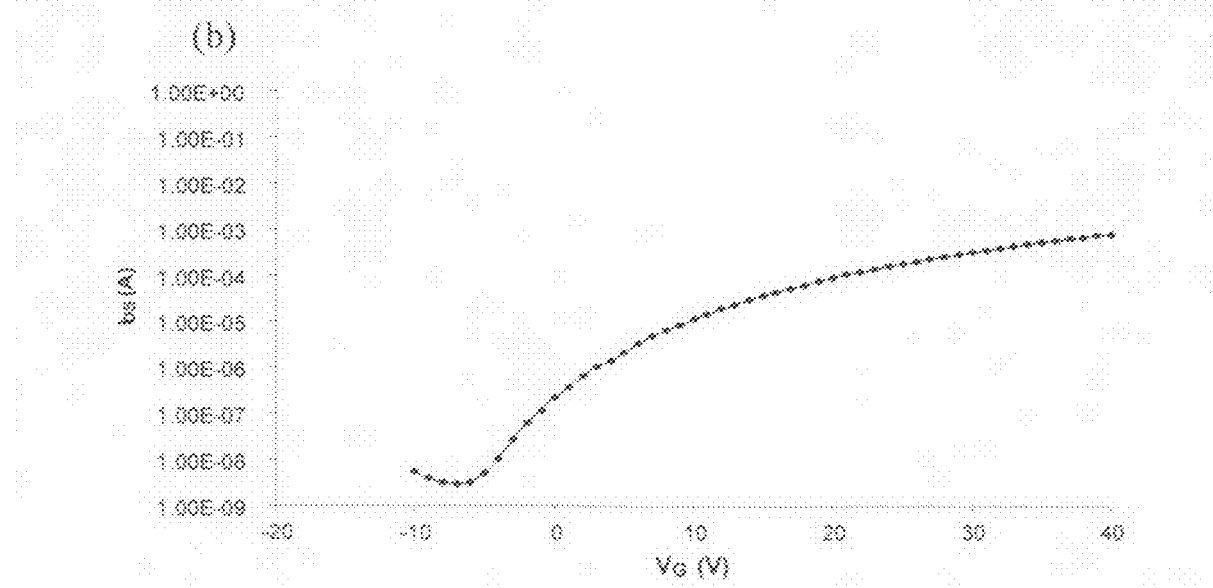
FIG. 39 provides $Log(I_{DS})$—$V_{GS}$ transfer characteristics at $V_{DS}$=40 V indicating a drain current on-to-off ratio of approximately $10^6$ with a turn-on voltage of −7 V for one embodiment of an IZTO MISFET made according to the present invention.

This example concerns one embodiment for inkjet printing IZTO thin films using a precursor solution of $InCl_3$, $ZnCl_2$ and $SnCl_3$ in acetonitrile. Without any process optimization, the overall device performance for the inkjet printed IZTO MISFET is quite encouraging. FIG. 38 shows the drain current-drain voltage ($I_{DS}$-$V_{DS}$) output characteristics for IZTO MISFET with a channel width-to-length ratio of 7 (channel length equals 200 μm) and a good gate-modulated transistor behavior. The field-effect mobility ($\mu_{FE}$) determined by the transconductance of this device is $\mu_{FE}$=12 cm$^2$/V-sec. FIG. 39 shows the Log($I_{DS}$)-$V_{GS}$ transfer characteristics at $V_{DS}$=40 V indicating a drain current on-to-off ratio of approximately $10^6$ with a turn-on voltage of −7 V. With a negative turn-on voltage, this device behaves as a depletion-mode device and the relatively large drain current on-to-off ratio indicates that it can function well as a switch. Another interesting example is the fabrication of ITO MISFET via the same process.

Figure 40:
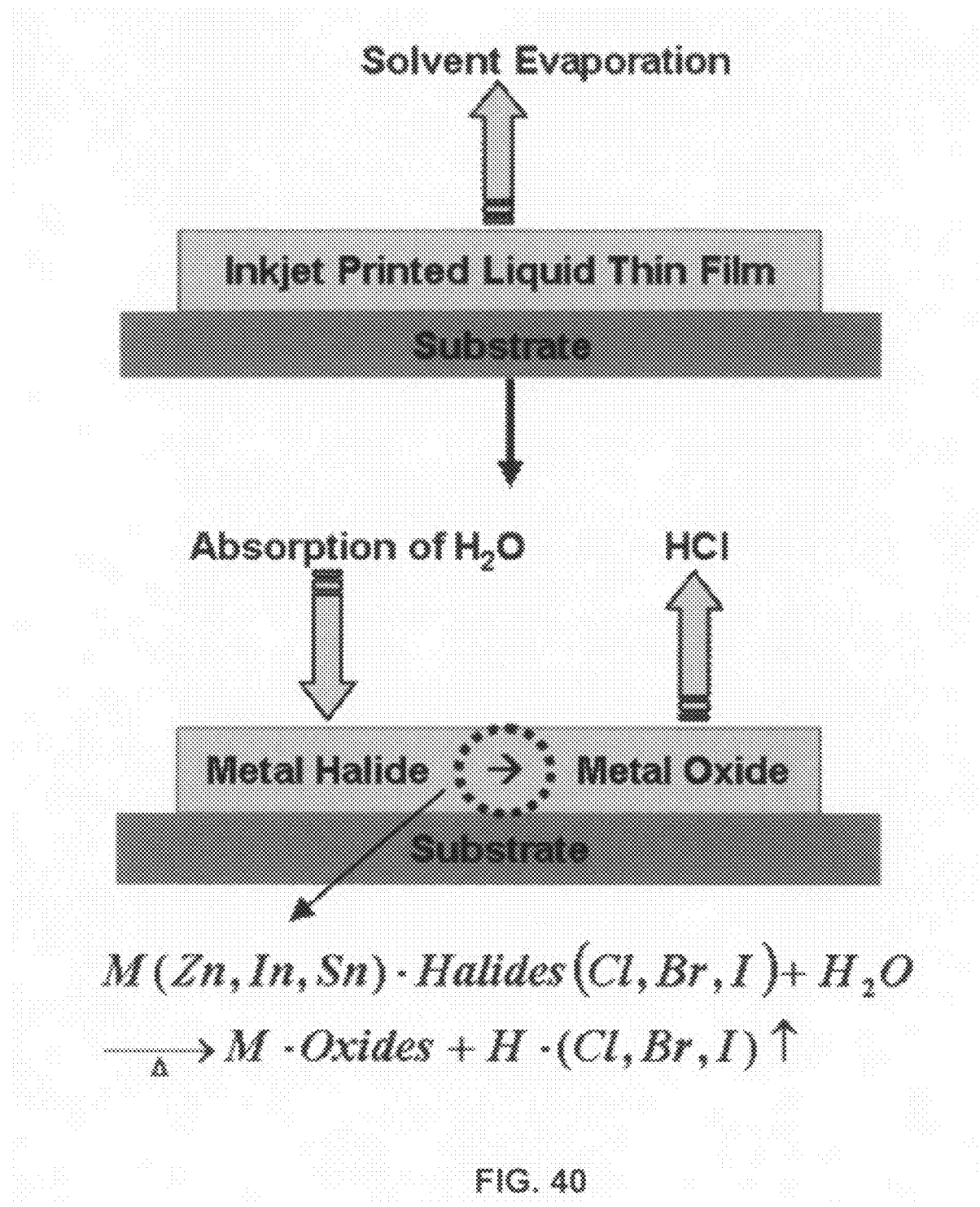
FIG. 40 is a schematic diagram illustrating a proposed mechanism for metal oxide semiconductor thin film formation.

Working examples provided herein establish that inkjet printed metal halide thin films can be to high performance semiconducting metal oxides. Without being limited to a theory of operation, it appears that the metal halides are converted to metal oxides by a thermally activated substitution reaction between the metal halide film and water. This proposed mechanism of metal oxide semiconductor thin film formation is illustrated schematically in FIG. 40. The metal oxide thin film formation starts with the precursor dissolution and follows by thin liquid film formation by inkjet printing, spin coating etc., thin solid film formation after solvent evaporation, and finishes by a substitution oxidation reaction. This synthetic pathway provides a new avenue to fabricate a variety of patterned metal oxide semiconductors at low-cost.

TABLE 2

Summary of Electrical Properties of Semiconducting Oxide Thin Film Transistors

| | | Oxide MISFET device by Inkjet printing | | | |
|---|---|---|---|---|---|
| | | ZIO | ZTO | ITO | IZTO |
| Spin-coating | Mobility (μFE) [cm$^2$/V-sec] | 16.13 | 15.92 | 30.21* | 15.09 |
| | On-off | 1e4 | 1e5 | 1e5 | 1e5 |
| | Von | −32 | 2 | −15 | −33 |
| Inkjet printing | Mobility (μFE) [cm$^2$/V-sec] | 7.37 | 1.17 | 2.03 | 12.02** |
| | On-off | 1e4 | 1e5 | 1e4 | 1e6 |
| | Von | −25 | 7 | −20 | −7 |

*, **indicate the TFT which has the highest mobility

Example 21

This example concerns one embodiment of a method for printing porous tin oxide thin films by using $SnCl_4$ as the precursor. Tin oxide thin film precursor solution was prepared by dissolving 0.0086 mol of tin tetrachloride (Alfa Aesar, 98% $SnCl_4$) into 25 ml of acetonitrile ($CH_3CN$) at room temperature. A modified HP 1220C thermal inkjet printer and Microsoft Excel software was used to print the active layer with a desired pattern. First, the precursor solution (~10 ml) was filled into the black cartridge (HP45) by a needle syringe, sealed with a metallic ball, and then loaded into the cartridge holder. Second, the substrate was treated by a standard Acetone, Methanol and De-ionized Water (AMD) pre-cleaning method, followed by a stream of clean dry nitrogen gas to blow it dry, before placing onto a plastic tray, and loaded into the inkjet printer. The absorption and transmission analysis of the thin films were measured at various wavelengths by a UV-Vis spectrophotometer (Ocean Optics Inc, USB 2000 optic spectrometer) for the optical bandgap and transmittance measurement. The TEM sample was prepared by inkjet printing thin films directly on a TEM grid (Electron Microscopy Sciences, Dura SiN TEM grid). TEM analysis was performed using a Philips CM 12 at 120 KV. The chemical composition was characterized by X-ray Photoelectron Spectroscopy (XPS) using a Physical Electronics QUANTERA Scanning ESCA in high power mode.

The thermal behaviors of the precursor chemicals were investigated by a Thermogravimetric Analyzer (TA Instrument Inc., Modulated TGA 2950 Thermogravimetric Analyzer). A drop of the precursor solution was laid on a pre-tarred aluminum pan. The temperature ramping rate was 5° C. per minute, and the temperature was increased to 600° C. Device testing was performed in the dark at room temperature using an Agilent Technology 4157B Semiconductor Parameter Analyzer.

Figure 41:
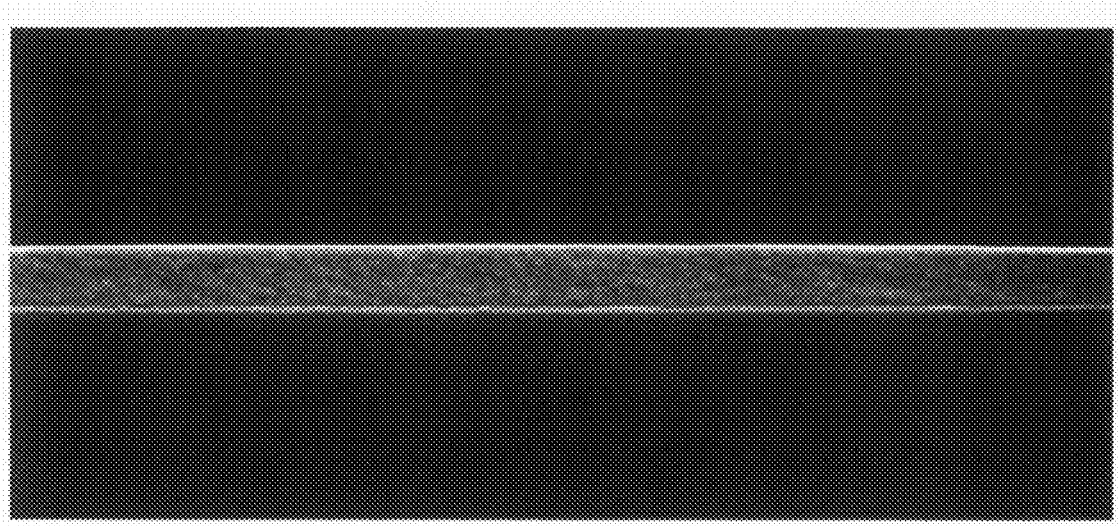
FIG. 41 is a cross-sectional SEM image of an as-deposited tin oxide thin film deposited on a 20×40 millimeter silicon substrate.
Figure 42:
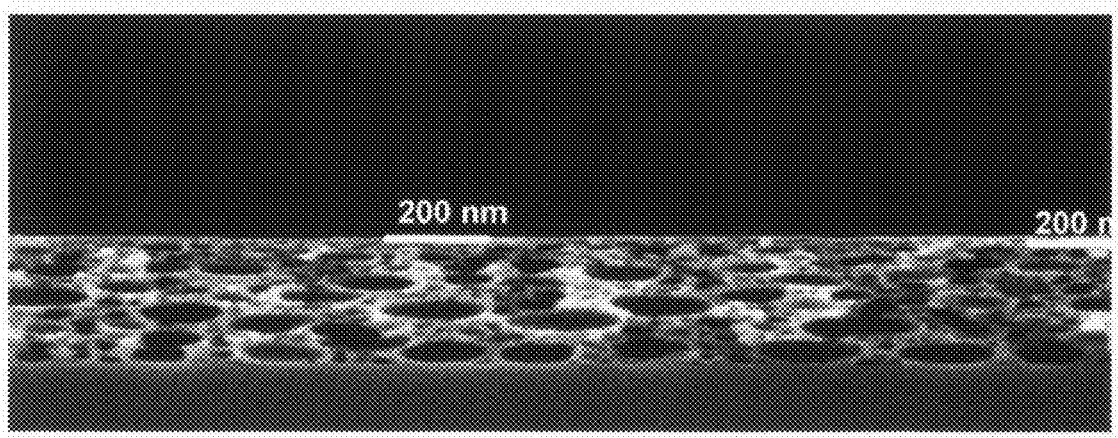
FIG. 42 is a cross sectional image after a post-annealing process of the tin oxide film of FIG. 41 in an air furnace at 500° C. for 15 minutes.
Figure 43:
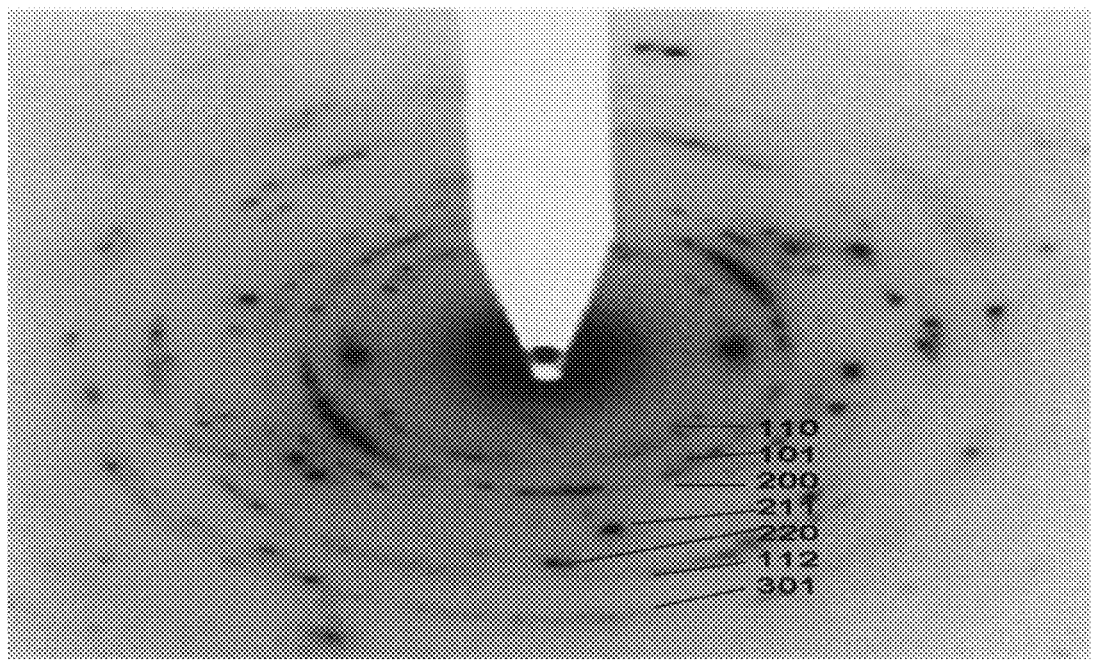
FIG. 43 is a TEM-electron diffraction pattern of a tin oxide sample prepared by one embodiment of an ink-jet printing process.

Top and cross-sectional SEM images of as-deposited $SnCl_4$ precursor thin film clearly illustrate a dense, smooth and very uniform film can be printed directly from a commercially available thermal inkjet printer. The printed $SnCl_4$ thin film precursors were subjected to a post annealing process using an air furnace at 500° C. for 15 minutes. FIGS. 41 and 42 show the corresponding top and cross-sectional SEM images of the annealed film. The top surface reveals nanopores on the order of 5 nanometers to 20 nanometers. The cross-sectional SEM image indicates an increment of film thickness. The thickness is mainly created by the porosity. The film surface remains smooth, uniform, and continuous. The film has an interesting porous structure that has a thin mesoporous layer on top and a thicker meso-(~2 to 20 nm) and macroporous layer (~70 nm to 100 nm) beneath the top layer.

The porous thin films were analyzed by scanning ESCA using a Physical Electronics QUANTERA in a high power mode. The Sn3d5 has 487 eV and 495.6 eV two binding energies and binding energy spectra of O1s were observed at 530.7 eV. The high binding energy shoulder in the O1s peak could be attributed to the oxygen atoms chemisorbed at the surface. The atomic concentrations were calculated from established elemental sensitivity factors and considered semi-quantitative. The results show a [O]/[Sn] ratio of 1.4. The XPS analysis indicated that our inkjet-printed thin film is corresponding to $SnO_{2-x}$.

Selected area electron diffraction (SAED) was carried out using a TEM (Philips CM12) to determine the crystal structure of the inkjet printed tin oxide thin films. An electron diffraction pattern was given in FIG. 34. The pattern confirms the formation of polycrystalline thin films that matches the tetragonal $SnO_2$ (JCPDS 72-1147) structure.

Figure 44:
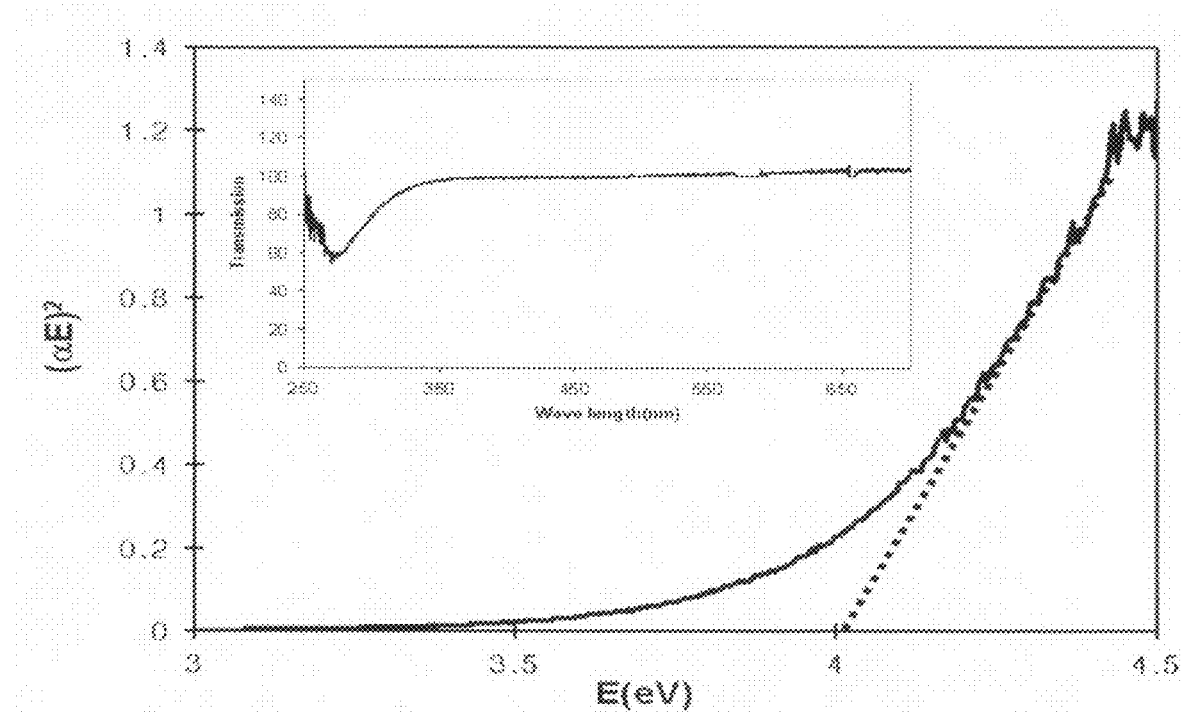
FIG. 44 provides an estimated bandgap and UV-Vis spectrum (inset) of a tin oxide thin film prepared by one embodiment of an ink jet printing process.
Figure 45:
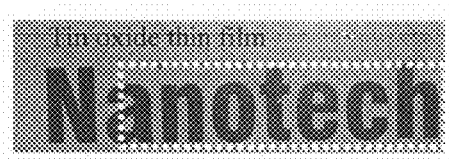
FIG. 45 illustrates a transparent tin oxide thin film printed directly on a fused silica substrate.

The optical properties of the inkjet printed porous tin oxide thin films were characterized by a UV/Vis spectrophotometer. FIG. 44 shows an absorption spectrum that is over 98% of transmittance within the visible range from 400 to 700 nm for the printed film on a fused silica substrate. The optical image of FIG. 45 shows a uniform porous tin oxide thin film could be printed directed on a fused silica substrate. The optical bandgap value was estimated to be around 4.0 eV [13].

Figure 46:
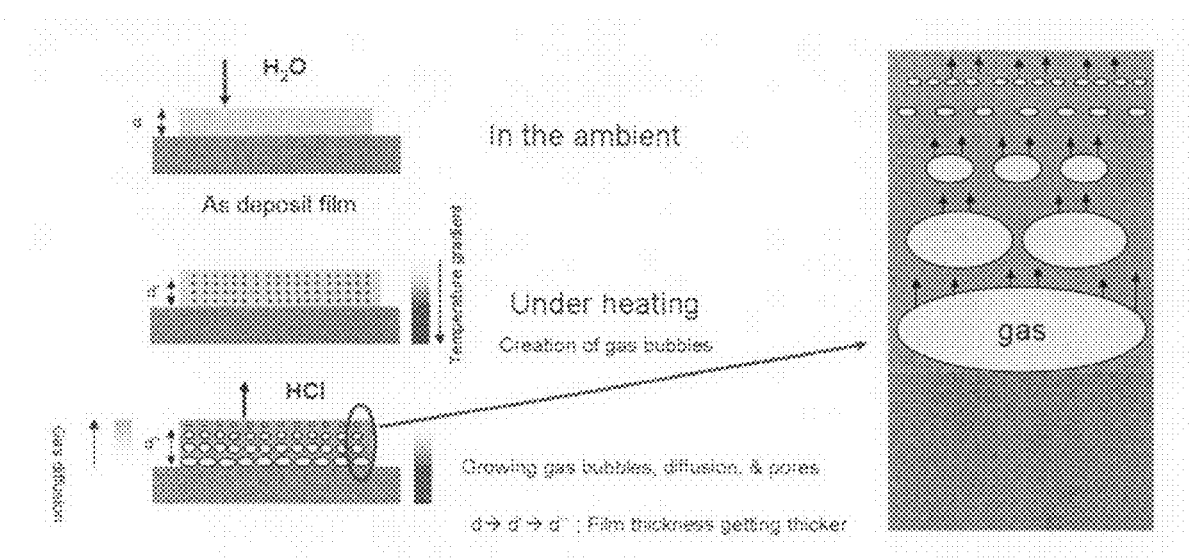
FIG. 46 is a schematic diagram illustrating a proposed mechanism for formation of a porous thin film.

The formation of pores in the film could be attributed to a series of water absorption, water diffusion, reaction, and gas evolution. Without being limited to a particular theory of operation, a schematic diagram of the proposed mechanism is provided by FIG. 46. At first, $SnCl_4$ precursor solution deposited on the substrate released the acetonitrile solvent by evaporation. After that, the as-deposited hygroscopic $SnCl_4$ precursor film absorbed water from the ambient and the water distributed within the precursor film and form $SnCl_4 \cdot H_2O$. During the thermal annealing process, $SnCl_4$ precursor will react with water and convert to tin oxide and generate hydrogen chloride gas according to the chemical reaction of $SnCl_4 + 2H_2O \rightarrow SnO_2 + 4HCl (g) \uparrow$. During this reaction, the HCl gas was generated, nucleated and formed bubbles within the film. The gas then diffused toward the surface of the film and created nano-sized pores within the tin oxide thin film. The pore size depends on the temperature, the mass transport of the evolving gas, and the surface tension between the gas and the precursor.

Figure 47:
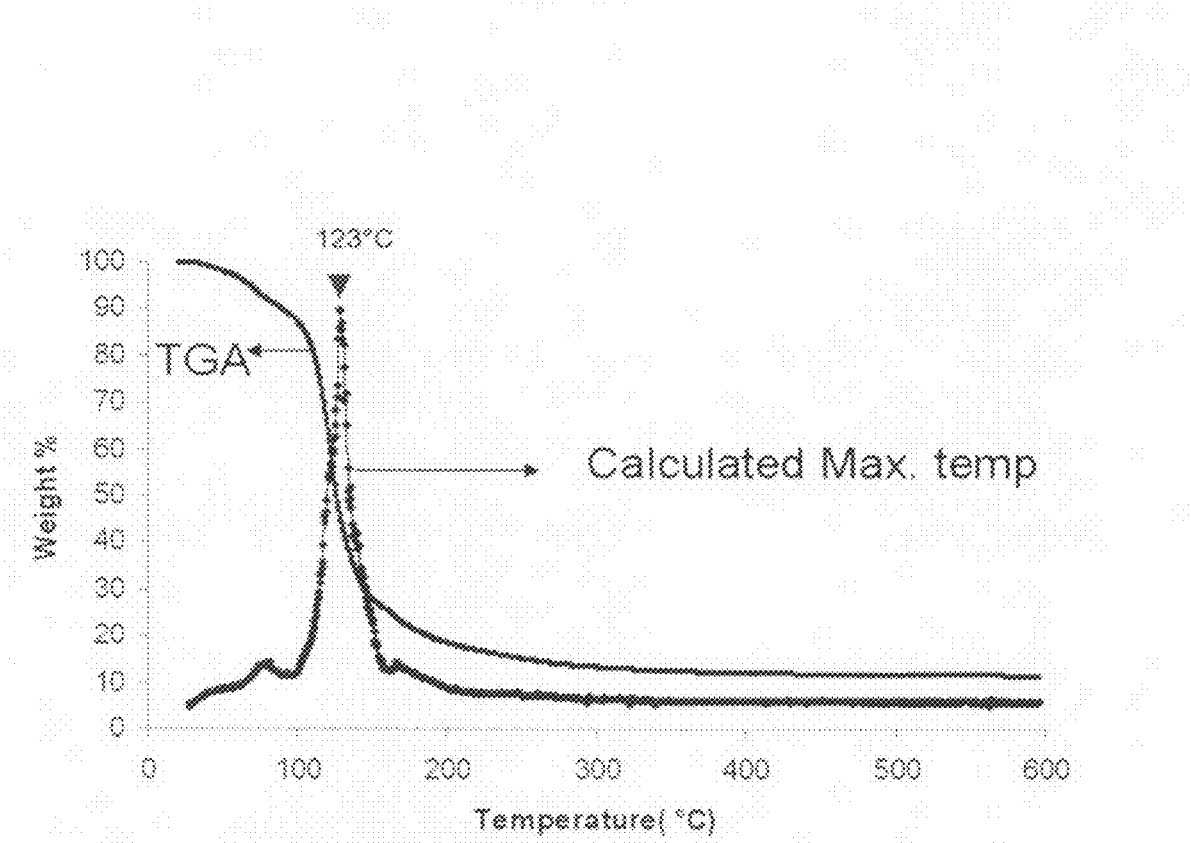
FIG. 47 is a thermo gravimetric analysis curve used to characterize weight loss at an annealing ramping rate of 15° C./minute with an operating temperature up to 600° C.

Thermo Gravimetric Analysis (TGA) was used to characterize the weight loss at an annealing ramping rate of 15° C./min with an operating temperature up to 600° C. The samples were prepared by preheating the metal halide/acetonitrile precursor solution at 87° C. for 5 minutes to remove the residual acetonitrile by evaporation. The TGA curve for the $SnCl_4$ precursor is provided by FIG. 47. The range of major weight loss was observed between 100° C. and 200° C. and the maximum weight loss at 123° C. was also calculated. The first weight loss peak in the TGA spectra was observed before 100° C., indicating that there is residual acetonitrile existed in the film after the preheating treatment. TGA data also suggest that an annealing temperature below 200° C. might be sufficient for converting $SnCl_4$ to $SnO_2$.

Figure 48:
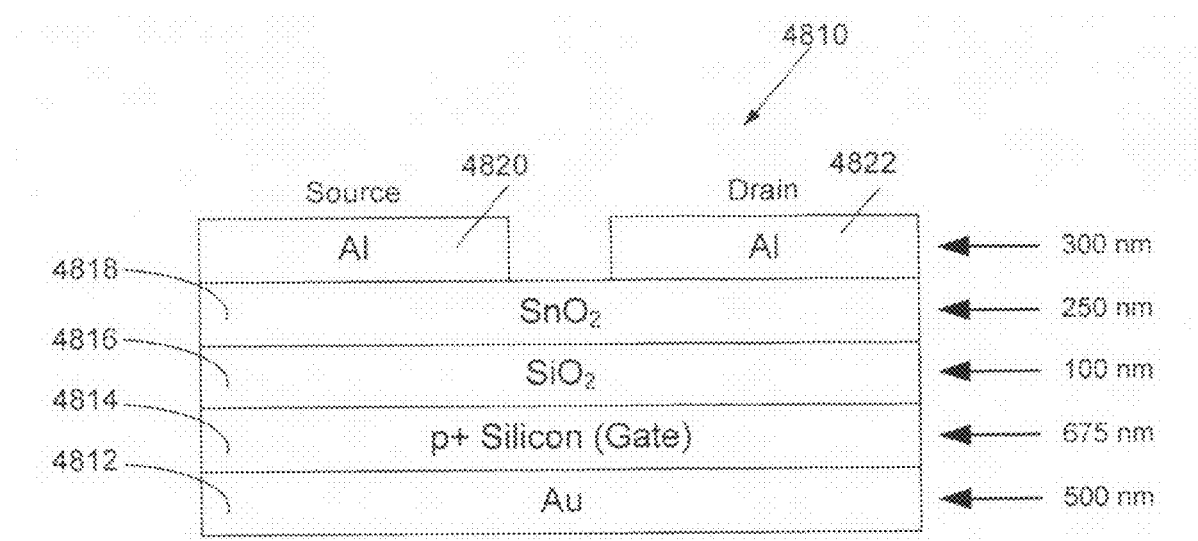
FIG. 48 is a schematic cross-sectional view of an inkjet printed $SnO_2$ MISFET.

Thin film transistors (TFTs) are commonly used for controlling pixels in flat panel displays. The typical semiconducting channel material used today is silicon. Tin oxide TFTs have been investigated in the early days for communication applications. More recently, the emergence of transparent electronics has spurred new interests in using tin oxide as a channel material. On the other hand, tin oxide is a well established material for gas sensing applications. The Fermi level affects the adsorption gases at semiconductor surface. Gas sensing properties of $SnO_2$-thin films may be controlled by applying an external electrical field. Wöllenstein et al. reported the possibility of using $SnO_2$ TFTs to tune the sensitivities and selectivities to various gases by controlling the gate voltage. The porous structure of ink jet printed tin oxide thin films of the present application are particularly good for sensing applications. To assess its electrical characteristics, MISFETs have been fabricated using porous tin oxide channel layer. For the device fabrication, we had used 10×15 mm $SiO_2$/Si/Au substrate. After depositing the tin oxide channel layer on the substrate by inkjet printing, the aluminum source and drain contacts with a channel width-to-length ratio of 12 (channel length are 200 μm) were deposited through a shadow mask by thermal evaporation. The device structure is illustrated in FIG. 19. FIG. 48 illustrates one embodiment of a metal oxide semiconductor MISFET 4810. MISFET structure 4810 includes a gold substrate material 4812 having a thickness of about 500 nanometers. A p+silicon gate layer 4814 was formed having a thickness of about 675 μm. Gold layer 4812 was sputter deposited on the silicon substrate to form a gate contact. Silicon dioxide ($SiO_2$) layer 4816 was thermally grown on top of a silicon layer 4814. Layer 4816 typically had a thickness of about 100 nanometers. As the name implies, a metal oxide semiconductor MISFET requires a metal oxide semiconductor layer 4818. Layer 4818 can be formed as described herein by solution process deposition of a suitable metal oxide or metal oxide precursor material, such as a metal halide. These layers have typical thicknesses of from about 10 to about 20 nanometers. 300-nanometer aluminum source contact 4820 and drain contact 4822 were evaporated on top of the SnO2 layer 4818 through a shadow mask with a channel width-to-length ratio of 7 and 12, respectively.

Figure 49:
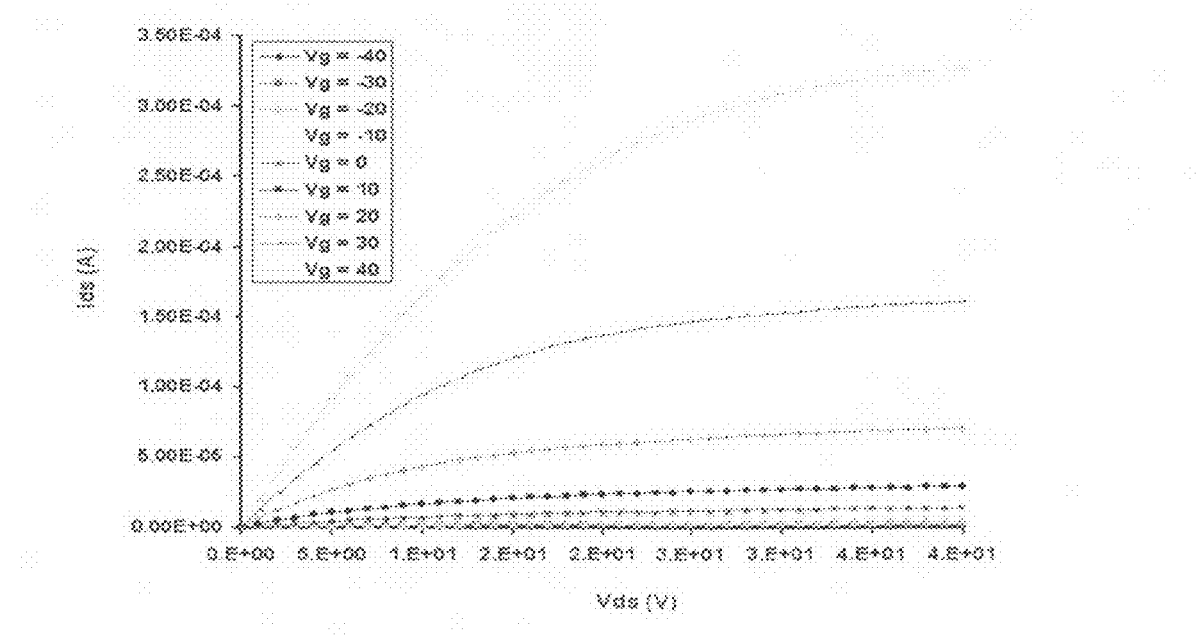
FIG. 49 provides drain current-drain voltage ($I_{DS}$-$V_{DS}$) output characteristics for one embodiment of an $SnO_2$ thin film transistor with a channel layer thickness of about 250 nanometers.

The drain current-drain voltage ($I_{DS}$-$V_{DS}$) characteristics of the fabricated SnO$_2$ MISFET having a channel thickness ~250 nm was shown in FIG. 49. For this n-type channel device, $V_G$ run from −40 to 40 and $V_{DS}$ from 0 to 40 resulting positive $I_{DS}$. The device characterization data showed that a field effect mobility ($\mu_{FE}$) of 3.62 cm$^2$ V$^{-1}$ s$^{-1}$, a turn-on voltage of −39V, and a drain current on-to-off ratio of 10$^3$ were obtained for this normally on tin oxide MISFET. This result is comparable to reported tin oxide thin-film transistor devices fabricated by an RF magnetron sputtering method.

This example demonstrates fabrication of highly transparent porous tin oxide thin films using an inkjet printing process. The films exhibit an interesting porous structure that has a thin mesoporous layer on top and a thicker meso-(~2 to 20 nm) and macroporous layer (~70 nm to 100 nm) beneath the top layer. The thin film transmittance is over 98% in the visible wavelength range. A normally on thin film transistor based on the porous tin oxide channel layer has been fabricated. A field effect mobility of 3.62 cm$^2$/V·s was measured, which is higher than previous reported SnO$_2$ TFTs using sputtered thin films.

Example 22

This example concerns fabricating an IZTO (indium-zinc oxide) MISFET using a piezo-inkjet printer. IZTO solutions for fabricating inkjet-printed ZIO thin films were prepared by dissolving InCl$_3$(0.02M), ZnCl$_2$(0.027M) and SnCl$_2$(0.02M) powders (Alfa Aesar) in the solvent with volumetric ratio of 35% of acetonitrile (J. C. Baker) and 65% of ethylene glycol (Sigma-Aldrich, 99%). A DIMATIX (DMP-2800) piezo-inkjet printer was used to print the active layer with a desired pattern. First, the metal halide precursor solution (~3 ml) was filled into the cartridge (Dimatix Model Fluid Cartridge) by a needle syringe, and then loaded into the cartridge holder. Second, the substrate was cleaned with 1M sodium hydroxide for 5 minutes in an ultra-sonicator, followed by a stream of clean dry nitrogen gas to blow it dry. The loading stage was heated and kept at 60° C. before loading the substrate. The as-deposited thin film was annealed at 600° C. under air for 1 hour to produce oxide materials.

For Metal-Insulator-Semiconductor Field-Effect Transistors (MISFETs) fabrication, a heavily boron (p+) doped silicon substrate (10×15 mm) was used as the gate in an inverted-gate structure. Silicon dioxide with a thickness of 100 nm was thermally grown on top of the silicon substrate. The back of the substrate had the silicon dioxide etched followed by deposition of a 500 nm gold layer for the gate contact. The semiconductor channel material was patterned to reduce the gate leakage current. The 300 nm aluminum source and drain contacts were then evaporated on top of metal oxide layer through a shadow mask. The device characterization was performed in the dark at room temperature with a HP 4157B Semiconductor Parameter Analyzer.

Figure 50:
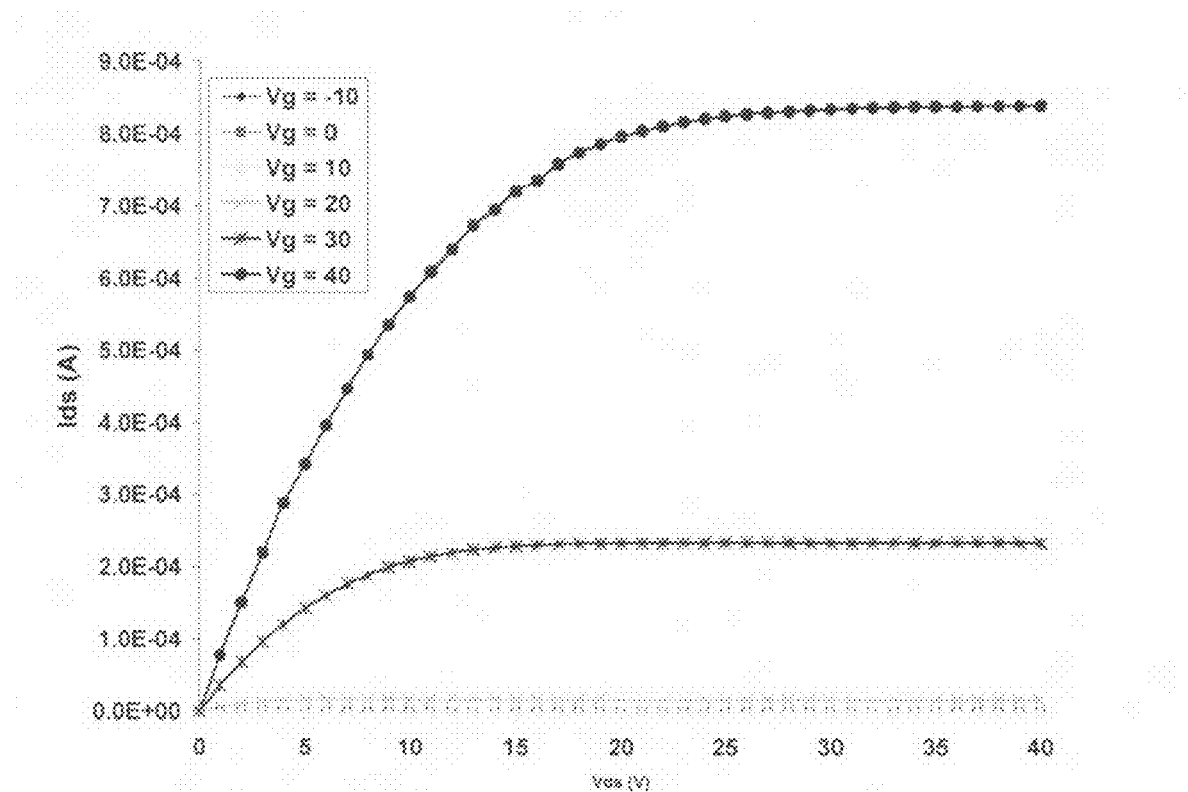
FIG. 50 provides drain current-drain voltage ($I_{DS}$-$V_{DS}$) output characteristics for one embodiment of an IZTO (indium-zinc oxide) MISFET.
Figure 51:
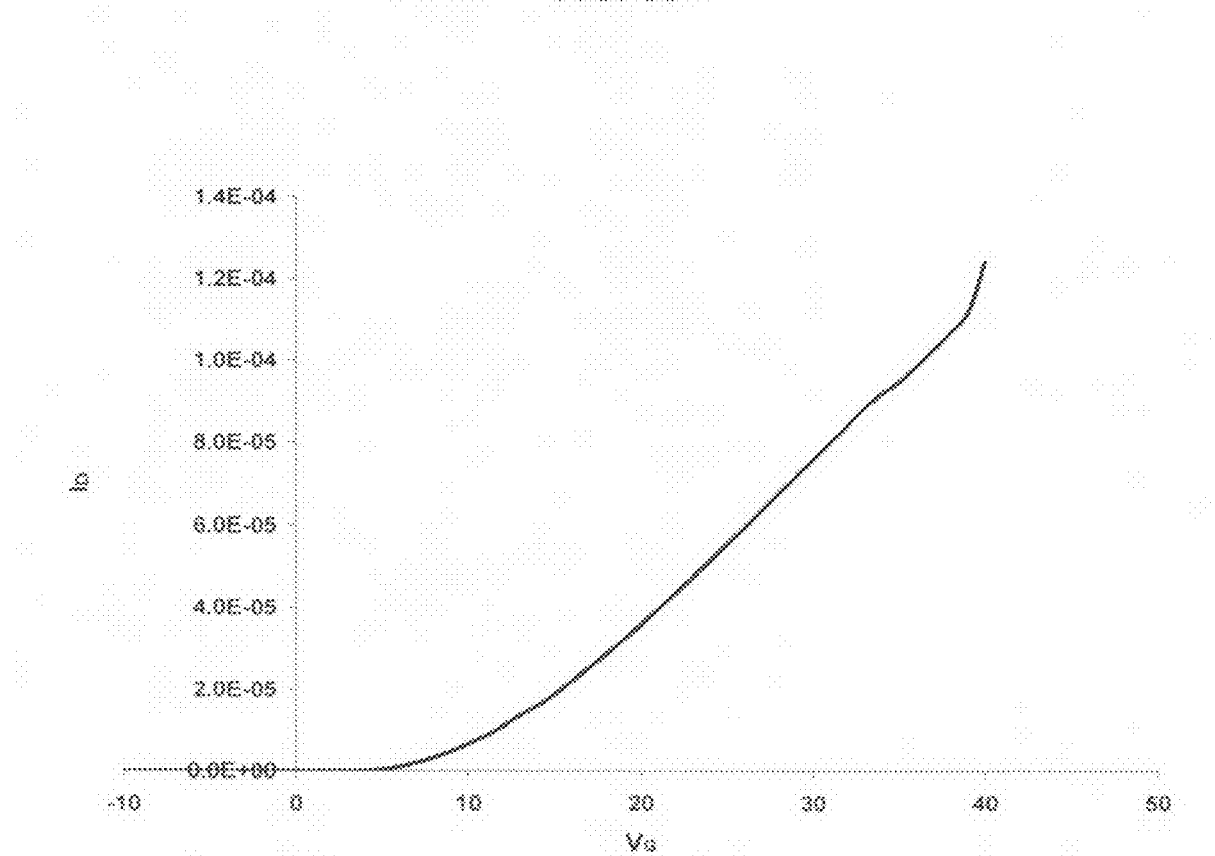
FIG. 51 provides characterization data for one embodiment of an IZTO (indium-zinc oxide) MISFET.
Figure 52:
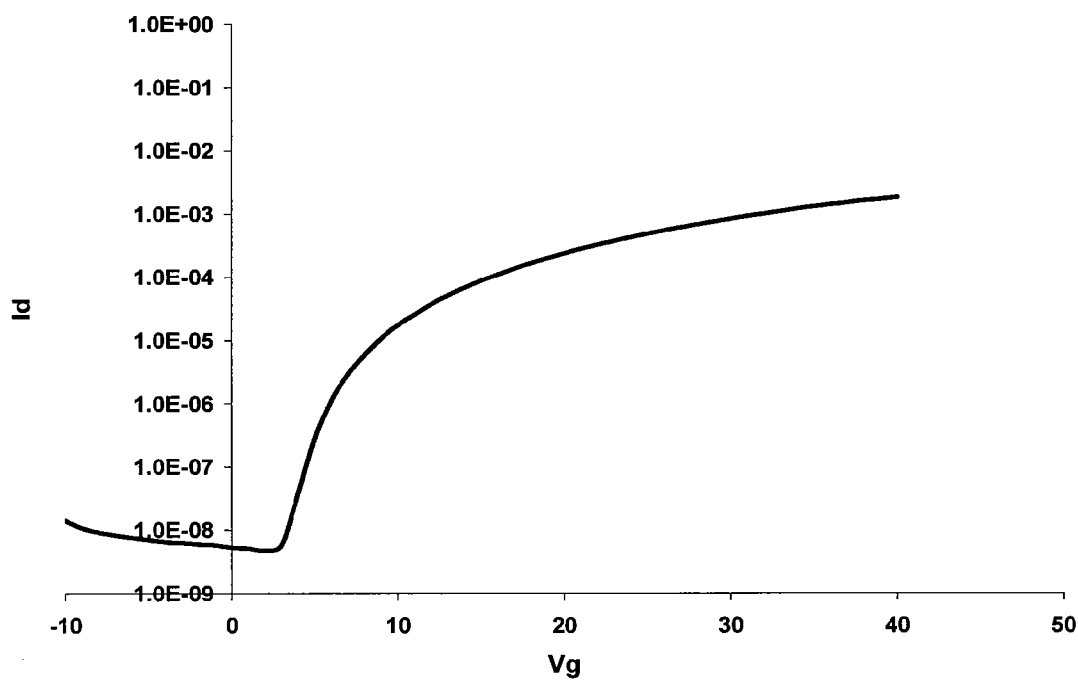
FIG. 52 provides characterization data for one embodiment of an IZTO (indium-zinc oxide) MISFET.
Figure 53:
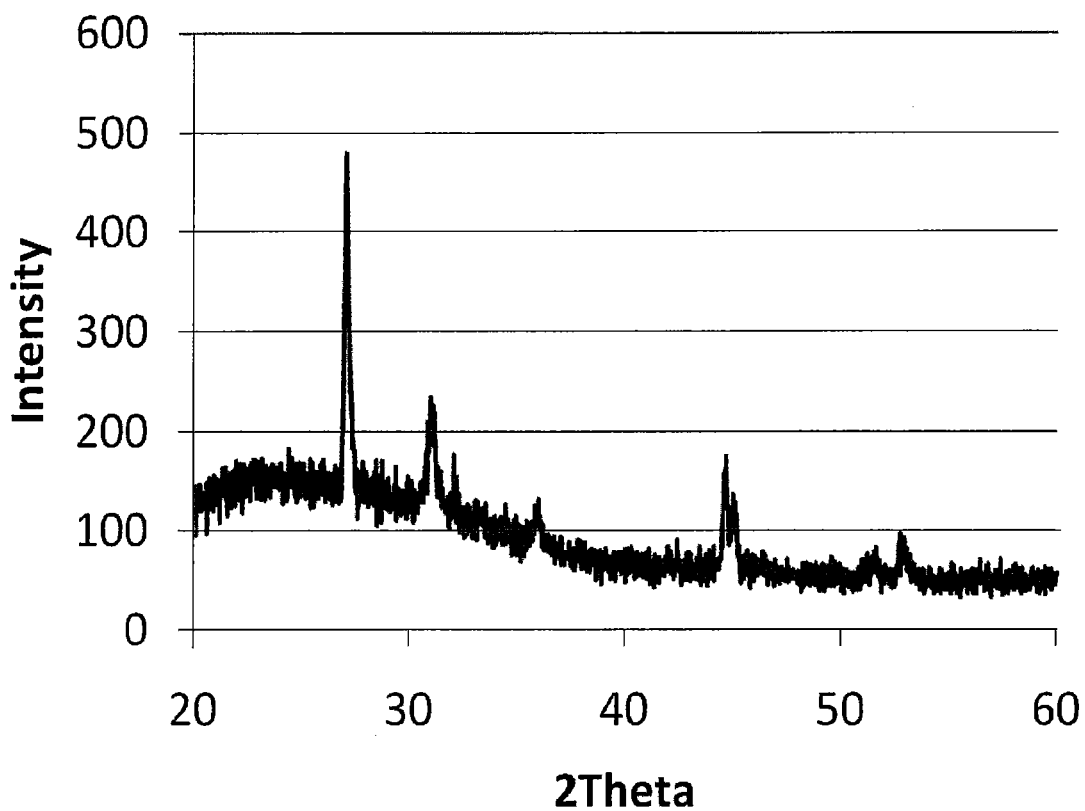
FIG. 53 is an XRD spectrum of $CuInSe_2$ that was produced using selenium metal powder.
Figure 54:
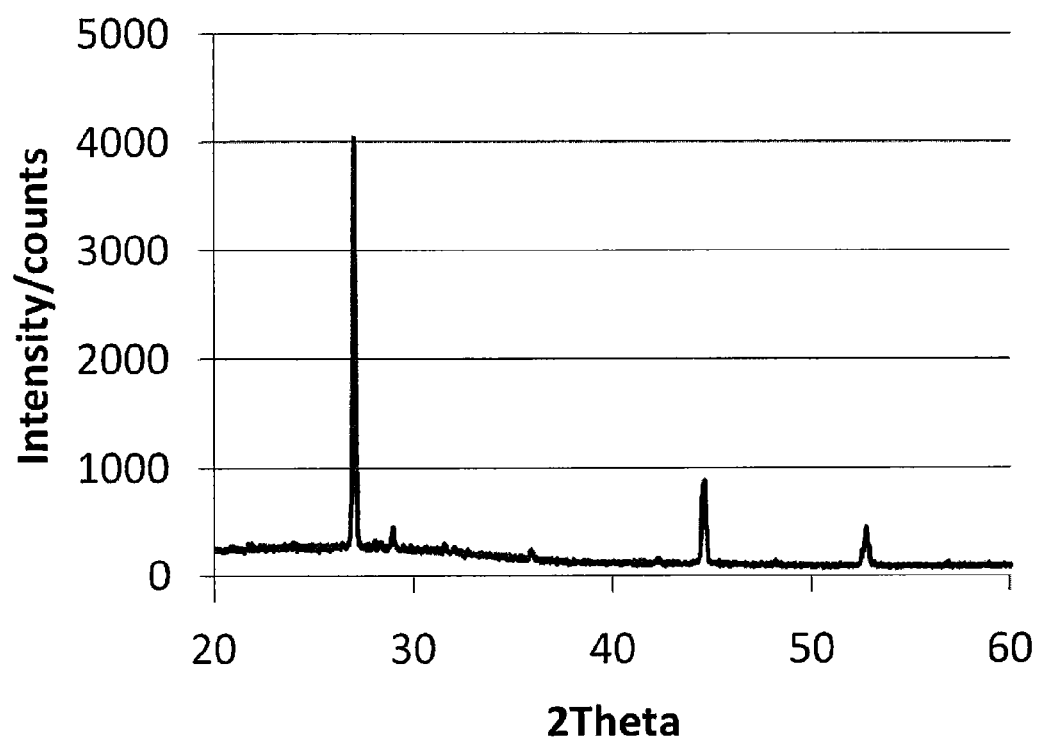
FIG. 54 is an XRD spectrum of $CuInSe_2$ that was produced using selenium vapor.
Figure 55:
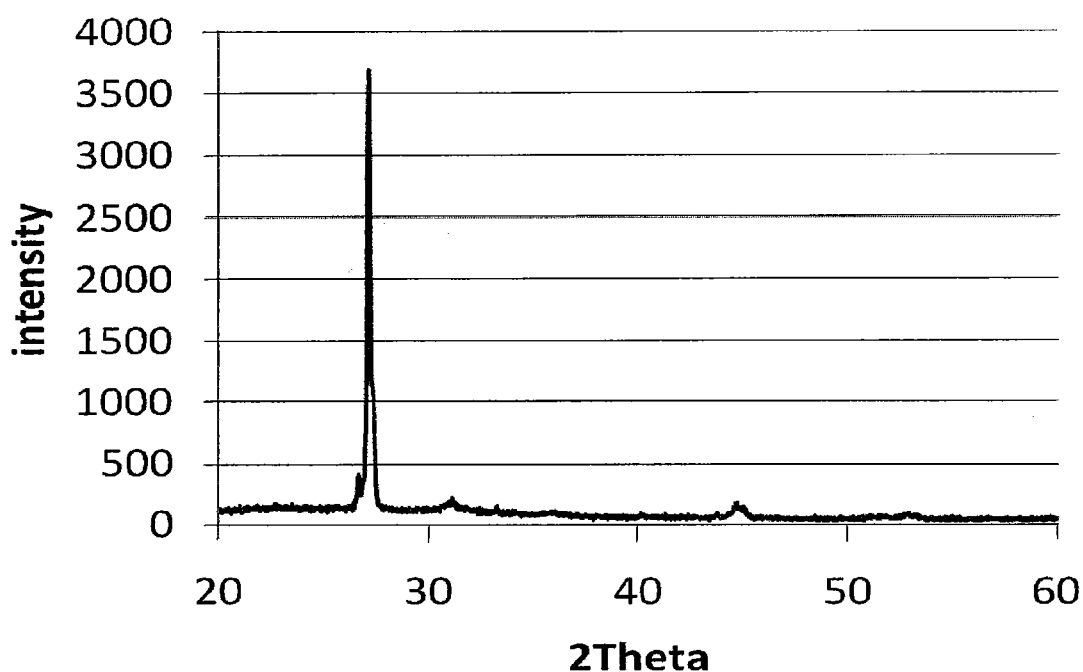
FIG. 55 is an XRD spectrum of $CuInSe_2$ that was produced using selenium dioxide ($SeO_2$).
Figure 56:
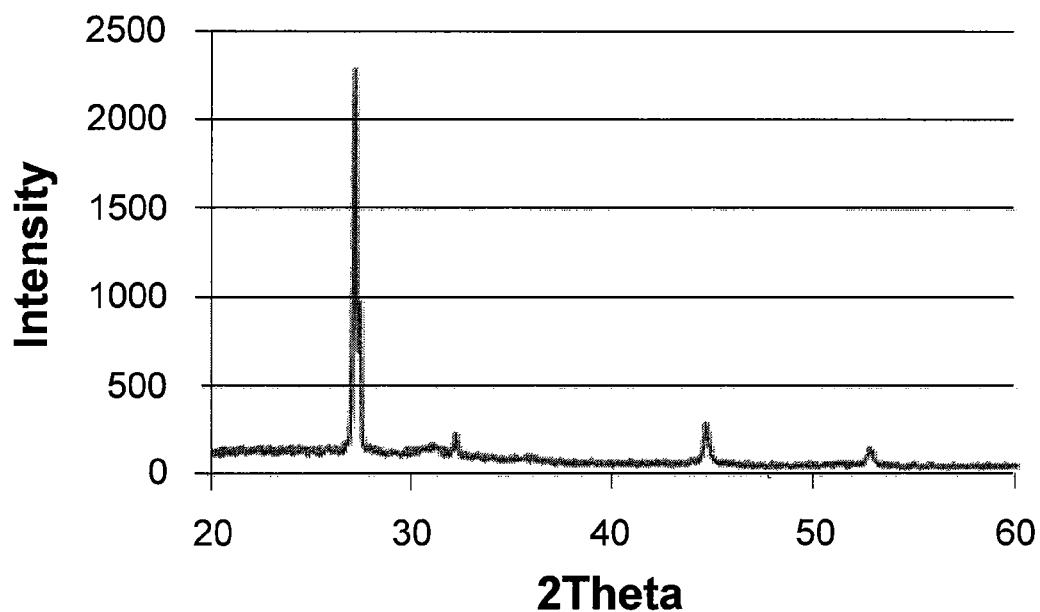
FIG. 56 is an XRD spectrum of $CuInSe_2$ that was produced using selenium chloride ($SeCl_4$).

The drain current-drain voltage ($I_D$-$V_{DS}$) output characteristics, field-effective mobility, Von, On-off current ratio are provided by FIGS. 50-52. The output characteristic date showed ~30 cm$^2$/V·sec of field-effect mobility, 2V of turn-on voltage (enhancement mode device) and ~10$^6$ of the on-off ratio respectively.

Example 23

This example concerns one embodiment of a method for fabricating a CIS (copper-indium-sulfide, CuInS$_2$) thin film by inkjet printing. CuInS$_2$ solutions for fabricating inkjet-printed CIS thin films were prepared by dissolving CuI (0.001M, Alfa), InCl$_3$ (0.001M, Alfa), and thiourea (0.002M, Aldrich) powders stoichiometrically in 25 ml of the acetonitrile (J. C. Baker). A modified HP 1220C thermal inkjet printer and Microsoft Excel software were used to print the thin film with a desired pattern. First, the metal halide precursor solution (~10 ml) was filled into the black cartridge (HP45) by a needle syringe, sealed with a metallic ball, and then loaded into the cartridge holder. Second, the substrate was treated with standard Acetone, Methanol and De-ionized Water (AMD) pre-cleaning method, followed by a stream of clean dry nitrogen gas to blow it dry, before placing onto a plastic tray, and loaded into the inkjet printer. The obtained as-deposit thin film was annealed at 400° C. for 1 hour under vacuum in order to form CuInS$_2$.

Example 24

Semiconductor materials are an example of inorganic materials that can be formed according to disclosed embodiments of the present invention. For example, CISS (copper-indium-diselenide) materials can be formed using the disclosed invention. This has been demonstrated by forming CISS compounds on a substrate, and confirming that the CISS compounds were made using XRD. CuI, InCl$_3$ and various Se precursors were dissolved in acetonitrile at certain concentrations (e.g. CuI 0.05 mol/L, InCl$_3$ 0.05 mol/L, Se precursor 0.10 mol/L). Ultrasonic agitation was used to improve the dissolution of the various solid material in the solvent. Precursor solutions comprising the 3 materials were printed on cleaned glass substrates and dried. The prepared samples were annealed under H$_2$/N$_2$ mixture at about 400° C. for a half hour. Se vapor was used to improve the formation of CIS. After annealing the sample was analyzed by Bruker XRD D8. FIGS. 53-56 confirm that each sample produced the desired CISS compound.

Example 25

Figure 57:
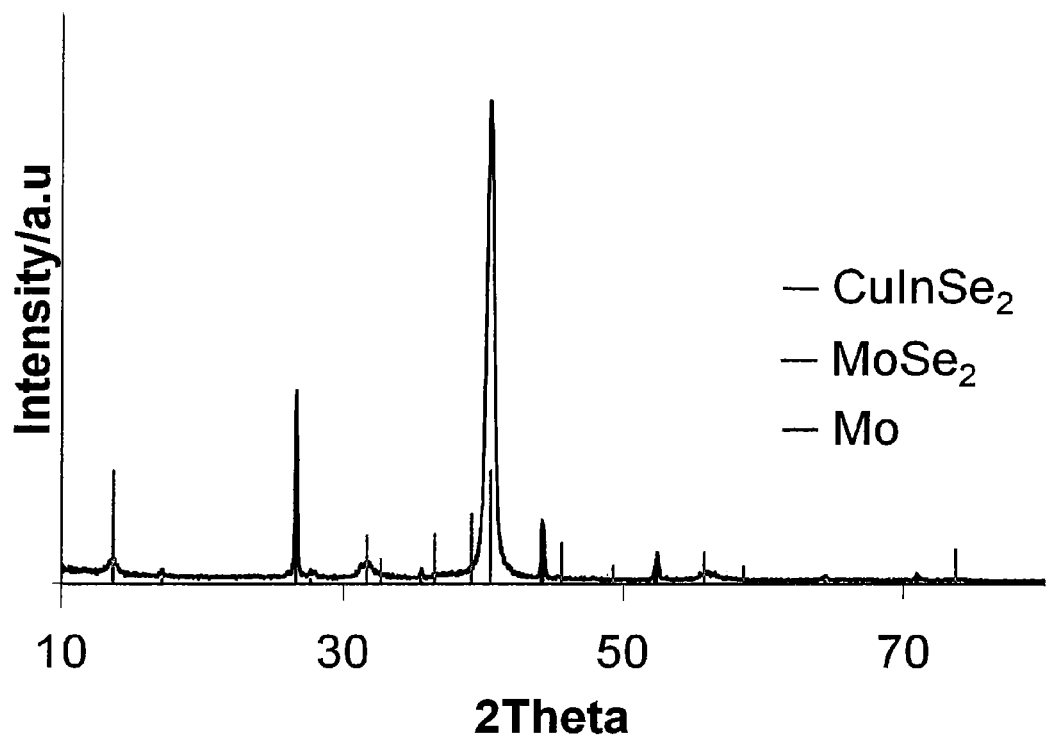
FIG. 57 is an XRD spectrum of a $CuInSe_2$ sample made from $CuCl_2$+$InCl_3$ dissolved in acetonitrile and ethylene glycol on a molybdenum-coated soda lime glass after annealed in Se vapor and $H_2$.
Figure 58:
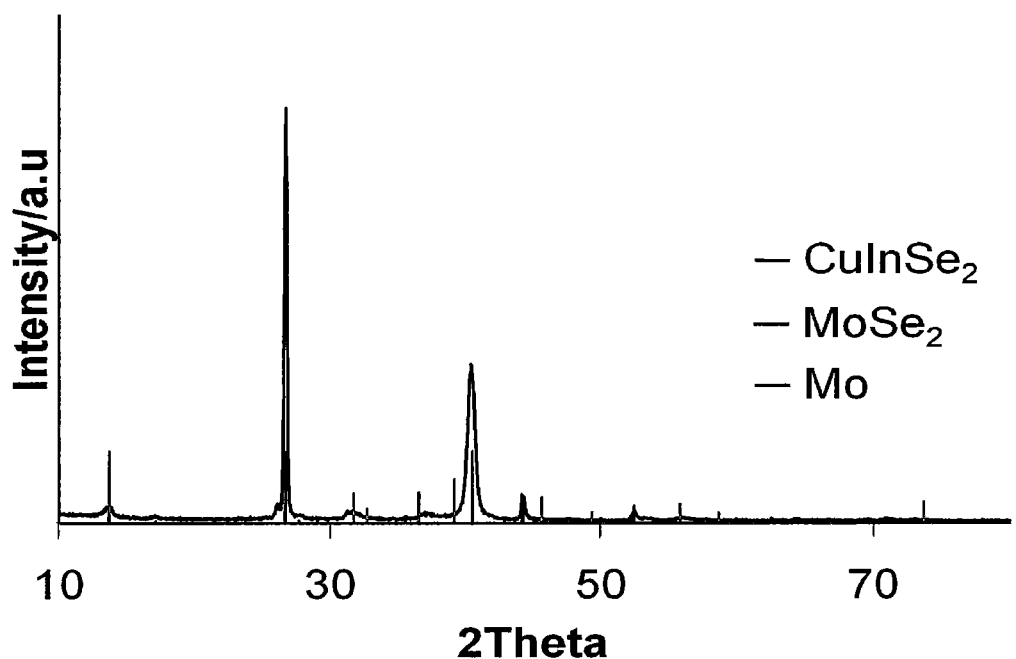
FIG. 58 is an XRD spectrum of a $CuInSe_2$ sample made from $CuCl_2$+$InCl_3$+$SeCl_4$ dissolved in acetonitrile and ethylene glycol on a molybdenum-coated soda lime glass after being annealed in Se vapor and $H_2$.

Two different CuInSe$_2$ samples were prepared to acquire X-ray diffraction spectra. Sample A was made from CuCl$_2$+InCl$_3$ dissolved in acetonitrile and ethylene glycol on a molybdenum-coated soda lime glass. Sample B was made from CuCl$_2$+InCl$_3$+SeCl$_4$ dissolved in acetonitrile and ethylene glycol on a molybdenum-coated soda lime glass. The X-ray diffraction spectrum for sample A is provided by FIG. 57, and the X-ray diffraction spectrum for sample B is provided by FIG. 58. Both samples show the chalcopyrite structure after being annealed in Se vapor and H$_2$. Both samples were annealed in a Se vapor solely so that the two samples were treated identically for purposes of comparison. However, sample B formed the desired compound and did not need to be treated with Se vapor to achieve this result. Sample A exhibits a CIS XRD pattern similar to JCPDS 87-2265 file. However, sample B has a much higher intensity in (112) "B" (selenium)

face compared with other CIS faces due to the addition of SeCl$_4$ in the precursor solution.

Example 26

Figure 59:
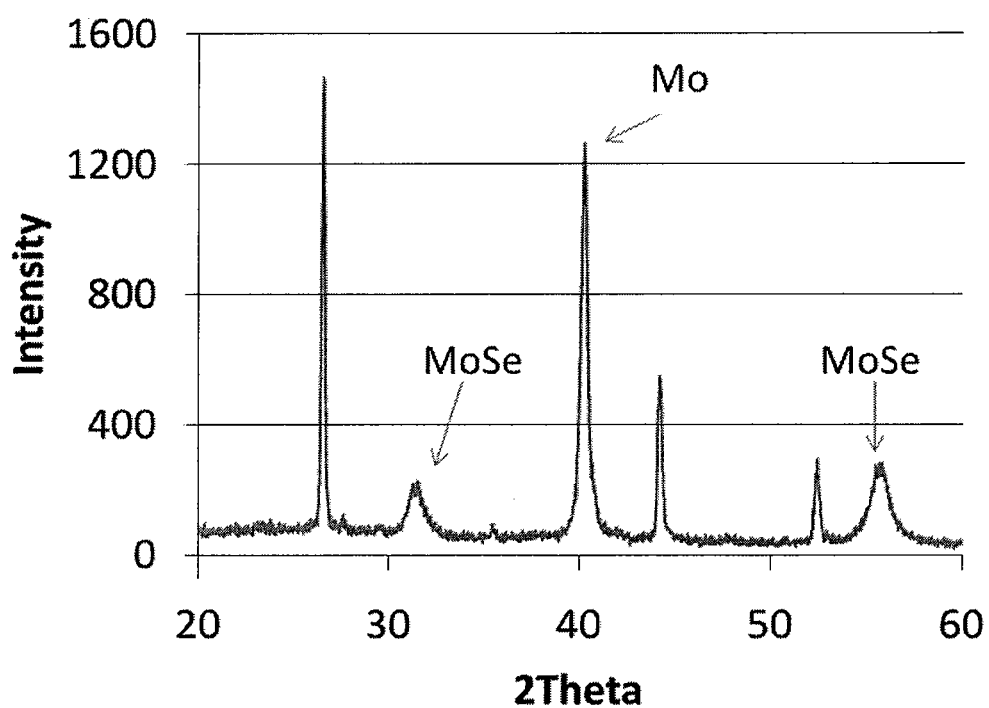
FIG. 59 is an XRD spectrum of a $CuInSe_2$ sample made from $Cu(CO_2CH_3)_2$+$In(CO_2CH_3)_3$ dissolved in ethanolamine, ethanol, and ethylene glycol on a molybdenum substrate after being annealed in Se vapor and $H_2/N_2$.

A CuInSe2 compound was synthesized from copper (II) acetate and indium (III) acetate precursors which were annealed in a H$_2$/N$_2$ mixture with Se vapor. The solution ink included 0.4 mol/L copper acetate (CuAc$_2$) and 0.4 mol/L indium acetate (InAc$_3$) with 2M ethanolamine as a complexing agent and ethanol:ethylene glycol (1:4 ratio) as solvents. The solution ink was printed on a molybdenum substrate and dried. The prepared samples were annealed at 500° C. for 30 min. After annealing the sample was analyzed by Bruker XRD D8. FIG. 59 confirms the successful synthesis of chalcopyrite CIS. In FIG. 51, one peak (labeled as Mo) was attributed to the Mo substrate and two peaks (labeled as MoSe) were attributed to molybdenum selenide.

X. Additional Information

A. Background

Inexpensive and flexible integrated circuits are needed to continue the digital revolution. One approach to making inexpensive and flexible integrated circuits is to fabricate semiconductor devices on flexible polymeric substrates using low temperature processes. Chemical bath deposition (CBD), the aqueous analogue of chemical vapor deposition with the constituent ions dissolved in a water solution, can be used to deposit epitaxial semiconductor layers at low temperatures. CBD has been successfully used as a batch process to deposit many semiconductor compounds, including Ag$_2$S, CdS, CdSe, CoS, Cu$_2$S, PbS, SnS, SnO, MoS$_2$, SbS, TiO$_2$, ZnO, SnSe, CdSnS, CuInSe$_2$, and PbHgS. Batch CBD processes also have been used to make thin film transistors. Gan et al., U.S. Pat. No. 6,225,149, for example, entitled "Method to Fabricate Thin Film Transistors and Circuits," describes forming thin film transistors by preparing a chemical deposition bath and depositing a semiconductor layer using the chemical bath.

In recent years, metal chalcogenide semiconductors have received much attention for electronic and optoelectronic applications. Typically, metal chalcogenides are deposited as binary or ternary compounds including sulfide, selenide and telluride using a variety of techniques, including electrodeposition, vacuum evaporation, Successive Ionic-Layer Adsorption and Reaction, spray pyrolysis, sputtering, chemical vapor deposition (CVD) and chemical bath deposition CBD. Batch CBD processes already have proved useful for fabricating large area devices, such as high efficiency CuInSe$_2$ and CdTe solar cells. P. K. Nair, M. T. S, Nair, V. M. Garcia, O. L. Arenas, Y. Pena, A. Castillo, I. T. Ayala, O. Gomez-daza, A. Sanchez, J. Campos, H. Hu, R. Suarez, M. E. Rincon. *Sol. Energy Mater. Sol. Cells.* 1998, 52, 313. O. Savadogo. *Sol. Energy Mater. Sol. Cells.* 1998, 52, 361.

Though CBD has many advantages, it also has drawbacks. One major drawback is the formation of particles, as well as the unwanted deposition that occurs with such processes, which generates waste and causes device defects. For batch CBD processes, the heat needed for chemical reaction may be supplied from the solution bath to the sample surface. With reference to CdS as an example, this results in both heterogeneous CdS nucleation at the surface as well as homogeneous CdS formation in the bath. Hence, with thermal jacket baths (glass beaker etc.) or water baths, significant CdS deposition also occurs on the walls of the vessels. The bath must be stirred continuously to ensure uniform thermal and chemical mixing and to minimize adhesion of homogeneously nucleated CdS particles to the growing film surface. Moreover, the unequal bath volumes used to form desired CdS films generates substantial waste and also creates device defects. Efforts have been made to reduce the bath-to-surface volume using cover plates. P. K. Nair, V. M. Garcia, O. Gomez-Daza, M. T. S, Nair, *Semicond. Sci. Technol.* 2001, 16, 855. Batch CBD processes also typically require that the deposited material be subjected to relatively high-temperature annealing processes. These high-temperatures generally are not compatible with substrates, such as polymeric materials, that are used to make flexible electronic devices, such as flexible transistors.

Batch CBD processes are quite useful. However, a low-temperature process that combines large area deposition with high utilization and growth rate for high conversion efficiencies and precise control over particle formation and deposition has not yet been demonstrated.

B. Summary

Embodiments of the present system for chemical deposition, particularly continuous deposition of thin films, typically comprise: a micromixer, such as an interdigital micromixer or other type of micromixer [such as disclosed in V. Hessel et al., *Chem. Eng. Sci.* 60, 2479 (2005), which is incorporated herein by reference]; a microchannel applicator; or both. Additional examples of micromixers and microchannel devices are disclosed in U.S. patent application Ser. No. 11/086,074, which is incorporated therein by reference. The present system and process provide a substantially constant flux of reactant solution that allows control over the homogeneous reaction of the chemical bath solution before the solution impinges on the substrate.

Working embodiments of the system typically include at least a first fluid source, more typically at least a first and second fluid source, operably coupled to an micromixer. The mixer effectively mixes fluids to initiate formation of the deposition material. A microchannel applicator may then be used to apply the deposition fluid to a substrate, such as an oxidized silicon substrate. Particular embodiments may use flexible substrates, such as polymeric materials, to form, for example, flexible transistors, light emitting diodes, detectors, and sensors.

A person of ordinary skill in the art will appreciate that the system can include other components, such as components that facilitate chemical deposition. For example, the deposition system may comprise a heater operably coupled to the substrate for heating the substrate. Furthermore, the system may comprise at least one pump for pumping the first and/or second fluids, or at least two pumps for pumping the first and second fluids through the system, such as to the micromixer. Transmission electron microscopy analysis indicated that an impinging flux without the formation of nanoparticles could be obtained using embodiments of the process and system of the present invention.

Uniform and highly oriented materials, such as nanocrystalline semiconductor thin films, were successfully deposited on oxidized silicon substrates using the system. The surface morphologies of the deposited materials were characterized by atomic force microscopy (AFM), scanning electron microscopy (SEM) and 3D Dektak surface profiler. These analyses clearly indicated an improvement of film smoothness and coverage compared to films deposited from a batch process.

A process for chemical deposition, particularly of thin films, also is described. One embodiment of the process comprises providing a first reactant, providing a second reactant, and flowing the first and second reactants to a micromixer to mix the first and second reactants, thereby initiating formation of a deposition material. A person of ordinary skill in the art will appreciate that formation of some deposition materials may require more than 2 reactant streams. The deposition material is then applied to substrate, such as by using a microchannel applicator.

A person of ordinary skill in the art will appreciate that the process and system can be used to make and/or apply many of different deposition materials, depending on the result desired in the device constructed using the method and/or system. Solely by way of example and without limitation, at least a first reactant, and generally at least a second reactant, may be selected to form deposition materials, such as Au, Ag, Cu, Co, Cr, Ge, Ni, Pt, Pd, Rh, Se, Si, Ru, $Ag_2S$, $Ag_2Se$, AgO, $Ag_2O$, $Al_2O_3$, $As_2S_3$, BaO, $Bi_2S_3$, $Bi_2Se_3$, CdO, CdS, CdSe, CdSnO, CdTe, CdZnS, $CeO_2$, CoS, CoSe, CoO, $CrO_2$, $CuBiS_2$, $CuGaSe_2$, $Cu(In,Ga)Se_2$, $CuInSe_2$, $CuInS_2$, $Cu_{2-x}Se$, $Cu_2O$, FeO(OH), $Fe_2O_3$, $Fe_3O_4$, GaAs, GaN, $Ga_2O_3$, GaP, Ge, $GeO_2$, $Hf_2$, HgS, HgSe, InGaAs, InAs, $In_2O_3$, InP, $In_2S_3$, $In_2Se_3$, $La_2O_3$, MgO, MnS, $MnO_2$, $MoO_2$, $MoS_2$, $MoSe_2$, $NbO_2$, NiS, NiSe, NiO, PbHgS, PbS, PbSe, PbTe, $PbO_2$, $ReO_3$, $RhO_2$, $RuO_2$, $Sb_2S_3$, $Sb_2Se_3$, SiGe, $SiO_2$, SnS, $SnS_2$, SnSe, $SnO_2$, $Sb_2S_3$, $TiO_2$, TlS, TlSe, $Tl_2O_3$, $VO_2$, $WO_2$, $Y_2O_3$, ZnO, ZnSe, $ZrO_2$, or combinations thereof.

Certain working embodiments exemplify the invention by reference to the production and/or application to a substrate of CdS, ZnO and $In_xO$. For CdS deposition, the first reactant typically was a cadmium halide, such as cadmium chloride, and the second reactant comprised thiourea.

A person of ordinary skill in the art also will appreciate that the first reactant, the second reactant, or both may comprise additional materials suitable for various functions, such as to facilitate the deposition process. For example, such compositions may include a complexing agent or agents, such as a nitrogen-bearing compound, with ammonia being one example of a suitable nitrogen-bearing complexing agent.

The process can be used to tailor the composition and morphology of the material as deposited on a substrate. For example, where a thin film is deposited on a substrate, the film may be an epitaxial nanostructured thin film, a nanocrystalline thin film, an epitaxial thin film comprising embedded nanocrystals, a superlattice thin film, a composition gradient thin film, a composite thin film comprising core-shell nanoparticles, and combinations thereof. Desired particles can be produced by a chemical bath deposition process by controlling the residence time of the mixed reacting solution, by using a combined chemical bath deposition and solution-based nanoparticle synthesis process, or by using a nanoparticle solution directly.

One advantage of the present process is that it can be used at low temperatures as a post-deposition, high-temperature annealing step is obviated. This allows process flexibility relative to known processes. For example, because high temperature annealing processes are avoided, candidate substrate materials are significantly increased, and include flexible substrate materials, such as polymeric materials, that cannot be used for known, high-temperature chemical bath deposition processes.

The process can be used to produce particular products, such as electronic devices including, without limitation, transistors, flexible transistors, solar cells, flexible solar cells, light emitting diodes, flexible light emitting diodes, detectors, flexible detectors, sensors, flexible sensors, switches, flexible switches, etc. The process for making devices comprises at least one step comprising flowing at least a first, and typically plural, reactants to a micromixer to mix the first and second reactant and initiate formation of a deposition material. The deposition material may then be applied to a substrate using a microchannel applicator. Working embodiments of the process were used to make CdS MISFETs.

C. CBD

1. CBD Generally

The fundamental aspects of CBD are similar to that of a CVD process. Without being limited to a theory of operation, CBD generally involves mass transport of reactants, adsorption, surface diffusion, reaction, desorption, nucleation, and growth. Earlier studies suggested a colloidal-by-colloidal growth model. I. Kaur, D. K. Pandya, K. L. Chopra, *J. Electrochem. Soc.*, 1980, 140, 943. However, more recent investigations by Ortega-Borges & Lincot, based on initial rate studies using a Quartz Crystal Microbalance (QCM), suggested that different growth kinetics are involved. R. Ortega-Borges, D. Loncot, *J. Electrochem. Soc.*, 1993, 140, 3464. Ortega-Borges et al. identified three growth regimes: an induction period with no growth observed; a linear growth period; and finally a colloidal growth period, followed by the depletion of reactants. Ortega-Borges et al. proposed a molecular level heterogeneous reaction mechanism according to the equations provided below.

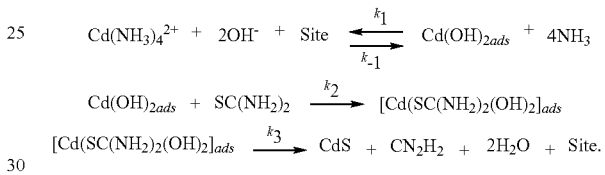

This model has provided a good understanding of CBD processes at the molecular level. It is well known that particle formation plays an important role in CBD processes. Kostoglou et al. reported a detailed and comprehensive model for a CBD process for depositing CdS. M. Kostoglou, N. Andritsos, A. J. Karabelas, *Ind. Eng. Chem. Res.*, 2000, 39, 3272. This model includes particle nucleation, growth, and deposition in addition to molecule-by-molecule film growth.

Figure 60:
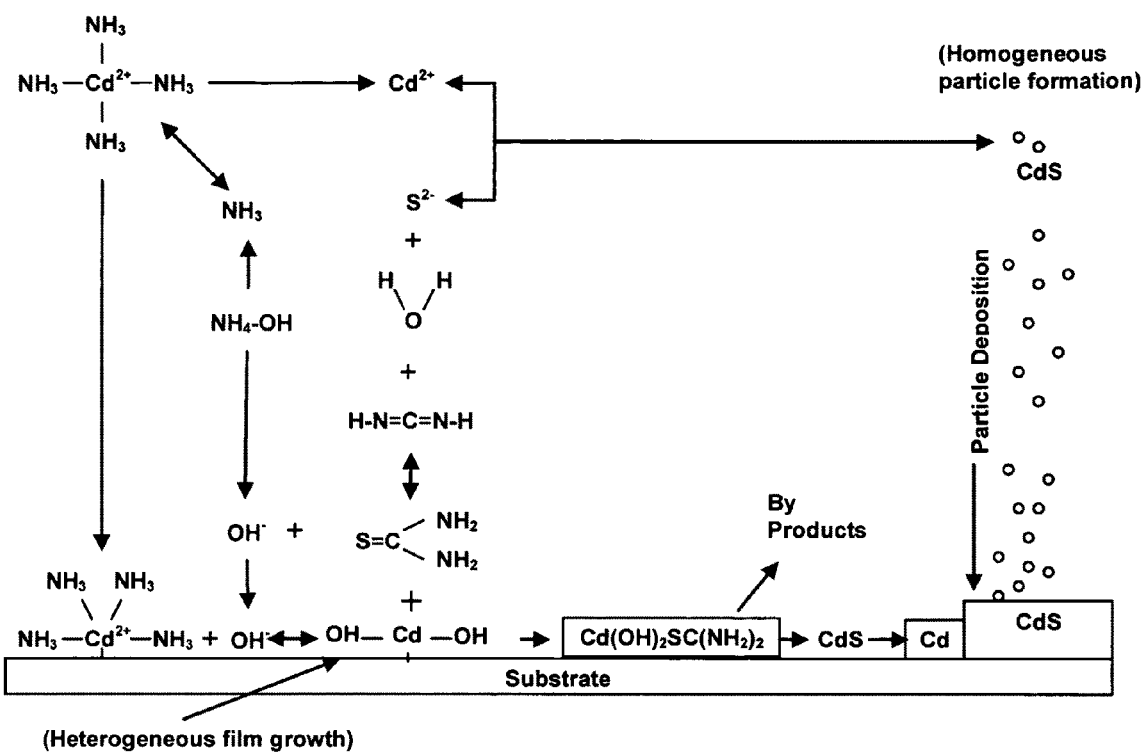
FIG. 60 is a schematic diagram illustrating CBD-CdS growth mechanisms.

FIG. 60 is a schematic diagram of CBD-CdS growth mechanisms that illustrates the results associated with both homogeneous and heterogeneous reactions. Small particles form and grow even at the beginning of the process as observed by dynamic light scattering and TEM measurements. C. Voss, Y. J. Chang, S. Subramanian, S. O. Ryu, Lee, C.-H. Chang, *J. Electrochem. Soc.*, 2004, 151(10), C655, incorporated herein by reference. These experimental results indicated the importance of particle formation even in the linear growth regime. It is desirable to develop a process that de-couples homogeneous particle formation and deposition from the molecular level heterogeneous surface reaction for a better understanding and optimization of CBD processes.

2. Deposition Materials

A person of ordinary skill in the art will appreciate that the present CBD process can be used to deposit a variety of different materials. Disclosed embodiments of the present invention are exemplified with reference to particular materials, such as cadmium sulfide (CdS), zinc oxide (ZnO), and indium oxide ($In_xO$), and the use of such materials to form particular electronic devices, such as transistors. Many different materials can be deposited using the present system, not just the CdS, ZnO and $In_xO$ materials used to exemplify the invention, and many devices other than transistors also can be produced using the system and process. The appropriate selection of a deposition material, and hence reactants potentially useful for forming the desired deposition material, will depend on several factors, including the end use of the device constructed. For example, the composition of the material to be deposited can be selected to provide a desired result in a product made using the material. Once the deposition material is identified, the reactants used to form the deposition material can be varied to maximize reaction efficiency, reduce production costs, decrease or minimize toxicity, waste, etc., and combinations thereof. Other variables also can be manipulated, such as: varying the concentration of the material to be deposited; using complexing agents, such as nitrogen-bearing compounds, including ammonia, to facilitate the process; potentially varying the solvent or suspending liquid to be other than water; and combinations of such variations.

Solely by way of example and without limitation, useful materials that may be formed and deposited by the present CBD process include Au, Ag, Cu, Co, Cr, Ge, Ni, Pt, Pd, Rh, Se, Si, Ru, $Ag_2S$, $Ag_2Se$, AgO, $Ag_2O$, $Al_2O_3$, $As_2S_3$, BaO, $Bi_2S_3$, $Bi_2Se_3$, CdO, CdS, CdSe, CdSnO, CdTe, CdZnS, $CeO_2$, CoS, CoSe, CoO, $CrO_2$, $CuBiS_2$, $CuGaSe_2$, Cu(In,Ga)$Se_2$, $CuInSe_2$, $CuInS_2$, $Cu_{2-x}S$, $Cu_{2-x}Se$, $Cu_2O$, FeO(OH), $Fe_2O_3$, $Fe_3O_4$, GaAs, GaN, $Ga_2O_3$, GaP, Ge, $GeO_2$, $HfO_2$, HgS, HgSe, InGaAs, InAs, $In_2O_3$, InP, $In_2S_3$, $In_2Se_3$, $La_2O_3$, MgO, MnS, $MnO_2$, $MoO_2$, $MoS_2$, $MoSe_2$, $NbO_2$, NiS, NiSe, NiO, PbHgS, PbS, PbSe, PbTe, $PbO_2$, $ReO_3$, $RhO_2$, $RuO_2$, $Sb_2S_3$, $Sb_2Se_3$, SiGe, $SiO_2$, SnS, $SnS_2$, SnSe, $SnO_2$, $Sb_2S_3$, $TiO_2$, TlS, TlSe, $Tl_2O_3$, $VO_2$, $WO_2$, $Y_2O_3$, ZnO, ZnS, ZnSe, $ZrO_2$, etc., and combinations thereof.

Again by way of example, and without limitation, CdS can be made from a source of cadmium (II) and a source of sulfide. Examples, without limitation, of a suitable Cd (II) source are the halides, such as cadmium chloride ($CdCl_2$). The cadmium (II) source is then combined with a sulfide source, such as thiourea, to form CdS. A working embodiment of the present invention useful for forming CdS used a continuous microreactor system; a first solution comprising 24 milliliters of cadmium chloride, ammonium chloride and ammonium hydroxide; and a second mixture comprising aqueous thiourea. The concentrations of the materials for this working embodiment were 0.004 M $CdCl_2$, 0.04 M $NH_4Cl$, 0.04 M thiourea, and 0.4 M $NH_4OH$.

Zinc oxide also has been processed using working embodiments of the present apparatus and system. For ZnO, the continuous deposition reactor included a microprocessor-controlled dispensing pump (ISMATEC® pumps), a T-mixer, and a substrate heater. The ZnO thin films were prepared from source solutions of A, comprising 200 milliliters of 0.005 M zinc acetate, and 10 milliliters of 0.25 M ammonium acetate; and B, comprising 200 milliliters of 0.1 M sodium hydroxide. The source solutions were mixed through a T-mixer and entered a micro-tube, which was immersed in an 80° C. hot bath. The mixture was impinged on a substrate that was maintained at 80° C. by a heater.

Indium oxide also has been processed using working embodiments of the present invention and system. An indium oxide thin film was deposited using 0.03 M $InCl_3$ dissolved in acetonitrile solvent and pumped through a microprocessor-controlled dispensing pump (ISMATEC® pumps). The solution passed through a micro-tube and impinged on a heated substrate that was maintained at 70° C. A working thin film transistor was fabricated from an indium oxide film as discussed further in the examples.

As will be apparent to a person of ordinary skill in the art, many of the metals, alloys, semiconductors, etc., that are desirably deposited using the present invention are produced by mixing precursor materials that react to form the desired deposition material. Any effective metal precursor material can be used with the present invention. Solely by way of example, and without limitation, particular examples of metal precursors include halides, acetates, nitrates, sulfates and carbonates. Mixtures of such precursors also can be used.

The reactant sources can be formulated with other materials that facilitate the process. For example, the metal source, such as the cadmium (II) source, can be formulated with other materials, such as complexing agents. Many of the useful complexing agents are nitrogen-bearing compounds, including by way of example, and without limitation, ammonia, aliphatic amines, aliphatic amides, with particular examples including ammonia, triethanolamine, ethanolamine, diethylenetriamine, ethylenediaminetetracetate, hydrazine, nitrilotriacetate and triethylenetriamine. Plural different complexing agents also can be used in combination. The reactant sources also can be formulated in different solvents, such as water and/or organic solvent(s), to form a first fluid mixture. Thiourea also can be combined with other materials, such as ammonia and water, to form a second mixture. The deposition material, such as cadmium sulfide, is then formed by combining the first mixture with the second mixture.

The reactants also can include chalcogens, and hence chalcogenide precursors are compounds potentially useful for practicing the present invention. Examples of chalcogenide precursors include, by way of example and without limitation, thiourea, thioacetamide, thiocarbazide, thiosemicarbazide, ethylthiourea, allylthiourea, selenourea, N,N dimethyl selenourea, thiosulfate, selenosulfate, water, peroxide, persulfate, sodium hydroxide, urea, dimethylamineborane, trimethylamineborane, acetamide, hexamethyleneteramine, and combinations of such materials.

D. Continuous Flow CBD Systems

1. Working Embodiments

Figure 61:
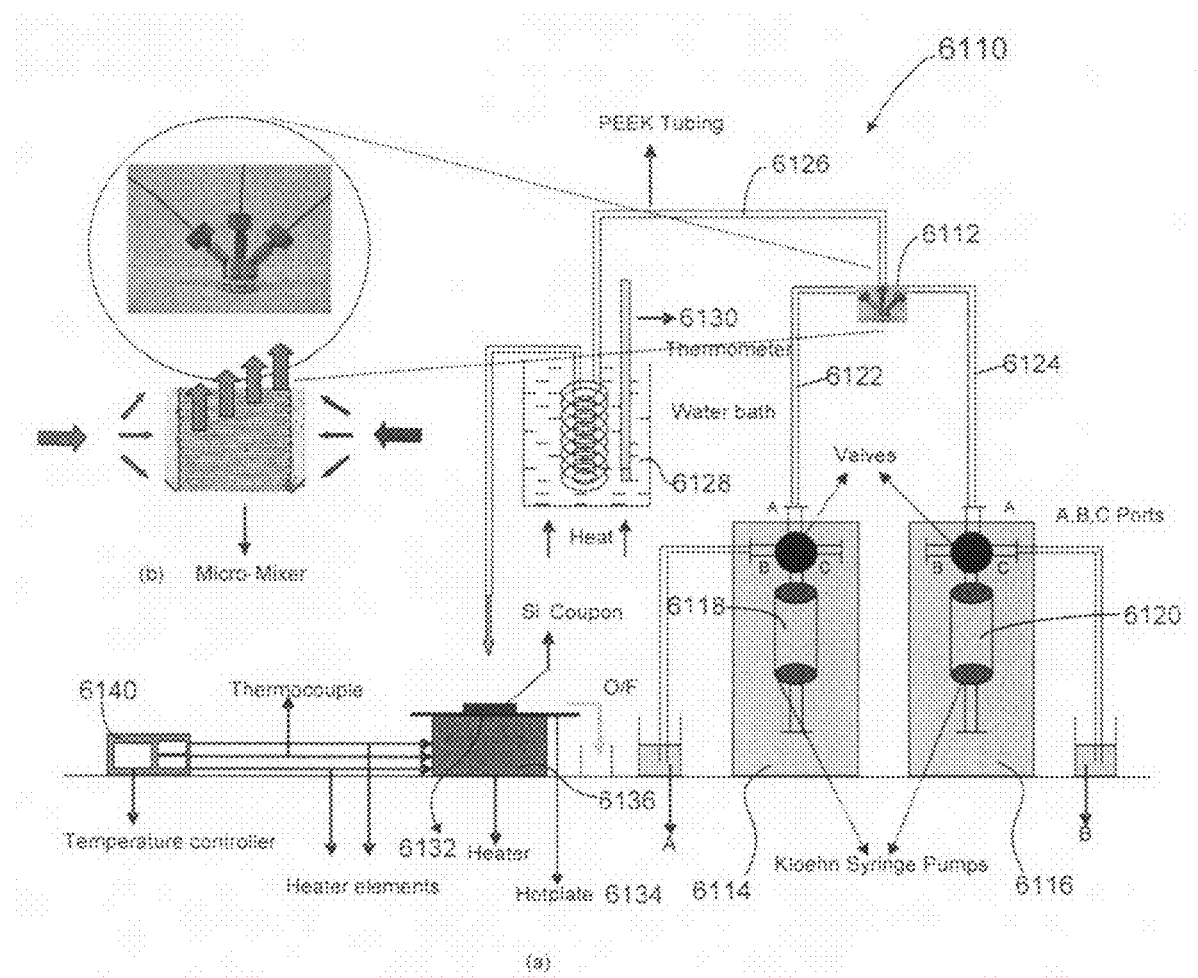
FIG. 61 is a schematic diagram of one embodiment of a continuous flow microreactor system.

Embodiments of a continuous flow microreactor system have been developed for performing CBD. FIG. 61 is a schematic diagram of one embodiment of a continuous flow microreactor CBD system 6110. System 6110 includes a mixer 6112, particularly a micromixer, such as an interdigital micromixer. A detailed schematic diagram of one embodiment of a micromixer is shown in the FIG. 61 inset. Micromixers offer features that cannot be easily achieved using macroscopic devices, such as ultrafast mixing on the microscale. D. Bökenkamp, A. Desai, X. Yang, Y.-C. Tai, E. M. Marzluff, S. L. Mayo., *Anal. Chem.*, 1998, 70, 232. As illustrated in FIG. 61, two fluids A and B to be mixed are introduced into the mixer 6112, often as two counter-flowing fluid streams. For an interdigital micromixer 12, the two fluids A and B enter interdigital channels (30 µm in a working embodiment) and form plural interpenetrated substreams. The substreams exit the interdigital channels perpendicular to the direction of the feed flows, initially with a multilayered structure. Fast mixing through diffusion soon follows due to the small thickness of individual layers.

The continuous flow microreactor system 6110 includes a reactant source, typically plural reactant sources, such as reactant sources 6114, 6116, that are combined to form the deposition material or materials. Again, as discussed above, the composition of the reactant sources 6114 and 6116 may vary, such as to provide desired deposition materials, reduce cost, reduce toxicity, provide flexibility in the selection of appropriate reactants, etc. The illustrated embodiment of system 6110 includes two syringe pumps 6118, 6120 that pump desired quantities of reactants A and B at desired flow rates to the mixer 6112. In working embodiments, two syringe pumps (V6 module from Kloehn Ltd.) of 25 milliliters each were used for reactant streams A and B. Each pump 6118, 6120 had three ports (A, B, C). One port of each pump aspirated the reactant streams and one port was used for dispensing the same. Syringe pumps 6118, 6120 were fluidly coupled to mixer 6112 using polyetheretherketone (PEEK) conduits 6122, 6124 (1/16" OD, 0.03" ID from Upchurch Scientific).

For the illustrated embodiment, a commercial interdigital micromixer (SSIMM from Institut für Mikrotechnik Mainz, Germany)[13] was used. This interdigital micromixer included a stainless steel (SS 316Ti) housing with inlaid, thermally oxidized silicon to form 30 μm×100 μm microchannels. Reactant streams A and B were pumped through PEEK conduits 6122 and 6124, respectively, for mixing in mixer 6112.

The fluidmixture flowing from mixer 6112 comprises the chemical species useful for deposition. In the embodiment 6110 illustrated in FIG. 61, conduit 6126 was a 5-foot-long coil of PEEK. PEEK conduit 6126 was immersed in a water bath 6128 to provide temperature control. Water bath 6128 generally was maintained at an effective temperature for CdS processing, such as a temperature of from about 80° C. to about 85° C. (using a VWR hot plate stirrer). A person of ordinary skill in the art will appreciate that the effective temperature may vary depending on, for example, the composition of the deposition material. Moreover, the homogeneous chemistry of the impinging flux can be controlled by selecting various factors, such as the length of the channel 6126, the flow rate through channel 6126, residence time in channel 6126, etc., and combinations thereof.

The fluid mixture formed by mixing fluids A and B was made to impinge on substrate 6132. In the illustrated embodiment, the substrate 6132 was coupled to a metal plate 6134. Certain embodiments of CBD are facilitated by heating. In the embodiment illustrated in FIG. 61, system 6110 includes a hotplate 6136 (2" dia.×0.75" thick SS disk from Watlow). For certain working embodiments employing CdS as a deposition material, the hot plate was maintained at a temperature of from about 80° C. to about 90° C. The temperature controller 6140 was effectively coupled to the hot plate 6136 to control the temperature thereof.

In a working embodiment for CdS, the syringe pumps were operated at a speed of 250 steps/sec. (Hz). The mean residence time of the mixture was about 5 seconds. Once the process was completed, the substrate 6132 was removed from the plate 6134, washed with Millipore DI water and dried under a stream of nitrogen gas.

Figure 62:
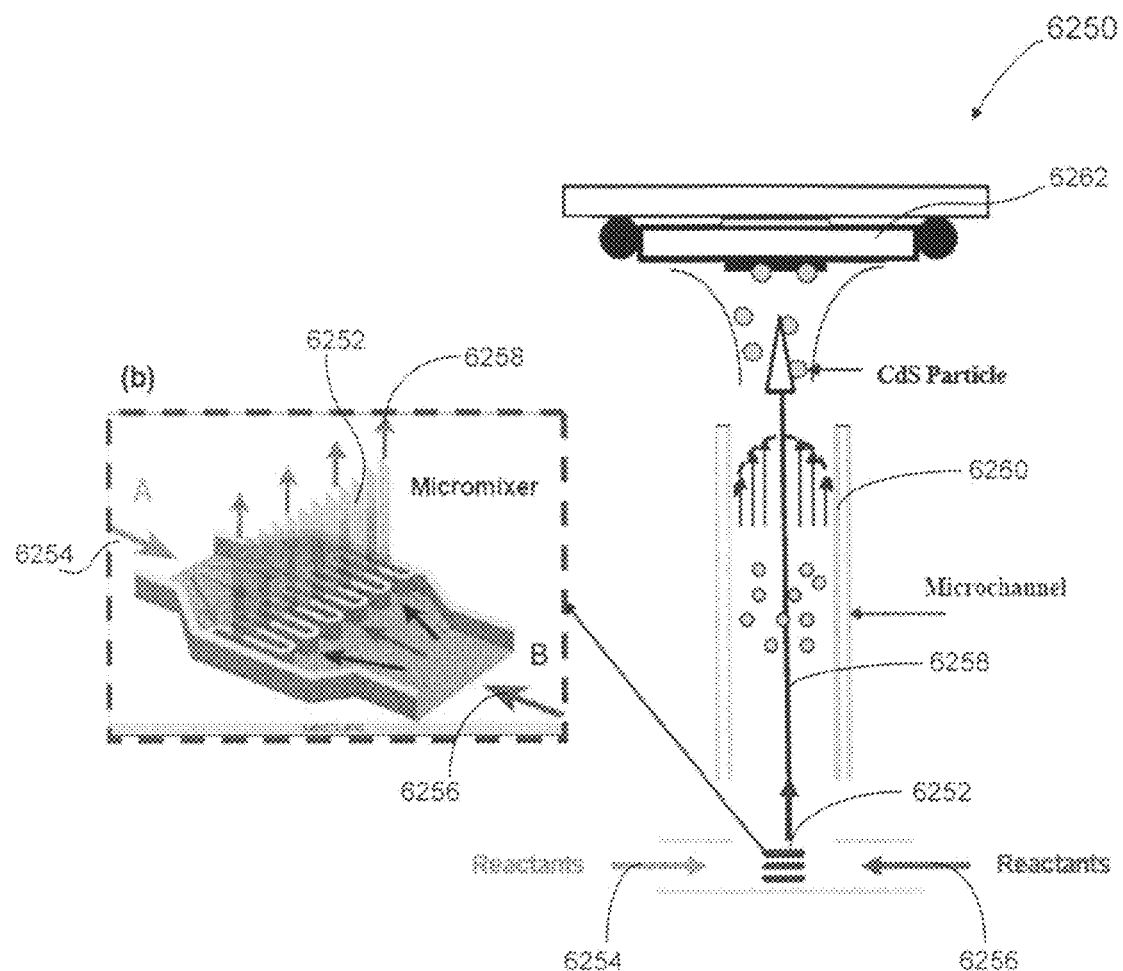
FIG. 62 is a schematic diagram of one embodiment of an impinging flow bath deposition reactor, with the inset illustrating one embodiment of an interdigital micromixer.

FIG. 62 is a schematic cross sectional drawing illustrating an impinging flow chemical bath deposition reactor 6250. The inset to FIG. 62 is an enlarged view of the micromixer 6252 illustrated schematically in FIG. 62. FIG. 62 shows that a first reactant stream 6254 and a second reactant stream 6256 flow into micromixer 6252, thereby forming a third stream 6258 comprising the desired chemical species for substrate deposition. Third stream 6258 flows through a channel 6260, particularly a microchannel, for direct impingement on to the substrate 6262.

Figure 63:
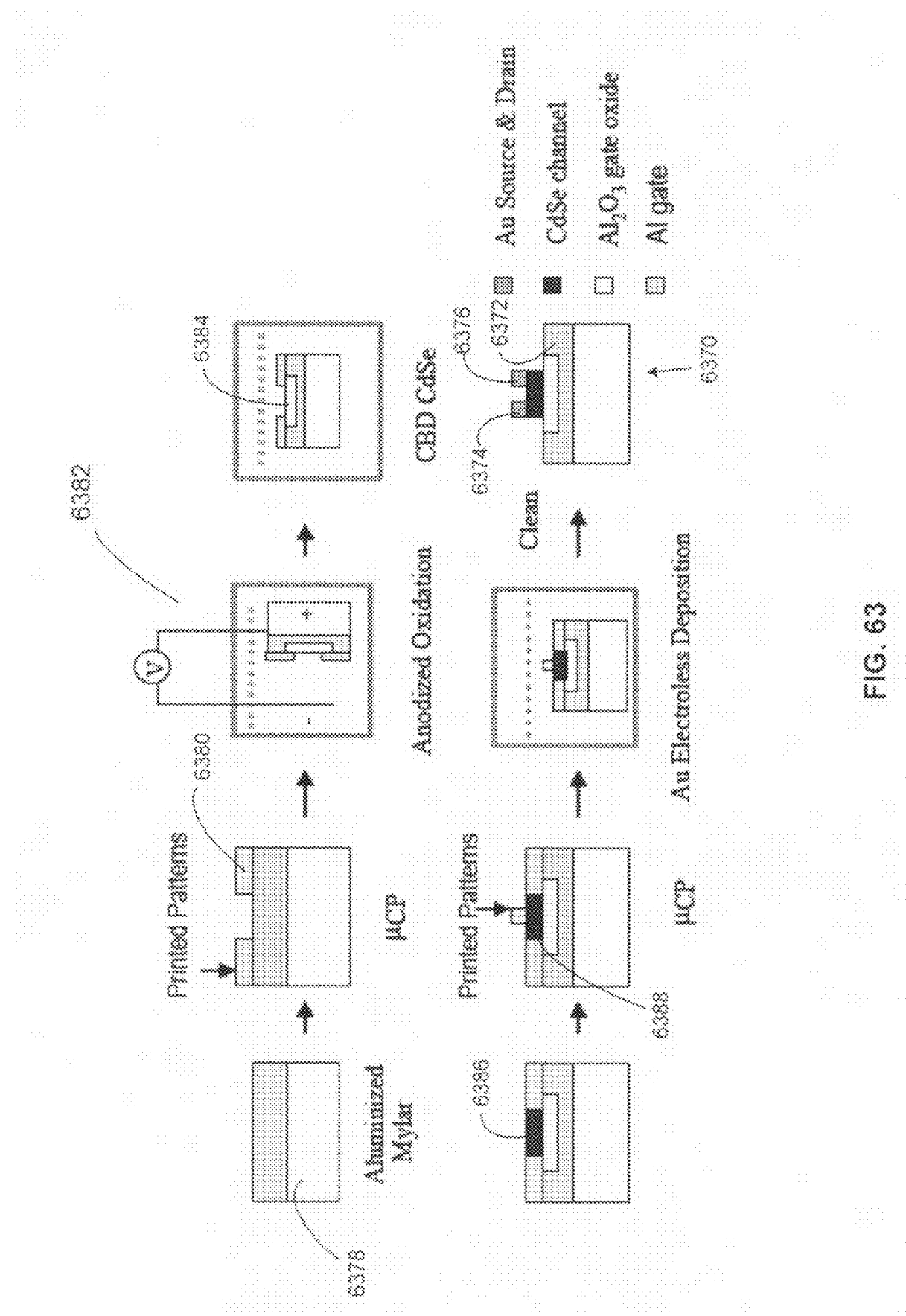
FIG. 63 is a schematic illustration of one embodiment of a process useful for forming a transistor.

FIG. 63 is a schematic representation of one embodiment of a process useful for forming transistors 6370 comprising an aluminum gate 6372 and gold source and drain 6374, 6376. FIG. 63 illustrates that a first component 6378 comprising aluminized Mylar is provided. Printed patterns 6380 are then formed on the aluminized Mylar substrate 6378 using, for example, micro-contact printing (μCP). μCP relies on replicating a patterned elastomeric stamp made from a master that can be inked with a self-assembled-monolayer-forming ink. The stamp is then used to print the desired pattern onto the surface of the substrate, which subsequently can be used as a mask. This technique has been used to fabricate field effect transistors with a gate length of about 20 μm. See, for example, "Patterning Organic-Inorganic Thin Film Transistors using Microcontact Printed Templates," *Appl. Phys. Lett.*, 79, 3536-3538 (2001); and "Using Soft Lithography to Fabricate GaAs/AlGaAs Heterostructures Field Effect Transistors,"*Appl. Phys. Lett.* 71(14), 202-2022 (1997), which are incorporated herein by reference. μCP has been used with alkanethiol inks to transfer patterns onto a gold surface. "Features of Gold having Micrometer to Centimeter Dimensions can be Formed through a Combination of Stamping with an Elastomeric Stamp and an Alkanethiol "ink" Followed by Chemical Etching," *Appl. Phys. Lett.*, 63, 2002-4 (1993), which is incorporated herein by reference. Alkanethiol chemistry and rolling stamp techniques can be easily adapted for large scale, roll-to-roll manufacturing processes. Alkylsiloxane chemistry can be used to pattern $Al/Al_2O_3$ surfaces. "An Introduction to Ultrathin Organic Films from Langmuir-Blodgett to Self-Assembly," Ulman, Academic Press (1991), which is incorporated herein by reference Again with reference to FIG. 63, once the printed patterns 6380 are produced, the substrate 6378 then may be subjected to an electrochemical anodization oxidation process (indicated as process step 6382) to form aluminum oxide gate 6384. A semiconductor material, such as CdSe, is then deposited using embodiments of a process and system of the present invention to produce a channel 6386. Desired printed patterns 6388 are then formed, such as by μCP, followed by deposition of gold to provide source and drain 6374, 6376. Post production processes, such as cleaning processes, also can be employed.

2. Commercial Implementation

Figure 64:
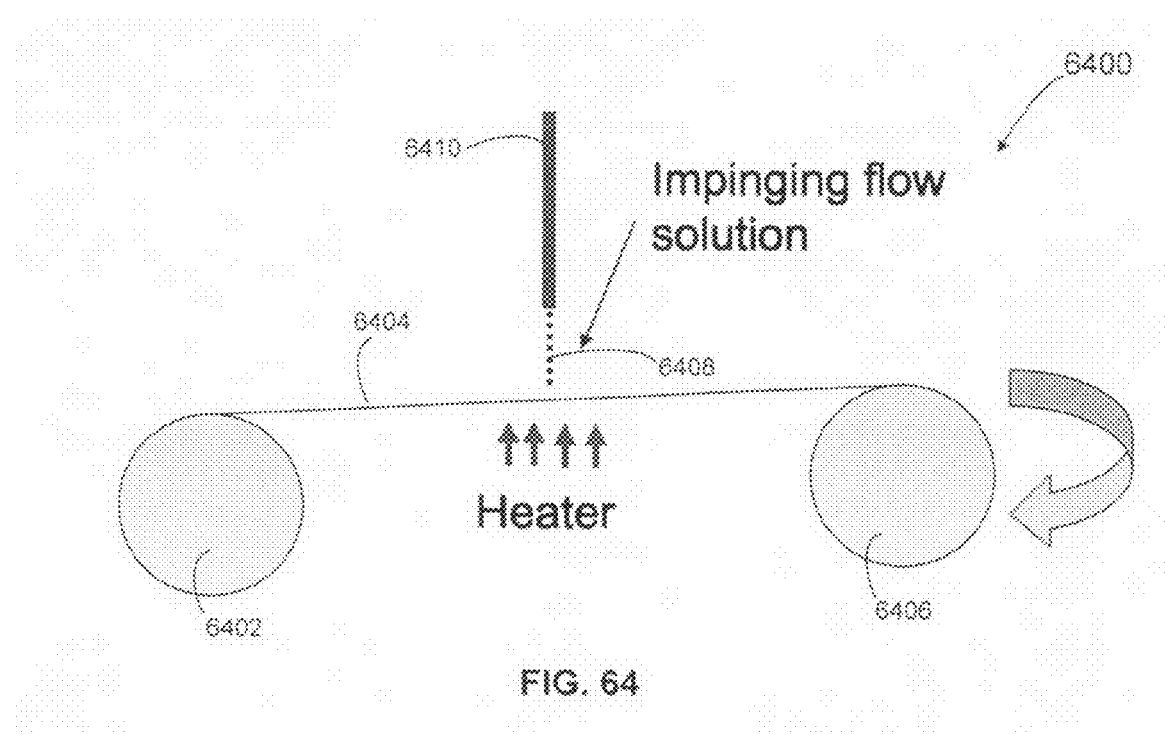
FIG. 64 is a schematic diagram illustrating one embodiment of a process using a roll-to-roll substrate susceptor or a substrate roll.

System 6110 may be modified to provide various CBD systems. A commercial system 6110 might include, for example, a continuous susceptor. FIG. 64 illustrates one embodiment of a continuous roll-to-roll susceptor 6400. The illustrated embodiment includes a first roller 6402 comprising a feed roll of a substrate or susceptor material 6404. Material 6404 is fed to a second roller 6406. Rollers 6402 and 6406 move material 6404 into a position effective to receive an impinging solution flow of a deposition material 6408 from channel 6410.

Figure 65:
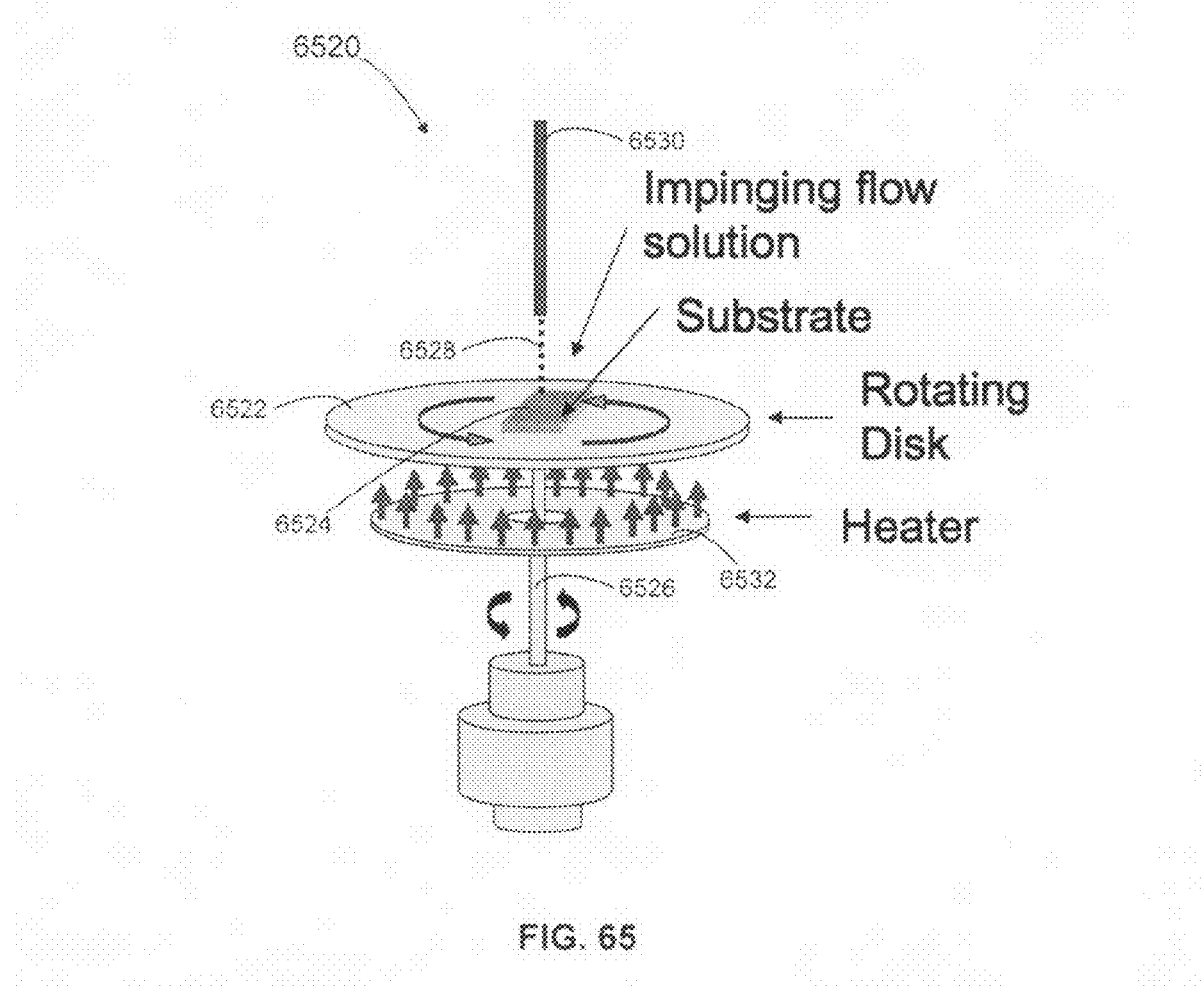
FIG. 65 is a schematic diagram of one embodiment of a rotating disk substrate susceptor.

Alternatively, system 6110 may include a rotating disk substrate susceptor system 6520, such as illustrated in FIG. 65. System 6520 includes a rotating disk 6522. While the illustrated disk is substantially circular, a person of ordinary skill in the art will realize that the disk 6522 need not be circular, and can have any geometric shape reasonably suited for use as a rotating disk susceptor. Substrate 6524 is coupled to the disk 6522 to allow rotation of the substrate 6524. Disk 6522 is effectively coupled to a rotator, such as a motor, via shaft 6526.

An impinging solution flow of deposition material 6528 is directed to substrate 6524 via channel 6530. As with other disclosed embodiments, heat may facilitate the deposition process. As a result, a heater 6532 also optionally may be included in a manner effective to transfer heat to the substrate 6524.

Figure 66:
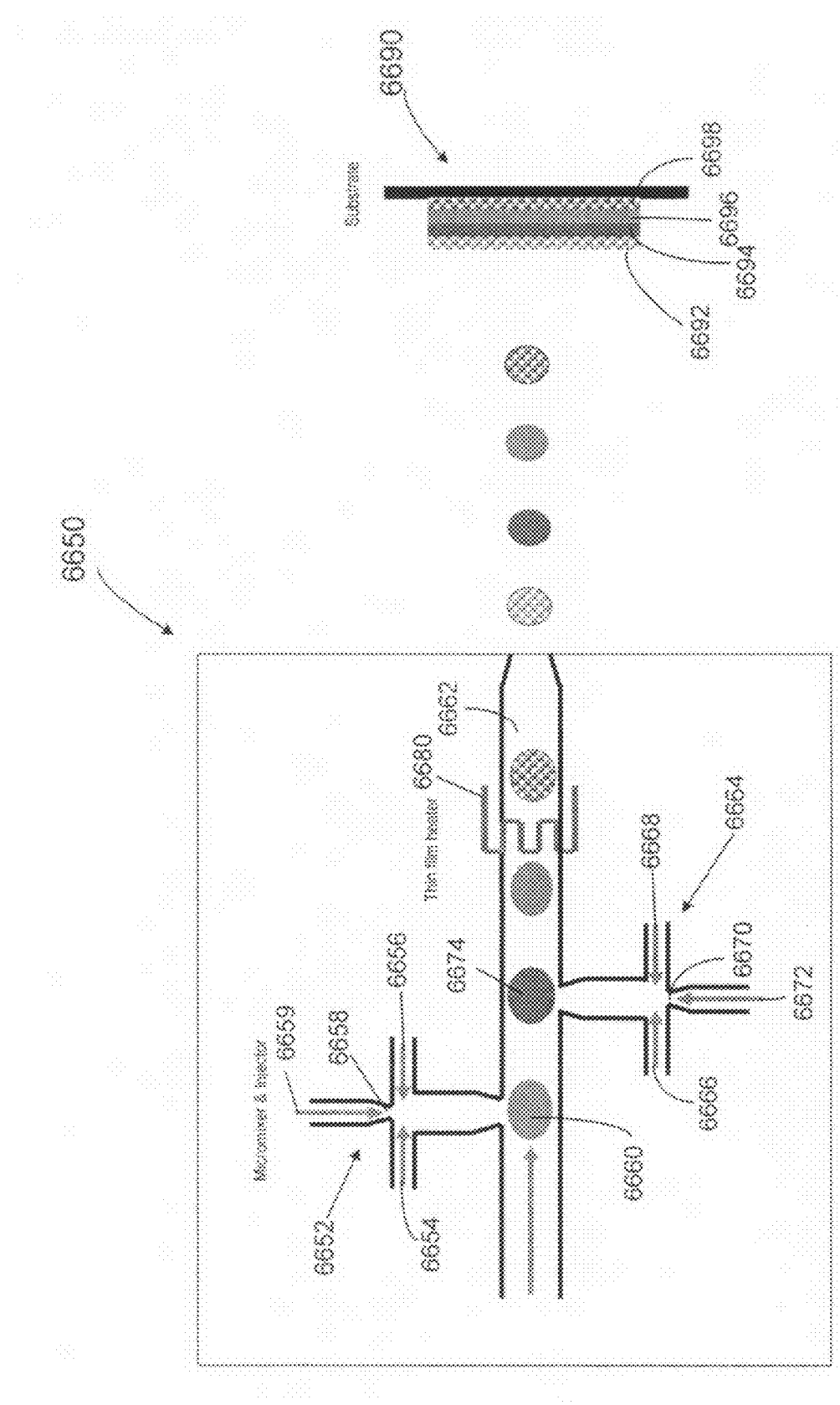
FIG. 66 is a schematic diagram of one embodiment of chip-based chemical mixing and deposition system.

System 6110 also can be provided as a chip-based system. A schematic drawing of a chip-based system 6650 is illustrated in FIG. 66. System 6650 includes a first micromixer section 6652. For embodiments comprising plural fluid reactants, at least a first fluid 6654 and a second fluid 6656 are flowed into the mixer 6652. A third port, such as port 6658, can be provided to aspirate fluids in mixer 6652. Alternatively, at least a third fluid stream 6659 can be flowed into micromixer system 6652. The number and composition of the fluid streams will vary as determined by the chemical system in use. Impinging fluid streams 6654, 6656 and/or 6659 are thoroughly mixed in mixer 6652 to form a deposition material 6660 that is flowed to the substrate via a fluid channel 6662.

Many devices, such as electrical devices including transistors, may require deposition of a more than one material onto a substrate. Furthermore, such material(s) typically must be applied in a particular order to produce a working device. The possibility of depositing more than one material is contemplated by the chip-based system 6650. In this embodiment, at least a second micromixer 6664 optionally is provided.

As with micromixer 6652, at least a first fluid 6666 and a second fluid 6668 are flowed into the mixer 6664. A third port 6670 can be provided to aspirate fluids in mixer 6664. Alternatively, at least a third fluid stream 6672 can be flowed into micromixer 6664. The fluid streams 6666, 6668 and/or 6672 are mixed in mixer 6664 to form a deposition material 6674. Deposition material 6674 may be the same as deposition material 6660, or can be a different deposition material. Thus, by using plural different deposition materials, a deposited layer may have a composition gradient throughout its cross section.

System 6650 can include a heat transfer section. One example of a device useful for heat transfer is a heater, such as a thin film heater 6680.

Once formed, the deposition materials 6660, 6674, etc. are flowed through channel 6662 to impinge on a substrate 6690. Again, in the illustrated embodiment, the device formed includes plural layers 6692, 6694, 6696 and 6698, all of which layers may be different in composition or morphology, all of which layers may be the same in composition and morphology, and all possible combinations thereof.

Figure 67:
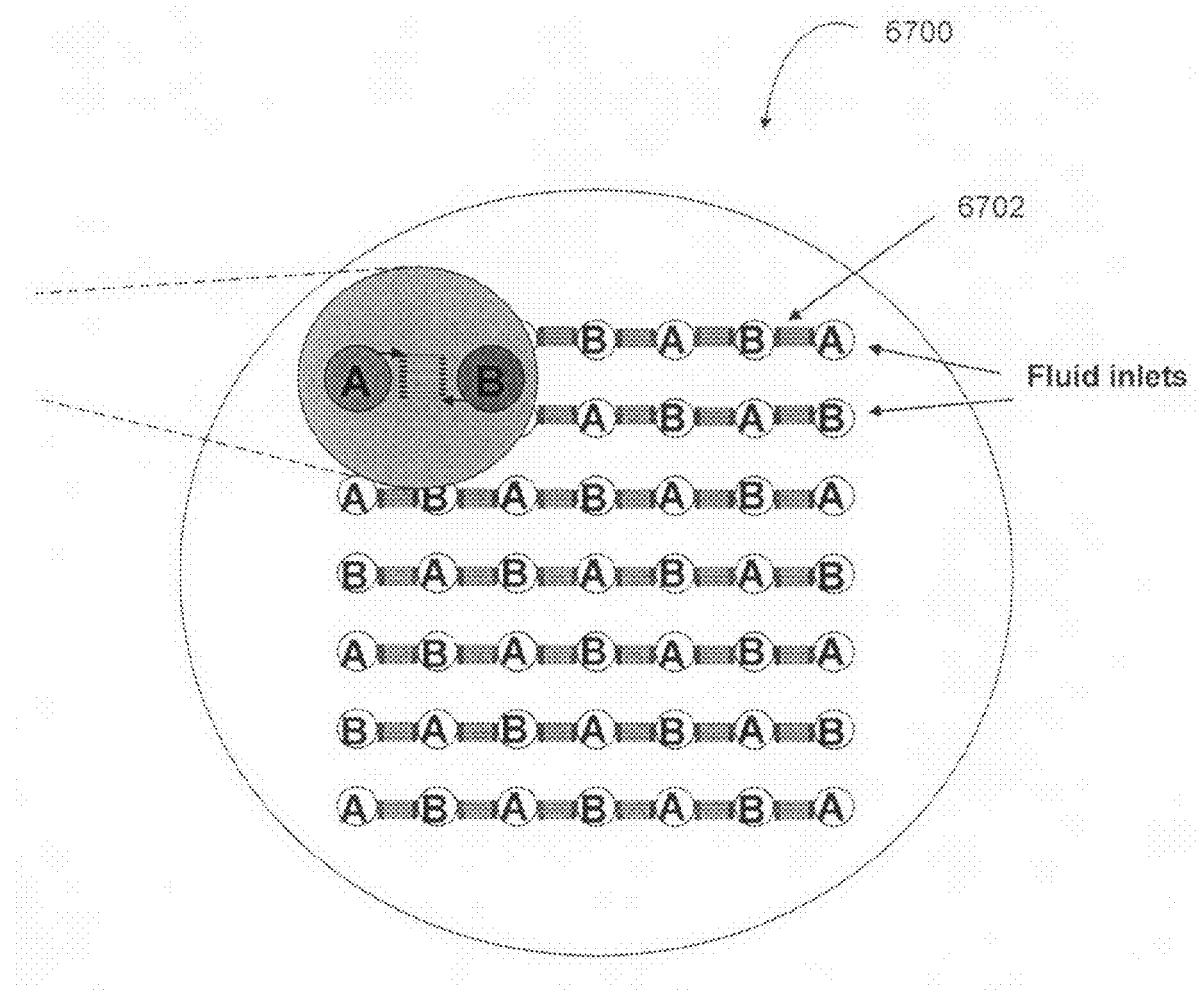
FIG. 67 is a schematic diagram of one embodiment of a micromixer array.

Micromixers are used effectively with certain embodiments of the present invention. Micromixers can be provided as unitary devices that can be used singularly, or plural such micromixers can be used. With chip-based systems, micromixer arrays, such as the array 6700 shown in FIG. 67 comprising plural micromixers 6702, can be used. One arrangement of plural micromixers to form an array is illustrated in FIG. 67. A person of ordinary skill in the art will appreciate that other micromixer arrangements can be used, such as a linear array of micromixers.

3. Thin Film Structures

Figure 68:
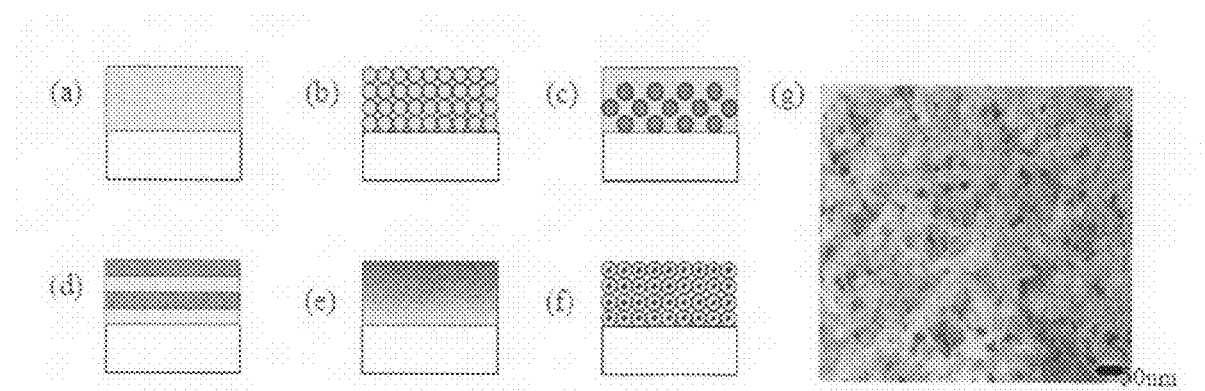
FIG. 68 is a schematic cross sectional drawing illustrating thin film morphologies that can be formed using embodiments of the present invention.

The present invention provides embodiments of a process and apparatus useful for depositing thin films on substrates. The process and apparatus can be used to deposit various films with tailored micro- and nanostructures. FIG. 68 is a schematic cross sectional representation providing examples of thin films that can be formed according to embodiments of the present invention. FIG. 68A is a schematic representation of an epitaxial nanostructured thin film; FIG. 68B is a schematic representation of a nanocrystalline thin film; FIG. 68C is a schematic representation of nanocrystals embedded in an epitaxial thin film; FIG. 68D is a schematic representation of a superlattice thin film; FIG. 68E is a schematic representation of a composition gradient thin film; and FIG. 68F is a composite film comprising core-shell nanoparticles. FIG. 68G is a plan view TEM image of nanocrystalline CdS deposited by a batch CBD process.

E. Electronic Devices

The present system is useful for forming electronic devices. One example, without limitation, of such an electronic device is a transistor. The structure and materials used to form such electronic devices, including transistors, are known to a person of ordinary skill in the art.

Figure 69:
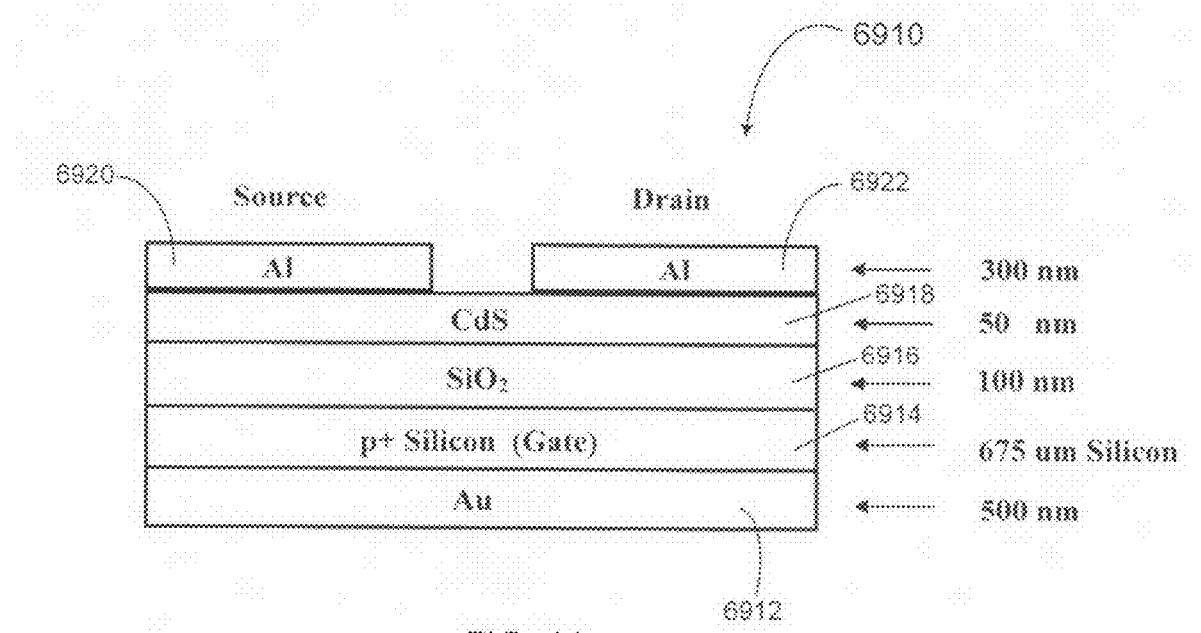
FIG. 69 is a schematic cross-sectional drawing of one embodiment of a CdS MISFET structure.

FIG. 69 is provided to exemplify devices that can be made according to the present invention. FIG. 69 is a schematic diagram of one embodiment of a CdS metal insulator semiconductor field effect transistor (MISFET) 6910 that has been made using working embodiments of the present invention. MISFET 6910 includes plural layers. The first layer 6912 was a gold layer, approximately 500 nanometers in thickness. First layer 6912 served as a gate contact. A boron (p+) doped silicon substrate, having a thickness of about 675 μM, was used to form gate layer 6914. A silicon dioxide layer 6916 was thermally grown on gate layer 6914 to a thickness of about 100 nanometers. A cadmium sulfide layer 6918, having a thickness of about 50 nanometers, was thin-film deposited onto the silicon dioxide layer using an embodiment of a continuous flow microreactor system of the present invention. Finally, aluminum source layer 6920 and drain layer 6922 were evaporated onto the CdS layer 6918 through a shadow mask to a thickness of about 300 nanometers. Additional detail concerning formation of the MISFET 6910 of FIG. 10 is provided below in the working examples.

F. Characterization of Deposited Thin Films

Figure 70A:
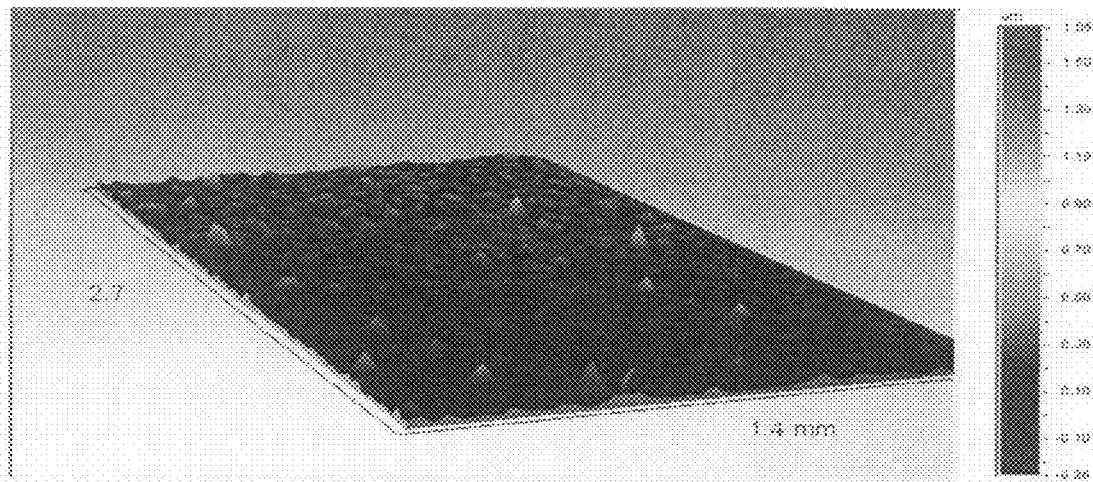
FIG. 70A is a surface profile image of a CdS film deposited by a batch reactor.
Figure 70B:
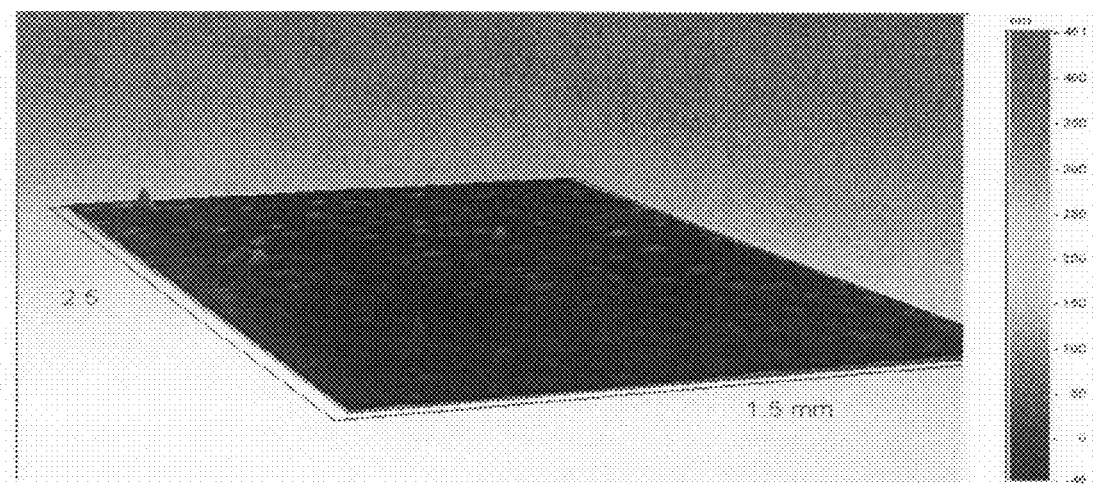
FIG. 70B is a surface profile image of a CdS film deposited by a continuous flow microreactor.
Figure 87:
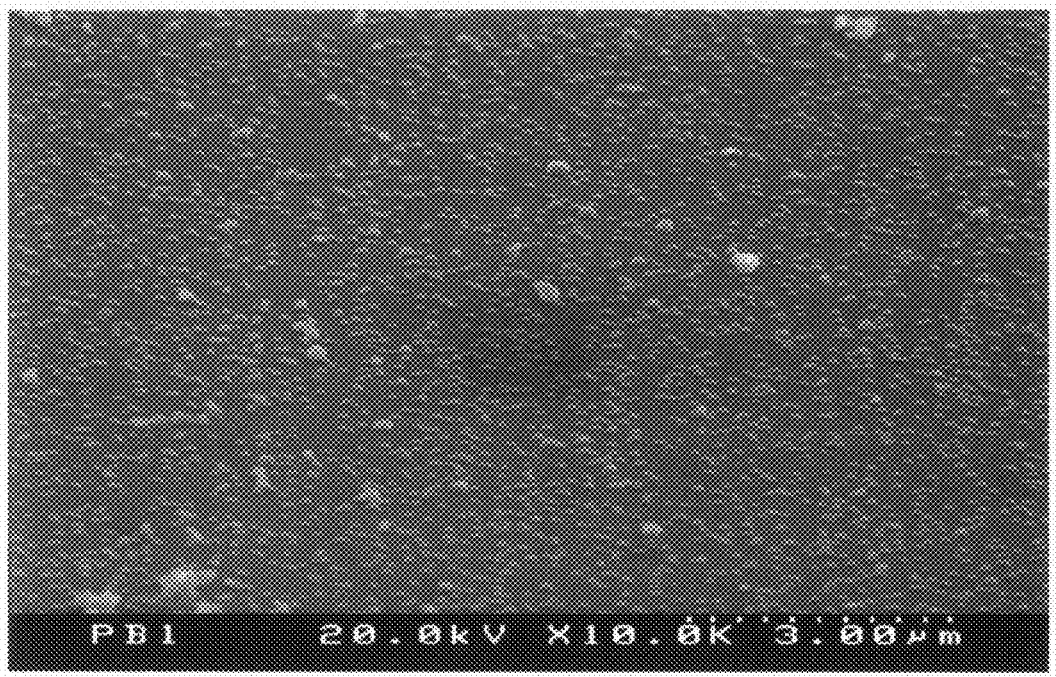
FIG. 87 is an SEM image of a CdS film deposited by a batch reactor.
Figure 88:
FIG. 88 is an SEM image of a CdS film deposited by a continuous flow microreactor.

Thin films deposited using embodiments of the present method and system have been characterized by AFM, TEM, XRD and 3D Dektak surface profilometry. FIG. 70 shows the surface profiler images of CdS films deposited by (A) a batch reactor and (B) a continuous flow microreactor according to the present invention. FIG. 70 demonstrates that films deposited by continuous flow microreactor systems according to the present invention are much smoother than films deposited by batch reactors. This also is demonstrated by FIGS. 87 and 88. FIG. 87 is an SEM of a CdS film deposited by a batch reactor. FIG. 88 is an SEM of a CdS film deposited by a continuous flow microreactor. FIGS. 87 and 88 demonstrate that films deposited by the continuous flow microreactor are smooth and continuous. Conversely, the batch reactor produced isolated CdS dots on the order of hundreds of nanometers in size.

Figure 71A:
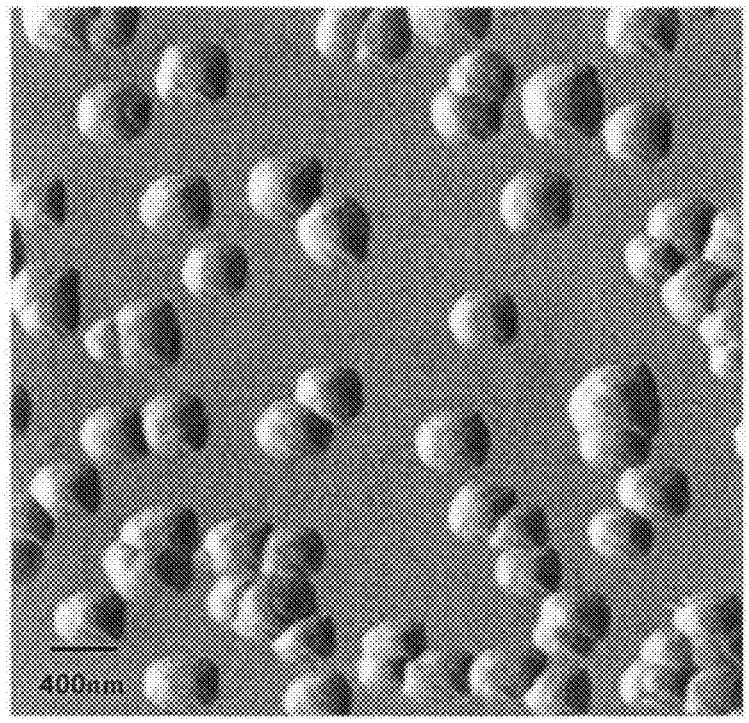
FIG. 71A is an atomic force microscopy (AFM) image of a CdS film deposited by a batch reactor.

FIG. 71 compares 2 μm×2 μm AFM scans of CBD CdS films deposited on a silicon oxidized substrate using batch and continuous flow microreactor processes. These AFM images reveal a clear difference in the appearance of the surface for samples deposited by batch processes compared to continuous flow microreactor systems. FIG. 71A shows the surface morphology of CdS deposited on an oxidized silicon substrate using a batch reactor for 3.12 minutes. FIG. 71A shows isolated groups of pyramidal CdS nanocrystals grown on top of the oxidized silicon substrate. This surface is referred to herein as a substantially discontinuous film. The sample has a root mean square (RMS) surface roughness of 19.592 nm with a mean roughness of 15.795 nm.

Figure 71B:
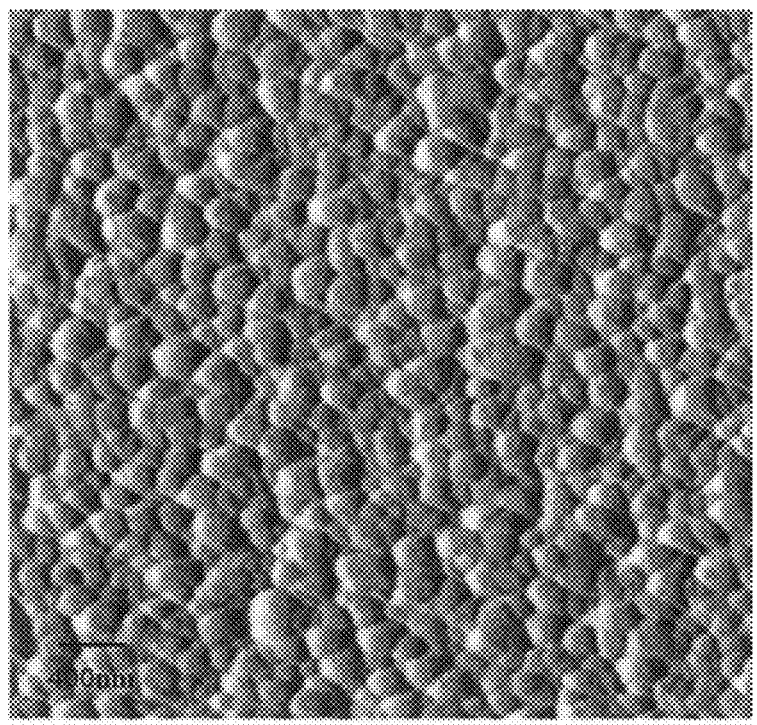
FIG. 71B is an AFM image of a CdS film deposited by a continuous flow microreactor.

FIG. 71B shows the surface morphology of a continuous flow microreactor deposited film of the same scan size (2 μm×2 μm). The AFM image shows a substantially continuous nanocrystalline film in contrast to the substantially discontinuous CdS nanocrystals produced using a batch process and the same deposition time. The RMS roughness value was found to be 11.751 nanometers with a mean roughness of 9.606 nanometers.

The reactant concentration of the batch process decreases quickly as the reaction proceeded due to homogeneous particle formation. Without being limited to a theory of operation, the continuous flow microreactor supplied a reactant flux with constant concentration that provides a higher nucleation density. This higher nucleation density made a significant difference in film coverage between the batch and a continuous flow microreactor processes.

Figure 72:
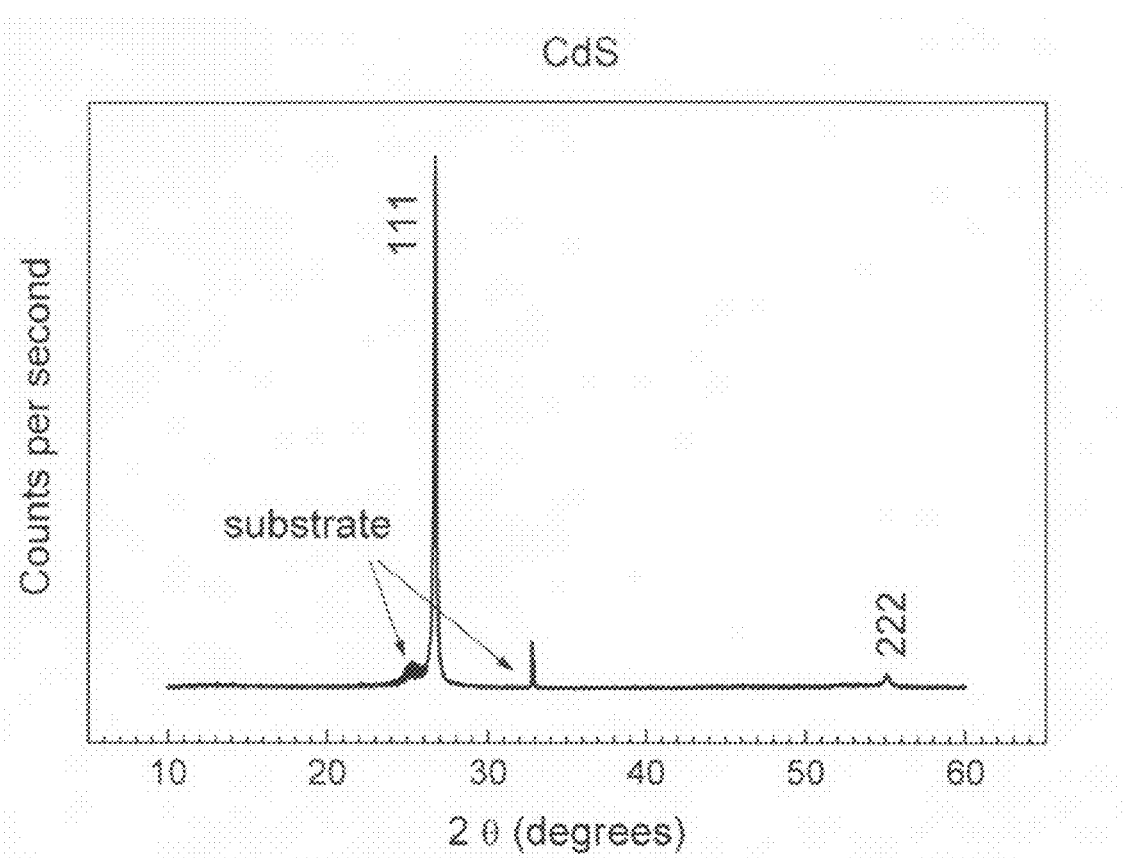
FIG. 72 is an X-Ray difftactogram (2θ, degrees versus counts per second) of CdS film deposited by a continuous flow microreactor.

A thin film (about 2,500 Å) of CdS has been deposited on a silicon coupon substrate using an embodiment of a continuous flow microreactor at a temperature of from about 85° C. to about 90° C. This CdS thin film has been characterized by XRD. FIG. 72 is a typical X-ray diffractogram, which shows diffraction peaks at 2θ=26.5° and 2θ=55°. These diffractogram peaks were compared to standards in the JCPDS data files (JCPDS card numbers: 80-0019, 75-0581, 42-1411, 75-1546). The as-deposited material appears to be composed of the cubic phase of CdS. In particular, the sharp peak at 26.5° corresponds to the (111) Bragg reflection planes from the cubic (zincblende) phase.

FIG. 72 clearly shows that the film is strongly oriented along (111) with another small peak with a (222) orientation. To test the accuracy of the result and to provide a comparison, XRD analysis also was done for the bare silicon coupon substrate. The peaks obtained for the substrate also are shown in FIG. 72. The presence of only (111) and (222) peaks is indicative of the highly oriented nature of CdS films deposited by the continuous flow microreactor. Without being limited to a theory of operation, such highly oriented CdS films likely grow as successive alternative planes composed of only Cd or S atoms parallel to the substrate surface, as it corresponds to the (111) planes of the cubic crystalline structure. This type of growth agrees well with the molecular level growth mechanism proposed by Lincot et al. [R. Ortega-Borges, D. Lincot, *J. Electrochem. Soc.*, 1993, 140, 3463.] based on the adsorption of the cadmium hydroxide species and the successive formation of the metastable complex by the adsorption of a thiourea molecule.

CdS can exist in three different crystal forms: hexagonal (wurtzite), cubic (zincblende or sphalerite) and cubic (rocksalt). The rocksalt form of CdS has been observed only at very high pressures and CBD films of this form have never been reported. The other two forms have been reported for CBD films under different conditions. The hexagonal form is thermodynamically more stable and usually occurs if the zincblende phase is heated above 300-400° C. G. Hodes, *Chemical Solution Deposition of Semiconductor Films*, Marcel Dekker, Inc., 2003. Therefore, the present invention provides a low temperature CBD process useful for forming cubic (zincblende) phase CdS.

Figure 73A:
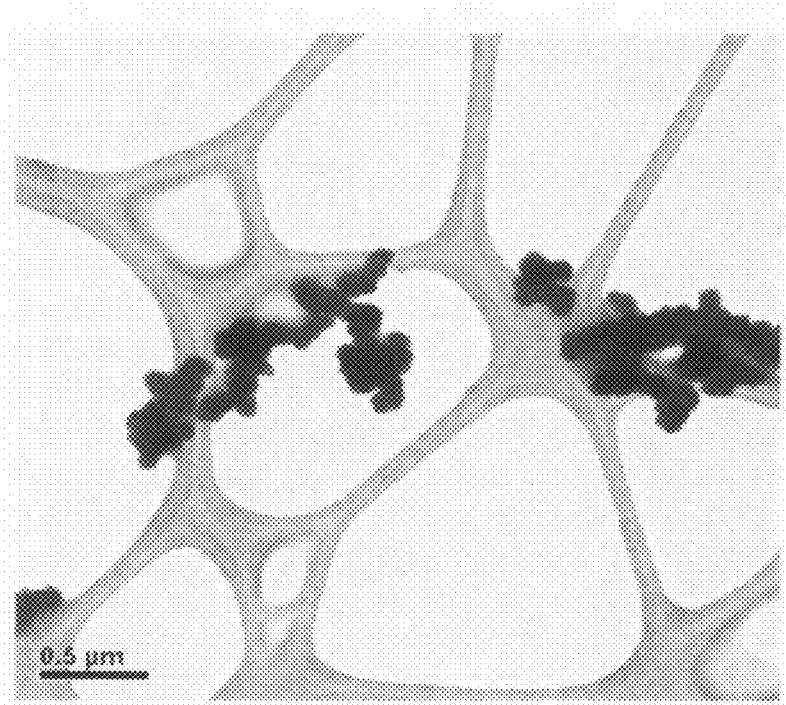
FIG. 73A is a transmission electron microscopy (TEM) image of CdS particles produced from a batch reactor with low resolution.
Figure 73B:
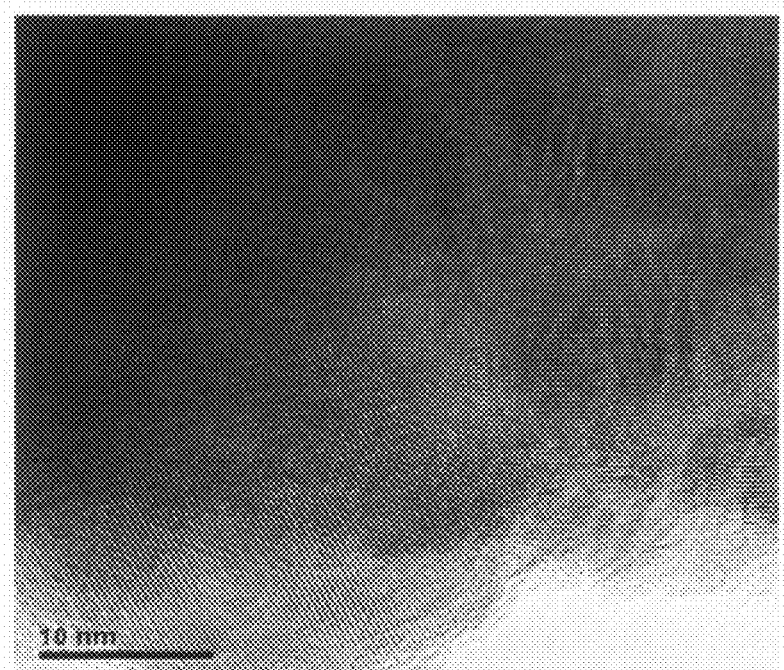
FIG. 73B is a TEM image of CdS particles produced from a batch reactor with high resolution.

The differences between batch and the continuous flow processes also were studied by TEM, SAED and EDX. FIG. 73 provides TEM micrographs of CdS particles obtained by dipping copper grids covered by thin lacey carbon films in a batch reactor solution for 10 seconds at 80° C. when the reaction time was 3.12 min. FIG. 73A shows that many agglomerates are formed with particles over 0.1 μm in size. Each of these agglomerates contains a mixture of crystalline nanoparticles on the order of 10 nanometers in diameter.

Figure 74A:
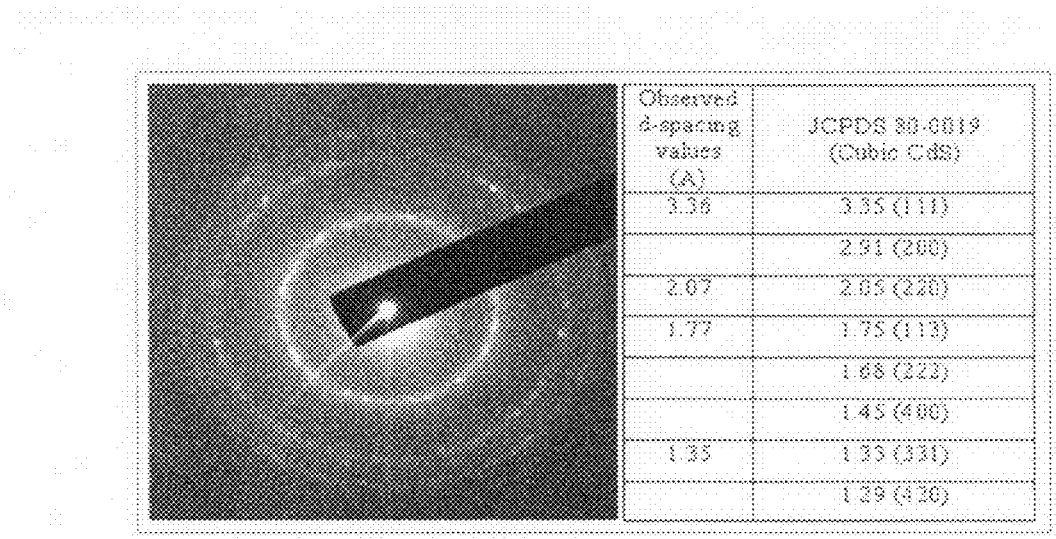
FIG. 74A is a selected-area electron diffraction (SAED) pattern of CdS particles formed using a batch reactor.

FIG. 74A provides the corresponding SAED pattern. The observed lattice plane spacing-d values agree well with the JCPDS power diffraction data for the cubic phase of CdS, which is shown in FIG. 74A as well. Also, the experimental lattice constant, a=5.87 Å, agrees well with the literature value of 5.82 Å for cubic CdS phase.

Figure 74B:
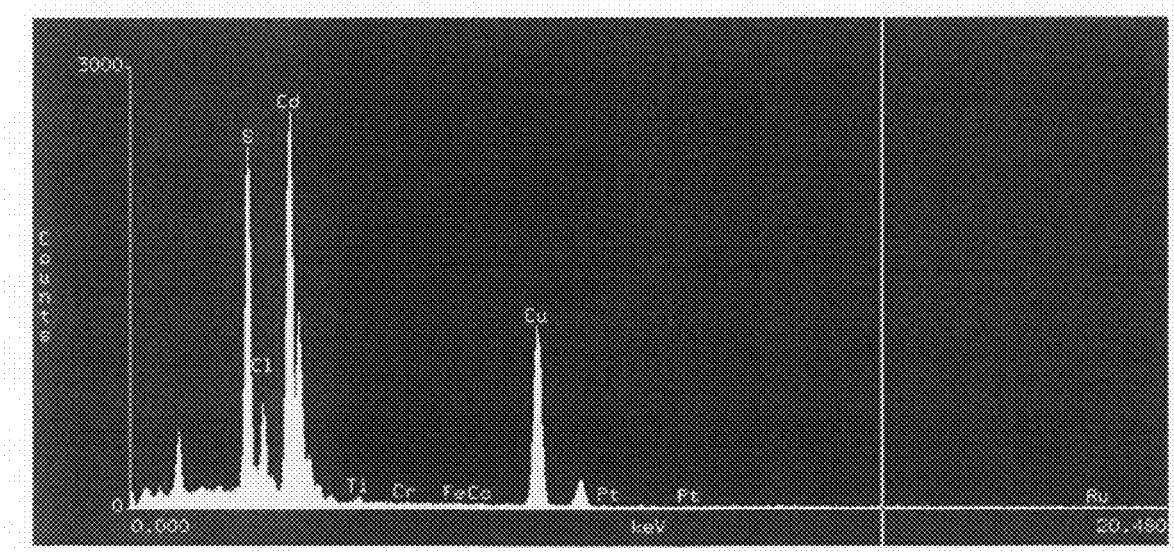
FIG. 74B is an energy dispersive X-ray (EDX) spectrum of CdS particles formed using a batch reactor.

FIG. 74B provides an EDX spectrum. The peaks of Cd and S are pronounced, with a Cd/S ratio of 43.1/56.9 atomic %. The Cl peak is due to the reagents $CdCl_2$ or $NH_4Cl$ that are used in the CBD process. The Cu peak can be attributed to copper grids used in the sample preparation process.

Figure 75:
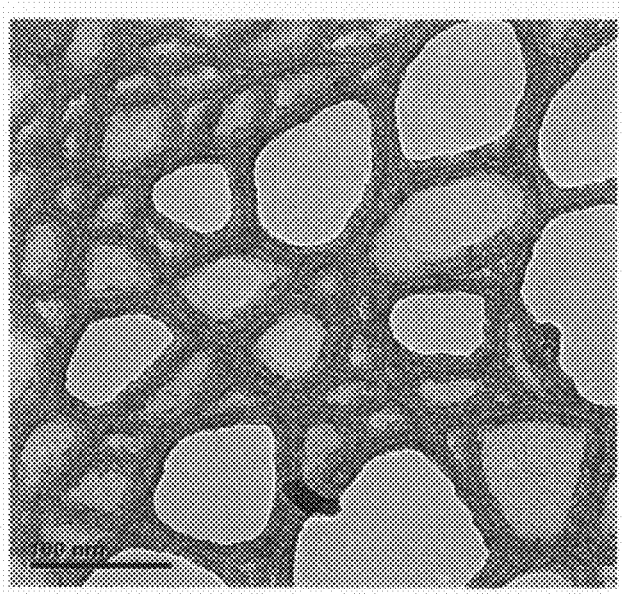
FIG. 75 is a TEM image showing the absence of CdS particles when using continuous flow microreactors.

Similarly, TEM measurements were done by dipping copper grids (with thin lacey carbon film) in hot solution, collected from the continuous flow microreactor, for about 10 seconds. There was no evidence of any particles on the surface of the grid as shown in FIG. 75. This sample had no crystallinity. Also, the EDX did not show any CdS. This result indicates that the impinging reactant flux from the continuous flow microreactor is particle free under these operating conditions. Thus, the CdS films likely were grown by a molecule-by-molecule mechanism.

Figure 76A:
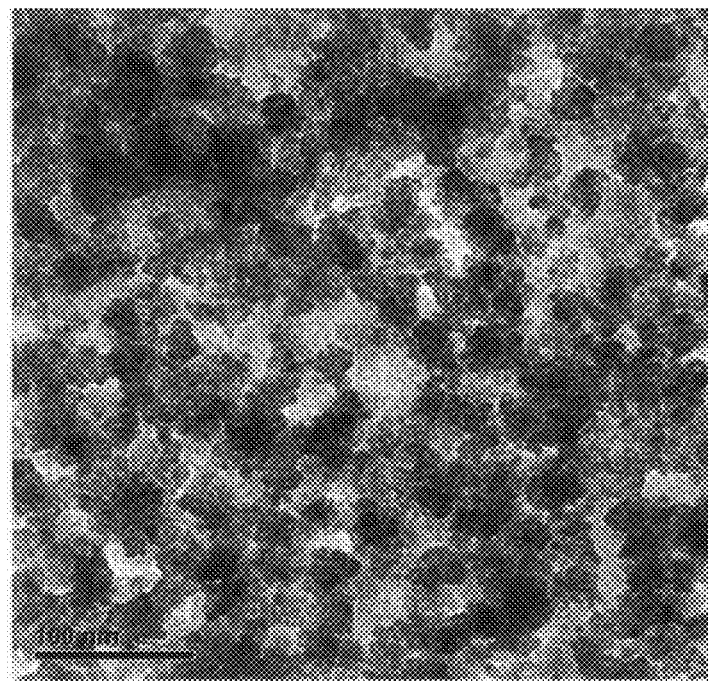
FIG. 76A is a TEM micrograph of a CdS film produced by one embodiment of a continuous flow microreactor at low resolution.
Figure 76B:
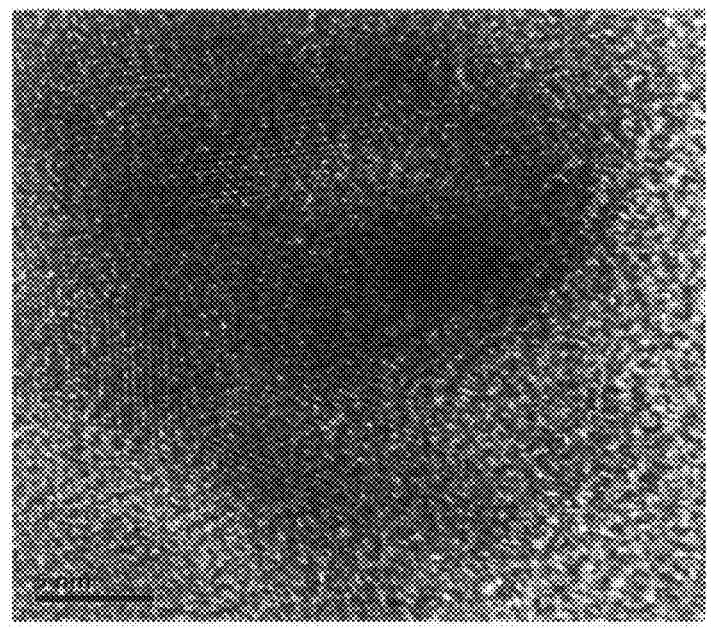
FIG. 76B is a TEM micrograph of a CdS film produced by one embodiment of a continuous flow microreactor at high resolution.
Figure 77A:
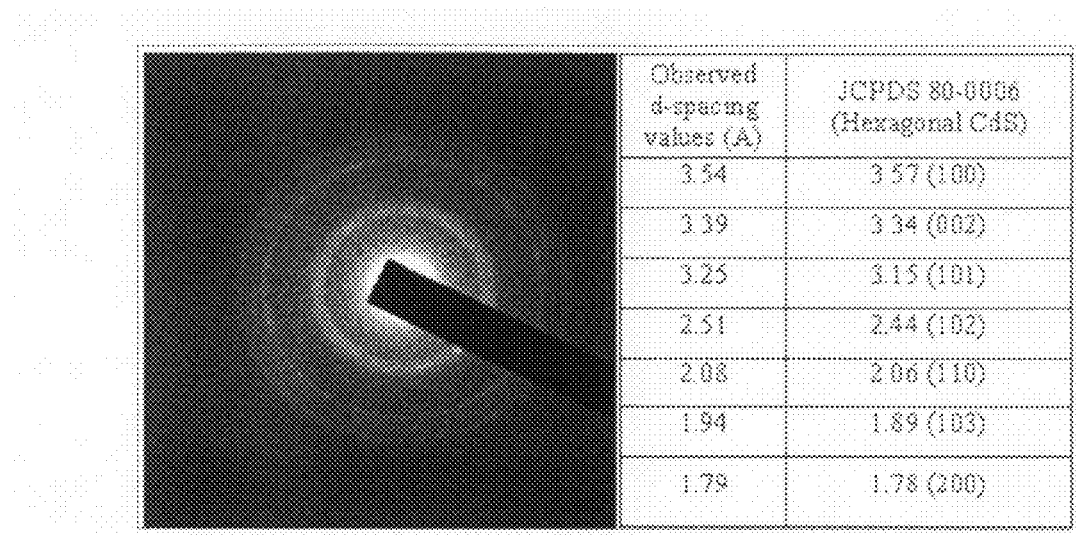
FIG. 77A is an SAED pattern of a CdS film deposited using one embodiment of a continuous flow microreactor.

A comparative study was conducted by depositing CdS film on copper grids covered with thin lacey carbon films using an embodiment of a continuous flow microreactor. The CdS coated copper grids were analyzed by TEM. FIG. 76 shows TEM micrographs of CdS film deposited using the continuous flow microreactor at 80° C. with a deposition time of 3.12 min. The distribution of small grain agglomerates can be observed and individual grains reach up to 5 nanometers in diameter as shown in FIGS. 76A and 76B. The corresponding SAED diagram (FIG. 77A) indicates the formation of a polycrystalline film that is composed of well defined rings. The measured d-spacing values agree well with the hexagonal CdS phase. Also, the experimental lattice parameters of a=4.09 Å and c=6.77 Å were reported, in good agreement with the literature values of 4.13 Å and 6.75 Å respectively.

Figure 77B:
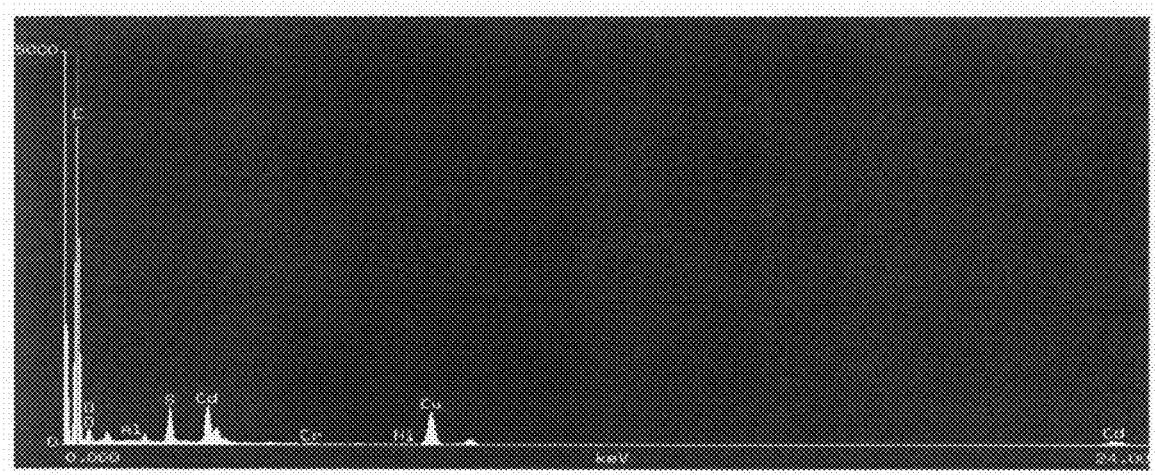
FIG. 77B is an EDX spectrum of a CdS film deposited using one embodiment of a continuous flow microreactor.

The difference in crystal structure and crystallinity from the film deposited on oxidized silicon substrate is likely a result of the lacey carbon film. The EDX spectrum for this film also is given in FIG. 77B, which shows a Cd-to-S ratio of 42.3/57.7 atomic %. Again, the Cu peak is attributable to the copper grid substrates.

Figure 78:
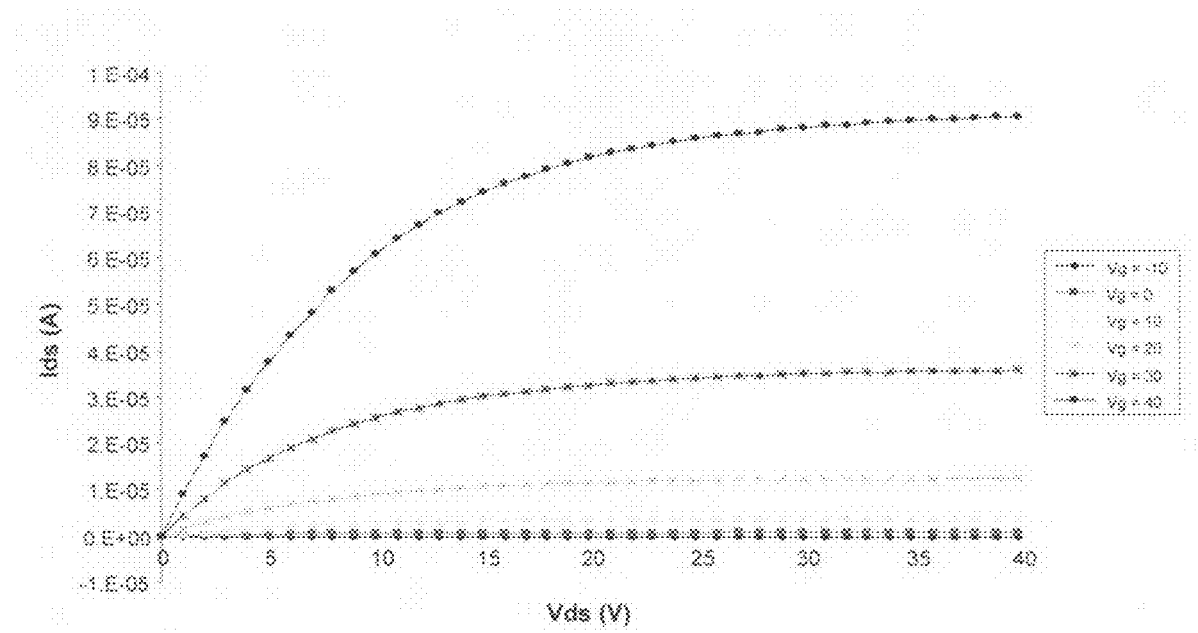
FIG. 78 is a plot of $V_{ds}$ (volts) versus $I_{ds}$ (amps) illustrating output characteristics for a CdS thin film transistor (TFT) with a $V_{GS}$=−10 to 40 V in 10 V steps, $V_{DS}$=0 to 40 V, and a channel width-to-length ratio of 12.

The TFT fabricated from a CdS active channel layer deposited by the continuous flow microreactor has a channel layer thickness of 50 nanometers, a $SiO_2$ gate oxide thickness of 100 nanometers and a channel width-to-length ratio of 12. No further post annealing process was performed on the CdS channel layer. The drain current-drain voltage-($I_{DS}$-$V_{DS}$) output characteristics for this CdS TFT are presented in FIG. 78, which shows good gate modulated transistor behavior and hard saturation. Gate currents are in the range of several nA from output characteristics, indicating that a patterned CdS channel layer successfully reduced current leakage compared to a non-patterned device. The electrical parameters used to characterize this TFT are threshold voltage, mobility, drain current on-to-off ratio, and turn on voltage. The threshold voltage is the minimum gate voltage required to produce a conductive channel, thereby enabling electrons to flow from source-to-drain. The threshold voltage for this device is approximated using a linear extrapolation method with the drain current measured as a function of gate voltage at a low $V_{DS}$ to ensure operation in the linear region. D. K. Schroder, *Semiconductor Material and Device Characterization* ($2^{nd}$ edn), John Wiley & Sons, Inc., New York 1998.

Figure 79:
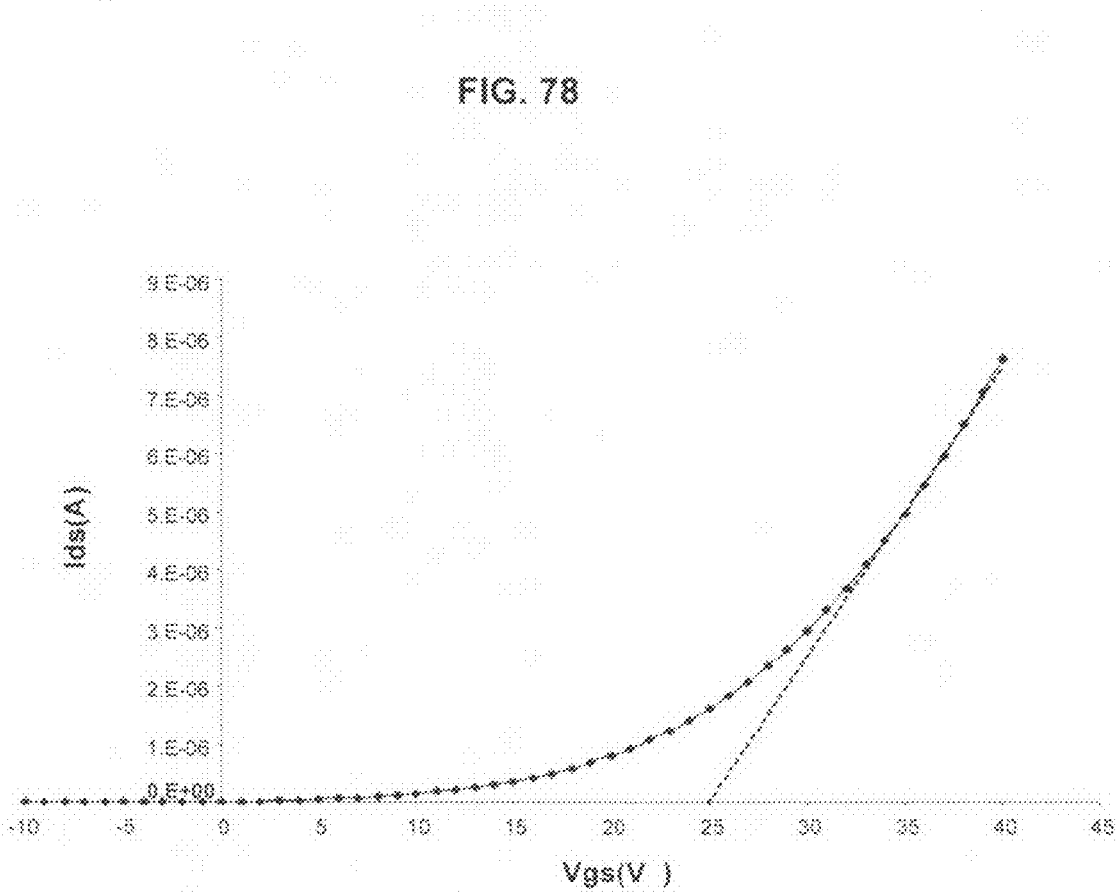
FIG. 79 is a plot of $V_{gs}$, (volts) versus $I_{ds}$, (amps) illustrating drain current-gate voltage ($I_{DS}$-$V_{GS}$) at $V_{DS}$=1 V for a CdS TFT illustrating a linear extrapolation method for threshold estimation.

FIG. 79 shows the drain current-gate voltage ($I_{DS}$-$V_{GS}$) at $V_{DS}$=1 V using the linear extrapolation method for threshold estimation, resulting in a threshold voltage of $V_T \cong 25$ V. With a positive threshold voltage, this device behaves as an enhancement-mode device that is initially off and requires a positive gate voltage to allow current to flow.

The mobility of a TFT refers to the carrier mobility that is proportional to the carrier velocity in an electric field. D. K. Schroder, *Semiconductor Material and Device Characterization* ($2^{nd}$ edn), John Wiley & Sons, Inc., New York 1998. The effective mobility ($\mu_{eff}$) is the most common mobility reported and depends on lattice scattering, ionized impurity scattering, and surface scattering and is derived from the drain conductance. R. F. Pierret, *Field Effect Devices* ($2^{nd}$ edn), Addison-Wesley Publishing Company, Inc., 1990. The field-effect mobility ($\mu_{FE}$) is determined by the transconductance of the device at $V_{DS}$=1 V to ensure mobility extracted from the linear region. The effective mobility for one embodiment of a CdS device produced using the present invention is $\mu_{eff} \cong 1.46$ $cm^2$/V–sec and the field-effect mobility is $\mu_{FE} \cong 1.4$ $cm^2$/V–sec.

Figure 80:
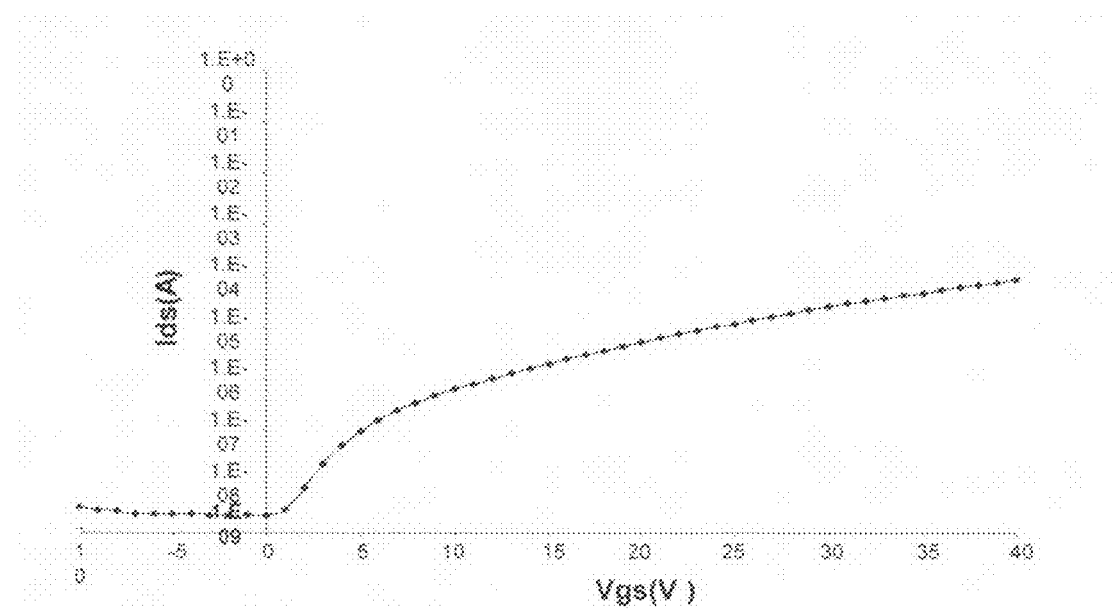
FIG. 80 is $V_{gs}$, (volts) versus $I_{ds}$, (amps) illustrating Log ($I_{DS}$)-$V_{GS}$ characteristics at $V_{DS}$=40 V for a CdS TFT showing an on-to-off ratio of approximately $10^5$ and turn on voltage at 0 V.
Figure 81:
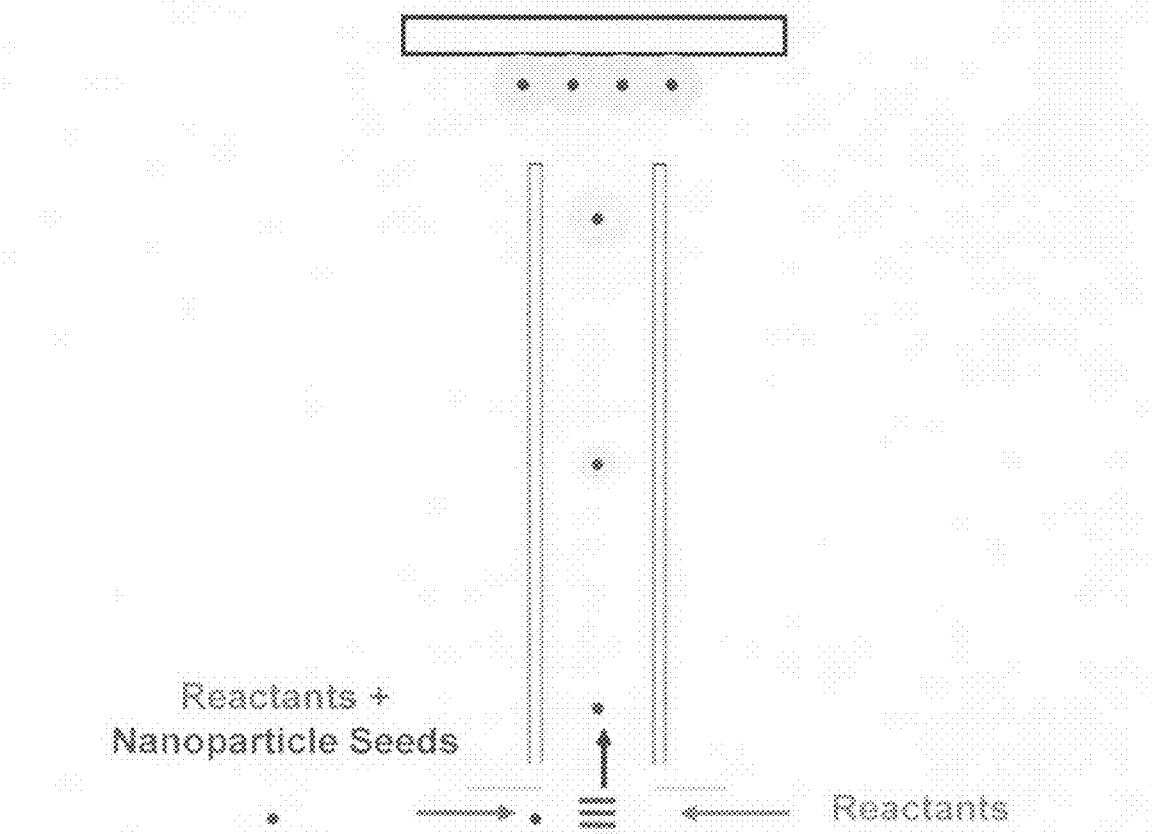
FIG. 81 is a schematic drawing illustrating application of reactants and nanoparticle seeds to a substrate.

The drain current on-to-off ratio determines the switching quality of the TFT. FIG. 80 shows the Log($I_{DS}$)-$V_{GS}$ transfer characteristics at $V_{DS}$=40 V, showing a drain current on-to-off ratio of approximately $10^5$ and turn on voltage at 0V.

This enhancement-mode CdS TFT with a CdS channel layer deposited by the continuous flow microreactor at low temperature (80-90° C.) shows an effective mobility and a field-effect mobility higher or close to the previous reported data. All previous reported CBD CdS TFTs employed a post-annealing process such as 400° C. vacuum annealing in $N_2$ ambient for 3-6 minutes; 200° C. vacuum annealing for 30 minutes; 300° C. in air for one hour; and 500° C. rapid thermal annealing in argon for 5 minutes. Embodiments of the presently disclosed invention provide a process for fabricating TFTs on low cost flexible polymeric substrates at low temperatures by, for example, avoiding the post annealing processes required for known TFTs.

Thus, the present application describes a continuous flow microreactor useful for chemical bath deposition processes. Films of materials, such as CdS, ZnO and $In_xO$ were deposited by conventional batch CBD reactor from heated solutions and also by CFM with heated substrates. Various characterization results showed that CFM deposited films were more uniform and of better quality than the batch deposited films.

Using an interdigital micromixer achieves efficient mixing of the reactant streams in a short time period. This reactor introduces constant reactant flux to the system (continuous process) that allows controlling the homogeneous reaction of the chemical bath solution before the solution impinges on the substrate. A reactant flux that is substantially particle free has been produced by controlling the residence time. Using this particle-free flux, molecule-by-molecule heterogeneous growth mechanism has been promoted to substantially prevent particle-by-particle growth. In this way, unwanted deposition on the walls of the vessels and the homogeneous CdS formation in the chemical bath is minimized. Furthermore, the continuous process minimizes waste production, which leads to more uniform films with negligible occurrence of pinholes.

Enhancement-mode CdS TFTs were fabricated using this continuous flow microreactor at low temperature (80-90° C.) without post-deposition annealing. An effective mobility, $\mu_{eff} \approx 1.46 \, cm^2/V$-sec and a field-effect mobility, $\mu_{FE} \approx 1.4 \, cm^2/V$-sec that is higher or close to the previous reported data were obtained from this device. This new approach can be adopted for low-temperature deposition of other compound semiconductor thin films using solution-based chemistry with improved control over processing chemistry and minimum waste production.

Disclosed embodiments of the present invention provide many benefits relative to batch CBD processes. For example, thin films deposited using embodiments of the present method and system are substantially more continuous, and generally have a higher crystallinity, than do thin films deposited by batch processes. Post annealing steps required with batch processes, which are obviated with the present invention, may reduce the porosity of the deposited materials and increase the crystallinity. However, films deposited using the present invention typically are less porous, and often have higher crystallinity, relative to batch processes even without a post deposition annealing step.

Moreover, the present invention provides a more reliable and reproducible deposition result. For batch processes, it is not unusual to make plural deposition attempts to obtain a suitable deposited layer. The occurrence of unsuitable deposition layers is significantly reduced using disclosed embodiments of the present method and system.

The present invention also provides a higher deposition rate than batch processes at the same deposition material concentration. To obtain a deposited layer having a suitable thickness, batch CBD processes often will use plural deposition baths to deposit a single layer. The longer a substrate is immersed in a deposition bath, the more likely it is that deleterious particle formation and deposition will occur on the substrate. This unwanted particle formation and deposition can be minimized in batch processes by moving the substrate from deposition bath to deposition bath, and immersing the substrate in a particular deposition bath for a time selected to minimize particle formation. However, the longer the substrate remains in the deposition bath, the slower the deposition rate is since the reactant concentrations are decreasing. All of these process deficiencies are addressed by using disclosed embodiments of the present invention.

G. EXAMPLES

Working examples are provided to illustrate particular features of the disclosed embodiments. The scope of the present invention should not be limited to the features exemplified by these working embodiments.

Example 1

Chemical Deposition

Oxidized silicon substrates (silicon wafer coupons) measuring 15×10 mm were used for deposition studies. The coupons were initially sonicated in an ultrasonic bath using 1M NaOH for about 10-15 min. and then cleaned according to a standard AMD (Acetone, Methanol, DI water) procedure. Finally, they were dried under a stream of nitrogen gas before being used for deposition.

A CBD batch reactor was used, consisting of an 800 ml glass beaker mounted on top of a VWR hotplate stirrer. Substrates were taped on to a 75×25 mm commercial glass slide after cleaning by the AMD procedure and immersed in 436 ml. of Millipore DI water in the beaker. $CdCl_2$ (0.004M) and $NH_4Cl$ (0.04M) were added slowly with stirring and the temperature of the reaction mixture was monitored using a thermometer. When the temperature reached 80° C., thiourea (0.04M) was added, which decreased the temperature. Heating was continued until the reaction mixture again reached 80° C. and $NH_4OH$ (0.4M) was then added to initiate the reaction. The reaction was allowed to proceed for a defined period of time. The substrates were then taken out of the solution, removed from the glass slide, washed with DI water and dried under a nitrogen stream.

The continuous flow microreactor used consisted of two syringe pumps and a micromixer connected using PEEK tubes (1/16" OD, 0.03" ID from Upchurch Scientific) as shown in FIG. 61. Two 25 milliliter syringe pumps (V6 module from Kloehn Ltd.) were used. Reactant streams A and B initially were pumped into syringes and then dispensed through the PEEK tube and allowed to mix in the micromixer. Stream A was 24 ml of $CdCl_2$, $NH_4C_1$, $NH_4OH$ and de-ionized water. Stream B consisted of a total of 25 ml of thiourea and de-ionized water. The overall reactant concentrations were 0.004M $CdCl_2$, 0.04M $NH_4Cl$, 0.04M thiourea and 0.4M $NH_4OH$. Mixture flowing from the micromixer passed through a 5' long coil (PEEK), kept immersed in a hot water bath maintained at 80-85° C. (using VWR hot plate stirrer). The solution was impinged on a substrate, taped to a 3" dia. SS metallic plate and heated on a hotplate (2" dia.×0.75" thick SS disk from Watlow) at 80-90° C. The syringe pumps were operated at a speed of 250 steps/sec. (Hz) and the mean residence time of the mixture was about 5 sec. Once the process was completed, the substrate was removed from the plate, washed with Millipore DI water and dried under a stream of nitrogen gas.

Example 2

Film Characterization

Both batch reactor and continuous flow microreactors were used for depositing CdS. The CdS thin film morphology was characterized by atomic force microscopy (AFM) using a DI Nanoscope III in contact mode, scanning electron microscopy (SEM) using a Hitachi S-4100 FE-SEM with a cold field emission electron gun and a Dektak 8 stylus profilometer. The phase and crystalline orientation was determined by X-ray diffraction (XRD) using a Siemens D-5000 X-ray diffractometer with Cu K α radiation. Finally, to study the particle formation, transmission electron microscopy (TEM) was used, along with selected area electron diffraction (SAED) and energy dispersive X-ray (EDX) analysis. To prepare samples for the batch reactor, drops of CBD solution were taken out of the beaker at specified time intervals and loaded onto copper grids covered with a thin film of lacey carbon kept on a glass slide. Filter paper was used to absorb fluid through the bottom of the grid. To prepare samples for CFM, the copper grids were taped onto glass slides and the deposition was done using impinging flow for different periods of time.

Example 3

CdS MISFET Fabrication

For CdS MISFET fabrication, a heavily boron (p+) doped silicon substrate served as the gate in an inverted-gate structure was used. Silicon dioxide with thickness of 100 nm was thermally grown on top of a silicon substrate and a 500 nm gold layer for gate contact was sputtered on the backside of Si substrate. The semiconductor channel material was patterned in order to reduce the gate leakage current. To do this, around 1 μm thick positive photoresist was first spun on Si substrate following by a photolithography process. A ~50 nm CdS thin film was deposited on top of the $SiO_2$ by the continuous flow microreactor with overall reactants concentration at 0.004 M of $CdCl_2$, 0.04 M of $NH_4Cl$, 0.04 M of Thiourea and 0.4 M of $NH_4OH$. After the deposition, the sample was immersed into an acetone solution and gently agitated to remove the photoresist and lift-off the additional CdS layer. The sample was removed from the solution, washed with DI water and dried under a stream of nitrogen gas. No further post annealing process was performed. 300 nm aluminum source and drain contacts were then evaporated on top of CdS layer through a shadow mask with channel width-to-length ratio of 7 and 12 to complete the process of fabricating CdS Metal-Insulator-Semiconductor Field Effect Transistors (MISFETs). A schematic cross-sectional view of the CdS MISFETs structure is shown in FIG. 69.

Example 4

Indium Oxide TFT

An indium oxide thin film was deposited using 0.03 M $InCl_3$ dissolved in acetonitrile solvent and pumped through a microprocessor-controlled dispensing pump (ISMATEC® pumps). The solution passed through a micro-tube and impinged on a heated substrate that was maintained at 70° C.

Figure 82:
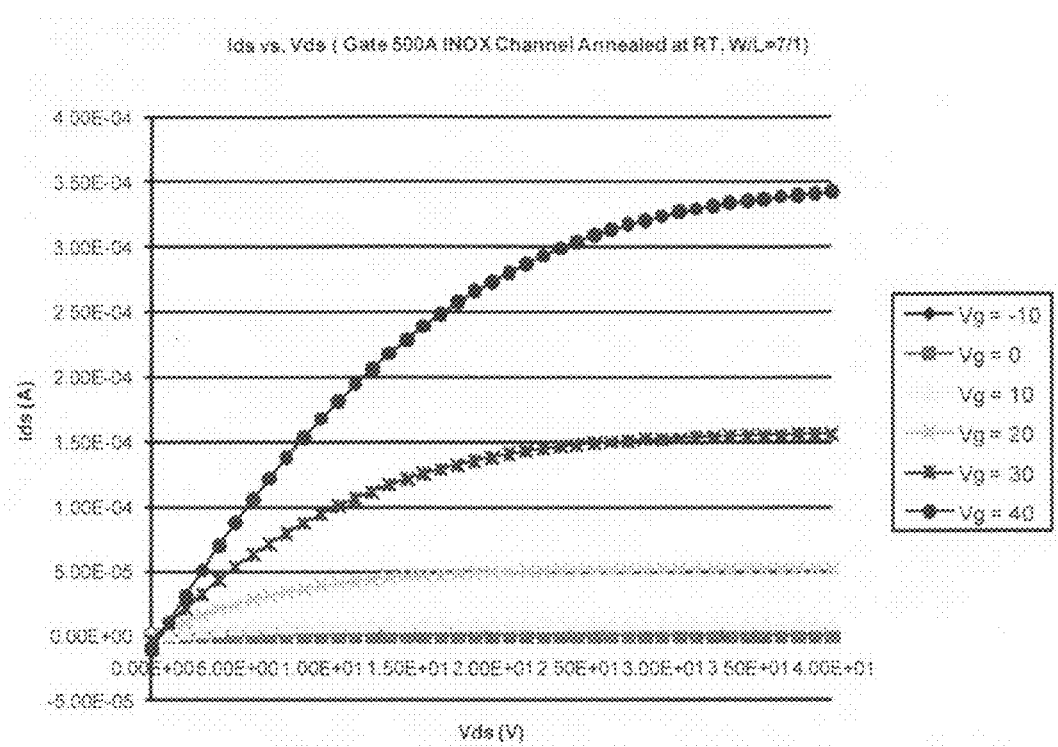
FIG. 82 is a plot of $V_{ds}$ (volts) versus $I_{ds}$, (amps) illustrating output characteristics for an $InO_x$ TFT.
Figure 83:
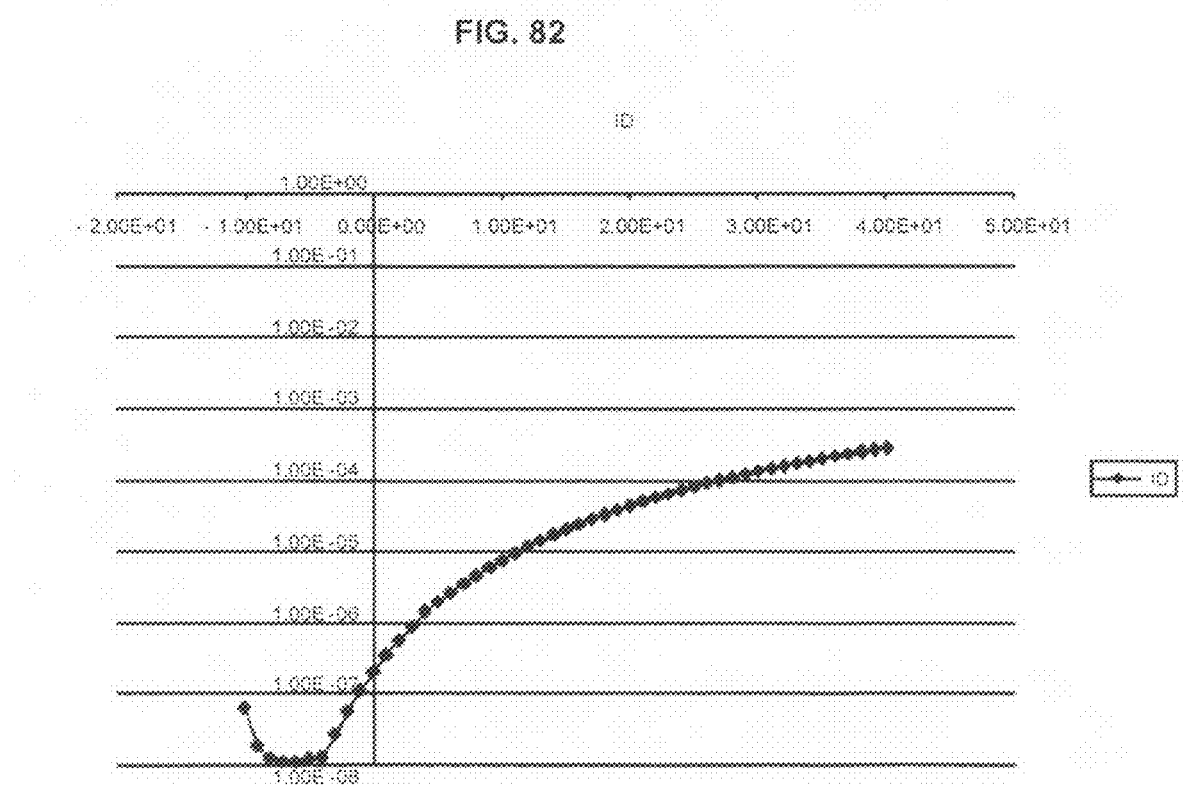
FIG. 83 is $V_{gs}$, (volts) versus $I_{ds}$, (amps) illustrating Log ($I_{DS}$)-$V_{GS}$ characteristics at $V_{DS}$=40 V for an $InO_x$ TFT showing an on-to-off ratio of greater than $10^4$ and turn on voltage at −6V.

A working thin film transistor was fabricated from an indium oxide film that was deposited for 2.5 minutes. As shown in FIGS. 82 and 83, the device has a field effect mobility of 2.1 cm2/V·s, a turn on voltage (Von) at −6 V, and a current on/off ratio of 104.

Example 5

Batch Process Comparison Example

A CBD batch reactor used for this example includes a 1000 milliliter beaker, a sample holder, a thermometer, a quartz crystal microbalance (QCM) probe (Maxtex PM 710) and a magnetic stir bar. The reactor was placed on top of a VWR Oyla-Dual heater and magnetic stirrer. The stirring rate was set at about 200 rpm and the temperature was maintained at 80° C. with a pH of ~11. The CdS film thickness was monitored using a QCM probe.

For device fabrication, a heavily antimony-doped silicon substrate served as the gate in an inverted-gate structure. A silicon dioxide layer having a thickness of about 100 nanometers was grown thermally on top of a silicon substrate and a 500 nanometer gold layer for gate contact was sputter deposited on the backside of a Si substrate. A 200 nanometer CdS thin film was deposited on top of the $SiO_2$ by CBD with 0.004 M $CdCl_2$, 0.04 M thiourea, 0.04 M $NH_4Cl$ and 0.4 M $NH_4OH$. A two-step rapid thermal annealing (RTA) process was performed in an argon atmosphere before and after evaporating a 300 nm aluminum source and drain contacts for 5 minutes at 500° C. The first anneal improves the CdS crystallinity of the semiconductor layer. The second anneal forms a good source and drain and ohmic contact between the aluminum and CdS layer.

To study particle formation, solutions were taken from the CBD CdS reactor using a micropipette 5 and 10 minutes after reaction occurred and then dropped onto $SiO_2$/Si substrates. After 3 minutes, a micropipette was used to remove the solution.

The CdS thin-film morphology and structure were characterized by scanning electron microscopy (SEM) and transmission electron microscopy (TEM), respectively. The optical bandgap of CBD CdS thin films was estimated by UV-Vis absorption. The average resistivity for as-deposited CBD CdS thin films on glass slides was measured in the dark using a four-point probe at room temperature. All the TFT testing was performed in the dark at room temperature with an HP 4156B semiconductor parameter analyzer.

Figure 84A:
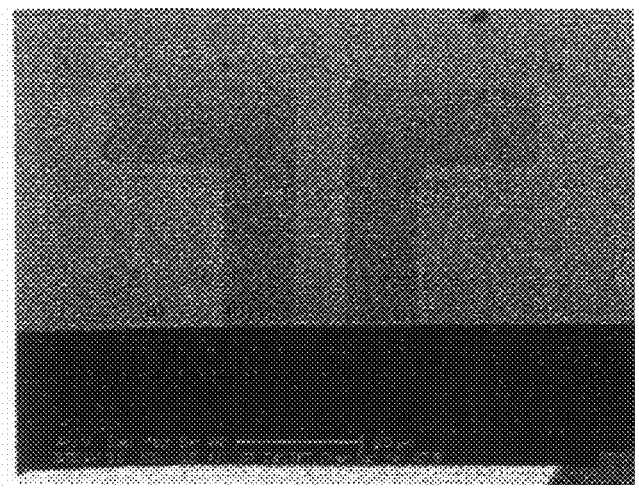
FIG. 84A is an SEM image of a CdS channel layer made by a batch CBD process.
Figure 84B:
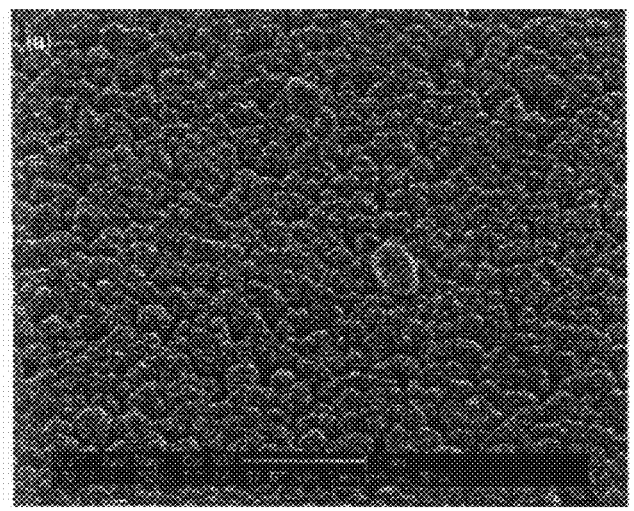
FIG. 84B is an SEM image of an aluminum source and drain electrode contact layer with the CdS channel layer of FIG. 85A made by a batch CBD process.
Figure 84C:
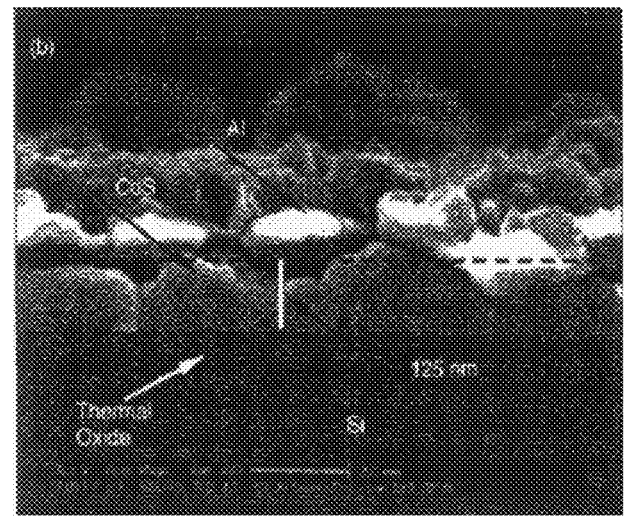
FIG. 84C is a cross-sectional SEM image of the CdS channel layer of FIG. 85A.

The CBD CdS thin films were characterized by TEM, UV-Vis absorption, XPS and four-point probe to determine structural, optical, chemical and electrical properties. An SEM image that indicates the analysis position for a typical CdS TFT after focused ion beam (FIB) sample preparation is shown in FIG. 84A, where (a) indicates the CdS channel layer and (b) indicates the Al source and drain electrode contact layer. The top and cross-sectional SEM images of these layers also are shown in FIGS 84B and 84C, respectively. The SEM images indicate that the CBD CdS channel layer grown under current conditions is dominated by a particle growth mechanism.

Figure 85A:
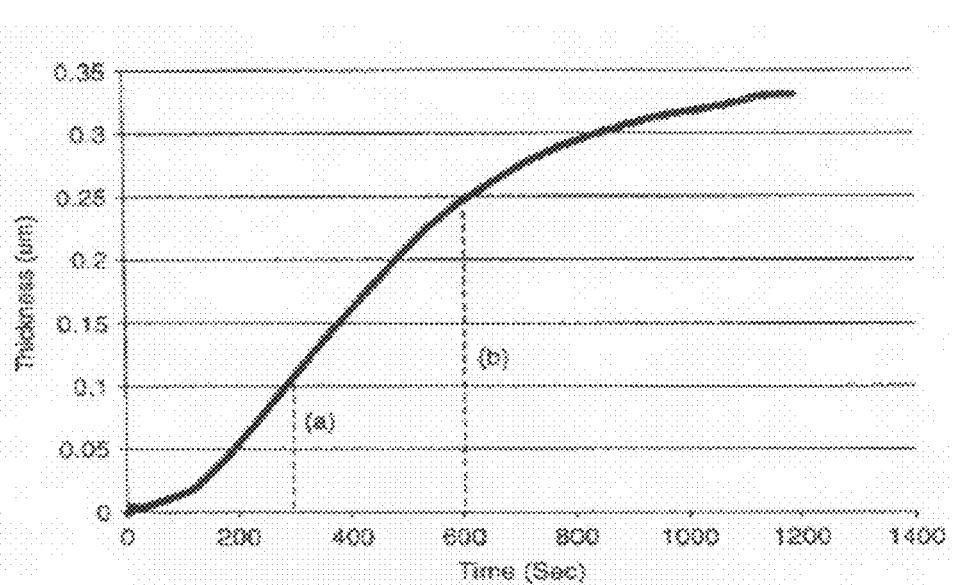
FIG. 85A is a QCM growth curve for a CDB CdS batch process, with FIGS. 85B and 85C being the corresponding AFM micrographs of the CdS particles taken from the CBD solution.

FIG. 85A shows the corresponding real-time QCM growth curve. The QCM curve indicates that the CBD CdS film started with a linear growth regime (molecule-by-molecule) and then changed to faster particle sticking growth after 100 seconds. The CBD CdS film shown in the SEM image (FIG. 84) has been grown for 8.5 minutes (which is well within the particle sticking growth regime) before being removed from the bath. Both SEM and QCM analysis suggest that the CBD CdS thin films grown under these conditions are dominated by a particle sticking mechanism.

Figure 85B:
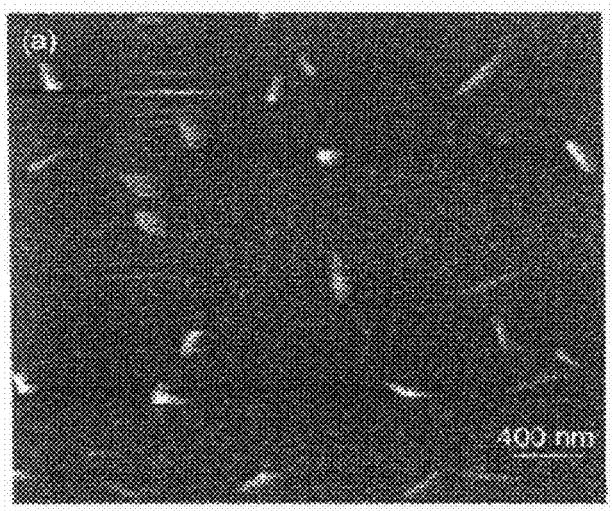

Tapping mode AFM was used to characterize the formation of the homogeneous particle formation responsible for the colloidal sticking growth mechanism. The AFM images of particles taken from the solution 5 and 10 minutes after the reaction started are given in FIGS. 85B and 85C, respectively. FIG. 85B shows an AFM image of the sample prepared from the CBD solution 5 minutes after the reaction started. A number of rod-shaped crystals could be identified clearly, in addition to smaller round-shaped particles. The rod-shaped crystals were formed most likely through a crystallization process of unreacted thiourea when the solvent evaporated.

Figure 85C:
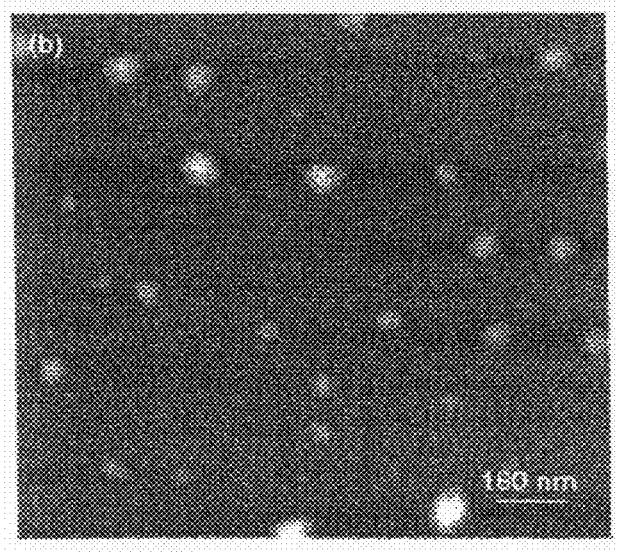

FIG. 85C shows an AFM image of the sample prepared from the CBD solution 10 minutes after the reaction started. A large number of round-shaped (CdS) particles could be identified clearly and the rod-shaped thiourea crystals could no longer be observed. This data indicates that round-shaped CdS particles were growing at the expense of consuming sulfur from thiourea.

Figure 89:
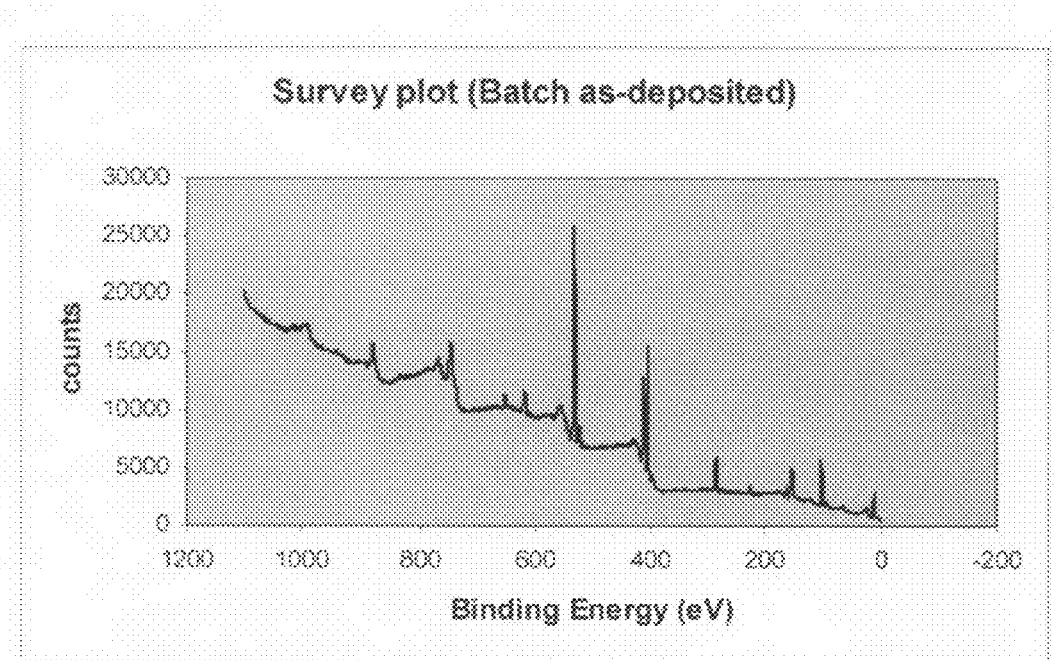
FIG. 89 is an x-ray photoelectron spectrum (XPS) of a CdS film deposited by a batch reactor.
Figure 90:
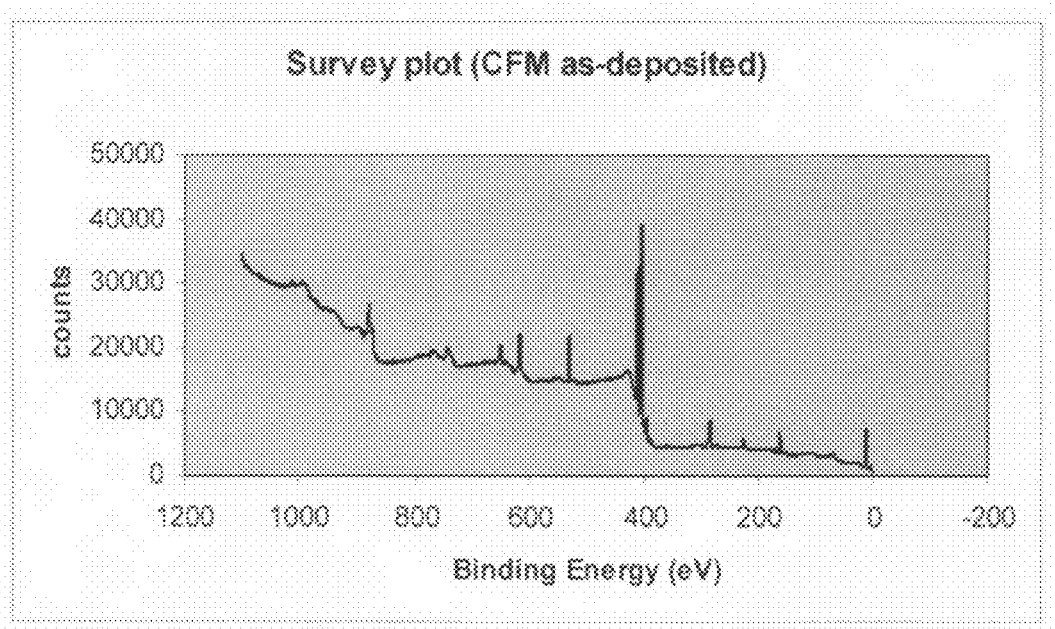
FIG. 90 is an XPS spectrum of a CdS film deposited by a continuous flow microreactor.
Figure 91:
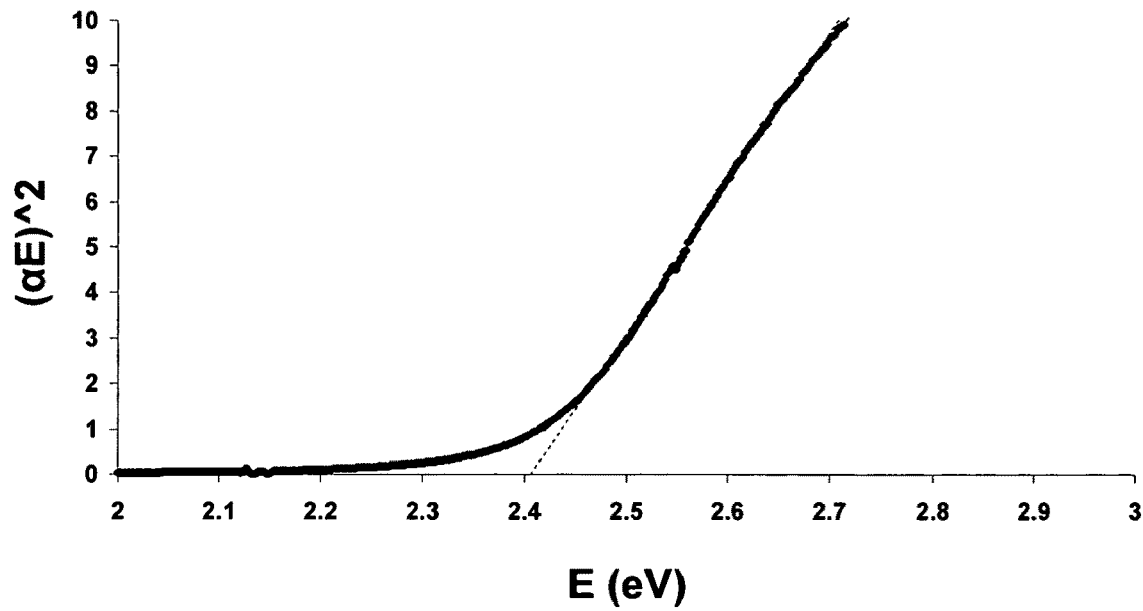
FIG. 91 provides information concerning optical bandgap for a CdS thin film deposited by a batch reactor.
Figure 92:
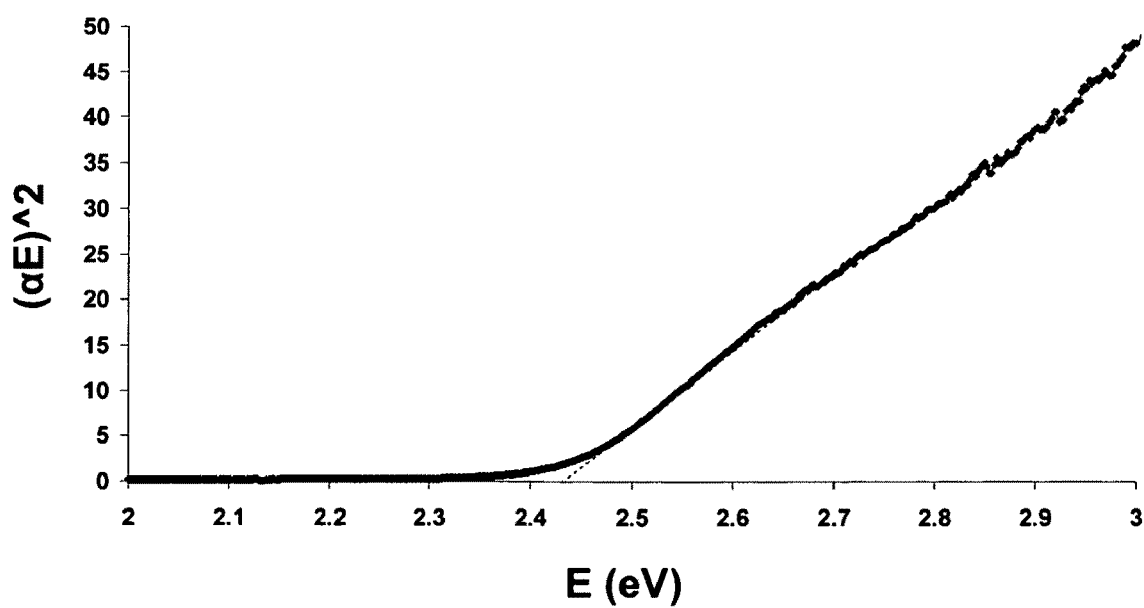
FIG. 92 provides information concerning optical bandgap for a CdS thin film deposited by a continuous flow microreactor for comparison to the bandgap for a CdS thin film deposited by a batch reactor.

The CdS layers deposited by batch and impinging flow reactor were analyzed by XPS. See, FIGS. 89 and 90. The XPS spectra for CBD CdS were typical for CdS films reported by other researchers. The binding energies of Cd $3d_{5/2}$ and Cd $3d_{3/2}$ at ~405.2 eV and ~411.9 eV and that of S 2p at ~161.5 eV for the films were indicative of the CdS chemistry. An important observation was the presence of carbon and oxygen as impurities in the as-deposited and annealed films. The carbon peak, present in these samples, was of little informational utility since it is present as an impurity in all the samples exposed to atmosphere. The energy scale was calibrated using this carbon peak (C 1s at 284.8 eV) as a reference. The O 1s line possesses a rather narrow bandwidth and symmetric shape and is an indication of the presence of some oxidation products on the surface of the film. After annealing, a concentration of chloride species was observed in the XPS spectrum of IFR produced CdS film. The chlorine concentration in annealed films could be attributed to the reagents $CdCl_2$ and/or $NH_4Cl$ used for the preparation of CdS layers by CBD and the Cl 2p peak position at ~199 eV corresponds to Cl bonded as $CdCl_2$. The Si 2p peak in the batch produced (annealed) film at binding energy of 103.2 eV suggests $SiO_2$ and is more likely due to the presence of pinholes in the film. XPS data for as-deposited CdS films and associated Binding Energy (eV) peaks (in good agreement with literature values), are provided below in Table 2.

TABLE 2

| Photoelectron peak | Binding energy (eV) | | |
| --- | --- | --- | --- |
| | Batch | CFM | Lit. Values |
| Cd $3d_{5/2}$ | 405.2 | 405.1 | 405.2 |
| Cd $3d_{3/2}$ | 411.9 | 411.7 | 411.9 |
| S 2p | 161.7 | 161.4 | 162.5 |
| O 1s | 532 | 531.6 | 543.1 |
| C 1s | 284.7 | 284.6 | 284.2 |

Figure 86A:
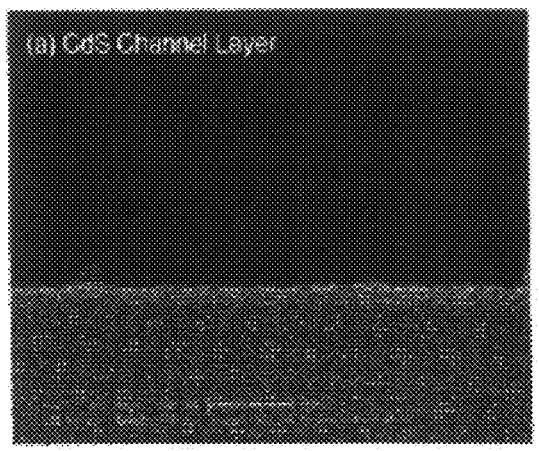
FIG. 86A is a cross sectional SEM image of a CBD CdS thin film batch deposited on an $SiO_2$/Si substrate.
Figure 86B:
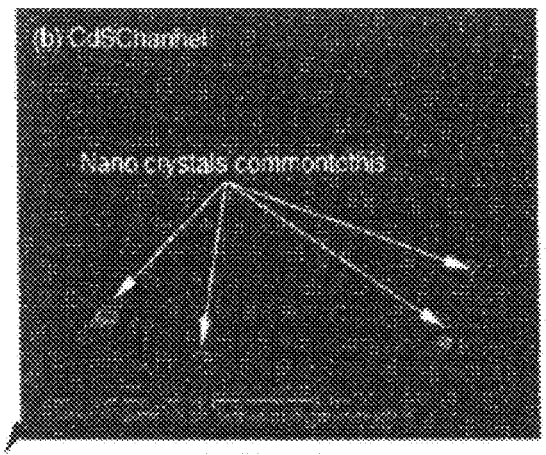
FIGS. 86B-D are plan view SEM images of a CBD CdS thin film batch deposited on an sioilsi substrate.
Figure 86C:
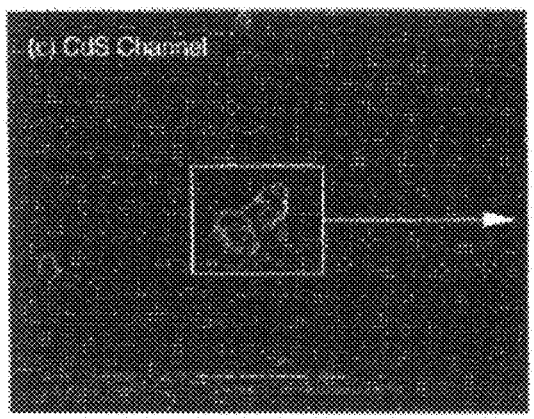
Figure 86D:
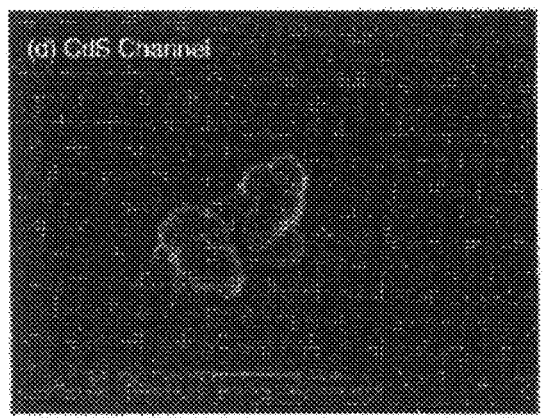

A different CBD CdS growth was performed with 0.002 M $CdCl_2$, 0.02 M $SC(NH_2)_2$, 0.02 M $NH_4Cl$ and 0.2 M $NH_4OH$ at 80° C. for further elucidation of the molecule-by-molecule and particle-by-particle growth mechanism. A cross-sectional SEM image of the resulting CBD CdS thin film deposited on an $SiO_2$/Si substrate is shown in FIG. 86A. In this condition, the majority of the batch CBD CdS thin film was formed within the compact layer growth regime, which resulted in a denser film. The series of SEM images shown in FIGS. 86B-D suggest that film growth was terminated when particle sticking growth was initiated.

Example 6

This example illustrates the effect of residence time in tailoring deposition flux using a continuous flow microreactor for CBD, such as illustrated in FIG. 61. The particular continuous flow microreactor used for this example included a microprocessor controlled peristaltic pump (Ismatec REGLO Digital), three 1.22 mm ID Tygon ST tubings (Upchurch Scientific), an interdigital micromixer, a 3" diameter stainless steel metallic plate, and a 2" diameter×0.75" thick heating hotplate with a digital temperature controller (Watlow). The standard slit interdigital micromixer (SSIMM from Institut für Mikrotechnik Mainz, Germany) was used for burst and uniform mixing of reactant stream A and B. It is essentially made of a stainless steel SS 316Ti housing with an inlay of thermally oxidized silicon (30 μm×100 μm channels). These mixer inlays are fabricated by an advanced silicon etching (ASE) technique.

Oxidized silicon substrates (silicon wafer coupons) measuring 15×10 mm were used for deposition studies. The coupons were cleaned according to a standard AMD (acetone, methanol, DI water) procedure then dried under a stream of nitrogen gas before being used for deposition.

Reactant streams A and B initially were heated to 80° C. (using VWR hot plate stirrer) then pumped through the Tygon ST tubings and mixed in the micromixer. Stream A comprised 24 ml of 0.0163 M $CdCl_2$, ml of 0.196 M $NH_4Cl$, and 4 ml of 9.8 M $NH_4OH$. Stream B comprised 24 ml of 0.163 M thiourea and 26 ml of de-ionized water. The overall concentrations of the reactants were 0.004 M $CdCl_2$, 0.04M $NH_4Cl$, 0.04 M thiourea and 0.4 M $NH_4OH$. The resulting solution was passed through a 10 cm Tygon ST tubing and impinged on the substrate, which was taped to a 3" diameter SS metallic plate and heated on a hotplate (2" diameter×0.75" thick SS disk from Watlow) at 80° C.

Different mixture mean residence times after passing from the micromixer were used and were controlled by changing the reactant flow rate. The specific mean residence times used were 1, 7, 70, and 280 seconds. Once the one minute deposition process was completed, the substrate was removed from the plate, washed with Millipore DI water and dried under a stream of nitrogen gas.

The surface morphology and chemical composition of CdS thin films were characterized by scanning electron microscopy (SEM) and energy dispersive X-ray (EDX) (FEI Sirion XL30) at 5 KV and 20 KV, respectively. The nanoparticles generated from homogeneous reaction within the microchannel were analyzed by transmission electron microscope. To prepare transmission electron microscopy (TEM) samples for continuous flow microreactor, copper grids with thin lacey carbon films (Ted Pella, Inc.) were placed on top of a filter paper inserted inside a funnel with a small hole first pinched underneath the grid. One drop of the hot solution collected from the reactor at the specific residence times was dropped on the TEM grid and dried immediately by vacuum to prevent further chemical reaction from the remaining solution. Electron micrographs of CdS thin-films deposited on TEM grids were characterized by TEM, (FEI Tecnai F20) at 200 KV.

Figure 93:
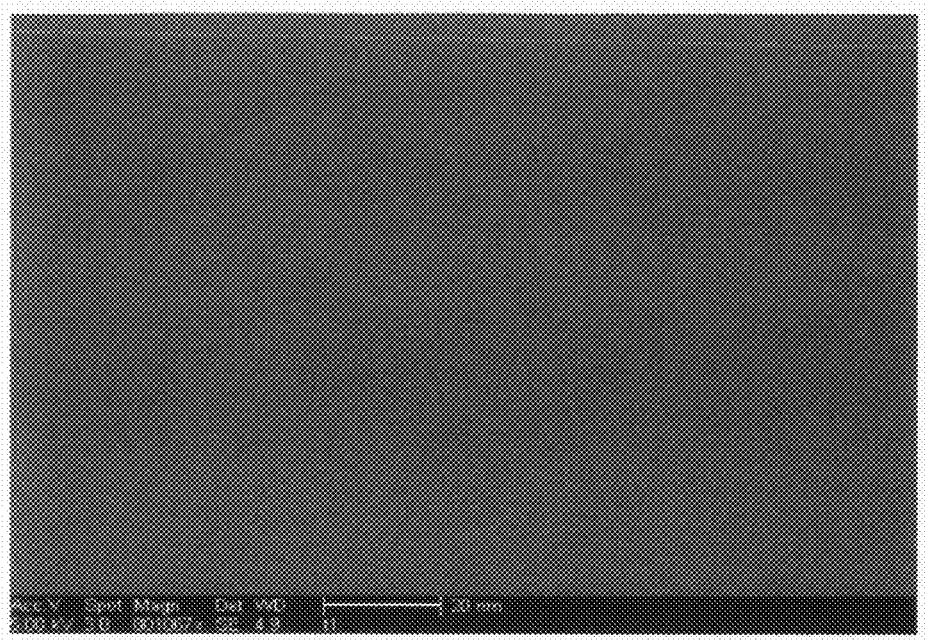
FIG. 93 is an SEM image of a CdS film deposited using a continuous flow microreactor for one minute using a mean residence time of 1 second.

Extremely smooth and uniform CdS thin films were observed when CBD flux of 1 second residence time was used for deposition (see FIG. 93.). Smooth, uniform films of this quality are difficult, if not impossible, to achieve using a conventional batch CBD process. Using this nearly particle-free flux, the molecule-by-molecule heterogeneous growth mechanism was promoted, which prevents particle-by-particle growth. As a result, unwanted deposition on vessel walls and the homogeneous CdS particle formation for the CBD process were minimized.

Figure 94:
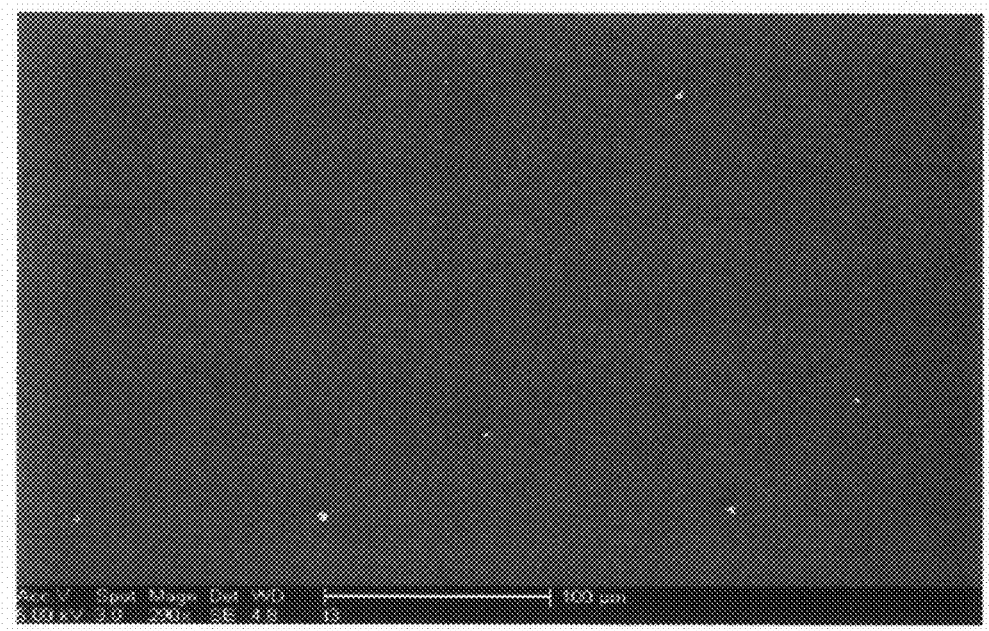
FIG. 94 is an SEM image of a CdS film deposited using a continuous flow microreactor for one minute using a mean residence time of 7 seconds.
Figure 95:
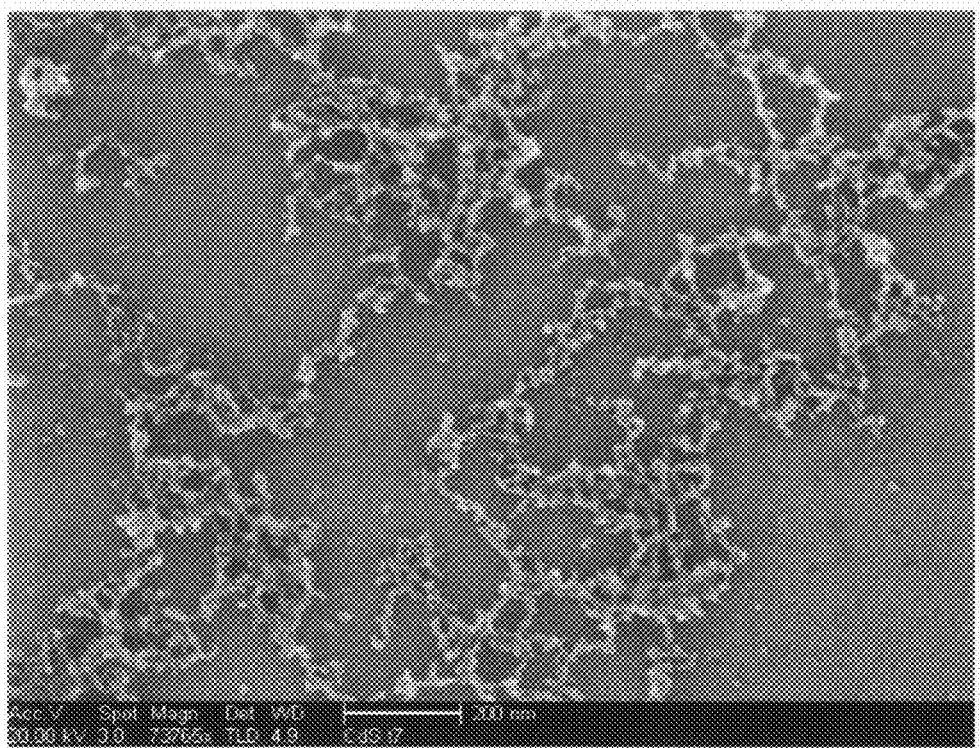
FIG. 95 is an SEM image of a CdS film deposited using a continuous flow microreactor for one minute using a mean residence time of 280 seconds.

In addition to the uniform thin film, some CdS nanoparticles could be found when a CBD flux of 7 seconds residence time was used for deposition (see FIG. 94). The nanoparticles were further aggregated and connected together when using a CBD flux of 280 seconds residence for deposition (see FIG. 95).

Figure 96:
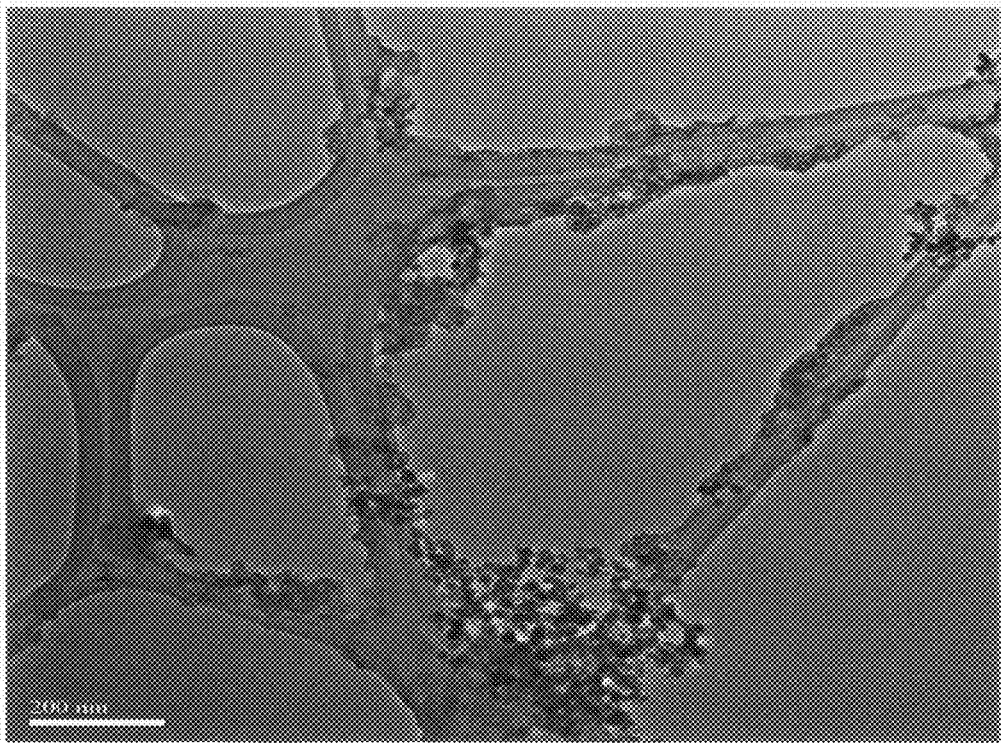
FIG. 96 is a TEM micrograph of CdS nanoparticles generated from a homogeneous reaction from a continuous flow microreactor with a 1 second residence time.
Figure 97:
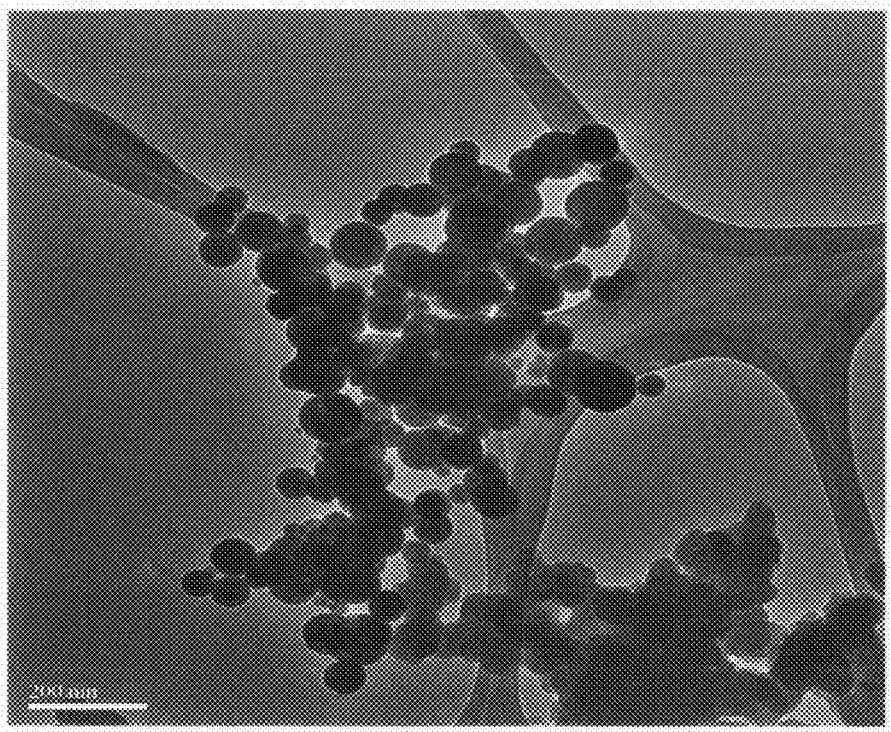
FIG. 97 is a TEM micrograph of CdS nanoparticles generated from a homogeneous reaction from a continuous flow microreactor with a 7 seconds residence time.
Figure 98:
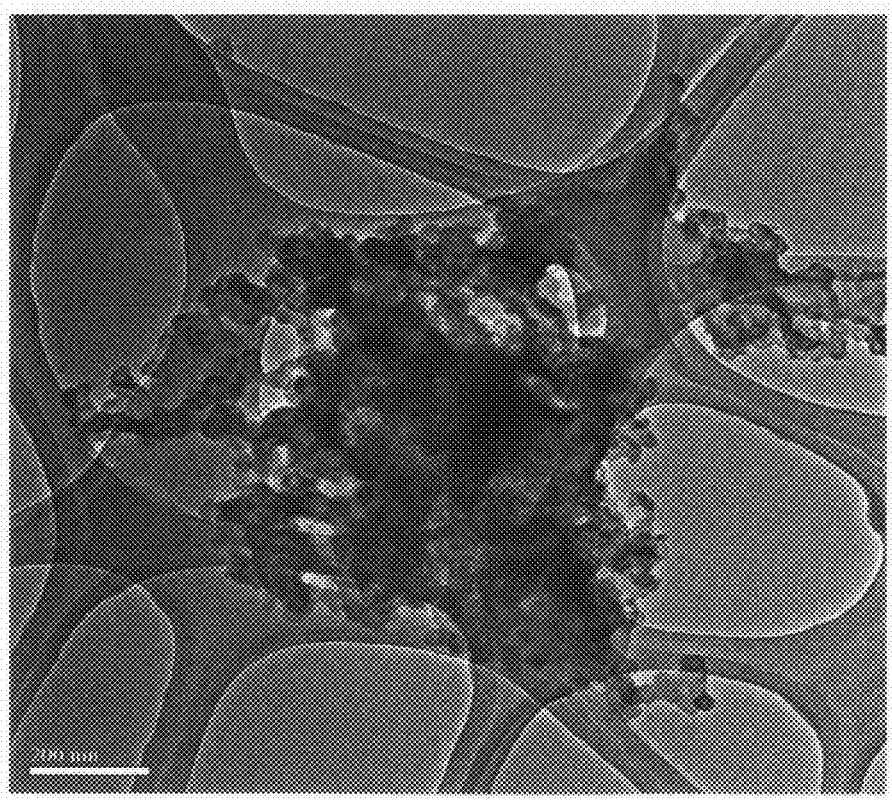
FIG. 98 is a TEM micrograph of CdS nanoparticles generated from a homogeneous reaction from a continuous flow microreactor with a 280 seconds residence time.
Figure 99:
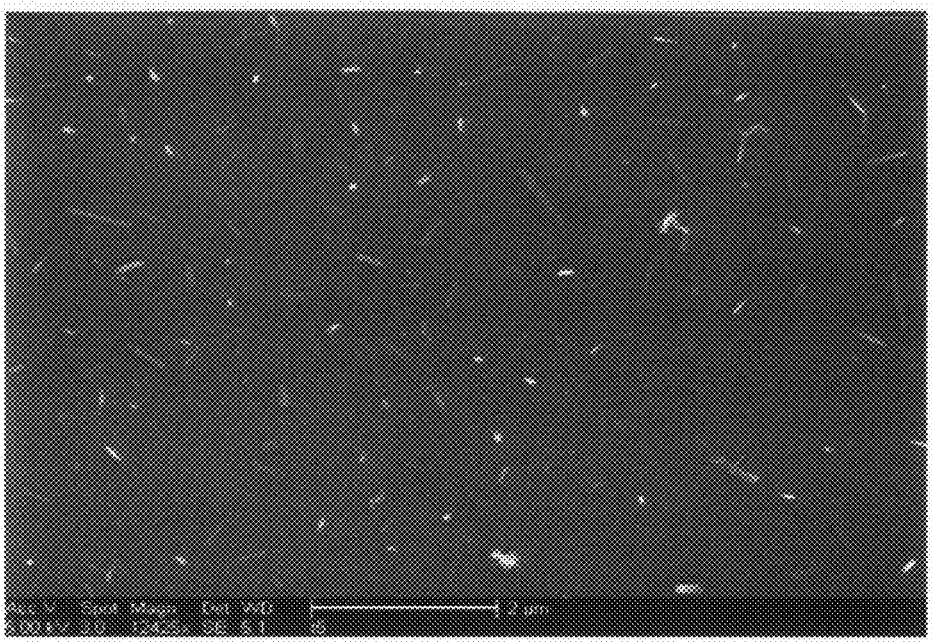
FIG. 99 is a TEM micrograph of CdS nanoparticles generated from homogeneous reaction using a continuous flow microreactor with a residence time of 1 second.

In order to further study and elucidate the formation of homogeneous particle growth that could also be deposited on the heterogeneous thin film surface, TEM characterizations were performed. FIG. 96 shows that some very small CdS clusters and nanoparticles could be found from CBD flux of 1 second residence time. Spherical nanoparticles having diameters in the range of from about 30 to about 100 nm could be clearly observed from a CBD flux of 7 seconds residence time (see FIG. 97). CdS nanoparticles start to aggregate and agglomerate together when a longer residence time (e.g. 280 seconds) was applied (see FIG. 98).

Figure 100:
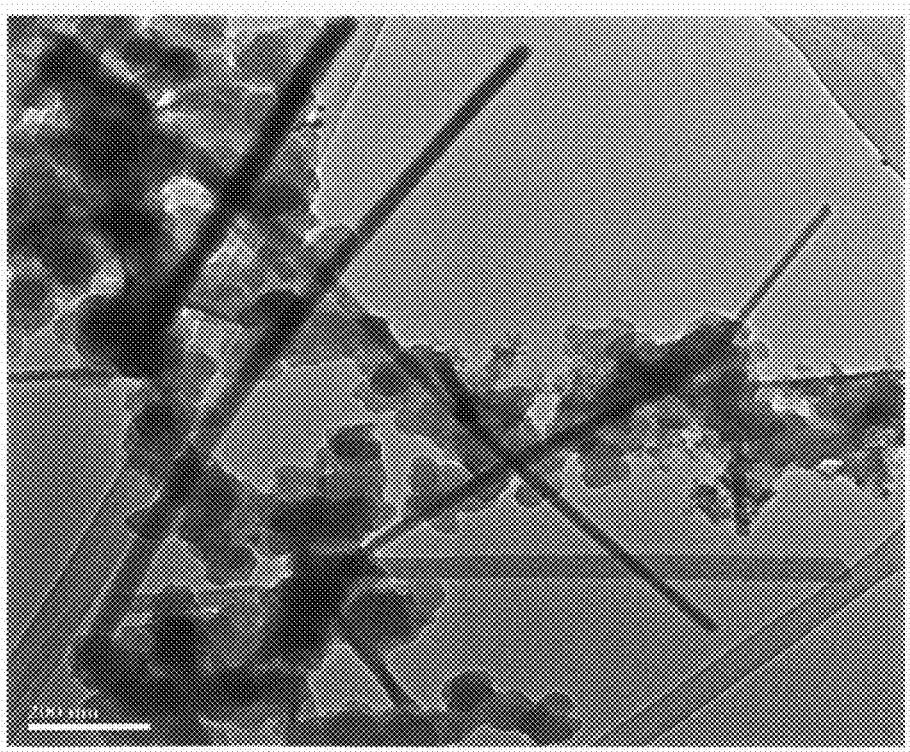
FIG. 100 is a TEM micrograph of CdS nanoparticles generated from homogeneous reaction using a continuous flow microreactor with a residence time of 7 seconds.
Figure 101:
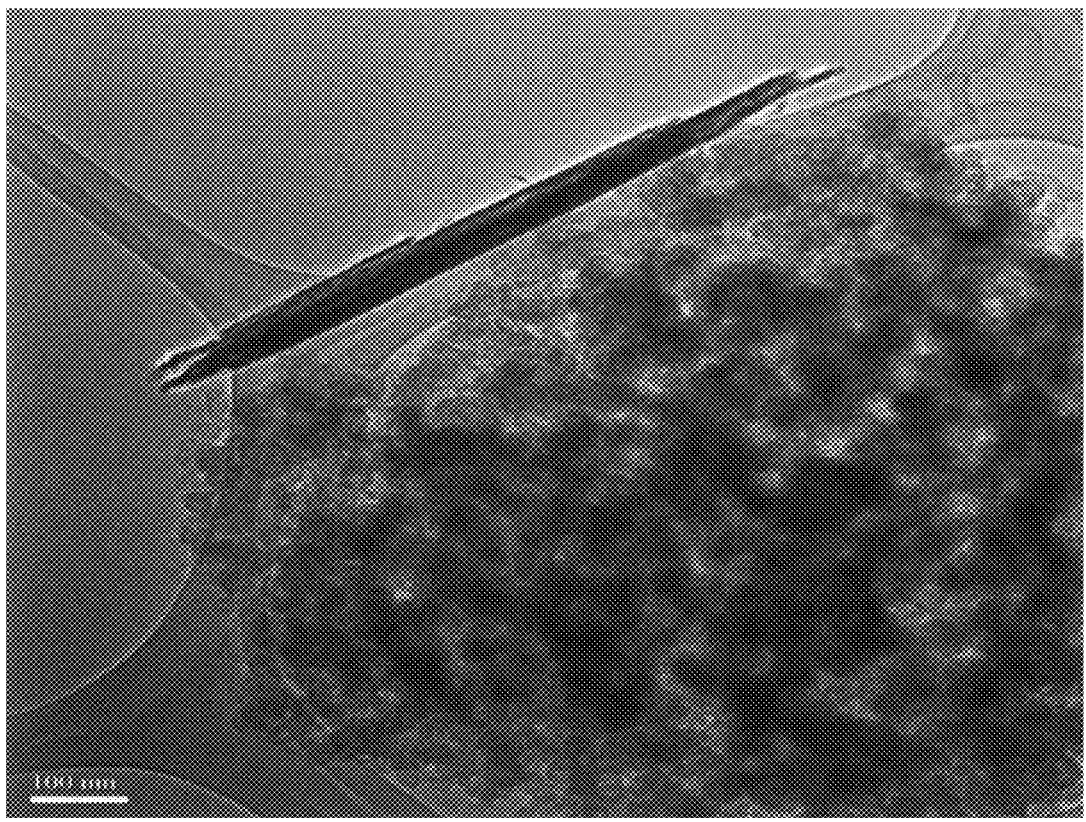
FIG. 101 is a TEM micrograph of CdS nanoparticles generated from homogeneous reaction using a continuous flow microreactor with a residence time of 280 seconds.

In some areas, CdS nanorods were clearly observed from the SEM micrograph having a diameter in a range of from about 50 to about 70 nm. The corresponding EDX spectrum confirmed the formation of CdS particles. The formation of CdS nanorods perhaps contributed to anisotropic growth from spherical CdS nanoparticles in the Tygon ST tubing with increasing residence time (growth time). CdS nanorods or nanowires also could be observed from the TEM results. For example, CdS nanorods having a diameter in a range of from about 30 to about 70 nm, along with nanoparticles, were found. See, FIG. 100. In addition, CdS nanorod bundle structures could be formed at longer residence times (e.g. 140 seconds, FIG. 101).

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method, comprising:
providing at least a first reactant and a chalcogen precursor compound in solution, wherein the first reactant is a metal precursor compound, and the chalcogen precursor compound is selected from a chalcogen powder, a chalcogen halide, a chalcogen oxide, a chalcogen urea, a chalcogen or dichalcogen comprising organic ligands, or combinations thereof;
depositing the first reactant and the chalcogen precursor compound on a substrate;
evaporating solvent to form a deposited material on the substrate; and
thermally annealing the deposited material to form a semiconductor.

2. The method according to claim 1 where the semiconductor is a I-III-VI semiconductor.

3. The method according to claim 1 where the first reactant and the chalcogen precursor compound are provided in the same solution.

4. The method according to claim 1 where the first reactant and the chalcogen precursor compound are provided in different solutions.

5. The method according to claim 1, further comprising:
flowing the metal precursor compound and the chalcogen precursor compound to a micromixer to form the solution; and
applying the solution to the substrate using a microchannel applicator.

6. The method according to claim 1 where the metal precursor compound is a metal halide.

7. The method according to claim 1 where the chalcogen precursor compound has a formula

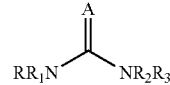

where A is a chalcogen, and R—$R_3$ are independently aliphatic, substituted aliphatic, arylalkyl, cyclic, substituted cyclic, heterocyclic, substituted heterocyclic, aryl, substituted aryl, heteroaryl, substituted heteroaryl or hydrogen.

8. The method according to claim 7 where R—$R_3$ are independently hydrogen or lower alkyl.

9. The method according to claim 7 where the chalcogen precursor compound is

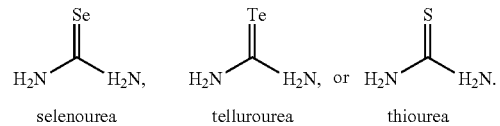

10. The method according to claim 1 where the chalcogen precursor compound has a formula

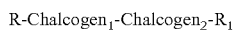

where $Chalcogen_1$ and $Chalcogen_2$ are the same or different, and are selected from sulfur, selenium and tellurium, and where R and $R_1$ are the same or different and are selected from aliphatic, substituted aliphatic, arylalkyl, cyclic, substituted cyclic, heterocyclic, substituted heterocyclic, aryl, substituted aryl, heteroaryl, substituted heteroaryl or hydrogen.

11. The method according to claim 10 where R and $R_1$ are the same or different and are selected from hydrogen and lower alkyl.

12. The method according to claim 1 where chalcogen precursor compound has a formula

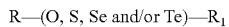

where R and $R_1$ are the same or different and are selected from aliphatic, substituted aliphatic, arylalkyl, cyclic, substituted cyclic, heterocyclic, substituted heterocyclic, aryl, substituted aryl, heteroaryl, substituted heteroaryl or hydrogen.

13. The method according to claim 12 where R and $R_1$ are the same or different and are selected from hydrogen and lower alkyl.

14. The method according to claim 1 where the chalcogen precursor compound has a formula

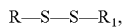

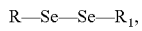

or

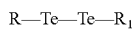

where R and $R_1$ are the same or different and are selected from hydrogen, ethyl, methyl and phenyl.

15. The method according to claim 1 where the chalcogen precursor compound has a formula R-Chalcogen-R₁ where R and R₁ are the same or different and are independently selected from aliphatic, substituted aliphatic, arylalkyl, cyclic, substituted cyclic, heterocyclic, substituted heterocyclic, aryl, substituted aryl, heteroaryl, substituted heteroaryl or hydrogen.

16. The method according to claim 15 where R and R₁ are the same or different and are selected from hydrogen and lower alkyl.

17. The method according to claim 16 where R and R₁ are the same or different and are independently selected from hydrogen, ethyl, methyl and phenyl.

18. The method according to claim 1 where the chalcogen precursor compound is dimethyl sulfide, dimethyl disulfide, diethyl sulfide, diethyl disulfide, diphenyl sulfide, diphenyl disulfide, dimethyl selenide, dimethyl diselenide, diethyl selenide, diethyl diselenide, diphenyl selenide, diphenyl diselenide, diphenylselenium dichloride, dimethyl telluride, dimethyl ditelluride, diethyl telluride, diethyl ditelluride, diphenyl telluride, diphenyl ditelluride, diphenyltellurium dichloride, phenol, thiophenol, phenylseleno and the tellurium analog, or combinations thereof.

19. The method according to claim 1 where thermally annealing is performed in a vacuum or under an inert atmosphere.

20. The method according to claim 1 further comprising exposing the deposited material or the semiconductor to an annealing gas.

21. The method according to claim 20, further comprising:
flowing the metal precursor compound and the chalcogen precursor compound to a micromixer to mix the first and second reactant to form the solution; and
applying the solution to the substrate using a microchannel applicator.

22. A method for making a photovoltaic, comprising:
depositing a metal precursor solution onto a substrate;
forming a first metal contact layer;
depositing a semiconductor absorber precursor solution on the metal layer, the semiconductor absorber precursor solution comprising a first precursor reactant and at least a second precursor reactant in appropriate stoichiometric ratios for forming a semiconductor absorber layer;
forming the semiconductor absorber layer;
forming a buffer layer on the semiconductor layer;
depositing a transparent conductive metal oxide precursor solution on the buffer layer;
forming the transparent conductive metal oxide layer; and
forming a second metal contact layer on the metal oxide layer.

23. The method according to claim 22 further comprising forming an antireflective coating on the second metal contact layer.

24. The method according to claim 22 further comprising encapsulating at least a portion of the photovoltaic in an encapsulant.

25. The method according to claim 22 where the substrate comprises glass, a metal, a metal alloy, a polymer, or combinations thereof.

26. The method according to claim 22 where the first metal contact is a molybdenum contact.

27. The method according to claim 22 where the metal precursor solution comprises molybdenum hexacarbonyl.

28. The method according to claim 22 where depositing comprises inkjet printing, spin coating, gravure, micro-pen, nano-fountain pen, dip-pen, screen printing, spray coating, slide coating, slot coating, curtain coating, dip coating or combinations thereof.

29. The method according to claim 22 where the semiconductor is a I-III-VI (Au, Ag, Cu)(In, Ga, Al)(0, S, Se, Te, Po) semiconductor.

30. The method according to claim 22 where the semiconductor layer is a CIS, CIGS, CIGSS or CGS semiconductor.

31. The method according to claim 22 where the semiconductor absorber layer is formed using solutions of copper halide, indium halide, gallium halides, and selenohalides or selenourea.

32. The method according to claim 22 where the solution comprises an acetonitrile solvent.

33. The method according to claim 22 where forming the semiconductor layer comprises thermally annealing the deposited material layer under vacuum or an inert atmosphere at a temperature of from about 400° C. to about 600° C.

34. The method according to claim 33 further comprising exposing the deposited material or the semiconductor material to an annealing gas.

35. The method according to claim 22, further comprising:
flowing a metal precursor compound and a chalcogen precursor compound to a micromixer to form the semiconductor absorber precursor solution; and
applying the semiconductor absorber precursor solution to the substrate using a microchannel applicator.

36. The method according to claim 22 where the first precursor reactant is a metal halide.

37. The method according to claim 22 where the second precursor reactant is a chalcogen precursor compound comprising a chalcogen powder, a chalcogen halide, a chalcogen oxide, a chalcogen urea, a chalcogen or dichalcogen comprising organic ligands, or combinations thereof.

38. The method according to claim 37 where the chalcogen urea has a formula

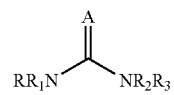

where A is a chalcogen, and R—R₃ are independently aliphatic, substituted aliphatic, arylalkyl, cyclic, substituted cyclic, heterocyclic, substituted heterocyclic, aryl, substituted aryl, heteroaryl, substituted heteroaryl or hydrogen.

39. The method according to claim 38 where R and R₁ are independently selected from hydrogen, ethyl, methyl and phenyl.

40. The method according to claim 38 where the chalcogen urea is

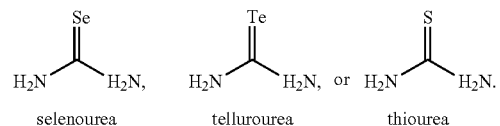

41. The method according to claim 37 where the chalcogen precursor compound has a formula R-Chalcogen₁-Chalcogen₂-R₁ where Chalcogen₁ and Chalcogen₂ are the same or different, and are selected from sulfur, selenium and tellurium, and where R and R₁ are the same or different and are selected from aliphatic, substituted aliphatic, arylalkyl, cyclic, substituted cyclic, heterocyclic, substituted heterocyclic, aryl, substituted aryl, heteroaryl, substituted heteroaryl or hydrogen.

42. The method according to claim 37 where the chalcogen precursor compound has a formula R-Chalcogen-R$_1$ where R and R$_1$ are the same or different and are independently selected from aliphatic, substituted aliphatic, arylalkyl, cyclic, substituted cyclic, heterocyclic, substituted heterocyclic, aryl, substituted aryl, heteroaryl, substituted heteroaryl or hydrogen.

43. The method according to claim 37 where the chalcogen precursor compound is dimethyl sulfide, dimethyl disulfide, diethyl sulfide, diethyl disulfide, diphenyl sulfide, diphenyl disulfide, dimethyl selenide, dimethyl diselenide, diethyl selenide, diethyl diselenide, diphenyl selenide, diphenyl diselenide, diphenylselenium dichloride, dimethyl telluride, dimethyl ditelluride, diethyl telluride, diethyl ditelluride, diphenyl telluride, diphenyl ditelluride, diphenyltellurium dichloride, phenol, thiophenol, phenylseleno and the tellurium analog, or combinations thereof.

44. A method for making a solar cell, comprising:
depositing a molybdenum precursor solution onto a glass substrate and forming a molybdenum metal contact layer;
depositing a CIS, CIGS, CIGSS or CGS semiconductor absorber precursor solution on the molybdenum metal layer, the semiconductor absorber precursor solution comprising at least a first metal precursor reactant and at least a second chalcogen precursor compound comprising a chalcogen powder, a chalcogen halide, a chalcogen oxide, a chalcogen urea, a chalcogen or dichalcogen comprising organic ligands, or combinations thereof, in appropriate stoichiometric ratios for forming a semiconductor absorber layer for the solar cell;
thermally annealing CIS, CIGS, CIGSS or CGS semiconductor absorber precursor material under vacuum or an inert atmosphere to form the semiconductor absorber layer;
forming a buffer layer on the semiconductor layer;
depositing a transparent conductive metal oxide precursor solution on the buffer layer;
forming the metal oxide layer;
depositing a solution comprising an antireflective coating precursor material on the metal oxide layer; and
forming the antireflective coating.

45. A method, comprising:
providing a solution comprising at least a first reactant and a chalcogen precursor compound, wherein the chalcogen precursor compound is selected from a chalcogen powder, a chalcogen halide, a chalcogen oxide, a chalcogen urea, a chalcogen or dichalcogen comprising organic ligands, or combinations thereof;
depositing the solution comprising the first reactant and the precursor compound on a substrate;
evaporating solvent to form a deposited material on the substrate; and
thermally annealing the deposited material to form a semiconductor.

46. A method, comprising:
providing at least a first reactant and a chalcogen precursor compound in solution, wherein the first reactant is a metal precursor compound, and the chalcogen precursor compound is selected from a chalcogen powder, a chalcogen halide, a chalcogen oxide, a chalcogen urea, a chalcogen or dichalcogen comprising organic ligands, or combinations thereof;
flowing the metal precursor compound and the chalcogen precursor compound to a micromixer to form a solution comprising the metal precursor compound and the chalcogen precursor compound;
applying the solution to a substrate using a microchannel applicator;
evaporating solvent to form a deposited material on the substrate; and
thermally annealing the deposited material to form a semiconductor.

47. A method, comprising:
providing at least a first reactant and a chalcogen precursor compound in solution, wherein the first reactant is a metal halide, and the chalcogen precursor compound is selected from a chalcogen powder, a chalcogen halide, a chalcogen oxide, a chalcogen urea, a chalcogen or dichalcogen comprising organic ligands, or combinations thereof;
depositing the first reactant and the chalcogen precursor compound on a substrate;
evaporating solvent to form a deposited material on the substrate; and
thermally annealing the deposited material to form a semiconductor.

48. A method, comprising:
providing at least a metal precursor compound and a chalcogen precursor compound in solution, wherein the metal precursor compound is a halide, an acetate, a nitrate, a sulfate, a carbonate, a carbonyl, a phosphate, a urea, or a mixture thereof, and the chalcogen precursor compound is selected from a chalcogen powder, a chalcogen halide, a chalcogen oxide, a chalcogen urea, a chalcogen or dichalcogen comprising organic ligands, or combinations thereof;
depositing the metal precursor compound and the chalcogen precursor compound on a substrate;
evaporating solvent to form a deposited material on the substrate; and
thermally annealing the deposited material to form a semiconductor.

* * * * *